US012279515B2

(12) United States Patent
Kim et al.

(10) Patent No.: US 12,279,515 B2
(45) Date of Patent: Apr. 15, 2025

(54) LIGHT EMITTING DEVICE

(71) Applicant: Samsung Display Co., Ltd., Yongin-si (KR)

(72) Inventors: Taeil Kim, Hwaseong-si (KR); Mun-Ki Sim, Seoul (KR); Sun Young Pak, Suwon-si (KR); Junha Park, Gwacheon-si (KR); Jang Yeol Baek, Yongin-si (KR); Kyoung Sunwoo, Hwaseong-si (KR); Chanseok Oh, Seoul (KR); Minjung Jung, Hongcheon-gun (KR)

(73) Assignee: Samsung Display Co., Ltd., Yongin-si (KR)

( * ) Notice: Subject to any disclaimer, the term of this patent is extended or adjusted under 35 U.S.C. 154(b) by 827 days.

(21) Appl. No.: 17/446,894

(22) Filed: Sep. 3, 2021

(65) Prior Publication Data

US 2022/0190249 A1 Jun. 16, 2022

(30) Foreign Application Priority Data

Dec. 11, 2020 (KR) ........................ 10-2020-0173413

(51) Int. Cl.
*H01L 51/50* (2006.01)
*C07F 5/02* (2006.01)
(Continued)

(52) U.S. Cl.
CPC ........... *H10K 85/322* (2023.02); *C07F 5/027* (2013.01); *C09K 11/06* (2013.01);
(Continued)

(58) Field of Classification Search
None
See application file for complete search history.

(56) References Cited

U.S. PATENT DOCUMENTS

2010/0001301 A1* 1/2010 Karg ...................... H10K 50/85 257/40
2015/0236274 A1* 8/2015 Hatakeyama ........ H10K 85/631 548/405

(Continued)

FOREIGN PATENT DOCUMENTS

KR 10-2016-0119683 A 10/2016
KR 10-2019-0025065 A 3/2019

(Continued)

OTHER PUBLICATIONS

Anton Pershin et al., Highly emissive excitons with reduced exchange energy in thermally activated delayed fluorescent molecules, Article, 2019, vol. 10, No. 597, Nature Communications, 5pp.

(Continued)

*Primary Examiner* — Gregory D Clark
(74) *Attorney, Agent, or Firm* — Womble Bond Dickinson (US) LLP

(57) ABSTRACT

A light emitting device of an embodiment includes oppositely disposed first electrode and second electrode, and multiple organic layers disposed between the first electrode and the second electrode, wherein at least one among the organic layers includes a fused polycyclic compound represented by Formula 1 below, thereby showing improved emission efficiency. In Formula 1, the substituents are the same as defined in the Detailed Description.

(Continued)

Formula 1

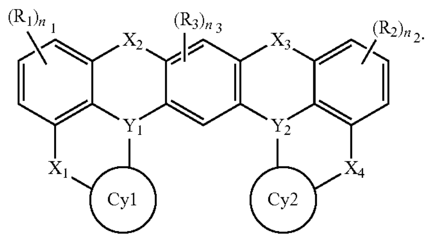

20 Claims, 6 Drawing Sheets

(51) Int. Cl.

| | |
|---|---|
| ***C09K 11/06*** | (2006.01) |
| ***H10K 85/30*** | (2023.01) |
| *H10K 50/11* | (2023.01) |
| *H10K 101/10* | (2023.01) |

(52) U.S. Cl.
CPC ...... *C09K 2211/1018* (2013.01); *H10K 50/11* (2023.02); *H10K 2101/10* (2023.02)

(56) References Cited

U.S. PATENT DOCUMENTS

2020/0006671 A1 1/2020 Sim et al.
2020/0190115 A1 6/2020 Hatakeyama et al.

FOREIGN PATENT DOCUMENTS

KR 10-2020-0001664 A 1/2020
KR 10-2020-0006965 A 1/2020
WO WO 2018/212169 A1 11/2018

OTHER PUBLICATIONS

Yasuhiro Kondo et al., Narrowband deep-blue organic light-emitting diode featuring an organoboron-based emitter, Letters, 2019, Nature Photonics., 6pp. (URL: https://doi.org/10.1038/s41566-019-0476-5).

* cited by examiner

LIGHT EMITTING DEVICE

CROSS-REFERENCE TO RELATED APPLICATION

This application claims priority to and the benefit of Korean Patent Application No. 10-2020-0173413, filed on Dec. 11, 2020, the entire content of which is hereby incorporated by reference.

BACKGROUND

1. Field

The present disclosure herein relates to a light emitting device and a fused polycyclic compound utilized therein.

2. Description of the Related Art

Recently, the development of an organic electroluminescence display as an image display apparatus is being actively conducted. The organic electroluminescence display is different from a liquid crystal display and is a so-called self-luminescent display in which holes and electrons injected from a first electrode and a second electrode recombine in an emission layer, so that a light emitting material (including an organic compound) in the emission layer emits light to achieve display (e.g., to display an image).

In the application of an organic electroluminescence device to a display, the decrease of a driving voltage, and the increase of emission efficiency and the life (lifespan) of the organic electroluminescence device are desired (e.g., required), and the development of materials for an organic electroluminescence device capable of stably attaining such characteristics (e.g., the requirements) is being continuously conducted.

Recently, in order to obtain an organic electroluminescence device with high efficiency, technologies pertaining to phosphorescence emission (which utilizes energy in a triplet state) or delayed fluorescence emission (which utilizes the generating phenomenon of singlet excitons by the collision of triplet excitons (triplet-triplet annihilation, TTA)) are being developed, and the development on a material for thermally activated delayed fluorescence (TADF) utilizing delayed fluorescence phenomenon is being conducted.

SUMMARY

An aspect according to embodiments of the present disclosure is directed toward a light emitting device showing improved emission efficiency.

An aspect according to embodiments of the present disclosure is also directed toward a fused polycyclic compound which is capable of improving the emission efficiency of a light emitting device.

According to an embodiment of the present disclosure, a light emitting device includes a first electrode, a second electrode facing the first electrode, and a plurality of organic layers between the first electrode and the second electrode. At least one organic layer selected from among the plurality of organic layers may include a fused polycyclic compound represented by Formula 1 below.

Formula 1

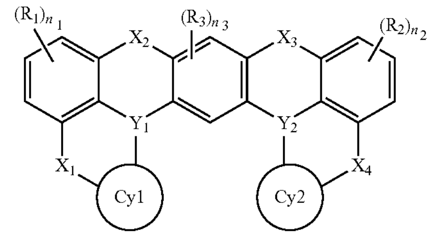

In Formula 1, $X_1$ to $X_4$ may each independently be $CR_4R_5$, $NR_6$, O, S or Se; $Y_1$ and $Y_2$ may each be B; $R_1$ to $R_6$ may each independently be a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms, and/or combined with an adjacent group to form a ring; "$n_1$" and "$n_2$" may each independently be an integer of 0 to 3; "$n_3$" may be an integer of 0 to 2; Cy1 and Cy2 may each independently be represented by Formula 2 or Formula 3 below, and Cy1 and/or Cy2 may be represented by Formula 2 below.

Formula 2

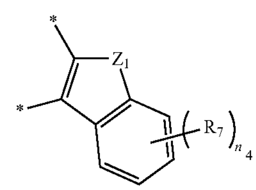

In Formula 2, $Z_1$ may be $CR_8R_9$, $NR_{10}$, O, S, or Se; $R_7$ to $R_{10}$ may each independently be a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms, and/or combined with an adjacent group to form a ring "$n_4$" may be an integer of 0 to 4; ——* may represent a position connected with $X_1$ or $Y_1$, or a position connected with $X_4$ or $Y_2$, respectively, in Formula 1.

Formula 3

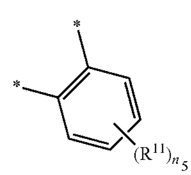

In Formula 3, $R_{11}$ may be a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms, and/or combined with an adjacent group to form a ring; "$n_5$" may be an integer of 0 to 4; and —* may represent a position connected with $X_1$ or $Y_1$, or a position connected with $X_4$ or $Y_2$, respectively, in Formula 1.

In an embodiment, the plurality of organic layers may include a hole transport region on the first electrode, an emission layer on the hole transport region, and an electron transport region on the emission layer, and the emission layer may include the fused polycyclic compound.

In an embodiment, the emission layer may be to emit delayed fluorescence.

In an embodiment, the emission layer may be a delayed fluorescence emission layer including a host and a dopant, and the dopant may include the fused polycyclic compound.

In an embodiment, the emission layer may be to emit light having a central wavelength of about 430 nm to about 490 nm.

In an embodiment, the fused polycyclic compound represented by Formula 1 may be represented by any one selected from among Formula 4-1 to Formula 4-3 below.

Formula 4-1

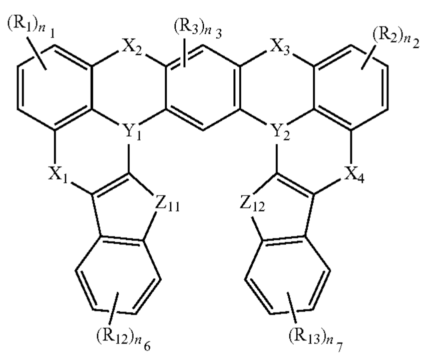

Formula 4-2

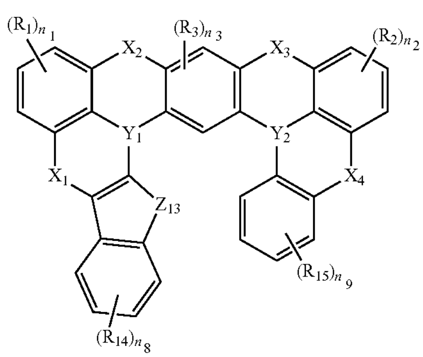

-continued

Formula 4-3

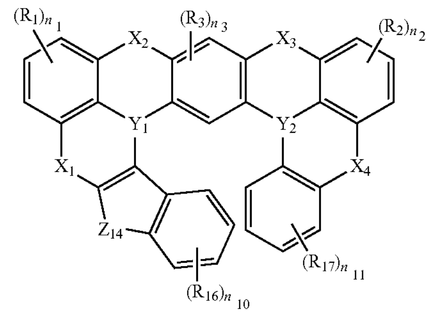

In Formula 4-1 to Formula 4-3, $Z_{11}$ to $Z_{14}$ may each independently be $CR_{18}R_{19}$, $NR_{20}$, O, S, or Se; $R_{12}$ to $R_{20}$ may each independently be a hydrogen atom, a deuterium atom, a halogen atom, a cyano group, a nitro group, a substituted or unsubstituted amine group, a substituted or unsubstituted silyl group, a substituted or unsubstituted baron group, a substituted or unsubstituted oxy group, a substituted or unsubstituted thio group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms, and/or combined with an adjacent group to form a ring; "$n_6$" to "$n_{11}$" may each independently be an integer of 0 to 4.

In Formula 4-1 to Formula 4-3, the same explanation on $X_1$ to $X_4$, $Y_1$, $Y_2$, $R_1$ to $R_3$, and "$n_1$" to "$n_3$" as respectively defined in connection with Formula 1 may be applied.

In an embodiment, the fused polycyclic compound represented by Formula 1 may be represented by any one selected from among Formula 5-1 to Formula 5-3 below.

Formula 5-1

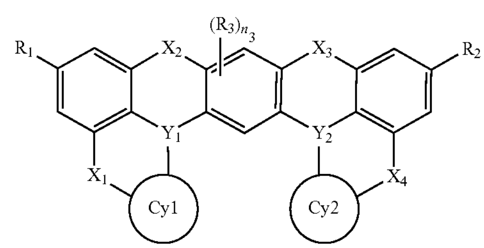

Formula 5-2

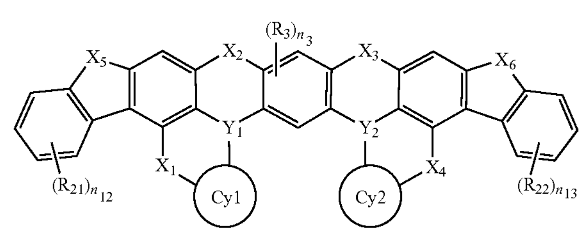

-continued

Formula 5-3

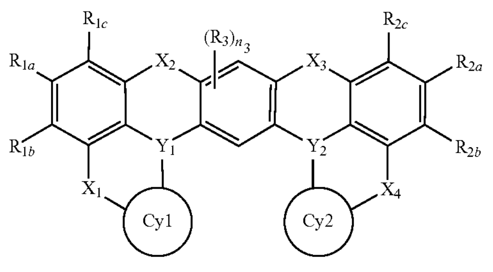

In Formula 5-1 to Formula 5-3, $X_5$ and $X_6$ may each independently be $CR_{23}R_{24}$, $NR_{25}$, O, or S; $R_{21}$ to $R_{25}$ may each independently be a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms, and/or combined with an adjacent group to form a ring; $R_{1a}$, $R_{1b}$, $R_{1c}$, $R_{2a}$, $R_{2b}$, and $R_{2c}$ may each independently be a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms; $R_{1a}$ may be combined with $R_{1b}$ and/or $R_{1c}$ to form a ring; $R_{2a}$ may be combined with $R_{2b}$ and/or $R_{2c}$ to form a ring; and "$n_{12}$" to "$n_{13}$" may each independently be an integer of 0 to 4.

In Formula 5-1 to Formula 5-3, the same explanation on $X_1$ to $X_4$, $Y_1$, $Y_2$, $R_1$, $R_2$, $R_3$, "$n_3$", Cy1 and Cy2 as respectively defined in connection with Formula 1 may be applied.

In an embodiment, Cy1 and/or Cy2 may be represented by Formula 2-1 or Formula 2-2 below.

Formula 2-1

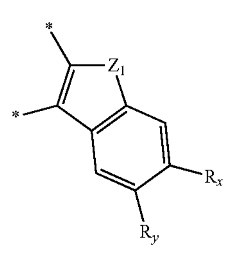

Formula 2-2

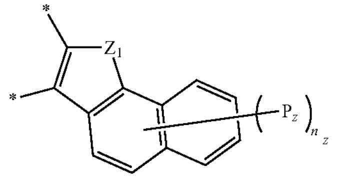

In Formula 2-1 and Formula 2-2, $R_x$, $R_y$, and $P_z$ may each independently be a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms, and/or combined with an adjacent group to form a ring, and "$n_z$" may be an integer of 0 to 6.

In Formula 2-1 and Formula 2-2, the same explanation on $Z_1$ and —* as respectively defined in connection with Formula 2 may be applied.

In an embodiment, in Formula 1, each of $X_1$ to $X_4$ may be $NR_6$, and $R_6$ may be a substituted or unsubstituted phenyl group.

In an embodiment, in Formula 1 to Formula 3, $R_1$ to $R_{11}$ may be each independently a hydrogen atom, a deuterium atom, a substituted or unsubstituted methyl group, a substituted or unsubstituted t-butyl group, a substituted or unsubstituted phenyl group, a substituted or unsubstituted terphenyl group, or a substituted or unsubstituted carbazole group.

In an embodiment, the light emitting device of an embodiment may further include a capping layer on the second electrode. The refractive index of the capping layer may be about 1.6 or more.

In an embodiment, the host may include a compound represented by Formula E-2a or Formula E-2b below.

Formula E-2a

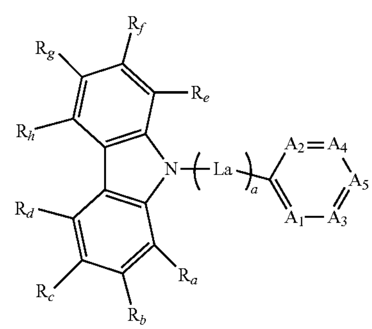

Formula E-2b $$(\text{Cbz1})\!-\!(L_b)_b\!-\!(\text{Cbz2})$$

In Formula E-2a, "a" may be an integer of 0 to 10; $L_a$ may be a direct linkage, a substituted or unsubstituted arylene group having 6 to 30 ring-forming carbon atoms, or a substituted or unsubstituted heteroarylene group having 2 to 30 ring-forming carbon atoms. $A_1$ to $A_5$ may each independently be N or $CR_i$; $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be combined with an adjacent group to form a ring; and two or three groups selected from among $A_1$ to $A_5$ may each be N, and remainder groups may each be $CR_i$; and in Formula E-2b, Cbz1 and Cbz2 may each independently be an unsubstituted carbazole group, or a carbazole group substituted with an aryl group having 6 to 30 ring-forming carbon atoms; $L_b$ may be a direct linkage, a substituted or unsubstituted arylene group having 6 to 30 ring-forming carbon atoms, or a substituted or unsubstituted heteroarylene group having 2 to 30 ring-forming carbon atoms; and "b" may be an integer of 0 to 10.

In an embodiment, the hole transport region may include a compound represented by Formula H-a below.

Formula H-a

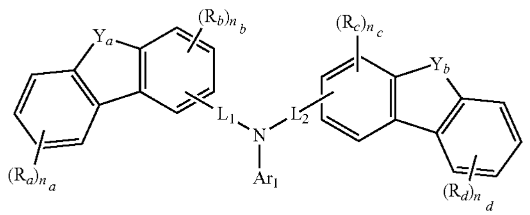

In Formula H-a, $Y_a$ and $Y_b$ may each independently be $CR_eR_f$, $NR_g$, O, or S; $Ar_1$ may be a substituted or unsubstituted aryl group having 6 to 30 ring-forming carbon atoms, or a substituted or unsubstituted heteroaryl group having 2 to 30 ring-forming carbon atoms; $L_1$ and $L_2$ may each independently be a direct linkage, a substituted or unsubstituted arylene group having 6 to 30 ring-forming carbon atoms, or a substituted or unsubstituted heteroarylene group having 2 to 30 ring-forming carbon atoms; $R_a$ to $R_g$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be combined with an adjacent group to form a ring; "$n_a$" and "$n_d$" may each independently be an integer of 0 to 4; and "$n_b$" and "$n_c$" may each independently be an integer of 0 to 3.

A fused polycyclic compound according to an embodiment of the present disclosure may be represented by Formula 1 above.

BRIEF DESCRIPTION OF THE FIGURES

The accompanying drawings are included to provide a further understanding of the subject matter of the present disclosure and are incorporated in and constitute a part of this specification. The drawings illustrate example embodiments of the present disclosure and, together with the description, serve to explain principles of the present disclosure. In the drawings.

DETAILED DESCRIPTION

Figure 1:
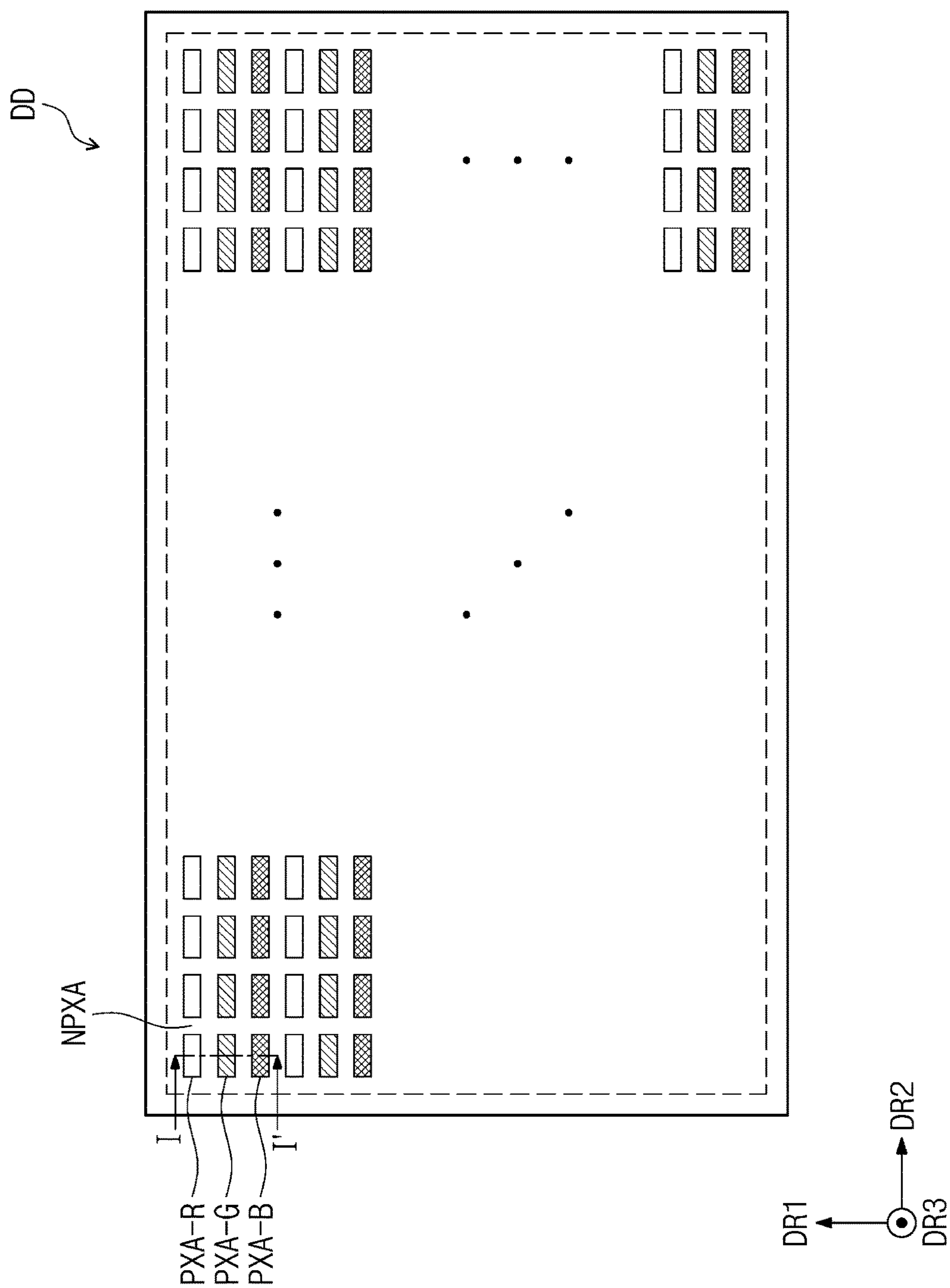
FIG. 1 is a plan view of a display apparatus according to an embodiment of the present disclosure.

The present disclosure may have various modifications and may be embodied in different forms, and example embodiments will be explained in more detail with reference to the accompany drawings. The present disclosure may, however, be embodied in different forms and should not be construed as limited to the embodiments set forth herein. Rather, all modifications, equivalents, and substituents which are included in the spirit and technical scope of the present disclosure should be included in the present disclosure.

Like reference numerals refer to like elements throughout. In the drawings, the dimensions of structures are exaggerated for clarity of illustration. It will be understood that, although the terms first, second, etc. may be used herein to describe various elements, these elements should not be limited by these terms. These terms are only used to distinguish one element from another element. For example, a first element could be termed a second element without departing from the teachings of the present invention. Similarly, a second element could be termed a first element. As used herein, the singular forms are intended to include the plural forms as well, unless the context clearly indicates otherwise.

In the description, it will be further understood that the terms "comprises" and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof.

In the description, when a layer, a film, a region, a plate, etc. is referred to as being "on" or "above" another part, it can be "directly on" the other part (without any intervening layers therebetween), or intervening layers may also be present. On the contrary, when a layer, a film, a region, a plate, etc. is referred to as being "under" or "below" another part, it can be "directly under" the other part (without any intervening layers therebetween), or intervening layers may also be present. Also, when an element is referred to as being disposed "on" another element, it can be disposed under the other element.

In the description, the term "substituted or unsubstituted" corresponds to a group that is unsubstituted or that is substituted with at least one substituent selected from the group consisting of a deuterium atom, a halogen atom, a cyano group, a nitro group, an amine group, a silyl group, an oxy group, a thio group, a sulfinyl group, a sulfonyl group, a carbonyl group, a boron group, a phosphine group, a phosphine oxide group, a phosphine sulfide group, an alkyl group, an alkenyl group, an alkynyl group, an alkoxy group, a hydrocarbon ring group, an aryl group, and a heterocyclic group. In addition, each of the substituents may be substituted or unsubstituted. For example, a biphenyl group may be interpreted as an aryl group or a phenyl group substituted with a phenyl group.

In the description, the term "forming a ring via the combination with an adjacent group" may mean forming a substituted or unsubstituted hydrocarbon ring, or a substituted or unsubstituted heterocycle via the combination with an adjacent group. The hydrocarbon ring includes an aliphatic hydrocarbon ring and an aromatic hydrocarbon ring. The heterocycle includes an aliphatic heterocycle and an aromatic heterocycle. The hydrocarbon ring and the heterocycle may be monocycles or polycycles. In addition, the ring formed via the combination with an adjacent group may be combined with another ring to form a spiro structure.

In the description, the term "adjacent group" may refer to a pair of substituent groups where the first substituent is connected to an atom which is directly connected to another atom substituted with the second substituent; a pair of substituent groups connected to the same atom; or a pair of substituent groups where the first substituent is sterically positioned at the nearest position to the second substituent. For example, in 1,2-dimethylbenzene, the two methyl groups may be interpreted as "adjacent groups" to each other, and in 1,1-diethylcyclopentene, the two ethyl groups may be interpreted as "adjacent groups" to each other. In addition, in 1,13-dimethylquinolino[3,2,1-de]acridine-5,9-dione, the two methyl groups connected with carbon at position 1 and carbon at position 13, respectively, may be interpreted as "adjacent groups" to each other.

In the description, the halogen atom may be a fluorine atom, a chlorine atom, a bromine atom, or an iodine atom.

In the description, the alkyl group may be a linear, branched or cyclic alkyl group. The number of carbon atoms in the alkyl group may be 1 to 50, 1 to 30, 1 to 20, 1 to 10, or 1 to 6. Non-limiting examples of the alkyl group may include a methyl group, an ethyl group, an n-propyl group, an isopropyl group, an n-butyl group, an s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldodecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc.

In the description, the hydrocarbon ring group may refer to an optional functional group or substituent derived from an aliphatic hydrocarbon ring. The hydrocarbon ring group may be a saturated hydrocarbon ring group having 5 to 30 or 5 to 20 ring-forming carbon atoms.

In the description, the aryl group may refer to an optional functional group or substituent derived from an aromatic hydrocarbon ring. The aryl group may be a monocyclic aryl group or a polycyclic aryl group. The carbon number for forming rings in the aryl group may be 6 to 60, 6 to 30, 6 to 20, or 6 to 15. Non-limiting examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, etc.

In the description, the fluorenyl group may be substituted, and two substituents may be combined with each other to form a spiro structure. Examples of a substituted fluorenyl group may be as follows, but the present disclosure is not limited thereto.

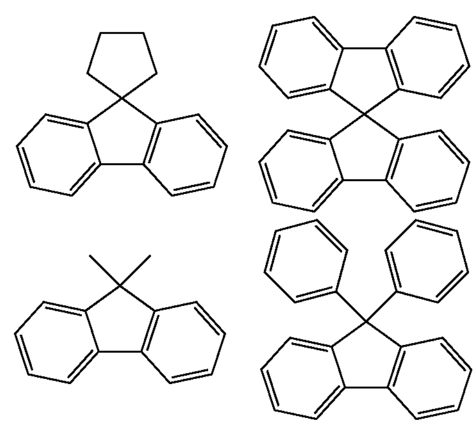

In the description, the heterocyclic group may refer to an optional functional group or substituent derived from a ring including one or more among B, O, N, P, Si, S and Se as heteroatoms. The heterocyclic group includes an aliphatic heterocyclic group and an aromatic heterocyclic group. The aromatic heterocyclic group may be a heteroaryl group. The aliphatic heterocyclic group and the aromatic heterocyclic group may be a monocycle or a polycycle.

In the description, the heterocyclic group may include one or more among B, O, N, P, Si, S and Se as heteroatoms. When the heterocyclic group includes two or more heteroatoms, two or more heteroatoms may be the same or different. The heterocyclic group may be a monocyclic heterocyclic group or a polycyclic heterocyclic group, and includes a heteroaryl group. The carbon number for forming rings of the heterocyclic group may be 2 to 60, 2 to 30, 2 to 20, and 2 to 10.

In the description, the aliphatic heterocyclic group may include one or more among B, O, N, P, Si, S and Se as heteroatoms. The number of ring-forming carbon atoms of the aliphatic heterocyclic group may be 2 to 60, 2 to 30, 2 to 20, or 2 to 10. Non-limiting examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, etc.

In the description, the heteroaryl group may include one or more among B, O, N, P, Si, S and Se as heteroatoms.

When the heteroaryl group includes two or more heteroatoms, two or more heteroatoms may be the same or different. The heteroaryl group may be a monocyclic heterocyclic group or a polycyclic heterocyclic group. The carbon number for forming rings of the heteroaryl group may be 2 to 60, 2 to 30, 2 to 20, or 2 to 10. Non-limiting examples of the heteroaryl group may include a thiophene group, a furan group, a pyrrole group, an imidazole group, a triazole group, a pyridine group, a bipyridine group, a pyrimidine group, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, etc.

In the description, the explanation for the aryl group may be applied to the arylene group except that the arylene group is a divalent group. The explanation for the heteroaryl group may be applied to the heteroarylene group except that the heteroarylene group is a divalent group.

In the description, the alkenyl group may be a linear chain or a branched chain. The carbon number is not specifically limited but may be 2 to 30, 2 to 20, or 2 to 10. Non-limiting examples of the alkenyl group may include a vinyl group, a 1-butenyl group, a 1-pentenyl group, a 1,3-butadienyl aryl group, a styrenyl group, a styrylvinyl group, etc.

In the description, the number of carbon atoms in the alkynyl group is not specifically limited, but may be 2 to 30, 2 to 20 or 2 to 10. Non-limiting examples of the alkynyl group may include a vinyl group, a 2-butynyl group, a 2-pentynyl group, and a 1,3-pentadinyl aryl group.

In the description, the explanation on the alkyl group, alkenyl group, alkynyl group, aryl group, and heteroaryl group may be applied to the alkyl connecting group, alkenyl connecting group, aryl connecting group, and heteroaryl connecting group, respectively, except that these are divalent, trivalent or tetravalent groups.

In the description, the silyl group may include an alkyl silyl group and an aryl silyl group. Non-limiting examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc.

In the description, the number of carbon atoms in a carbonyl group is not specifically limited, but the carbon number may be 1 to 40, 1 to 30, or 1 to 20. For example, the carbonyl group may have the structures below, but the present disclosure is not limited thereto.

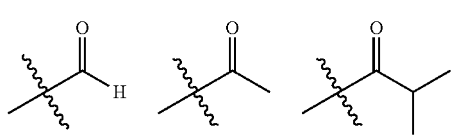

-continued

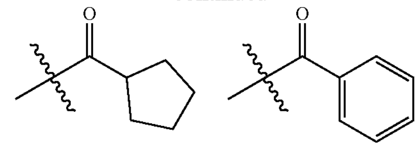

In the description, the number of carbon atoms in the sulfinyl group and the sulfonyl group is not specifically limited, but may be 1 to 30. The sulfinyl group may include an alkyl sulfinyl group and an aryl sulfinyl group. The sulfonyl group may include an alkyl sulfonyl group and an aryl sulfonyl group.

In the description, the thiol group may include an alkyl thio group and an aryl thio group. The thiol group may refer to the above-defined alkyl group or aryl group combined with a sulfur atom. Non-limiting examples of the thiol group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, etc.

In the description, the oxy group may refer to the above-defined alkyl group or aryl group which is combined with an oxygen atom. The oxy group may include an alkoxy group and an aryl oxy group. The alkoxy group may be a linear, branched or cyclic chain. The number of carbon atoms in the alkoxy group is not specifically limited but may be, for example, 1 to 20 or 1 to 10. Examples of the oxy group may include methoxy, ethoxy, n-propoxy, isopropoxy, butoxy, pentyloxy, hexyloxy, octyloxy, nonyloxy, decyloxy, benzyloxy, etc. However, the present disclosure is not limited thereto.

In the description, the boron group may refer to the above-defined alkyl group or aryl group which is combined with a boron atom. The boron group may include an alkyl boron group and an aryl boron group. Non-limiting examples of the boron group may include a trimethylboron group, a triethylboron group, a t-butyldimethylboron group, a triphenylboron group, a diphenylboron group, a phenylboron group, etc.

In the description, the number of carbon atoms in the amine group is not specifically limited, but may be 1 to 30. The amine group may include an alkyl amine group and an aryl amine group. Non-limiting examples of the amine group may include a methylamine group, a dimethylamine group, a phenylamine group, a diphenylamine group, a naphthylamine group, a 9-methyl-anthracenylamine group, a triphenylamine group, etc.

In the description, an alkyl group in the alkylthio group, the alkylsulfoxy group, the alkylaryl group, the alkylamino group, the alkylboron group, the alkyl silyl group, and the alkyl amine group may be the same as the examples of the above-described alkyl group.

In the description, the aryl group in the aryloxy group, the arylthio group, the arylsulfoxy group, the aryl amino group, the arylboron group, and the aryl silyl group may be the same as the examples of the above-described aryl group.

In the description, a direct linkage may refer to a single bond.

In the description,

“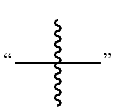”

and "—*" may each represent a position to be connected.

Hereinafter, embodiments of the present disclosure will be explained referring to the drawings.

Figure 2:
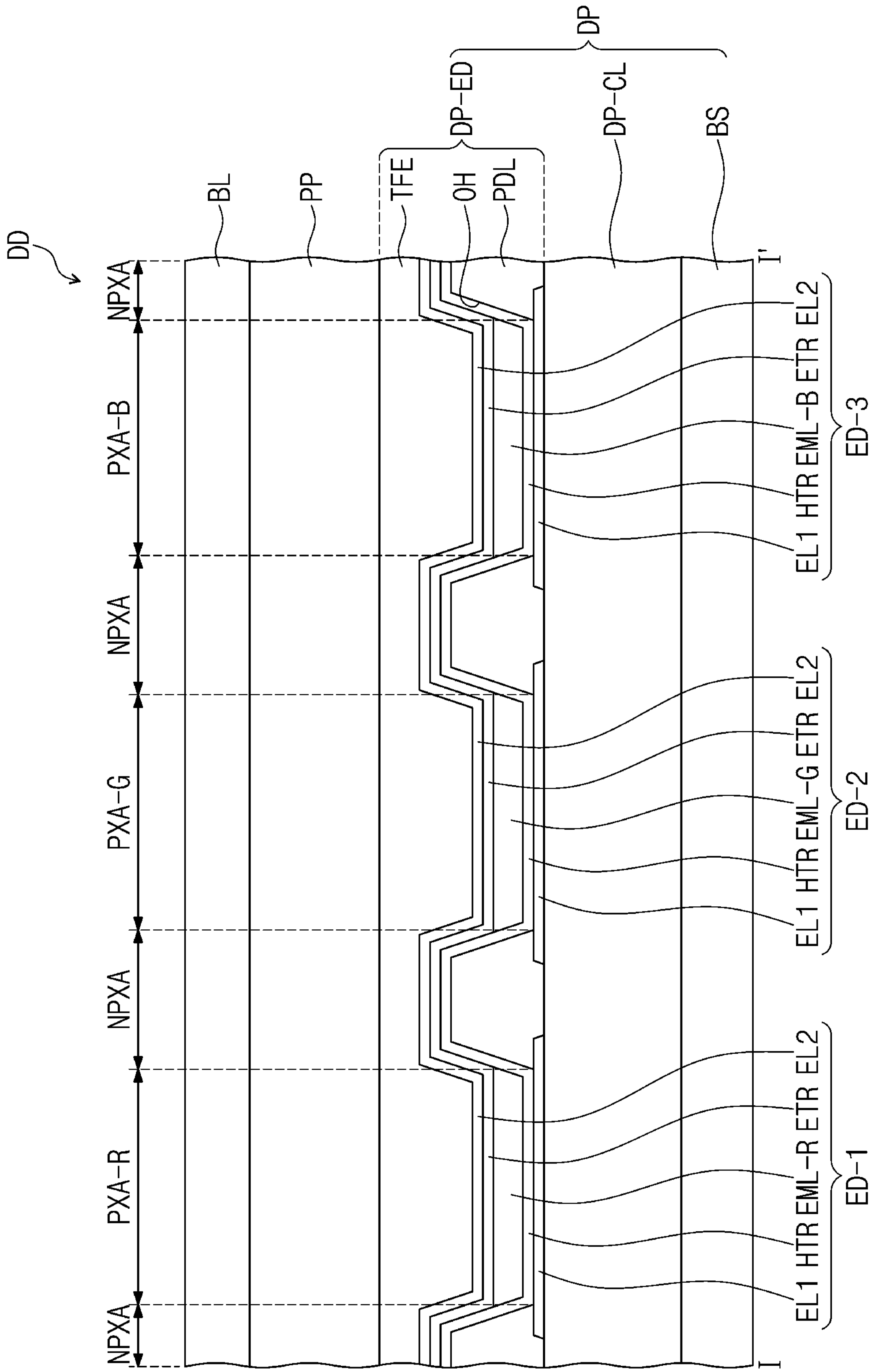
FIG. 2 is a cross-sectional view of a display apparatus according to an embodiment of the present disclosure.

FIG. 1 is a plan view showing an embodiment of a display apparatus DD. FIG. 2 is a cross-sectional view of a display apparatus DD of an embodiment. FIG. 2 is a cross-sectional view showing a part corresponding to the line I-I'.

The display apparatus DD may include a display panel DP and an optical layer PP disposed on the display panel DP. The display panel DP includes light emitting devices ED-1, ED-2 and ED-3. The display apparatus DD may include multiple light emitting devices ED-1, ED-2 and ED-3. The optical layer PP may be disposed on the display panel DP and control reflected light of external light at the display panel DP. The optical layer PP may include, for example, a polarization layer and/or a color filter layer. In one or more embodiments, different from the drawings, the optical layer PP may be omitted in the display apparatus DD.

On the optical layer PP, an upper base layer BL may be disposed. The upper base layer BL may be a member providing a base surface where the optical layer PP is disposed. The upper base layer BL may be a glass substrate, a metal substrate, a plastic substrate, etc. However, the present disclosure is not limited thereto, and the upper base layer BL may be an inorganic layer, an organic layer or a composite material layer (e.g., a composite material layer including an inorganic material and an organic material). In addition, different from the drawings, the upper base layer BL may be omitted in an embodiment.

The display apparatus DD according to an embodiment may further include a plugging layer. The plugging layer may be disposed between a display device layer DP-ED and the upper base layer BL. The plugging layer may be an organic layer. The plugging layer may include at least one selected from among an acrylic resin, a silicon-based resin and an epoxy-based resin.

The display panel DP may include a base layer BS, a circuit layer DP-CL provided on the base layer BS and a display device layer DP-ED. The display device layer DP-ED may include a pixel definition layer PDL, the light emitting devices ED-1, ED-2 and ED-3 disposed in the pixel definition layer PDL, and an encapsulating layer TFE disposed on the light emitting devices ED-1, ED-2 and ED-3.

The base layer BS may be a member providing a base surface where the display device layer DP-ED is disposed. The base layer BS may be a glass substrate, a metal substrate, a plastic substrate, etc. However, the present disclosure is not limited thereto, and the base layer BS may be an inorganic layer, an organic layer, or a composite material layer.

In an embodiment, the circuit layer DP-CL is disposed on the base layer BS, and the circuit layer DP-CL may include multiple transistors. Each of the transistors may include a control electrode, an input electrode, and an output electrode. For example, the circuit layer DP-CL may include switching transistors and driving transistors for driving the light emitting devices ED-1, ED-2 and ED-3 of the display device layer DP-ED.

Each of the light emitting devices ED-1, ED-2 and ED-3 may have a structure of a light emitting device ED of an embodiment according to FIG. 3 to FIG. 6, which will be explained in more detail later. Each of the light emitting devices ED-1, ED-2 and ED-3 may include a first electrode EL1, a hole transport region HTR, emission layers EML-R, EML-G and EML-B, an electron transport region ETR, and a second electrode EL2.

In FIG. 2 shows an embodiment where the emission layers EML-R, EML-G and EML-B of the light emitting devices ED-1, ED-2 and ED-3 are in opening portions OH defined in a pixel definition layer PDL, and the hole transport region HTR, the electron transport region ETR and the second electrode EL2 are provided as common layers in all light emitting devices ED-1, ED-2 and ED-3. However, the present disclosure is not limited thereto. Different from FIG. 2, in an embodiment, the hole transport region HTR and the electron transport region ETR may be patterned and provided in the opening portions OH defined in the pixel definition layer PDL. For example, in an embodiment, the hole transport region HTR, the emission layers EML-R, EML-G and EML-B, and the electron transport region ETR of the light emitting devices ED-1, ED-2 and ED-3 may be patterned by an ink jet printing method.

The encapsulating layer TFE may cover the light emitting devices ED-1, ED-2 and ED-3. The encapsulating layer TFE may encapsulate the display device layer DP-ED. The encapsulating layer TFE may be a thin film encapsulating layer. The encapsulating layer TFE may be one layer or a stacked layer of multiple layers. The encapsulating layer TFE may include at least one insulating layer. The encapsulating layer TFE according to an embodiment may include at least one inorganic layer (hereinafter, encapsulating inorganic layer). In addition, the encapsulating layer TFE according to an embodiment may include at least one organic layer (hereinafter, encapsulating organic layer) and at least one encapsulating inorganic layer.

The encapsulating inorganic layer protects the display device layer DP-ED from moisture/oxygen, and the encapsulating organic layer protects the display device layer DP-ED from foreign materials such as dust particles. The encapsulating inorganic layer may include silicon nitride, silicon oxy nitride, silicon oxide, titanium oxide, and/or aluminum oxide, without being limited thereto. The encapsulating organic layer may include an acrylic compound, an epoxy-based compound, etc. The encapsulating organic layer may include a photopolymerizable organic material, without being limited thereto.

The encapsulating layer TFE may be disposed on the second electrode EL2 and may fill the opening portion OH.

Referring to FIG. 1 and FIG. 2, the display apparatus DD may include a non-luminous area (e.g., non-light emitting area) NPXA and luminous areas (e.g., light emitting areas) PXA-R, PXA-G and PXA-B. The luminous areas PXA-R, PXA-G and PXA-B may be areas emitting light produced from the light emitting devices ED-1, ED-2 and ED-3, respectively. The luminous areas PXA-R, PXA-G and PXA-B may be separated from each other in a plan view (e.g., on a plane).

The luminous areas PXA-R, PXA-G and PXA-B may be areas separated by the pixel definition layer PDL. The non-luminous areas NPXA may be areas between neighboring luminous areas PXA-R, PXA-G and PXA-B and may be areas corresponding to the pixel definition layer PDL. In one or more embodiments, in the disclosure, each of the luminous areas PXA-R, PXA-G and PXA-B may correspond to each pixel. The pixel definition layer PDL may divide the light emitting devices ED-1, ED-2 and ED-3. The emission layers EML-R, EML-G and EML-B of the light emitting devices ED-1, ED-2 and ED-3 may be disposed and divided in the opening portions OH defined in the pixel definition layer PDL.

The luminous areas PXA-R, PXA-G and PXA-B may be divided into multiple groups according to the color of light produced from the light emitting devices ED-1, ED-2 and ED-3. In the display apparatus DD of an embodiment, shown in FIG. 1 and FIG. 2, three luminous areas PXA-R, PXA-G and PXA-B emitting red light, green light and blue light are illustrated as an embodiment. For example, the display apparatus DD of an embodiment may include a red luminous area PXA-R, a green luminous area PXA-G and a blue luminous area PXA-B, which are separated from each other.

In the display apparatus DD according to an embodiment, multiple light emitting devices ED-1, ED-2 and ED-3 may emit light having different wavelength regions (e.g., wavelength ranges). For example, in an embodiment, the display apparatus DD may include a first light emitting device ED-1 emitting red light, a second light emitting device ED-2 emitting green light, and a third light emitting device ED-3 emitting blue light. That is, each of the red luminous area PXA-R, the green luminous area PXA-G, and the blue luminous area PXA-B of the display apparatus DD may correspond to the first light emitting device ED-1, the second light emitting device ED-2, and the third light emitting device ED-3, respectively.

However, the present disclosure is not limited thereto, and the first to third light emitting devices ED-1, ED-2 and ED-3 may emit light in the same wavelength region, or at least one thereof may emit light in a different wavelength region. For example, the first to third light emitting devices ED-1, ED-2 and ED-3 may all emit blue light.

The luminous areas PXA-R, PXA-G and PXA-B in the display apparatus DD according to an embodiment may be arranged in a stripe shape. Referring to FIG. 1, multiple red luminous areas PXA-R may be arranged with each other along a second directional axis DR2, multiple green luminous areas PXA-G may be arranged with each other along the second directional axis DR2, and multiple blue luminous areas PXA-B may be arranged with each other along the second directional axis DR2. In addition, a red luminous area PXA-R, a green luminous area PXA-G and a blue luminous area PXA-B may be alternately arranged (e.g., in the stated order) along a first directional axis DR1.

In FIG. 1 and FIG. 2, the areas of the luminous areas PXA-R, PXA-G and PXA-B are shown to be similar to one another, but the present disclosure is not limited thereto. The areas of the luminous areas PXA-R, PXA-G and PXA-B may be different from each other according to the wavelength region of light emitted. In one or more embodiments, the areas of the luminous areas PXA-R, PXA-G and PXA-B may refer to areas in a plan view (e.g., when viewed in or on a plane defined by the first directional axis DR1 and the second directional axis DR2).

In one or more embodiments, the arrangement of the luminous areas PXA-R, PXA-G and PXA-B is not limited to the configuration shown in FIG. 1, and the arrangement order of the red luminous areas PXA-R, the green luminous areas PXA-G and the blue luminous areas PXA-B may be provided in various suitable combinations according to the properties of display quality required for the display apparatus DD. For example, the arrangement of the luminous areas PXA-R, PXA-G and PXA-B may be in a PENTILE® arrangement form (e.g., an RGBG matrix, RGBG structure, or RGBG matrix structure), or a diamond arrangement form. PENTILE® is a duly registered trademark of Samsung Display Co., Ltd.

In addition, the areas of the luminous areas PXA-R, PXA-G and PXA-B may be different from each other. For example, in an embodiment, the area of the green luminous area PXA-G may be smaller than the area of the blue luminous area PXA-B, but the present disclosure is not limited thereto.

Hereinafter, FIG. 3 to FIG. 6 are cross-sectional views schematically showing light emitting devices according to example embodiments. The light emitting device ED according to an embodiment may include a first electrode EL1, a hole transport region HTR, an emission layer EML, an electron transport region ETR, and a second electrode EL2 stacked in the stated order.

Figure 3:
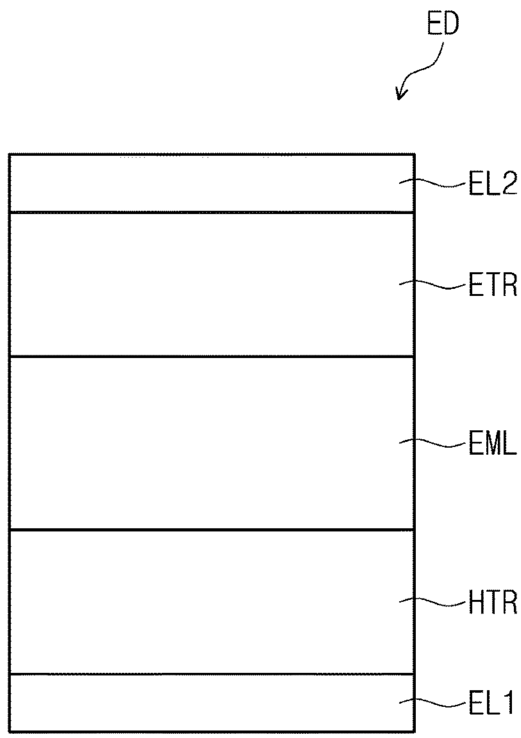
FIG. 3 is a cross-sectional view schematically showing a light emitting device according to an embodiment of the present disclosure.
Figure 4:
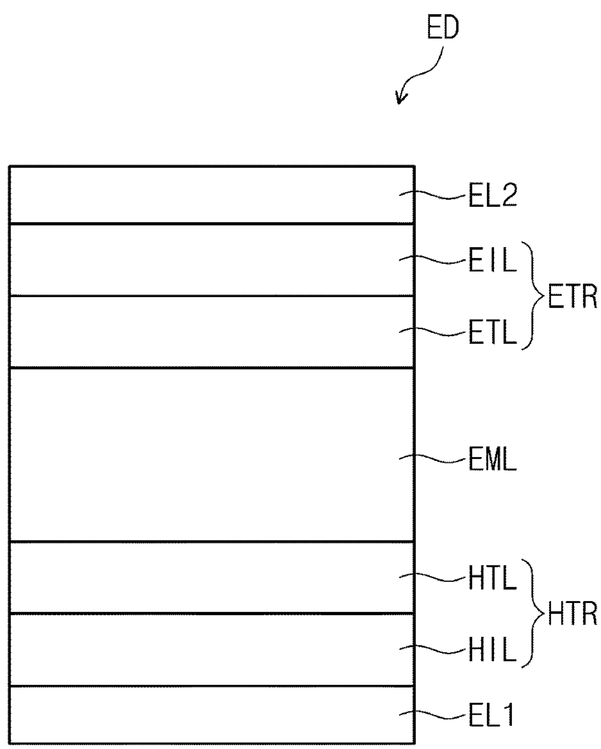
FIG. 4 is a cross-sectional view schematically showing a light emitting device according to an embodiment of the present disclosure.
Figure 5:
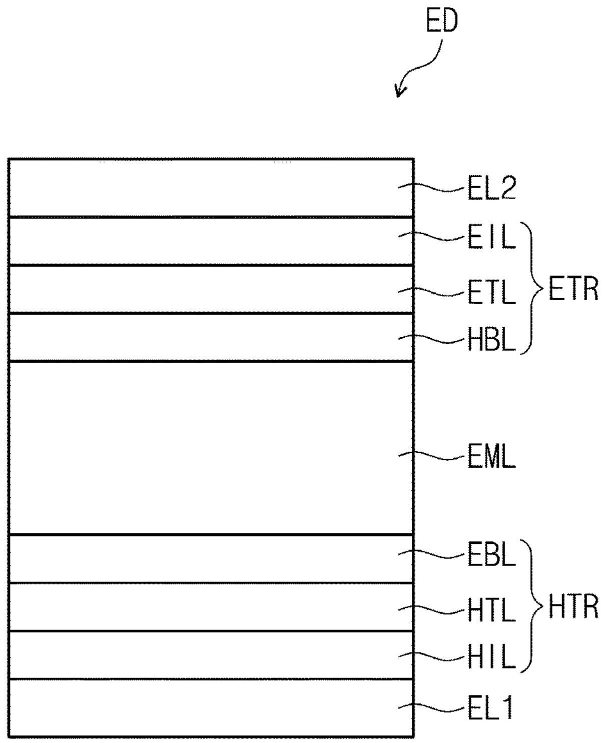
FIG. 5 is a cross-sectional view schematically showing a light emitting device according to an embodiment of the present disclosure.
Figure 6:
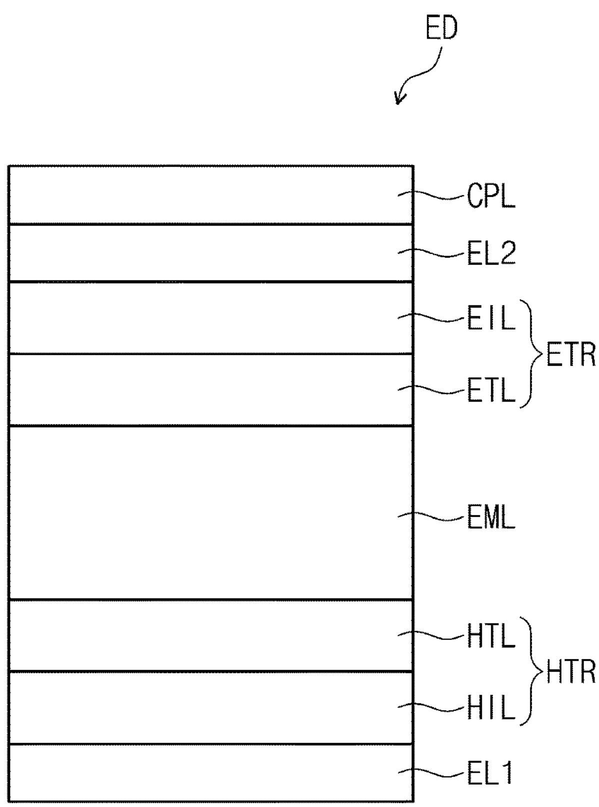
FIG. 6 is a cross-sectional view schematically showing a light emitting device according to an embodiment of the present disclosure.

When compared with FIG. 3, FIG. 4 shows the cross-sectional view of a light emitting device ED of an embodiment, wherein a hole transport region HTR includes a hole injection layer HIL and a hole transport layer HTL, and an electron transport region ETR includes an electron injection layer EIL and an electron transport layer ETL. In addition, when compared with FIG. 3, FIG. 5 shows the cross-sectional view of a light emitting device ED of an embodiment, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. When compared with FIG. 4, FIG. 6 shows the cross-sectional view of a light emitting device ED of an embodiment, including a capping layer CPL disposed on the second electrode EL2.

The first electrode EL1 has conductivity (e.g., electrical conductivity). The first electrode EL1 may be formed utilizing a metal material, a metal alloy or a conductive compound. The first electrode EL1 may be an anode or a cathode. However, the present disclosure is not limited thereto. In addition, the first electrode EL1 may be a pixel electrode. The first electrode EL1 may be a transmissive electrode, a transflective electrode, or a reflective electrode. When the first electrode EL1 is the transmissive electrode, the first electrode EL1 may include a transparent metal oxide such as indium tin oxide (ITO), indium zinc oxide (IZO), zinc oxide (ZnO), and/or indium tin zinc oxide (ITZO). When the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, In, Zn, Sn, a compound thereof, or a mixture thereof (for example, a mixture of Ag and Mg). In one or more embodiments, the first electrode EL1 may have a structure including multiple layers including a reflective layer or a transflective layer formed utilizing the above described materials, and a transmissive conductive layer formed utilizing ITO, IZO, ZnO, and/or ITZO. For example, the first electrode EL1 may include a three-layer structure of ITO/Ag/ITO. However, the present disclosure is not limited thereto. The first electrode EL1 may include the above-described metal materials, combinations of two or more metal materials selected from the above-described metal materials, and/or oxides of the above-described metal materials. The thickness of the first electrode EL1 may be from about 700 Å to about 10,000 Å. For example, the thickness of the first electrode EL1 may be from about 1,000 Å to about 3,000 Å.

The hole transport region HTR is provided on the first electrode EL1. The hole transport region HTR may include at least one of a hole injection layer HIL, a hole transport layer HTL, a buffer layer, an emission auxiliary layer or an electron blocking layer EBL. The thickness of the hole transport region HTR may be from about 50 Å to about 15,000 Å.

The hole transport region HTR may have a single layer formed utilizing a single material, a single layer formed utilizing multiple different materials, or a multilayer structure including multiple layers formed utilizing multiple different materials.

For example, the hole transport region HTR may have the structure of a single layer of a hole injection layer HIL or a hole transport layer HTL, and may have a structure of a single layer formed utilizing a hole injection material and a hole transport material. In some embodiments, the hole transport region HTR may have a structure of a single layer formed utilizing multiple different materials, or a structure of hole injection layer HIL/hole transport layer HTL, hole injection layer HIL/hole transport layer HTL/buffer layer, hole injection layer HIL/buffer layer, hole transport layer HTL/buffer layer, or hole injection layer HIL/hole transport layer HTL/electron blocking layer EBL, each stacked from the first electrode EL1 in the respective stated order. However, the present disclosure is not limited thereto.

The hole transport region HTR may be formed utilizing various suitable methods such as a vacuum deposition method, a spin coating method, a cast method, a Langmuir-Blodgett (LB) method, an inkjet printing method, a laser printing method, and/or a laser induced thermal imaging (LITI) method.

The hole transport region HTR may include a compound represented by Formula H-1 below.

Formula H-1

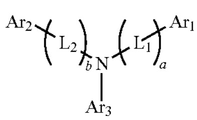

In Formula H-1 above, $L_1$ and $L_2$ may be each independently a direct linkage, a substituted or unsubstituted arylene group having 6 to 30 ring-forming carbon atoms, or a substituted or unsubstituted heteroarylene group having 2 to 30 ring-forming carbon atoms. "a" and "b" may be each independently an integer of 0 to 10. In one or more embodiments, when "a" or "b" is an integer of 2 or more, multiple $L_1$ or $L_2$ may be each independently a substituted or unsubstituted arylene group having 6 to 30 ring-forming carbon atoms, or a substituted or unsubstituted heteroarylene group having 2 to 30 ring-forming carbon atoms.

In Formula H-1, $Ar_1$ and $Ar_2$ may be each independently a substituted or unsubstituted aryl group having 6 to 30 ring-forming carbon atoms, or a substituted or unsubstituted heteroaryl group having 2 to 30 ring-forming carbon atoms. In addition, in Formula H-1, $Ar_3$ may be a substituted or unsubstituted aryl group having 6 to 30 ring-forming carbon atoms.

The compound represented by Formula H-1 may be a monoamine compound. In one or more embodiments, the compound represented by Formula H-1 may be a diamine compound in which at least one among $Ar_1$ to $Ar_3$ includes an amine group as a substituent. In addition, the compound represented by Formula H-1 may be a carbazole-based compound in which at least one among $Ar_1$ to $Ar_3$ includes a substituted or unsubstituted carbazole group, or a fluorene-based compound in which at least one among $Ar_1$ to $Ar_3$ includes a substituted or unsubstituted fluorene group.

The compound represented by Formula H-1 may be represented by any one among the compounds in Compound Group H below. However, the compounds shown in Compound Group H are only examples, and the compound represented by Formula H-1 is not limited to the compounds represented in Compound Group H below.

Compound Group H

H-1-1

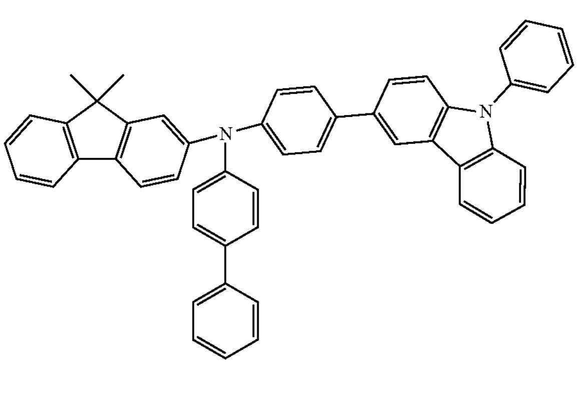

H-1-2

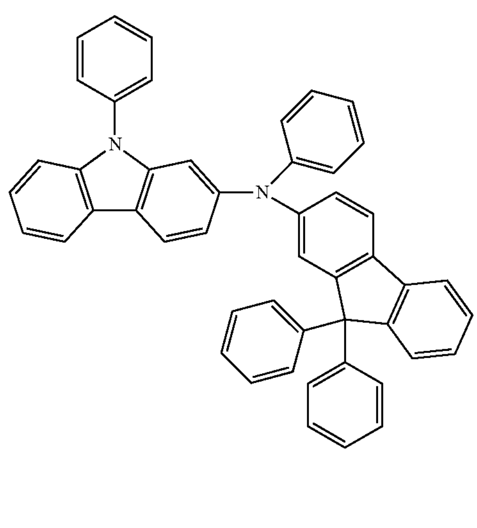

-continued
H-1-3
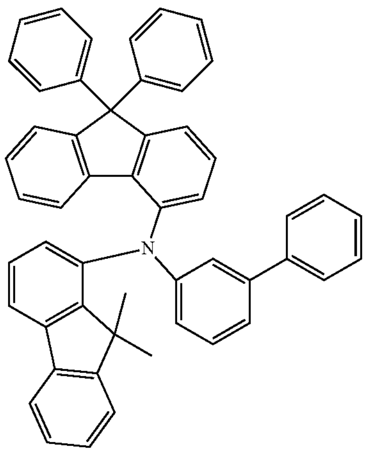
H-1-4
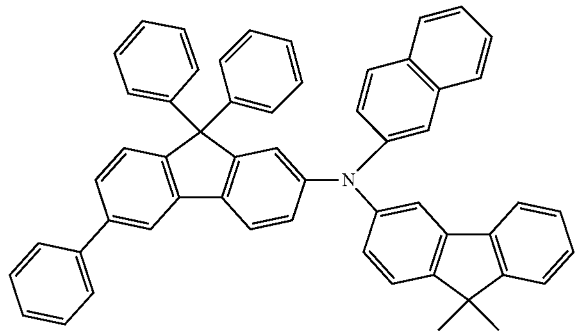
H-1-5
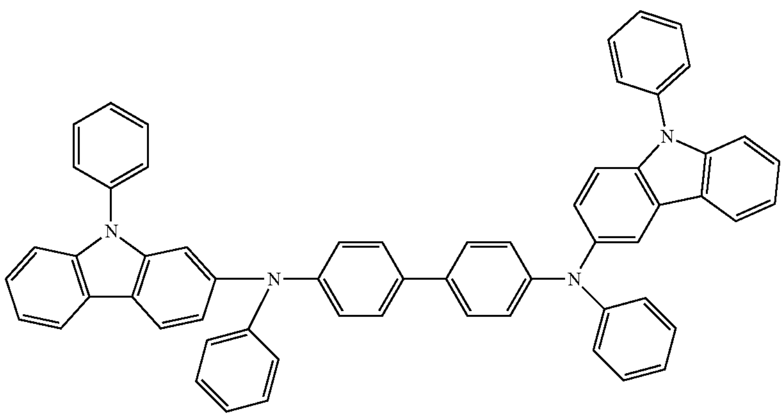
H-1-6
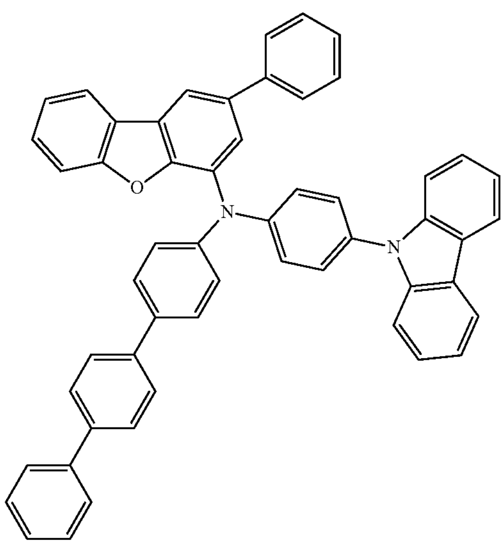
H-1-7
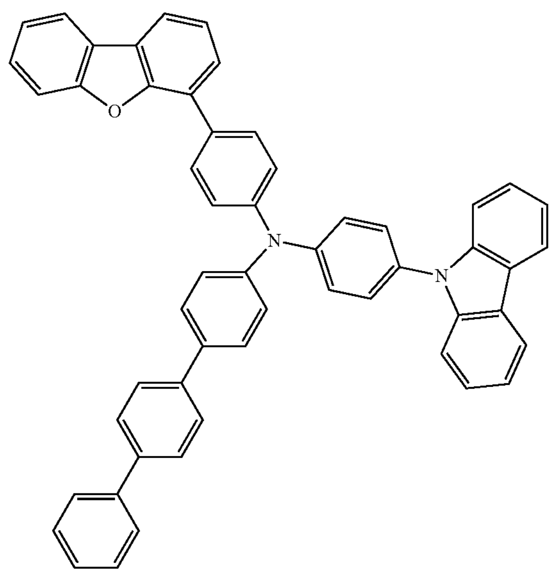

-continued
H-1-8
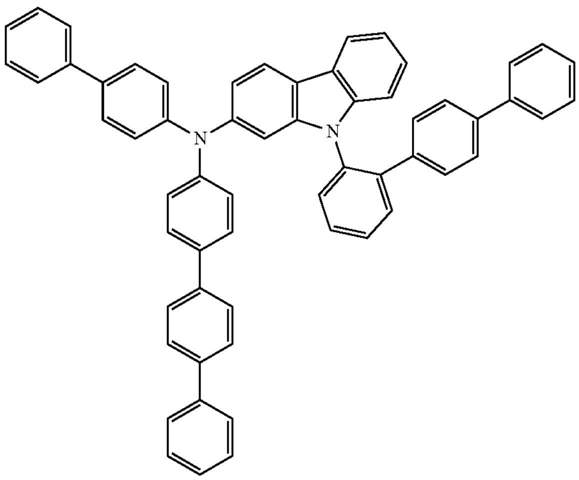
H-1-9
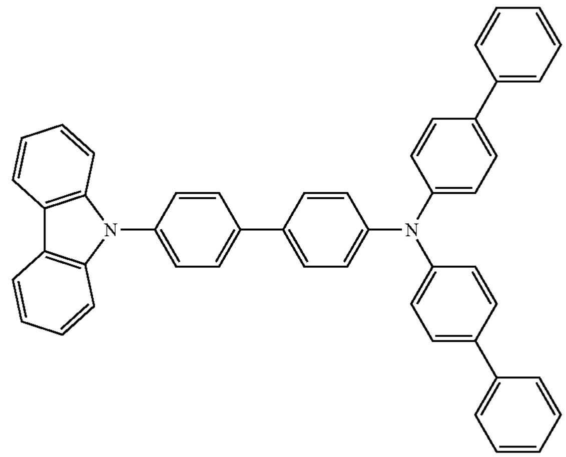
H-1-10
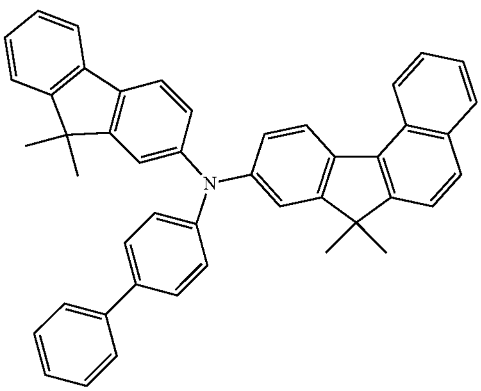
H-1-11
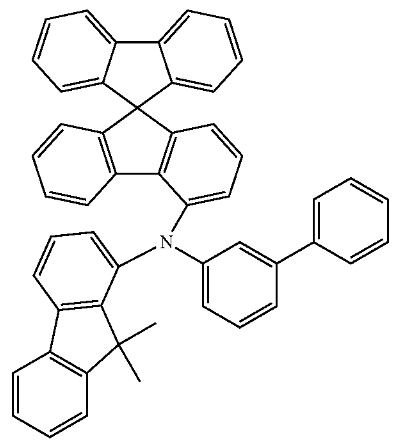
H-1-12
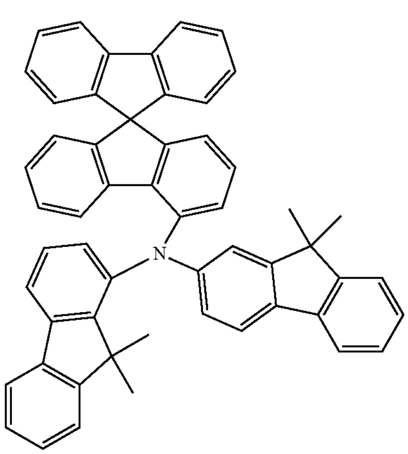
H-1-13
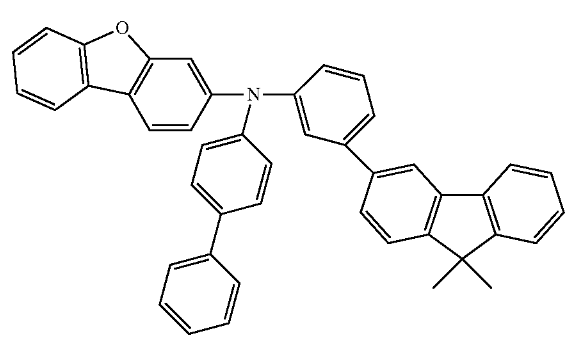

-continued
H-1-14
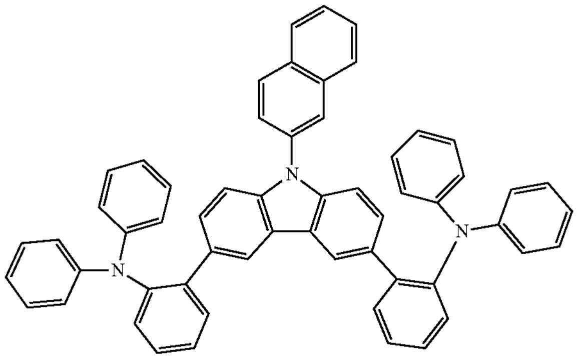
H-1-15
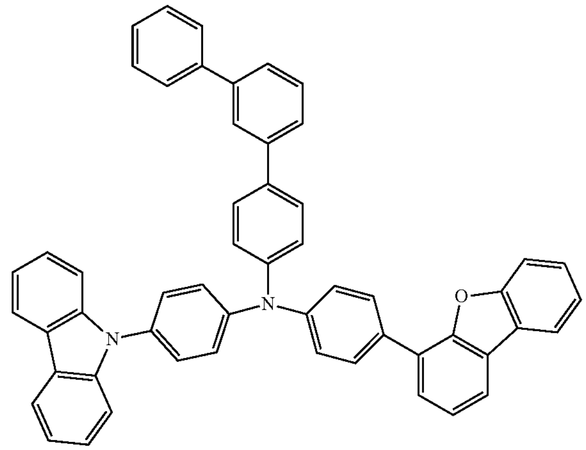
H-1-16
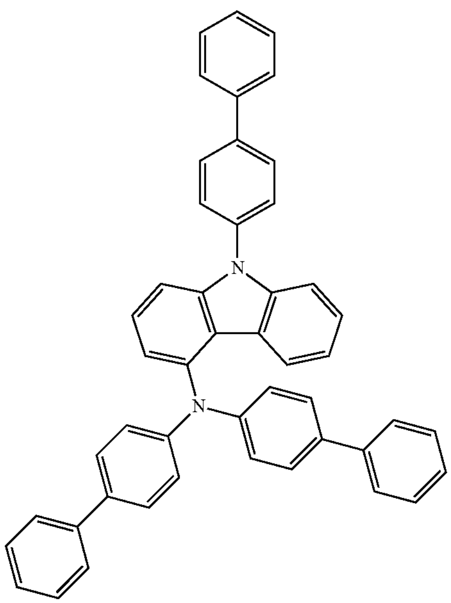
H-1-17
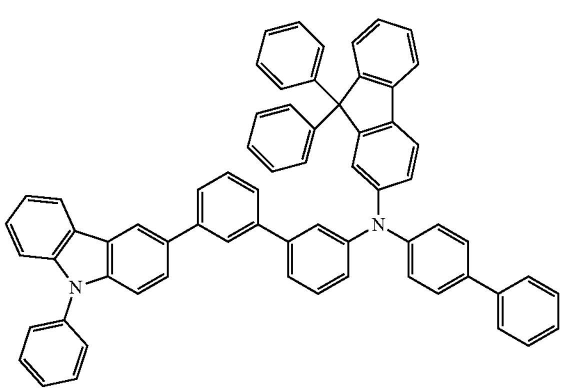
H-1-18
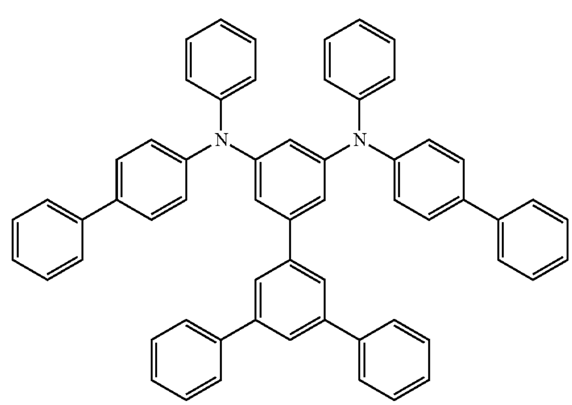

-continued

H-1-19

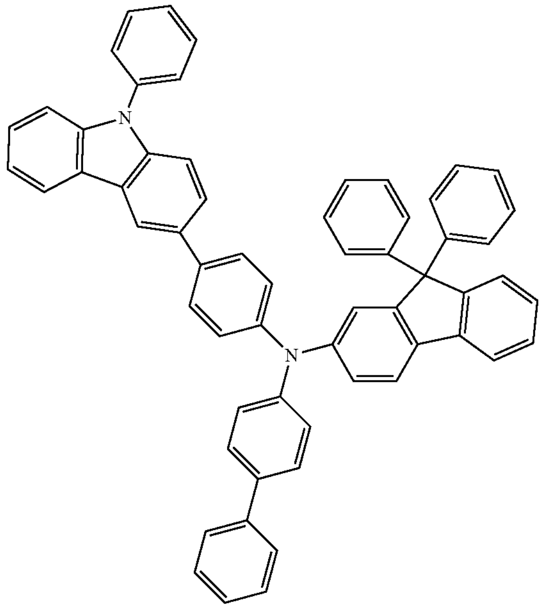

The hole transport region HTR may include a compound represented by Formula H-a below. The compound represented by Formula H-a may be a monoamine compound.

Formula H-a

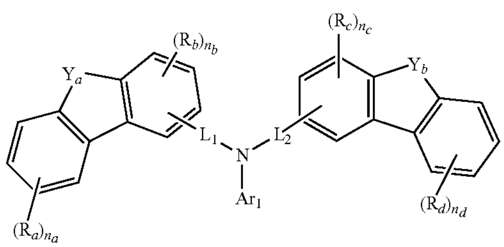

In Formula H-a, $Y_a$ and $Y_b$ are each independently $CR_eR_f$, $NR_g$, O, or S. $Y_a$ and $Y_b$ may be the same or different. In an embodiment, both $Y_a$ and $Y_b$ may be $CR_eR_f$. In one or more embodiments, $Y_a$ or $Y_b$ may be $CR_eR_f$, and the other one may be $NR_g$.

In Formula H-a, $Ar_1$ is a substituted or unsubstituted aryl group having 6 to 30 ring-forming carbon atoms, or a substituted or unsubstituted heteroaryl group having 2 to 30 ring-forming carbon atoms. For example, $Ar_1$ may be a substituted or unsubstituted phenyl group, a substituted or unsubstituted biphenyl group, a substituted or unsubstituted naphthyl group, a substituted or unsubstituted fluorenyl group, or a substituted or unsubstituted terphenyl group.

In Formula H-a, $L_1$ and $L_2$ are each independently a direct linkage, a substituted or unsubstituted arylene group having 6 to 30 ring-forming carbon atoms, or a substituted or unsubstituted heteroarylene group having 2 to 30 ring-forming carbon atoms. For example, $L_1$ and $L_2$ may be a direct linkage, a substituted or unsubstituted phenylene group, or a substituted or unsubstituted divalent biphenyl group.

In Formula H-a, $R_a$ to $R_g$ are each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be combined with an adjacent group to form a ring. For example, $R_a$ to $R_g$ may be each independently a hydrogen atom, a substituted or unsubstituted methyl group, or a substituted or unsubstituted phenyl group.

In Formula H-a, "$n_a$" and "$n_d$" are each independently an integer of 0 to 4, and "$n_b$" and "$n_c$" are each independently an integer of 0 to 3.

The hole transport region HTR may include a phthalocyanine compound such as copper phthalocyanine, $N^1,N^{1'}$-([1,1'-biphenyl]-4,4'-diyl)bis($N^1$-phenyl-$N^4,N^4$-di-m-tolylbenzene-1,4-diamine) (DNTPD), 4,4',4"-[tris(3-methylphenyl)phenylamino]triphenylamine (m-MTDATA), 4,4',4"-tris(N,N-diphenylamino)triphenylamine (TDATA), 4,4',4"-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(1-naphthalene-1-yl)-N,N'-diphenyl-benzidine (NPB), triphenylamine-containing polyetherketone (TPAPEK), 4-isopropyl-4'-methyldiphenyliodonium [tetrakis(pentafluorophenyl)borate], and/or dipyrazino[2,3-f:2',3'-h]quinoxaline-2,3,6,7,10,11-hexacarbonitrile (HAT-CN).

The hole transport region HTR may include carbazole derivatives (such as N-phenyl carbazole and/or polyvinyl carbazole), fluorene-based derivatives, N,N'-bis(3-methylphenyl)-N,N'-diphenyl-[1,1'-biphenyl]-4,4'-diamine (TPD), triphenylamine-based derivatives (such as 4,4',4"-tris(N-carbazolyl)triphenylamine (TCTA)), N,N'-di(1-naphthalene-1-yl)-N,N'-diphenyl-benzidine (NPB), 4,4'-cyclohexylidene bis[N,N-bis(4-methylphenyl)benzeneamine]

(TAPC), 4,4'-bis[N,N'-(3-tolyl)amino]-3,3'-dimethylbiphenyl (HMTPD), 1,3-bis(N-carbazolyl)benzene (mCP), etc.

In addition, the hole transport region HTR may include 9-(4-tert-butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the compounds of the hole transport region in at least one selected from among the hole injection layer HIL, the hole transport layer HTL, and the electron blocking layer EBL.

The thickness of the hole transport region HTR may be from about 100 Å to about 10,000 Å, for example, from about 100 Å to about 5,000 Å. When the hole transport region HTR includes a hole injection layer HIL, the thickness of the hole injection region HIL may be, for example, from about 30 Å to about 1,000 Å. When the hole transport region HTR includes a hole transport layer HTL, the thickness of the hole transport layer HTL may be from about 30 Å to about 1,000 Å. When the hole transport region HTR includes an electron blocking layer, the thickness of the electron blocking layer EBL may be from about 10 Å to about 1,000 Å. When the thicknesses of the hole transport region HTR, the hole injection layer HIL, the hole transport layer HTL and the electron blocking layer EBL satisfy the above-described ranges, satisfactory hole transport properties may be achieved without a substantial increase of a driving voltage.

The hole transport region HTR may further include a charge generating material to increase conductivity in addition to the above-described materials. The charge generating material may be dispersed uniformly or non-uniformly in the hole transport region HTR. The charge generating material may be, for example, a p-dopant. Non-limiting examples of the p-dopant may include at least one of a metal halide compound, a quinone derivative, a metal oxide, and a cyano group-containing compound. Non-limiting examples of the p-dopant may include metal halide compounds (such as CuI and/or RbI), quinone derivatives (such as tetracyanoquinodimethane (TCNQ) and/or 2,3,5,6-tetrafluoro-7,7',8,8-tetracyanoquinodimethane (F4-TCNQ)), metal oxides (such as tungsten oxide and/or molybdenum oxide), cyano group-containing compounds (such as dipyrazino[2,3-f: 2',3'-h]quinoxaline-2,3,6,7,10,11-hexacarbonitrile (HATCN) and/or 4-[[2,3-bis[cyano-(4-cyano-2,3,5,6-tetrafluorophenyl)methylidene]cyclopropylidene]-cyanomethyl]-2,3,5,6-tetrafluorobenzonitrile), etc.

As described above, the hole transport region HTR may further include at least one among a buffer layer or an electron blocking layer EBL in addition to the hole injection layer HIL and the hole transport layer HTL. The buffer layer may compensate resonance distance according to the wavelength of light emitted from the emission layer EML and may increase light emitting efficiency. As materials included in the buffer layer, materials which may be included in the hole transport region HTR may be utilized. The electron blocking layer EBL is a layer playing the role of blocking the injection of electrons from an electron transport region ETR to a hole transport region HTR.

The emission layer EML is provided on the hole transport region HTR. The emission layer EML may have a thickness of, for example, about 100 Å to about 1,000 Å or about 100 Å to about 300 Å. The emission layer EML may have a single layer formed utilizing a single material, a single layer formed utilizing multiple different materials, or a multilayer structure having multiple layers formed utilizing multiple different materials.

In the light emitting device ED according to an embodiment, the emission layer EML may include a fused polycyclic compound of an embodiment.

The fused polycyclic compound of an embodiment has a wide plate-type resonance structure containing two boron atoms, and at least one pentagonal ring in a fused structure. For example, the fused polycyclic compound of an embodiment includes at least one pentagonal ring resonance structure which is connected with a boron atom and a heteroatom in a plate-type structure containing two boron atoms, and has a structure in which a hexagonal ring resonance structure is additionally fused to a pentagonal ring resonance structure.

The fused polycyclic compound of an embodiment is represented by Formula 1 below.

Formula 1

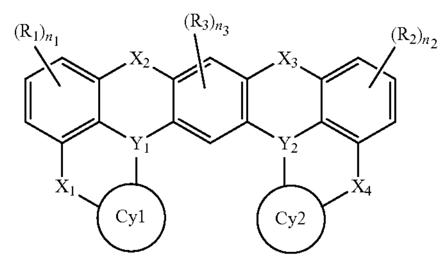

In Formula 1, $X_1$ to $X_4$ are each independently $CR_4R_5$, $NR_6$, O, S or Se. $X_1$ and $X_4$ may be the same or different. For example, both $X_1$ and $X_4$ may be $CR_4R_5$, both may be $NR_6$, both may be O, both may be S, or both may be Se. In one or more embodiments, $X_1$ or $X_4$ may be $NR_6$, and the other one may be O, $X_2$ and $X_3$ may be the same or different. For example, both $X_2$ and $X_3$ may be $CR_4R_5$, both may be $NR_6$, both may be O, both may be S, or both may be Se. In one or more embodiments, $X_2$ or $X_3$ may be $NR_6$, and the other one may be O.

In Formula 1, $Y_1$ and $Y_2$ are each B.

In Formula 1, $R_1$ to $R_6$ are each independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms. In one or more embodiments, each of $R_1$ to $R_6$ may be combined with an adjacent group to form a ring. For example, $R_1$ to $R_6$ may be each independently a hydrogen atom, a deuterium atom, a substituted or unsubstituted amine group, a substituted or unsubstituted silyl group, a substituted or unsubstituted methyl group, a substituted or unsubstituted i-propyl group, a substituted or unsubstituted t-butyl group, a substituted or unsubstituted n-butyl group, a substituted or unsubstituted cyclohexyl group, a substituted or unsubstituted phenyl group, a substituted or unsubstituted naphthyl group, a substituted or unsubstituted phenanthryl group, a substituted or unsubstituted anthracenyl group, a substituted or unsubstituted pyrenyl group, a substituted or unsubstituted terphenyl group, a substituted or unsubstituted furan group, a substituted or unsubstituted thiophene group, a substituted or unsubstituted benzofuran group, a substituted or unsubstituted benzothiophene group, a substituted or unsubstituted pyridine group, a substituted or unsubstituted pyrazine group, a substituted or unsubstituted acridyl group, a substituted or unsubstituted phenoxazine group, a substituted or unsubstituted phenothiazine group, or a substituted or unsubstituted carbazole group. For example, $R_6$ may be a substituted or unsubstituted phenyl group. In one or more embodiments, multiple $R_1$ groups may be provided, and adjacent $R_1$ groups may be combined with each other to form a ring. In one or more embodiments, multiple $R_2$ groups may be provided, and adjacent $R_2$ groups may be combined with each other to form a ring.

In Formula 1, "$n_1$" and "$n_2$" are each independently an integer of 0 to 3. "$n_3$" is an integer of 0 to 2. When each of "$n_1$" to "$n_3$" is 0, the fused polycyclic compound according to an embodiment may be an unsubstituted one with $R_1$ to $R_3$. That is, the fused polycyclic compound may not be substituted with $R_1$ to $R_3$. When each of "$n_1$" to "$n_3$" is an integer of 2 or more, the respective multiple $R_1$ to $R_3$ may all be the same, or at least one among the multiple $R_1$ to $R_3$ may be different from other respective $R_1$ to $R_3$.

In Formula 1, Cy1 and Cy2 are each independently an aromatic hydrocarbon ring, or an aromatic heterocycle. Cy1 and Cy2 are each independently represented by the Formula 2 or Formula 3 below. Cy1 and/or Cy2 is represented by Formula 2. In an embodiment, both Cy1 and Cy2 may have a structure represented by Formula 2. In one or more embodiments, any one selected from among Cy1 and Cy2 may have a structure represented by Formula 2, and the remainder one may have a structure represented by Formula 3.

Formula 2

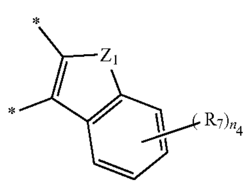

In Formula 2, $Z_1$ is $CR_8R_9$, $NR_{10}$, O, S, or Se.

In Formula 2, $R_7$ to $R_{10}$ are each independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms. In one or more embodiments, each of $R_7$ to $R_{10}$ may be combined with an adjacent group to form a ring. For example, $R_7$ to $R_{10}$ may be each independently a hydrogen atom, a deuterium atom, a substituted or unsubstituted methyl group, a substituted or unsubstituted t-butyl group, or a substituted or unsubstituted phenyl group. In one or more embodiments, multiple $R_7$ groups may be provided, and adjacent $R_7$ groups may be combined with each other to form a ring.

In Formula 2, "$n_4$" is an integer of 0 to 4. When "$n_4$" is 0, the fused polycyclic compound according to an embodiment may refer to one which is unsubstituted with $R_7$. That is, the fused polycyclic compound may not be substituted with $R_7$. When "$n_4$" is an integer of 2 or more, multiple $R_7$ groups may all be the same, or at least one among the multiple $R_7$ groups may be different.

In Formula 2, —* represents a position connected with $X_1$ or $Y_1$, or a position connected with $X_4$ or $Y_2$, in Formula 1.

In an embodiment, Cy1 may be a structure represented by Formula 2, the —* adjacent to $Z_1$ may be connected with $Y_1$, and the —* not adjacent to $Z_1$ may be connected with $X_1$. Accordingly, $X_1$ and $Z_1$ may be connected at para positions. In one or more embodiments, the —* adjacent to $Z_1$ may be connected with $X_1$, and the —* not adjacent to $Z_1$ may be connected with $Y_1$. Accordingly, $Y_1$ and $Z_1$ may be connected at para positions.

In an embodiment, Cy2 may be a structure represented by Formula 2, the —* adjacent to $Z_1$ may be connected with $Y_2$, and the —* not adjacent to $Z_1$ may be connected with $X_4$. Accordingly, $X_4$ and $Z_1$ may be connected at para positions. In one or more embodiments, the —* adjacent to $Z_1$ may be connected with $X_4$, and the —* not adjacent to $Z_1$ may be connected with $Y_2$. Accordingly, $Y_2$ and $Z_1$ may be connected at para positions.

Formula 3

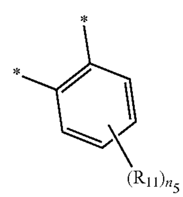

In Formula 3, $R_{11}$ is a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms. In one or more embodiments, $R_{11}$ may be combined with an adjacent group to form a ring. For example, $R_{11}$ may be a hydrogen atom, a deuterium atom, a substituted or unsubstituted methyl group, a substituted or unsubstituted t-butyl group, or a substituted or unsubstituted phenyl group. In one or more embodiments, multiple $R_{11}$ groups may be provided, and adjacent $R_{11}$ groups may be combined with each other to form a ring.

In Formula 3, "$n_5$" is an integer of 0 to 4. When "$n_5$" is 0, the fused polycyclic compound according to an embodiment may refer to one which is unsubstituted with $R_{11}$. That is, the fused polycyclic compound may not be substituted with $R_{11}$. When "$n_5$" is an integer of 2 or more, multiple $R_{11}$ groups may all be the same, or at least one among the multiple $R_{11}$ groups may be different.

In Formula 3, —* represents a position connected with $X_1$ or $Y_1$, or a position connected with $X_4$ or $Y_2$, in Formula 1.

The fused polycyclic compound of an embodiment includes a plate-type skeleton structure with two boron atoms as the center and has a structure including at least one pentagonal aromatic ring in the plate-type structure. The fused polycyclic compound of an embodiment includes at least one pentagonal aromatic ring connected with a boron atom in the plate-type structure and additionally includes a structure of a hexagonal aromatic ring fused to the pentagonal aromatic ring, i.e., a structure represented by Formula 2 in the plate-type structure. Accordingly, the fused polycyclic compound of an embodiment forms a wide conjugation structure to stabilize the polycyclic aromatic ring structure, which may be suitable as a light-emitting material to emit in a blue wavelength region, and when applied to a light emitting device, efficiency of the light emitting device may be improved.

The fused polycyclic compound represented by Formula 1 may be represented by any one selected from among Formula 4-1 to Formula 4-3 below.

Formula 4-1

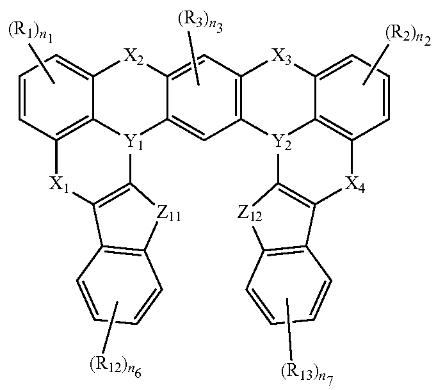

Formula 4-2

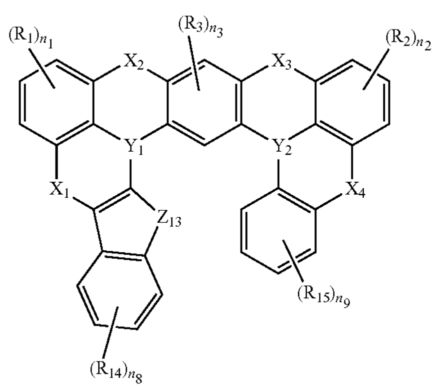

Formula 4-3

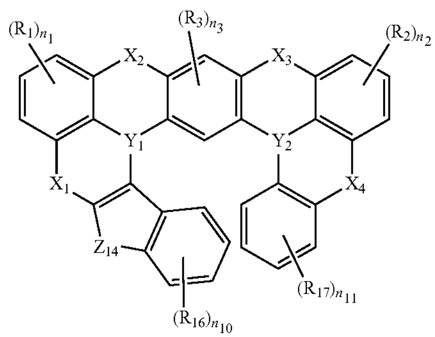

Formula 4-1 to Formula 4-3 each represent specific cases for Cy1 and Cy2 in Formula 1. Formula 4-1 represents a case including a structure in which bath Cy1 and Cy2 are represented by Formula 2. Each of Formula 4-2 and Formula 4-3 includes a structure in which Cy1 is represented by Formula 2 and Cy2 is represented by Formula 3, in Formula 1.

In Formula 4-1 to Formula 4-3, $Z_{11}$ to $Z_{14}$ are each independently $CR_{18}R_{19}$, $NR_{20}$, O, S, or Se. In Formula 4-1, $Z_{11}$ and $Z_{12}$ may be the same or different. For example, both $Z_{11}$ and $Z_{12}$ may be $CR_{18}R_{19}$, both may be $NR_{20}$, both may be O, both may be S, or both may be Se. In one or more embodiments, $Z_{11}$ or $Z_{12}$ may be $NR_{20}$, and the remainder one may be O. In one or more embodiments, $Z_{11}$ or $Z_{12}$ may be O, and the remainder one may be S. In one or more embodiments, $Z_{11}$ or $Z_{12}$ may be S, and the remainder one may be Se.

In Formula 4-1 to Formula 4-3, $R_{12}$ to $R_{20}$ are each independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms. In one or more embodiments, each of $R_{12}$ to $R_{20}$ may be combined with an adjacent group to form a ring. For example, $R_{12}$ to $R_{20}$ may be each independently a hydrogen atom, a deuterium atom, a substituted or unsubstituted methyl group, a substituted or unsubstituted t-butyl group, or a substituted or unsubstituted phenyl group. In one or more embodiments, multiple $R_{12}$ to $R_{15}$ may be provided, and adjacent $R_{12}$ to $R_{15}$ may be combined with each other to form a ring.

"$n_6$" to "$n_{11}$" are each independently an integer of 0 to 4. When each of "$n_6$" to "$n_{11}$" is 0, the fused polycyclic compound according to an embodiment may mean one which is unsubstituted with each of $R_{12}$ to $R_{17}$. That is, the fused polycyclic compound may not be substituted with $R_{12}$ to $R_{17}$. When each of "$n_6$" to "$n_{11}$" is an integer of 2 or more, multiple $R_{12}$ to $R_{17}$ may be the same, or at least one among multiple $R_{12}$ to $R_{17}$ may be different.

In one or more embodiments, in Formula 4-1 to Formula 4-3, the same explanation on $X_1$ to $X_4$, $Y_1$, $Y_2$, $R_1$ to $R_3$, and "$n_1$" to "$n_3$" in connection with Formula 1 may be applied.

The fused polycyclic compound represented by Formula 1 may be represented by any one among Formula 5-1 to Formula 5-3 below.

Formula 5-1

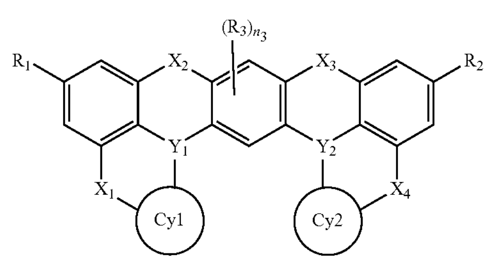

-continued

Formula 5-2

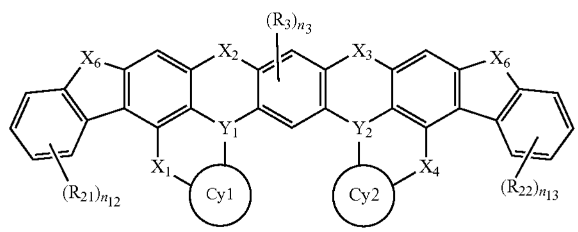

Formula 5-3

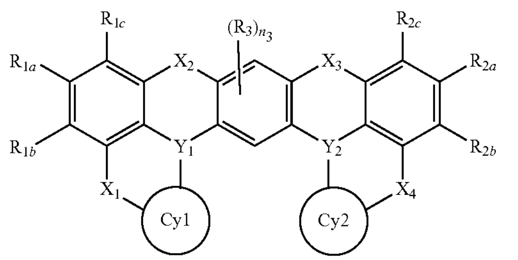

Formula 5-1 to Formula 5-3 each represent cases where the positions banded and/or the kinds of the substituents of $R_1$ and $R_2$ in Formula 1 are specified. Formula 5-1 represents a case where $R_1$ and $R_2$ are respectively connected with $Y_1$ and $Y_2$ at para positions in Formula 1. Formula 5-2 represents a case where multiple $R_1$ and $R_2$ are provided, respectively connected with $Y_1$ and $Y_2$ at a para position and a meta position, and combined with each other to form an additional ring in Formula 1. Formula 5-3 represents a case where multiple $R_1$ and $R_2$ are provided and combined with each other to form an additional ring (to be described in more detail below) in Formula 1.

In Formula 5-2, $X_5$ and $X_6$ are each independently $CR_{23}R_{24}$, $NR_{25}$, O, or S. $X_5$ and $X_6$ may be the same or different. For example, both $X_5$ and $X_6$ may be $CR_{23}R_{24}$, both may be $NR_{25}$, both may be O, or both may be S.

In Formula 5-2, $R_{21}$ to $R_{25}$ are each independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms. In one or more embodiments, $R_{21}$ to $R_{25}$ may be combined with an adjacent group to form a ring. For example, $R_{21}$ to $R_{25}$ may be each independently a hydrogen atom, a deuterium atom, a substituted or unsubstituted methyl group, a substituted or unsubstituted t-butyl group, or a substituted or unsubstituted phenyl group. In one or more embodiments, multiple $R_{21}$ and $R_{22}$ may be provided, and adjacent $R_{21}$ and $R_{22}$ may be combined with each other to form a ring.

"$n_{12}$" and "$n_{13}$" are each independently an integer of 0 to 4. When each of "$n_{12}$" and "$n_{13}$" is 0, the fused polycyclic compound according to an embodiment may refer to one which is unsubstituted with $R_{21}$ and $R_{22}$, respectively. That is, the fused polycyclic compound may not be substituted with $R_{21}$ and $R_{22}$. When each of "$n_2$" and "$n_{13}$" is an integer of 2 or more, multiple $R_{21}$ and $R_{22}$ may be the same, or at least one among multiple $R_{21}$ and $R_{22}$ may be different.

In Formula 5-3, $R_{1a}$, $R_{1b}$, $R_{1c}$, $R_{2a}$, $R_{2b}$, and $R_{2c}$ are each independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms. For example, $R_{1a}$, $R_{1b}$, $R_{1c}$, $R_{2a}$, $R_{2b}$, and $R_{2c}$ may be each independently a hydrogen atom, a deuterium atom, a substituted or unsubstituted amine group, a substituted or unsubstituted methyl group, a substituted or unsubstituted t-butyl group, or a substituted or unsubstituted phenyl group.

In Formula 5-3, $R_{1a}$ is combined with $R_{1b}$ and/or $R_{1c}$ to form a ring. For example, $R_{1a}$ and $R_{1b}$ may be combined with each other to form a ring, $R_{1a}$ and $R_{1c}$ may be combined with each other to form a ring, or $R_{1a}$ may be combined with both $R_{1b}$ and $R_{1c}$ to form a ring.

In Formula 5-3, $R_{2a}$ is combined with $R_{2b}$ and/or $R_{2c}$ to form a ring. For example, $R_{2a}$ and $R_{2b}$ may be combined with each other to form a ring, $R_{2a}$ and $R_{2c}$ may be combined with each other to form a ring, or $R_{2a}$ may be combined with both $R_{2b}$ and $R_{2c}$ to form a ring.

In one or more embodiments, in Formula 5-1 to Formula 5-3, the explanation on $X_1$ to $X_4$, $Y_1$, $Y_2$, $R_1$, $R_2$, $R_3$, "$n_3$", Cy1 and Cy2 in connection with Formula 1 may be applied.

In one or more embodiments, the ring structure represented by Formula 2 in Formula 1 may be represented by Formula 2-1 or Formula 2-2 below. In Formula 1, Cy1 and/or Cy2 may be represented by Formula 2-1 or Formula 2-2 below.

Formula 2-1

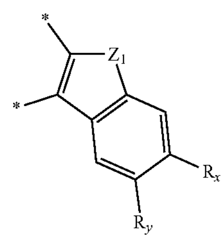

Formula 2-2

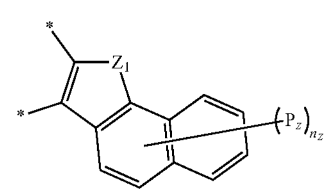

Formula 2-1 and Formula 2-2 each represent cases where the bonded position and/or the kind of substituent of $R_7$ are specified in Formula 2. Formula 2-1 represents a case where multiple $R_7$ are provided and connected at a para position and a meta position with respect to $Z_1$ in Formula 2. Formula 2-2 represents a case where multiple $R_7$ are provided and connected at a meta position and an ortho position with respect to $Z_1$, and combined with each other to form an additional ring in Formula 2.

In Formula 2-1 and Formula 2-2, $R_x$, $R_y$, and $P_z$ are each independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms. In one or more embodiments, each of $R_x$, $R_y$, and $P_z$ may be combined with an adjacent group to form a ring. For example, $R_x$, $R_y$, and $P_z$ may be each independently a hydrogen atom, a deuterium atom, a substituted or unsubstituted methyl group, or a substituted or unsubstituted t-butyl group.

"$n_z$" is an integer of 0 to 6. When "$n_z$" is 0, the fused polycyclic compound according to an embodiment may refer to one which is unsubstituted with $R_2$. That is, the fused polycyclic compound may not be substituted with $R_2$. When "$n_z$" is an integer of 2 or more, multiple $P_z$ may all be the same, or at least one among multiple $P_z$ may be different.

In one or more embodiments, the same explanation on $Z_1$ and ——* in connection with Formula 2 may be applied.

The fused polycyclic compound of an embodiment may be any one among the compounds represented in Compound Group 1 below. The light emitting device ED of an embodiment may include at least one fused polycyclic compound selected from among the compounds represented in Compound Group 1 in the emission layer EML.

Compound Group 1

1

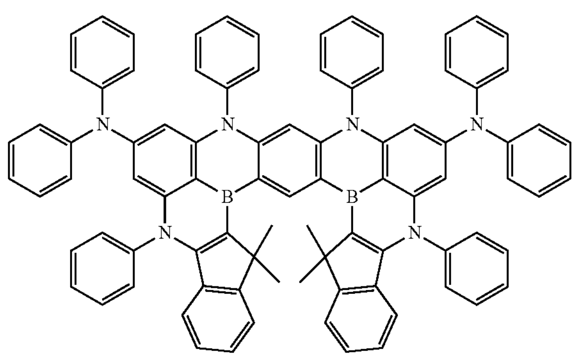

2

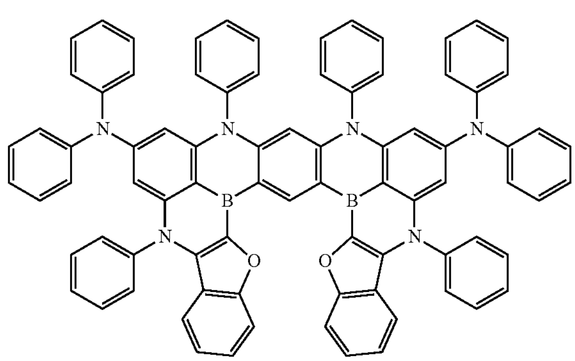

-continued

3

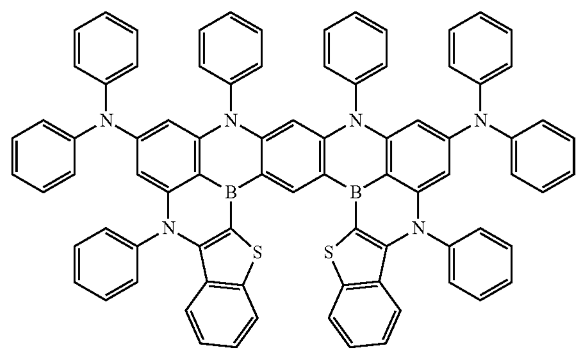

4

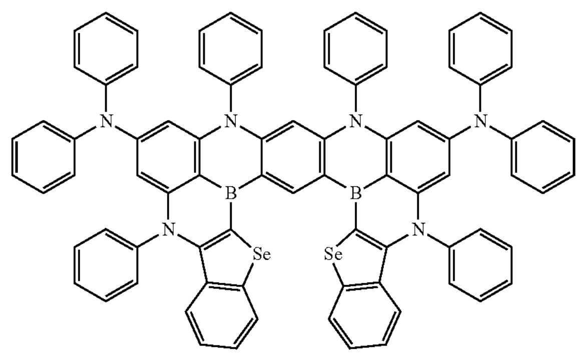

5

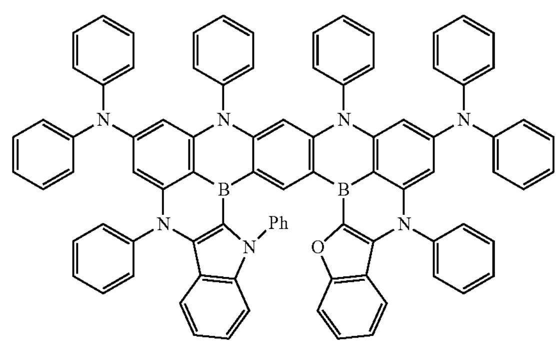

6

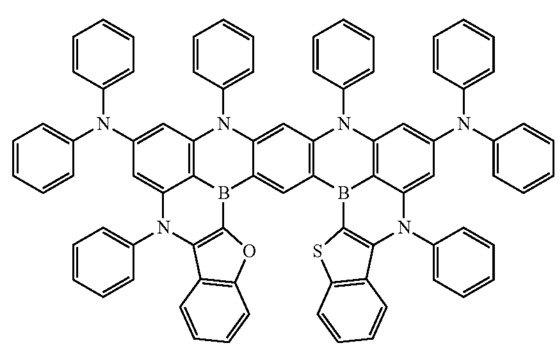

-continued
7
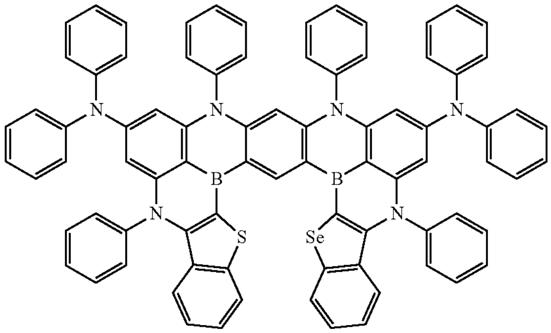
8
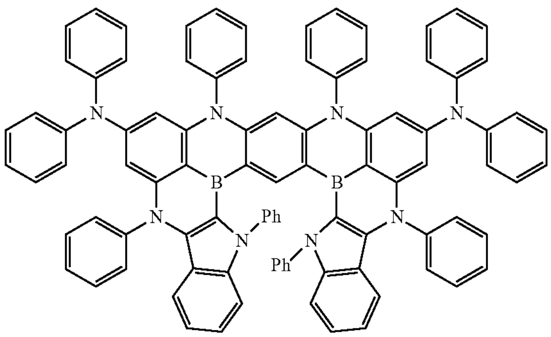
9
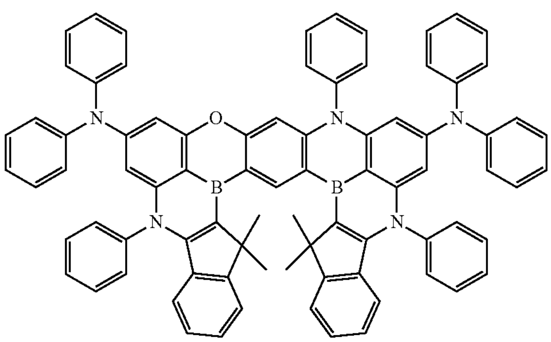
10
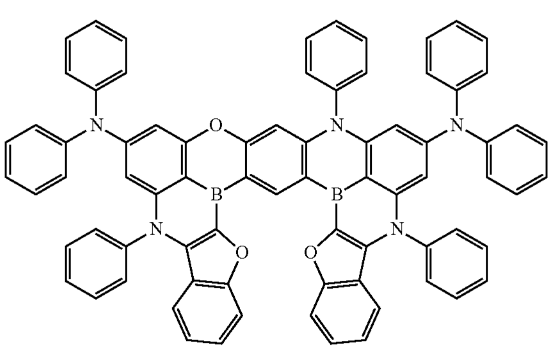
-continued
11
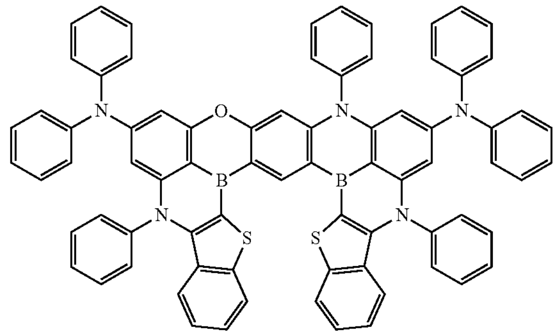
12
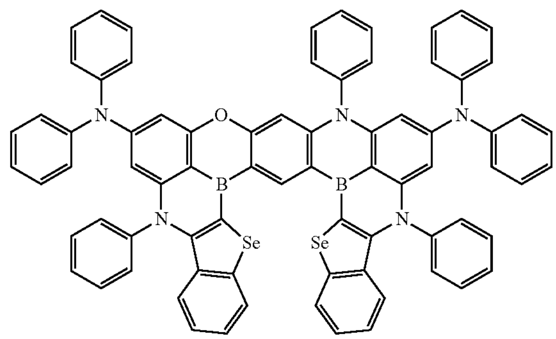
13
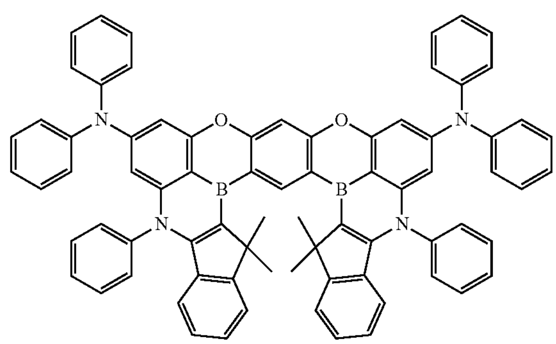
14
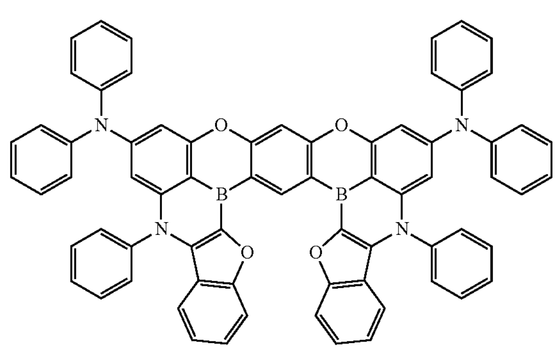

-continued
15
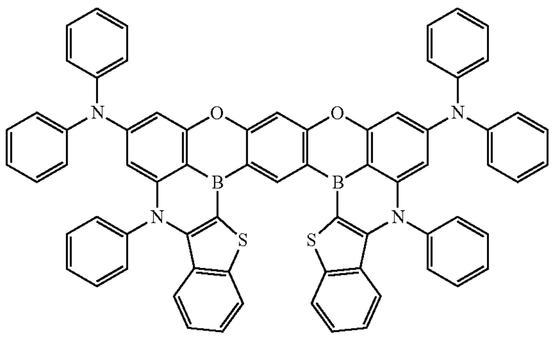
16
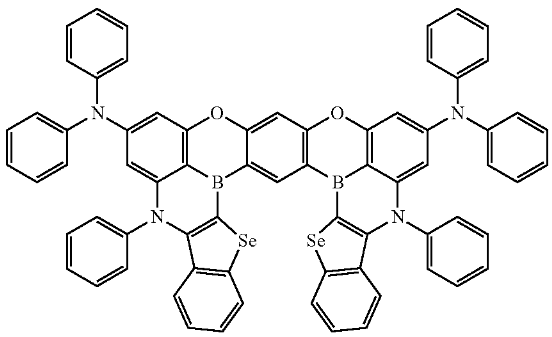
17
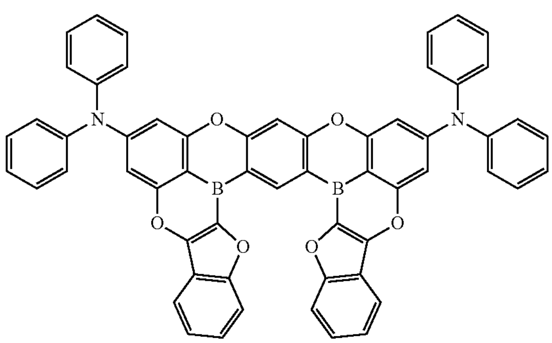
18
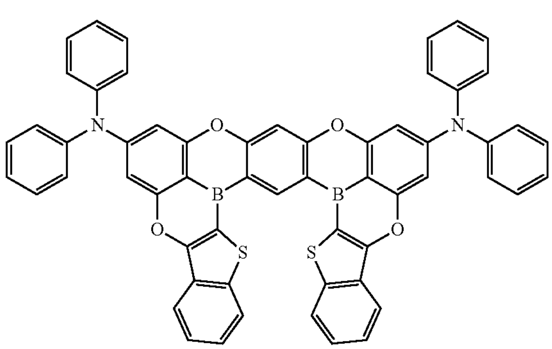
-continued
19
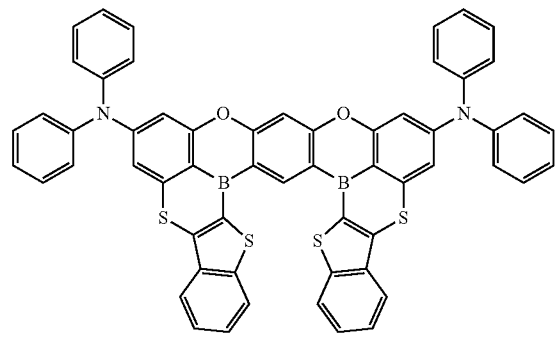
20
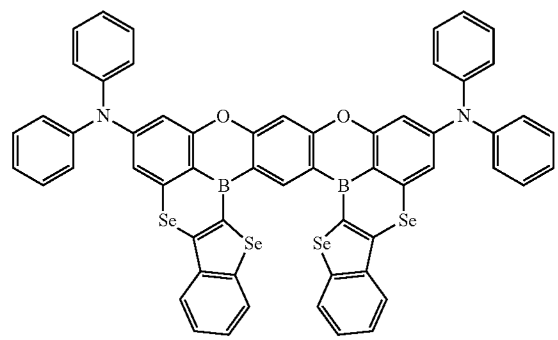
21
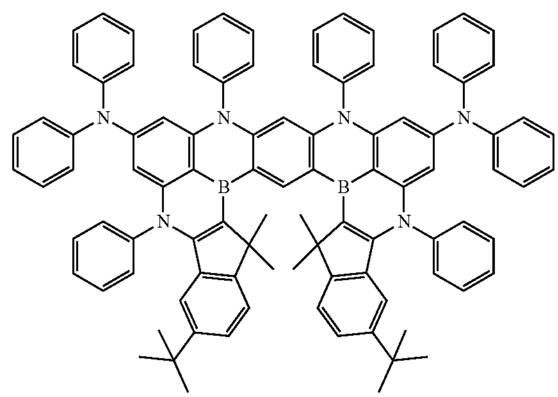
22
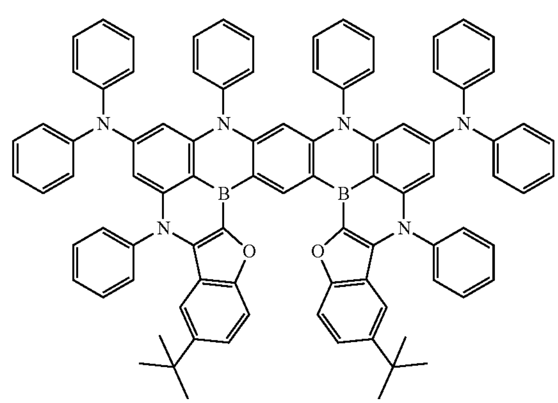

-continued
23
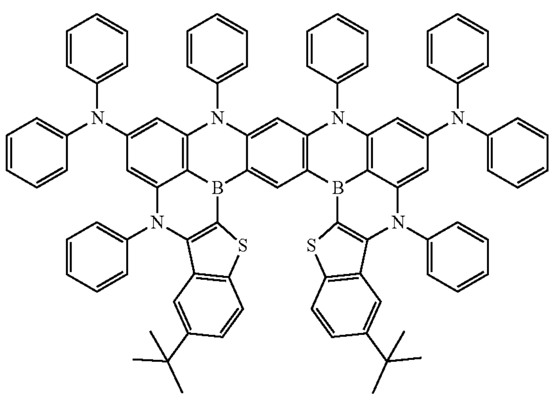
24
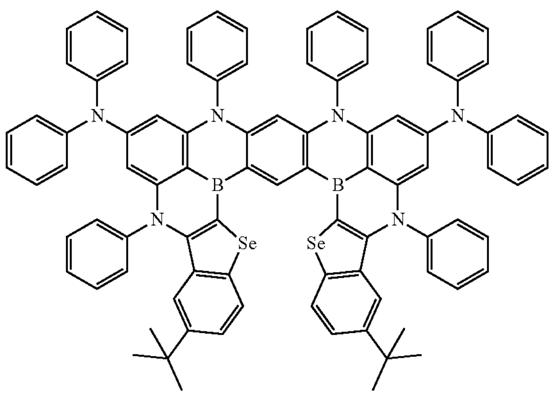
25
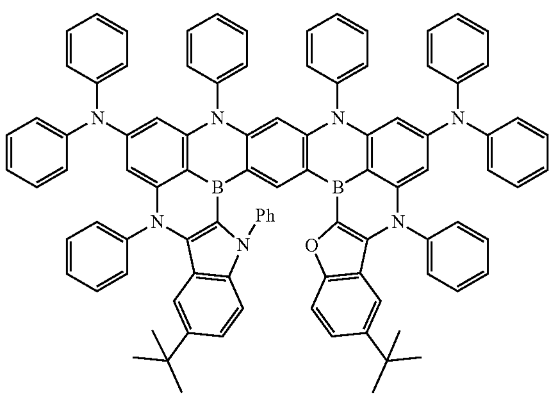
26
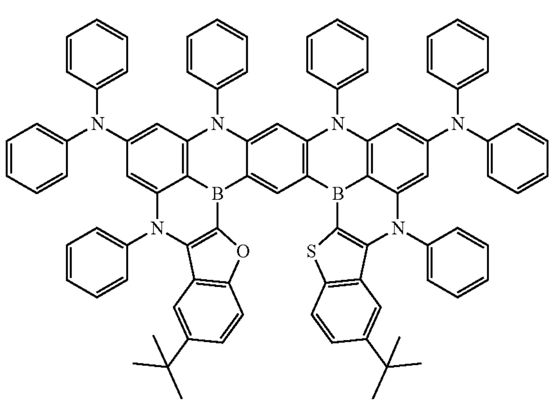
-continued
27
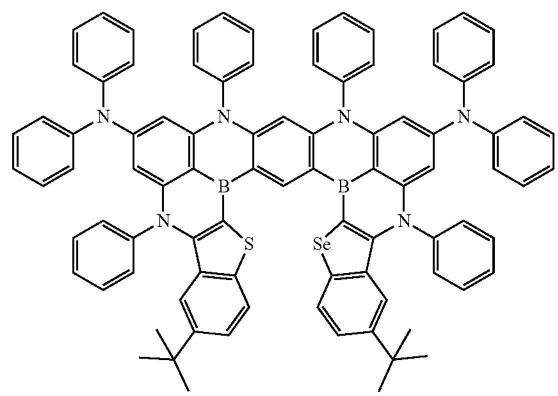
28
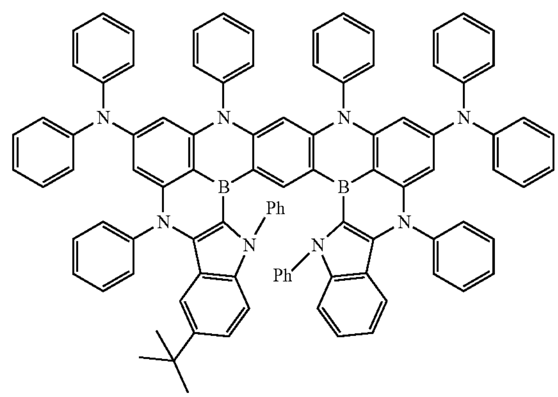
29
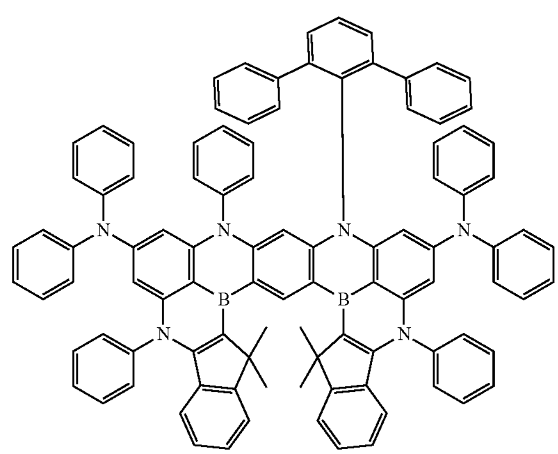

30
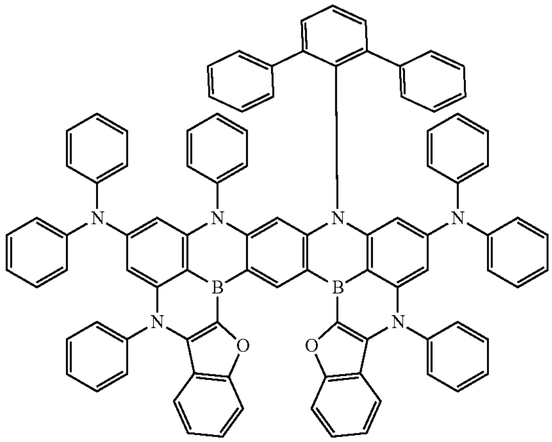
31
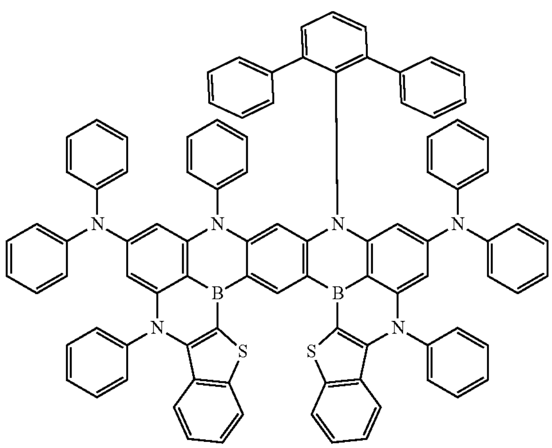
32
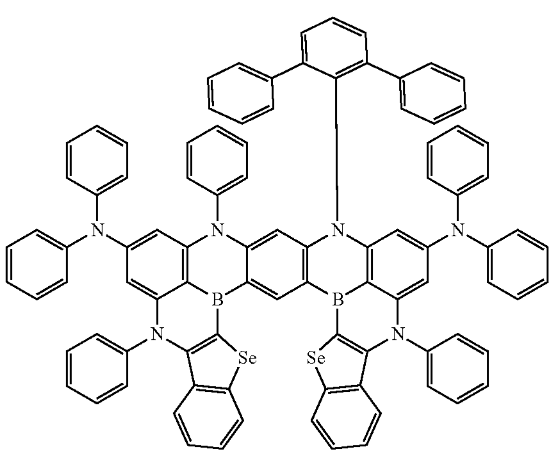
33
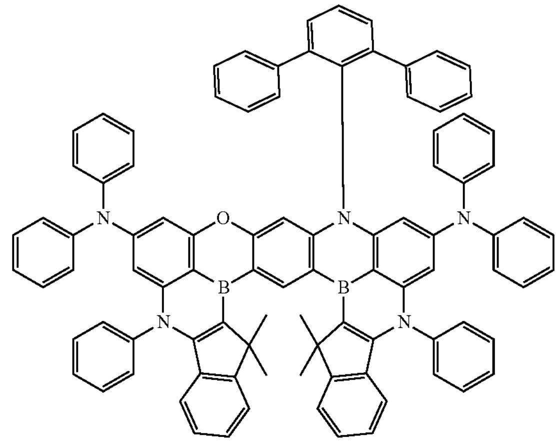
34
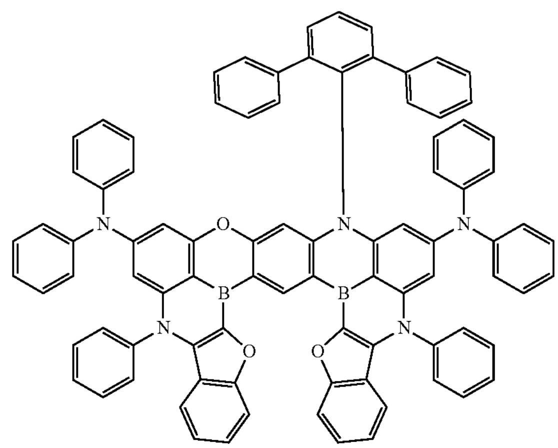
35
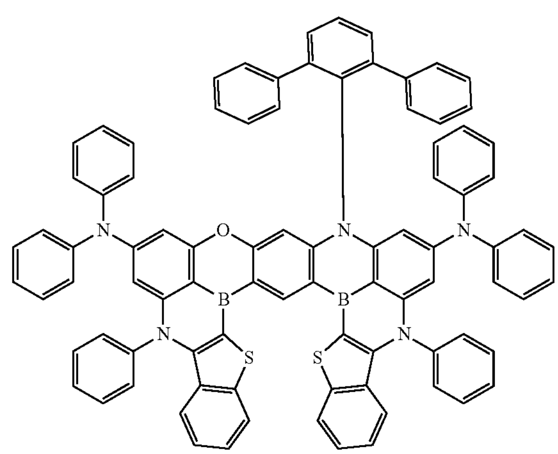

36
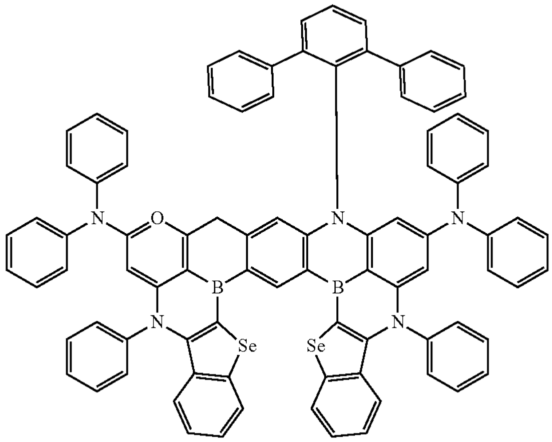
37
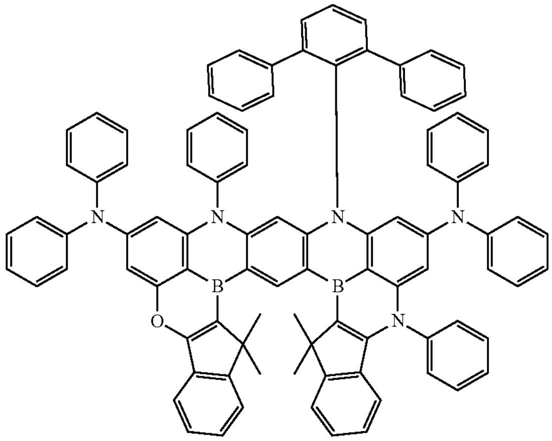
38
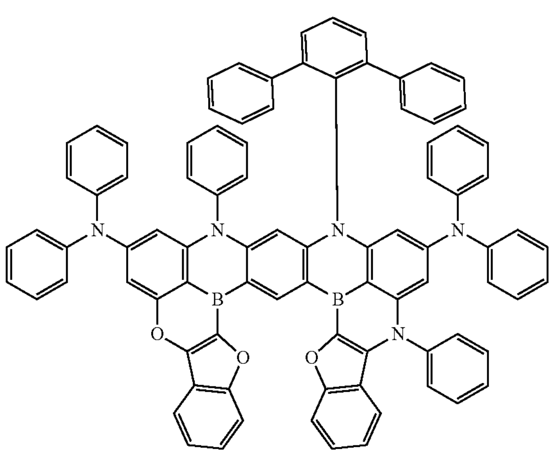
39
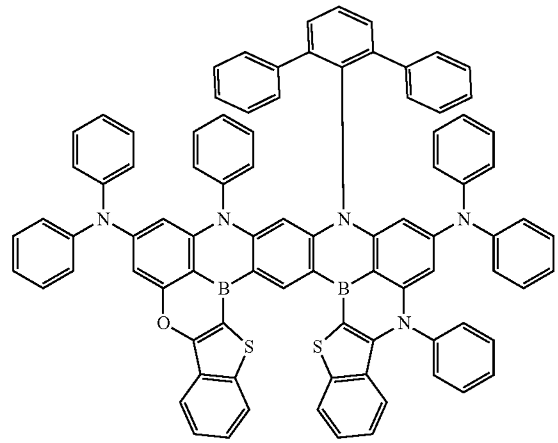
40
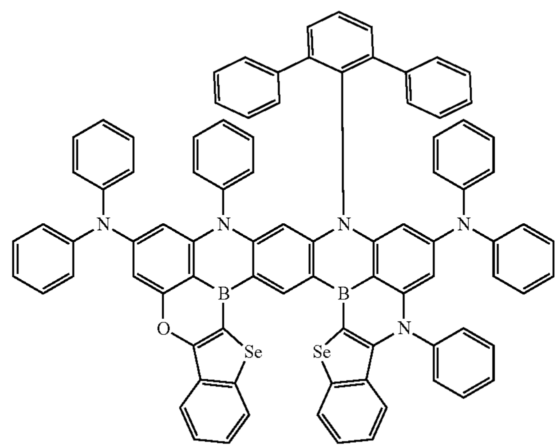
41
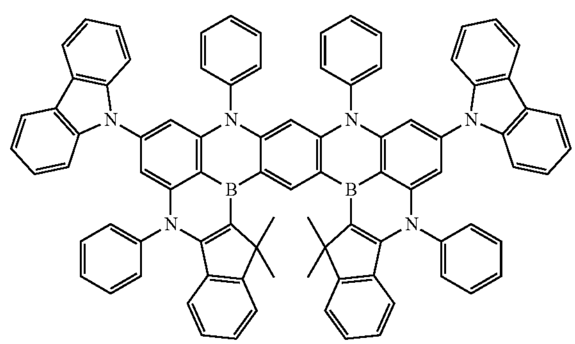
42
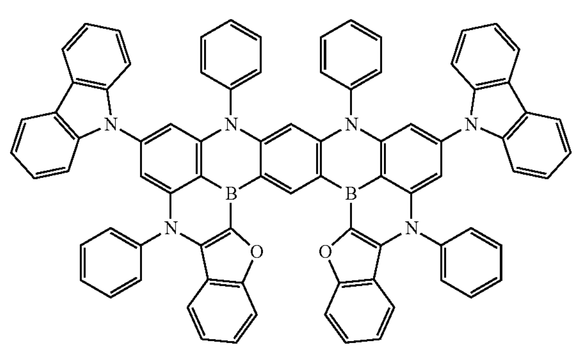

-continued
43
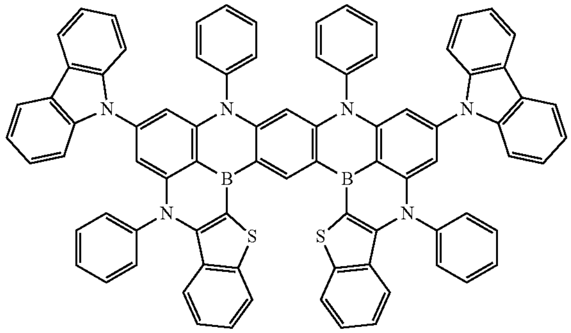
44
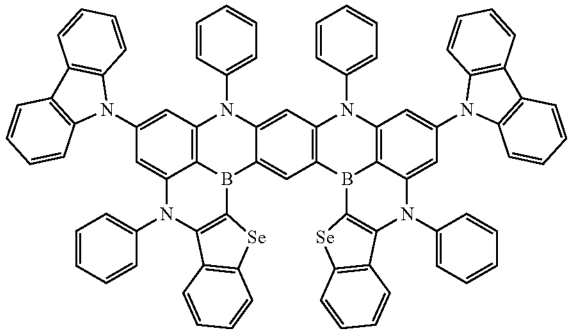
45
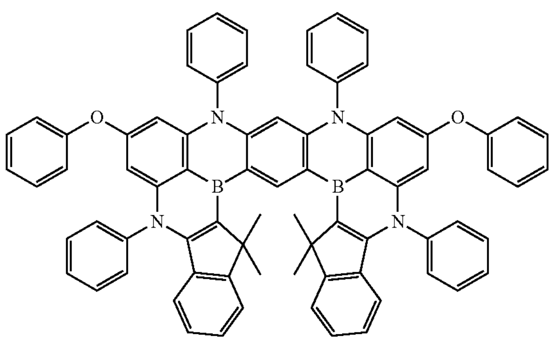
46
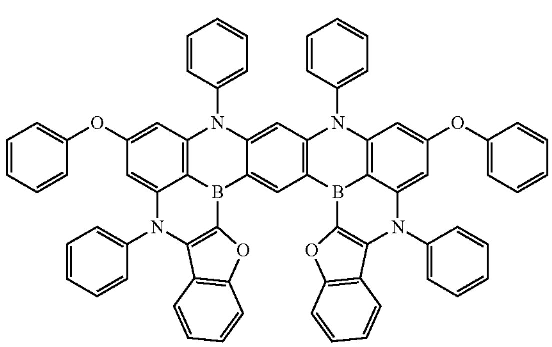
-continued
47
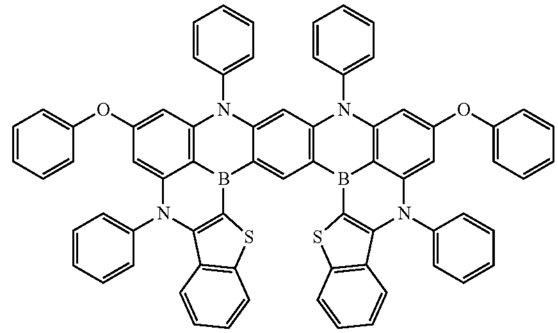
48
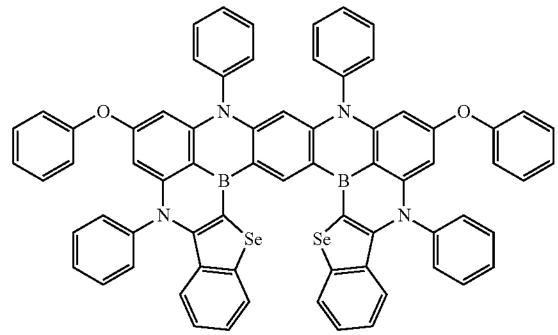
49
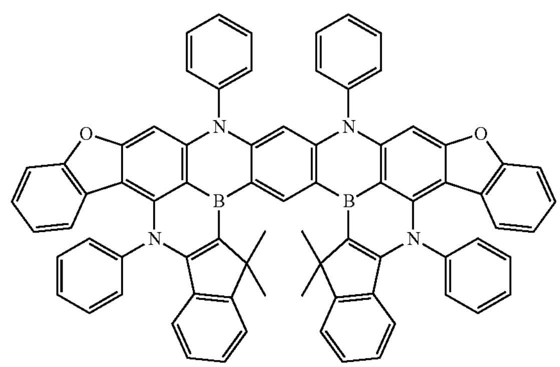
50
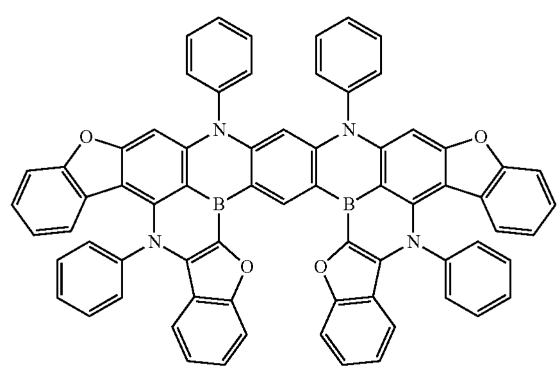

51
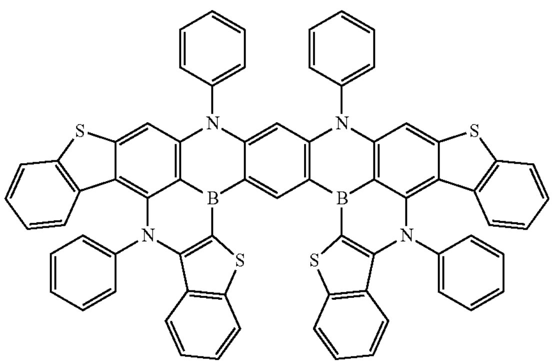
52
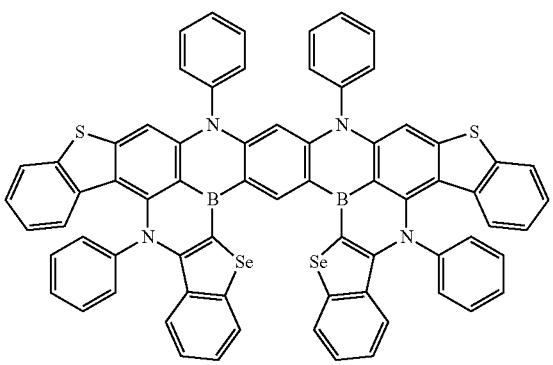
53
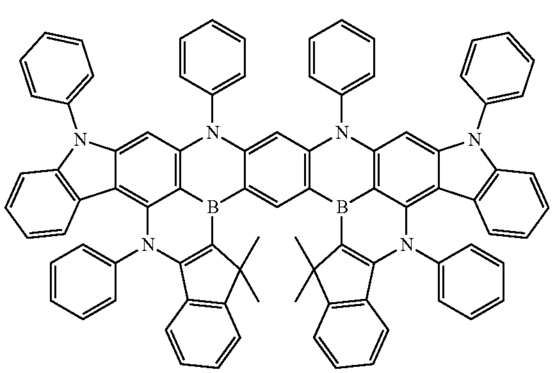
54
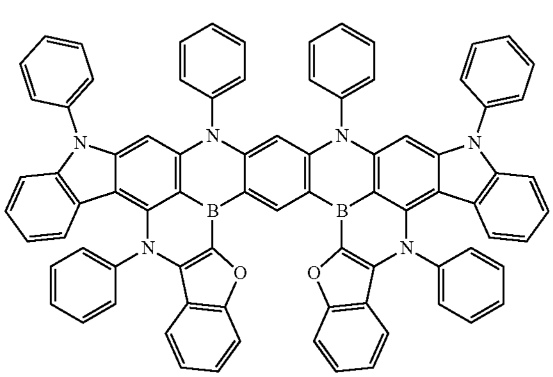
55
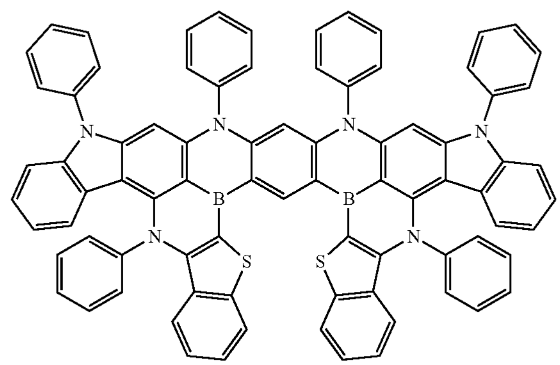
56
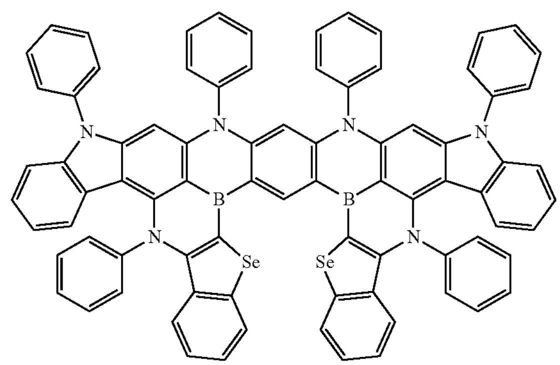
57
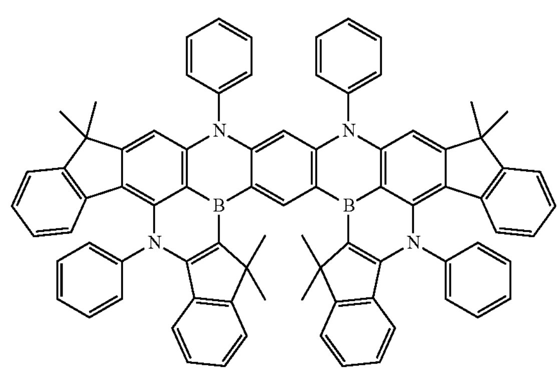
58
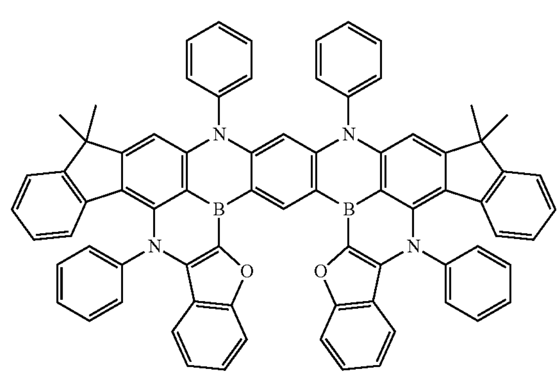

59
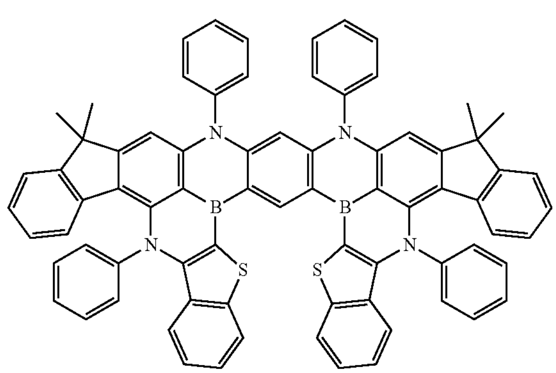
60
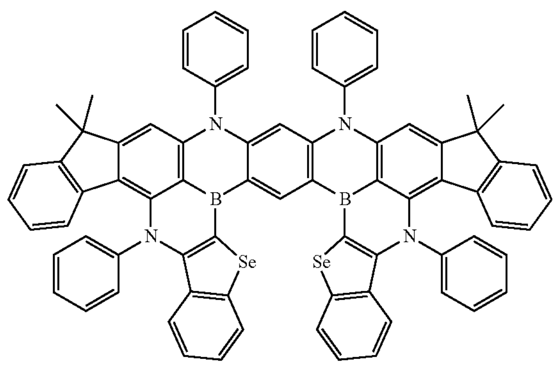
61
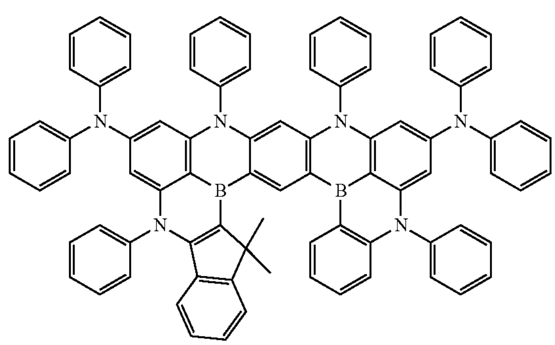
62
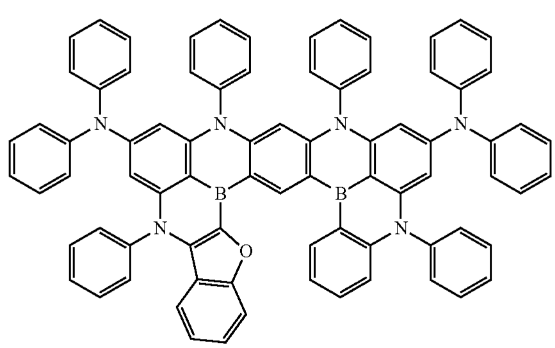
63
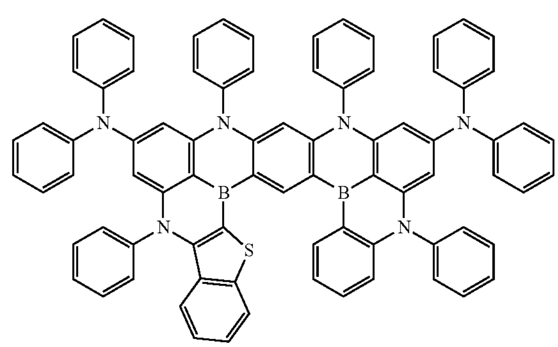
64
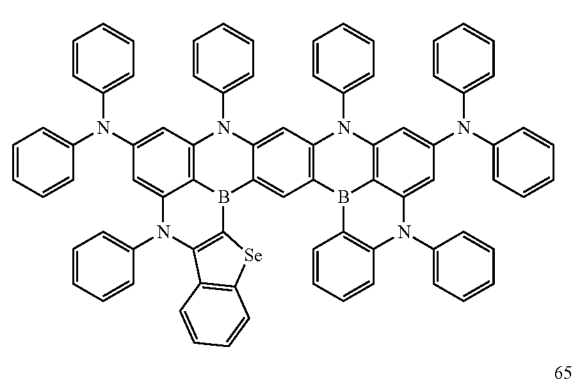
65
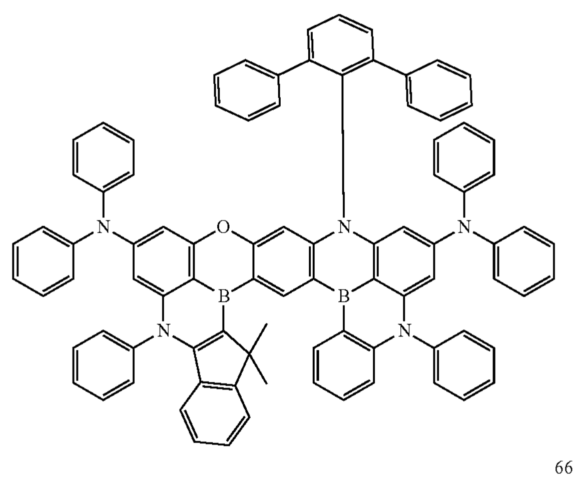
66
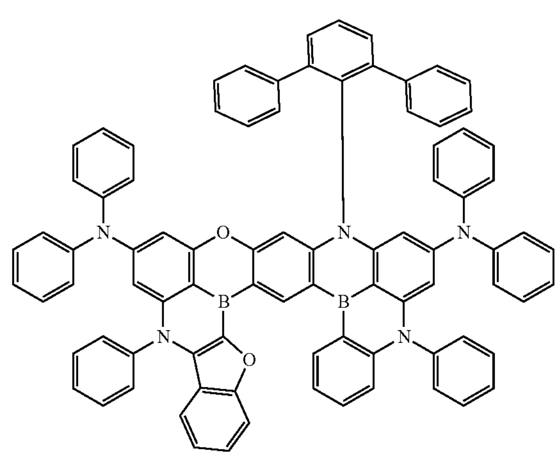

-continued
67
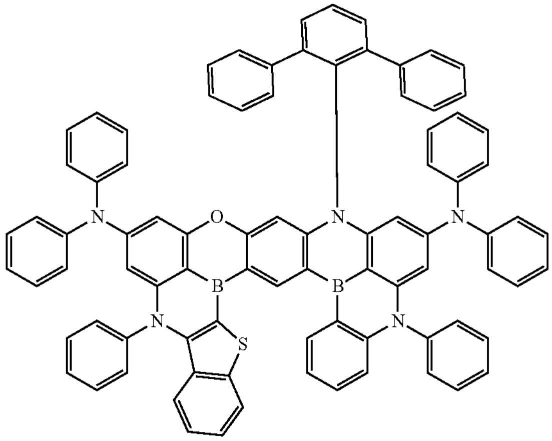
68
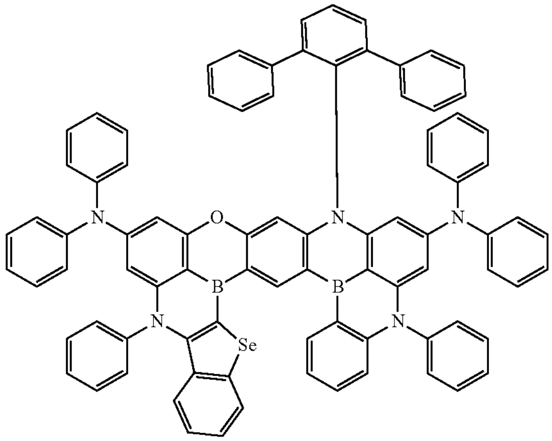
69
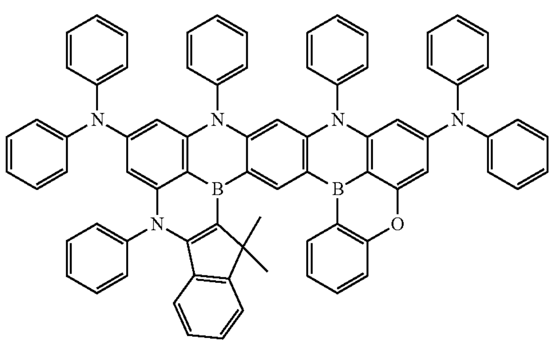
70
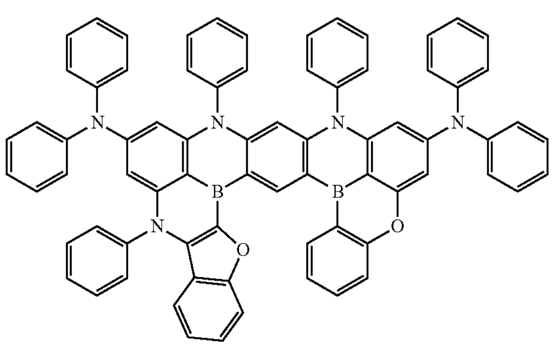
-continued
71
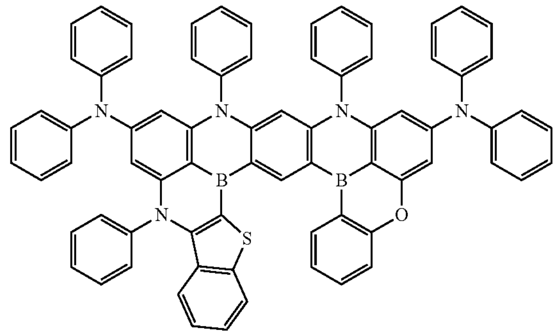
72
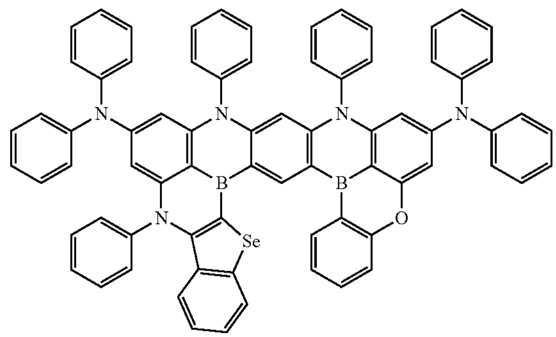
73
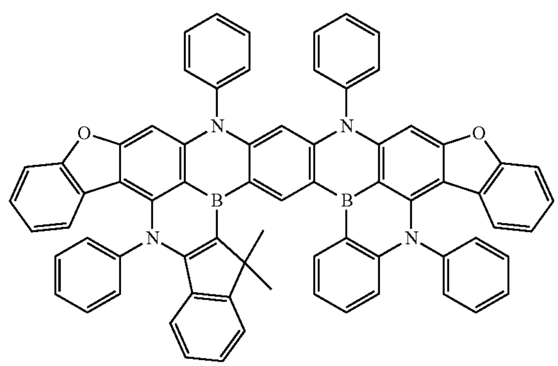
74
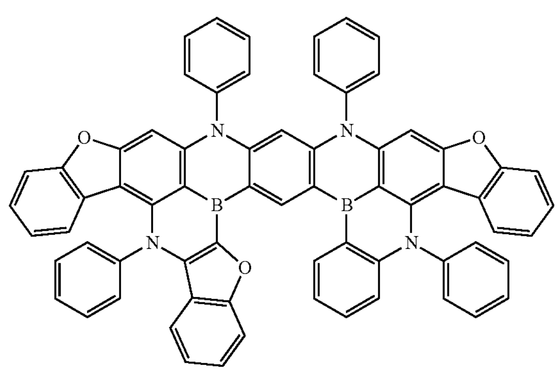

-continued
75
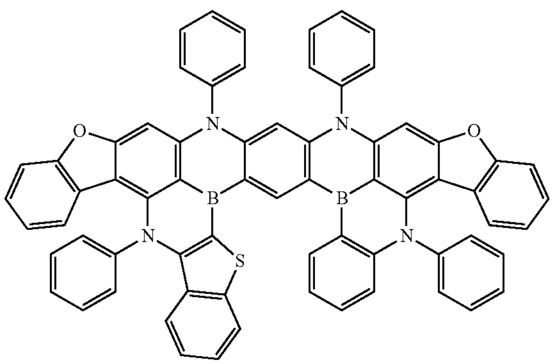
76
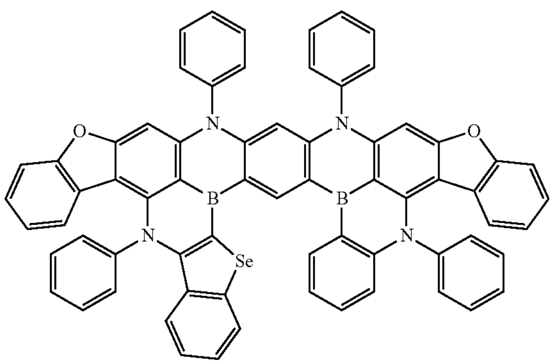
77
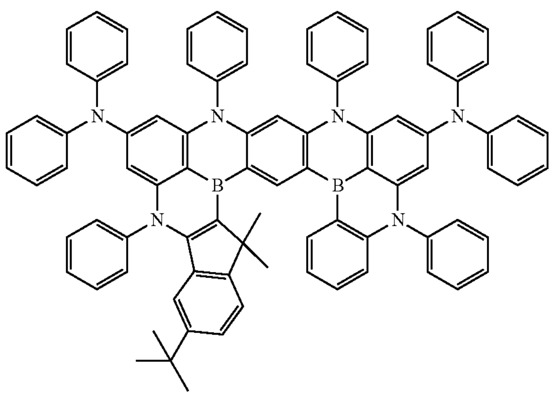
78
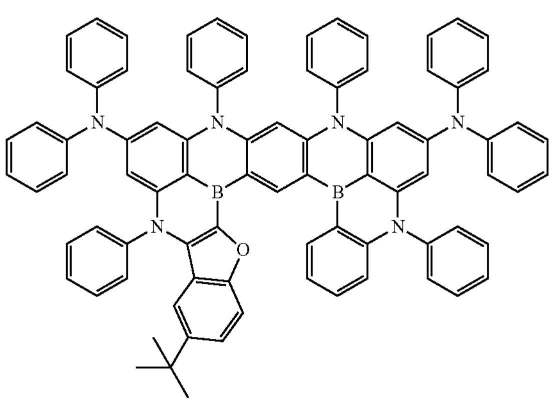
-continued
79
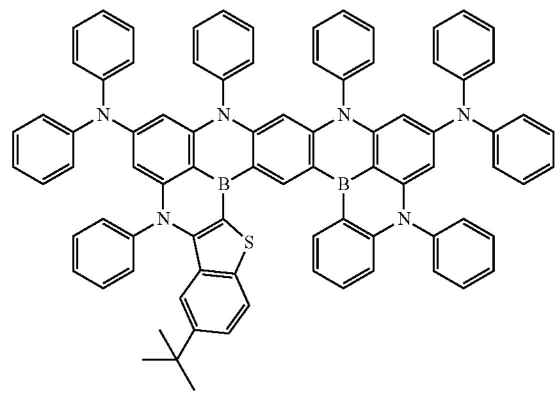
80
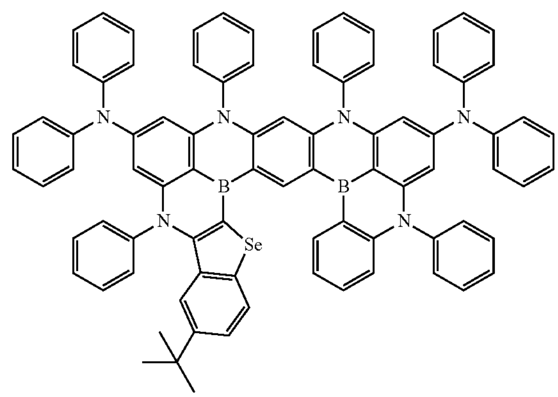
81
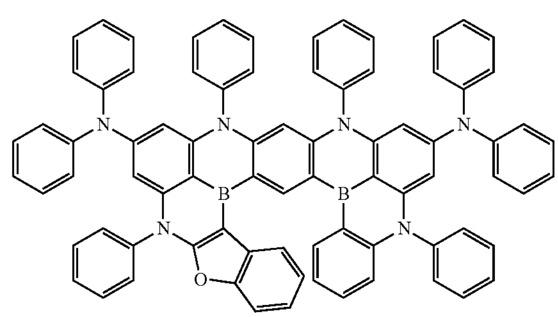
82
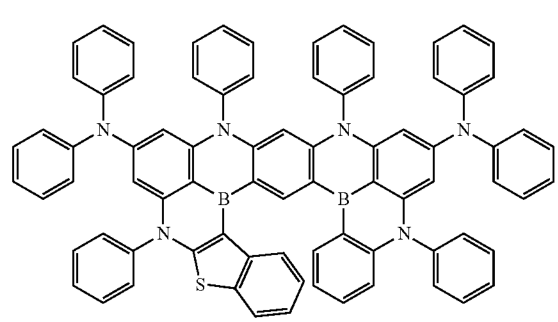

-continued
83
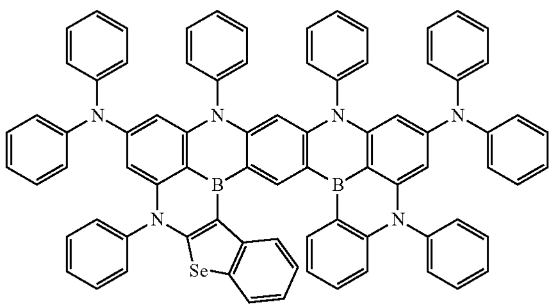
84
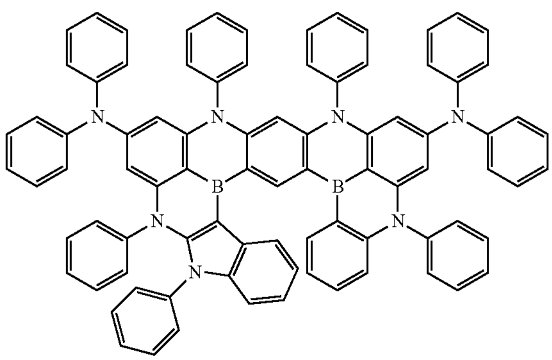
85
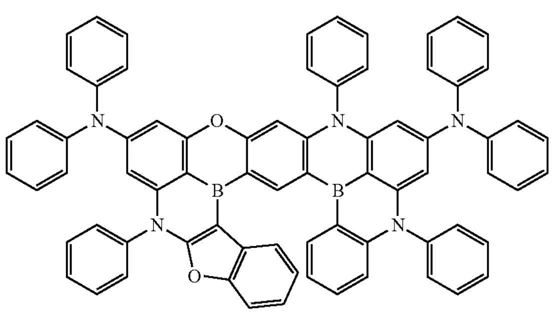
86
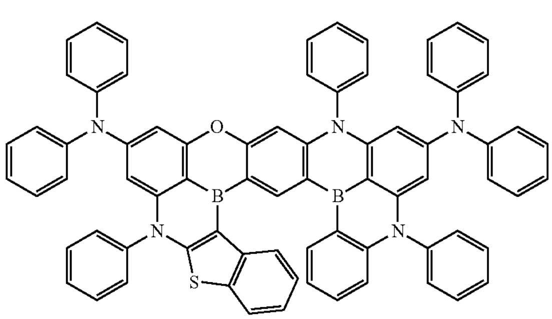
-continued
87
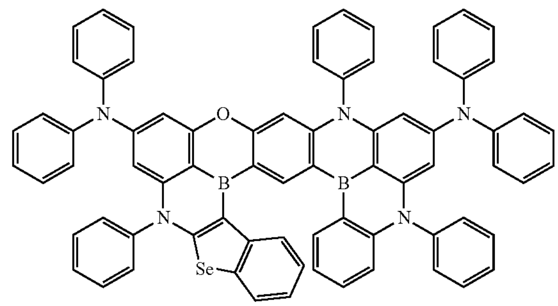
88
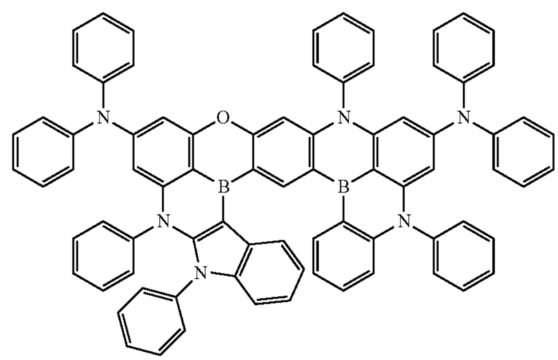
89
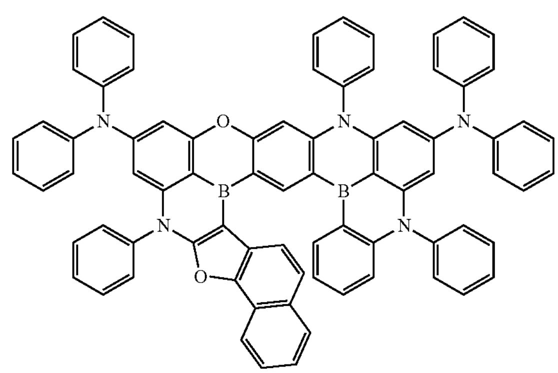
90
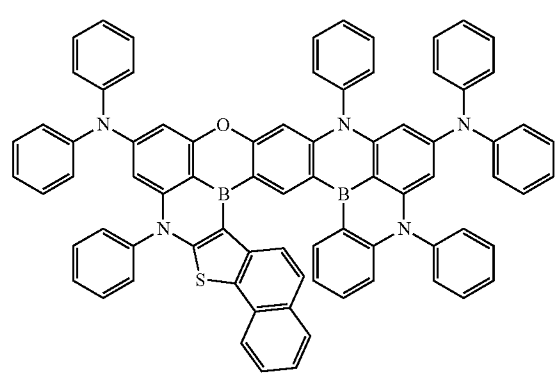

-continued
91
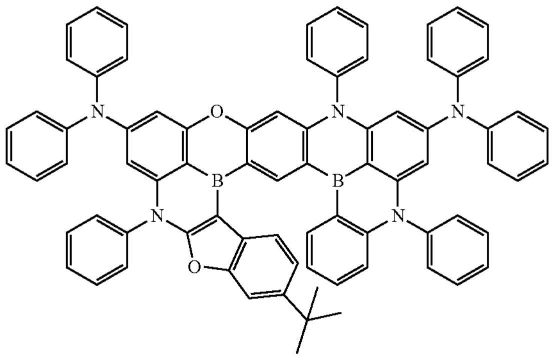
92
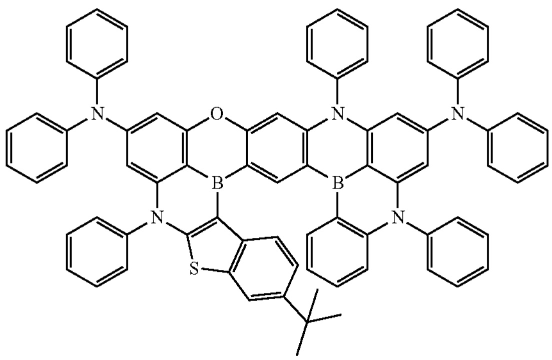
93
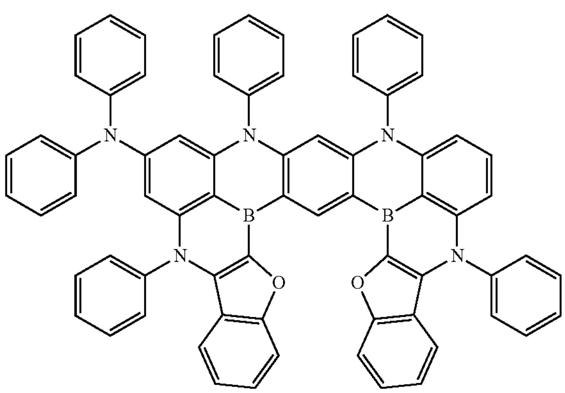
94
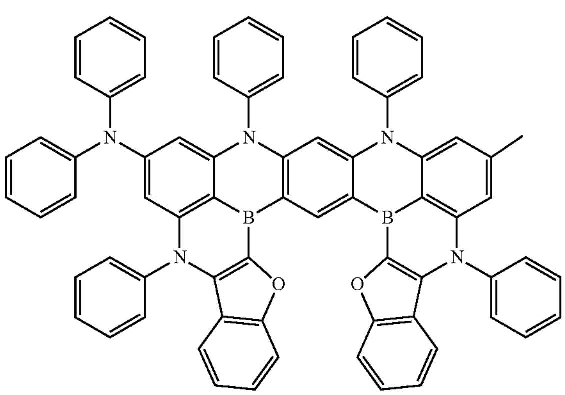
-continued
95
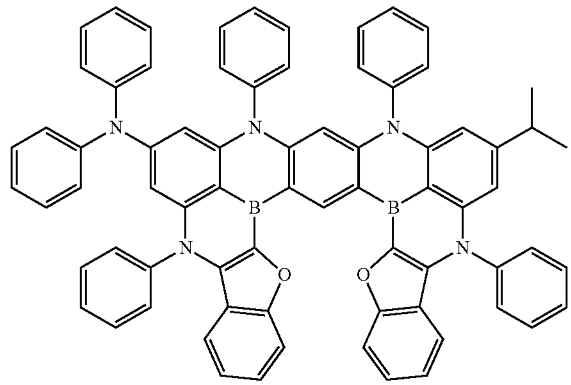
96
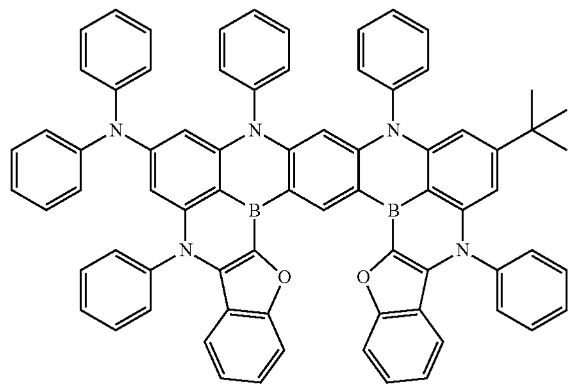
97
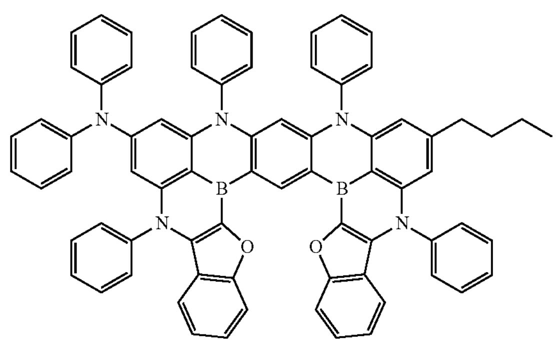
98
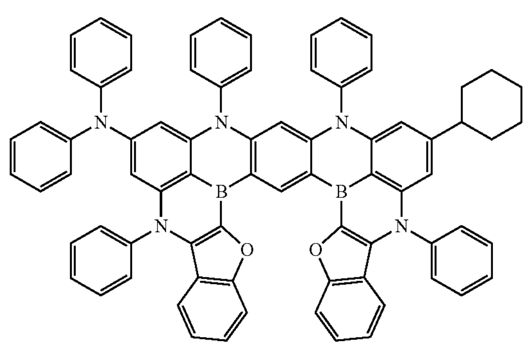

99
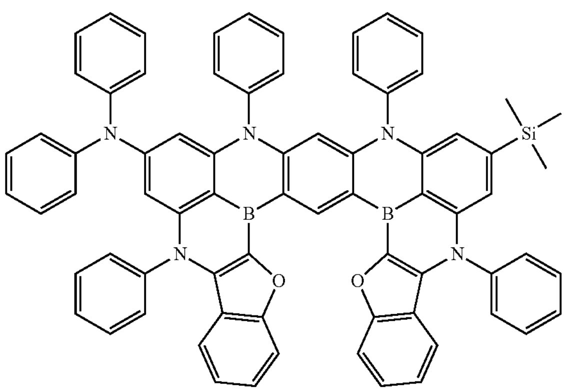
100
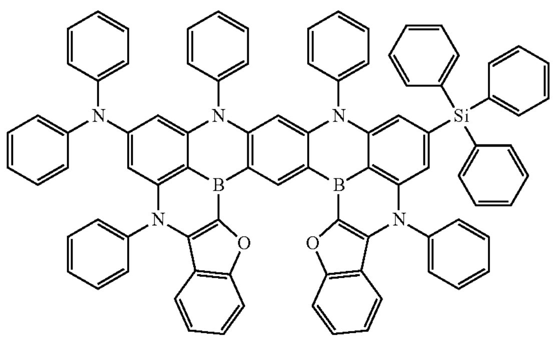
101
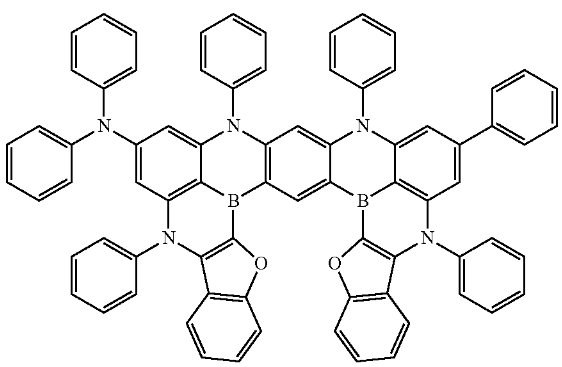
102
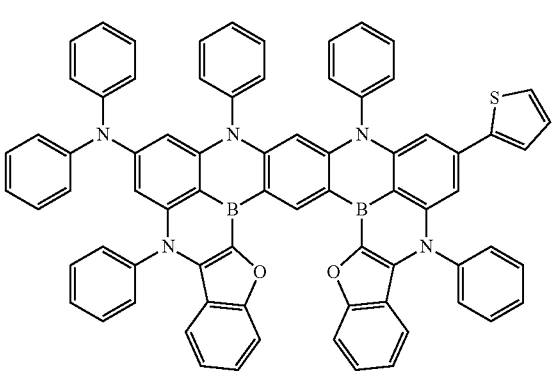
103
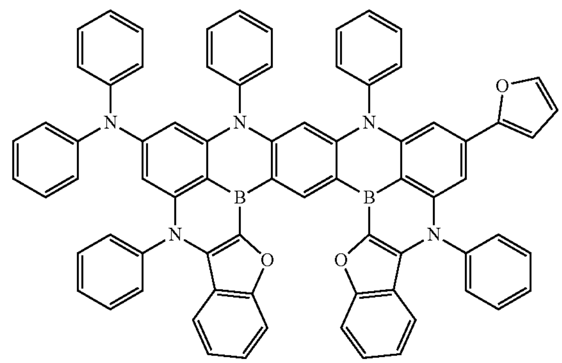
104
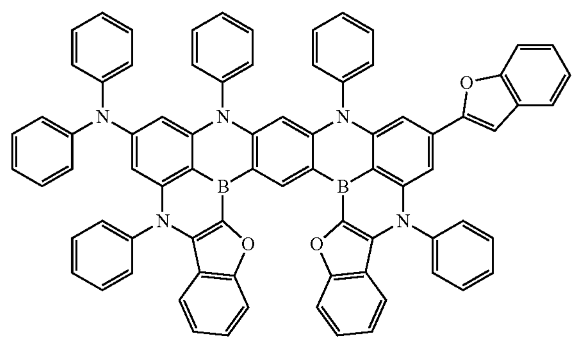
105
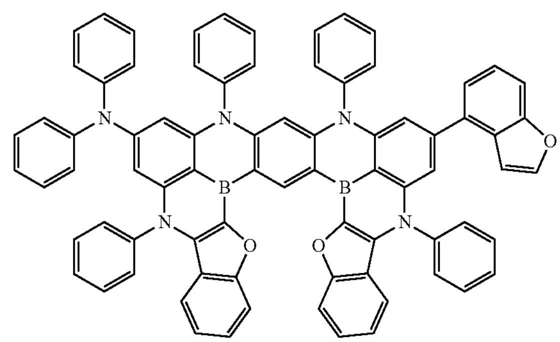
106
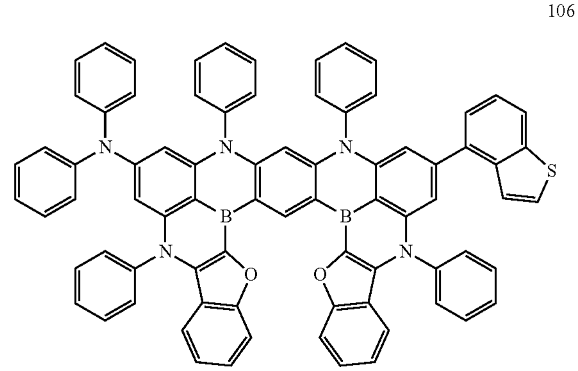

-continued
107
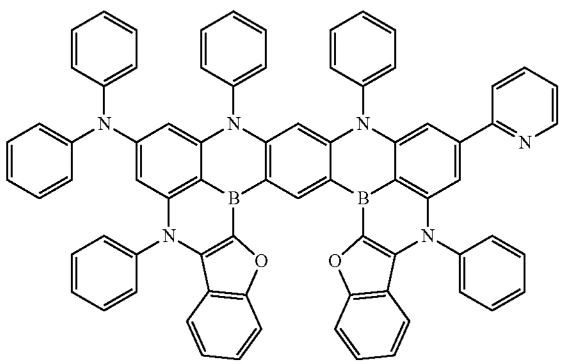
108
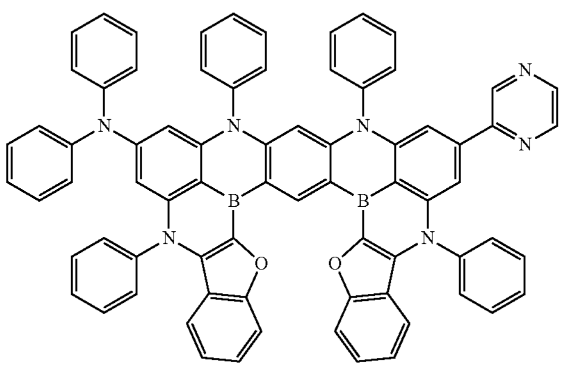
109
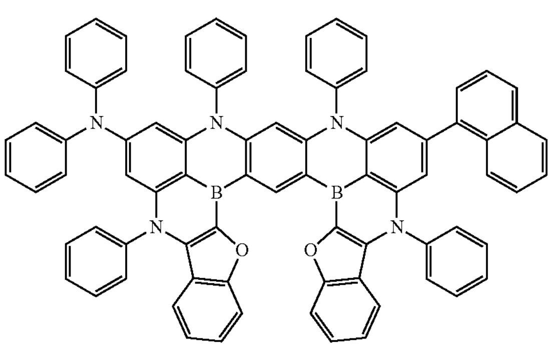
110
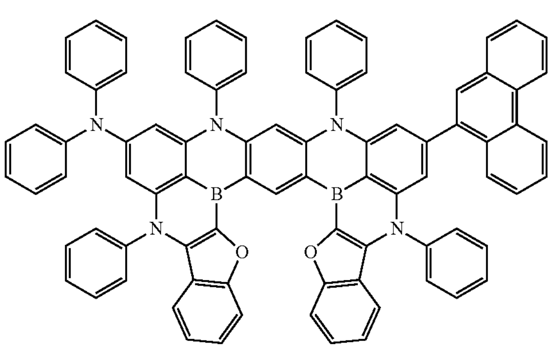
-continued
111
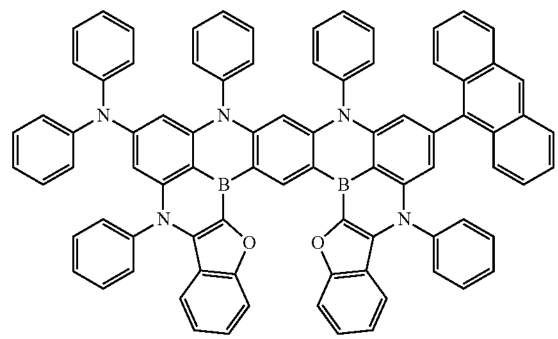
112
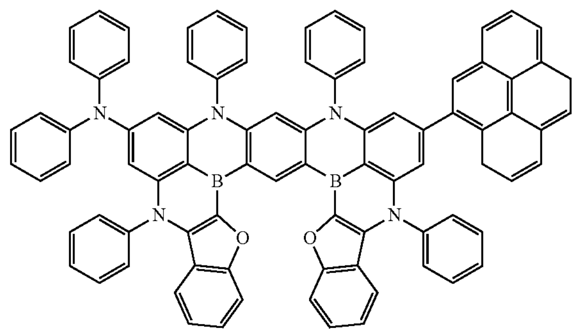
113
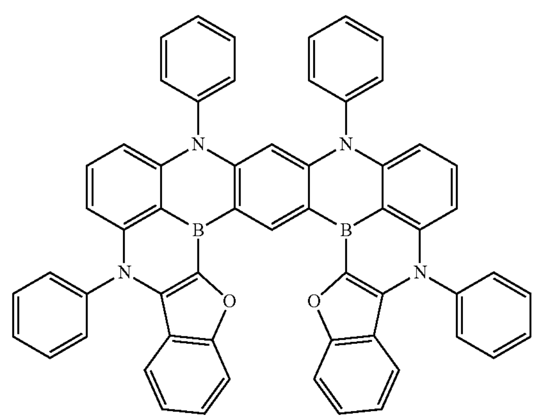
114
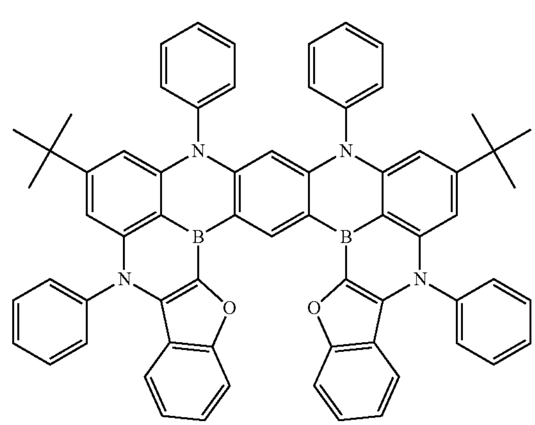

-continued
115
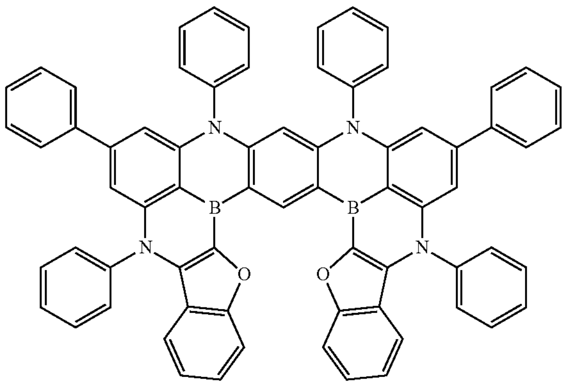
116
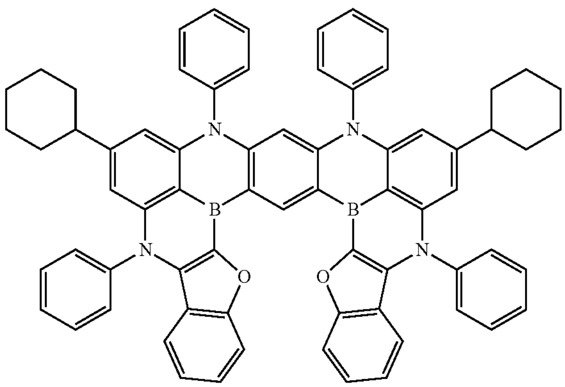
117
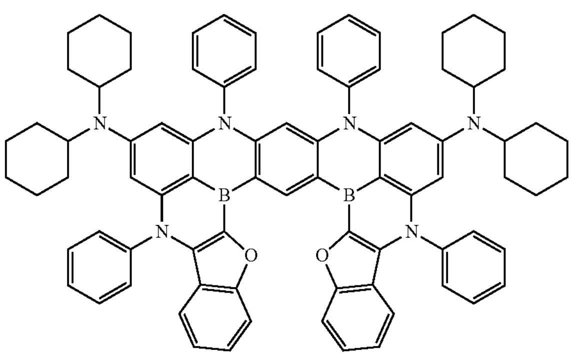
118
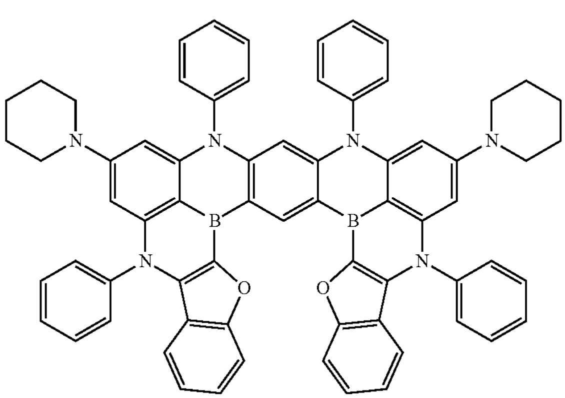
-continued
119
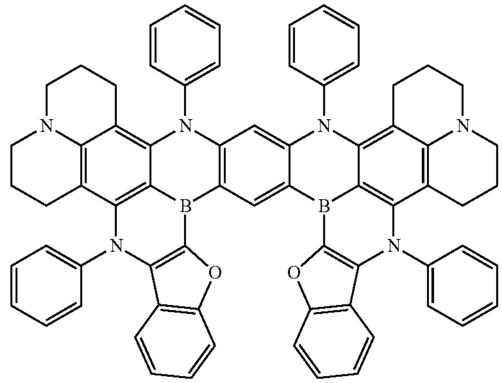
120
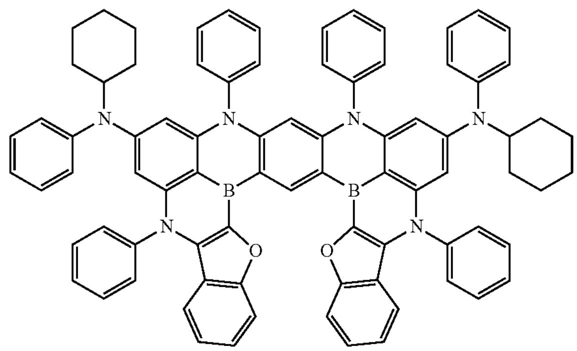
121
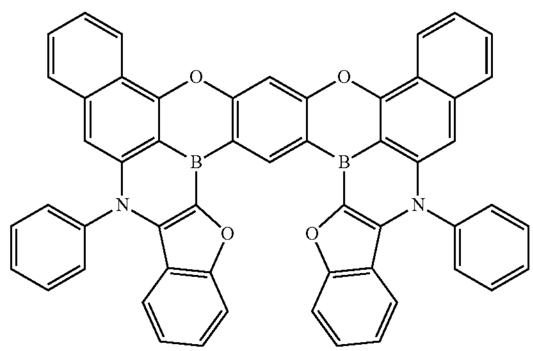
122
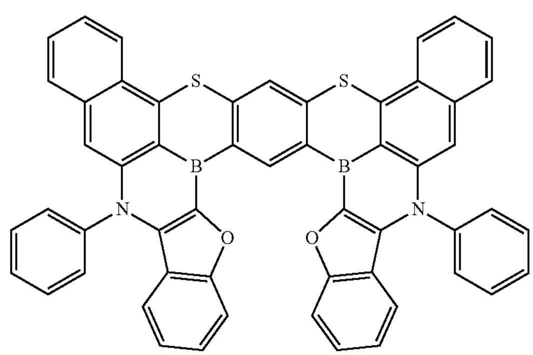

-continued
123
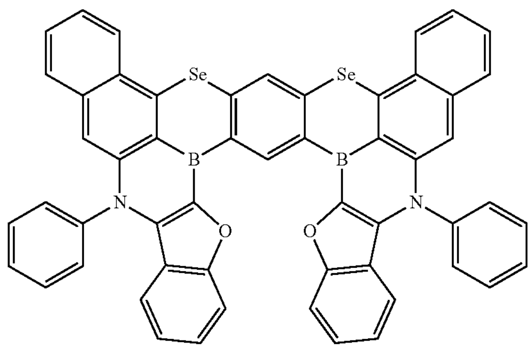
124
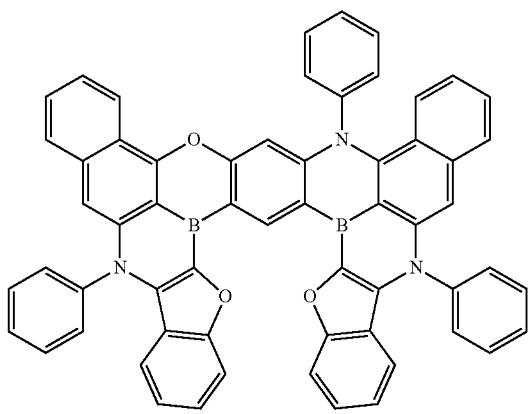
125
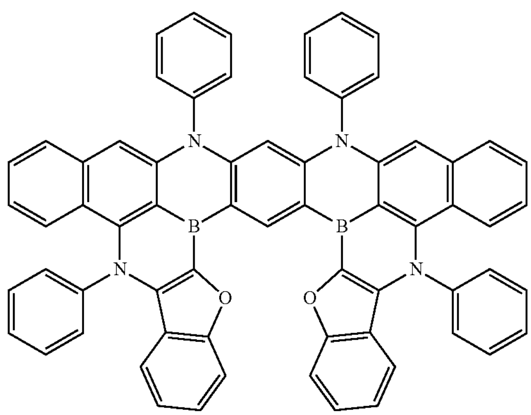
126
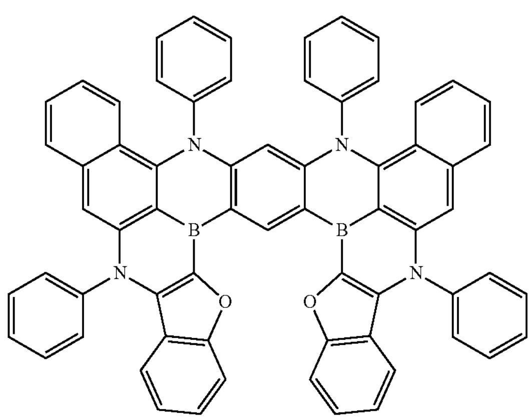
-continued
127
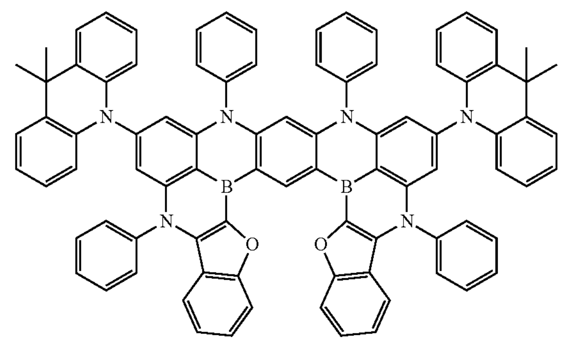
128
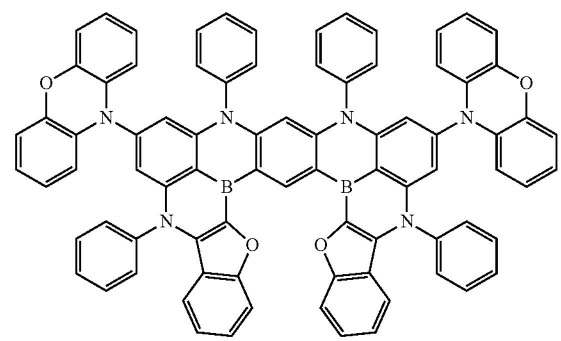
129
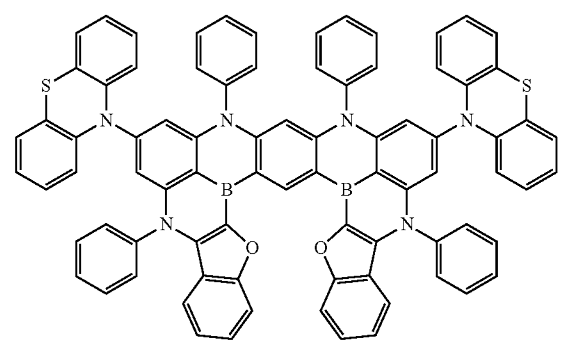
130
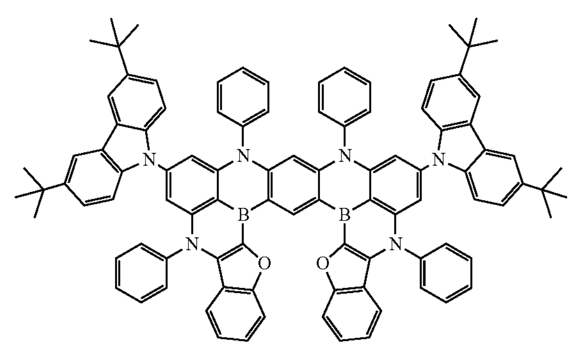

-continued

131

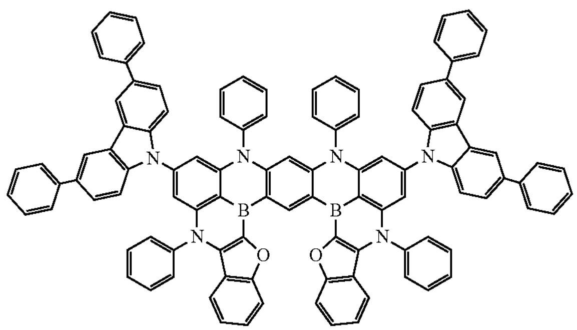

The light emitting spectrum of the fused polycyclic compound of an embodiment, represented by Formula 1, may have a full width at half maximum of about 10-50 nm, or about 20-40 nm. Because the light emitting spectrum of the fused polycyclic compound of an embodiment, represented by Formula 1, has the full width at half maximum in these ranges, when applied to a light emitting device, emission efficiency may be improved. In addition, when utilized as a material for a blue light emitting device, the device life may be improved.

The fused polycyclic compound of an embodiment, represented by Formula 1, may be a material for emitting thermally activated delayed fluorescence. In addition, the fused polycyclic compound of an embodiment, represented by Formula 1, may be a thermally activated delayed fluorescence dopant having a difference ($\Delta E_{ST}$) between the lowest triplet excitation energy level (T1 level) and the lowest singlet excitation energy level (S1 level) of about 0.6 eV or less. The fused polycyclic compound of an embodiment, represented by Formula 1, may be a thermally activated delayed fluorescence dopant having a difference ($\Delta E_{ST}$) between the lowest triplet excitation energy level (T1 level) and the lowest singlet excitation energy level (S1 level) of about 0.2 eV or less.

The fused polycyclic compound of an embodiment, represented by Formula 1, may be a light emitting material having the central light emitting wavelength in a wavelength region of about 430 nm to about 490 nm. For example, the fused polycyclic compound of an embodiment, represented by Formula 1, may be a blue thermally activated delayed fluorescence (TADF) dopant. However, the present disclosure is not limited thereto. In case of utilizing the fused polycyclic compound of an embodiment as a light emitting material, the fused polycyclic compound may be utilized as a dopant material emitting light in various suitable regions including a red light emitting dopant, a green light emitting dopant, etc.

In the light emitting device ED of an embodiment, an emission layer EML may emit delayed fluorescence. For example, the emission layer EML may emit thermally activated delayed fluorescence (TADF).

In addition, the emission layer EML of the light emitting device ED may emit blue light. For example, the emission layer EML of the light emitting device ED may emit blue light in a region of about 490 nm or less. However, the present disclosure is not limited thereto. The emission layer EML may emit green light or red light.

In an embodiment, the emission layer EML includes a host and a dopant and may include the fused polycyclic compound as the dopant. For example, in the light emitting device ED of an embodiment, the emission layer EML may include a host for emitting delayed fluorescence and a dopant for emitting delayed fluorescence. The fused polycyclic compound may include the dopant for emitting delayed fluorescence. The emission layer EML may include at least one among the fused polycyclic compounds represented in Compound Group 1 as a thermally activated delayed fluorescence dopant.

In one or more embodiments, in the light emitting device ED of an embodiment, the emission layer EML may further include a suitable material. The emission layer EML may include an anthracene derivative, a pyrene derivative, a fluoranthene derivative, a chrysene derivative, a dihydrobenzanthracene derivative, and/or atriphenylene derivative. For example, the emission layer EML may include an anthracene derivative and/or a pyrene derivative.

In each the light emitting devices ED of embodiments, shown in FIG. 3 to FIG. 6, the emission layer EML may include a host and a dopant, and the emission layer EML may include a compound represented by Formula E-1 below. The compound represented by Formula E-1 below may be utilized as a fluorescence host material or a delayed fluorescence host material.

Formula E-1

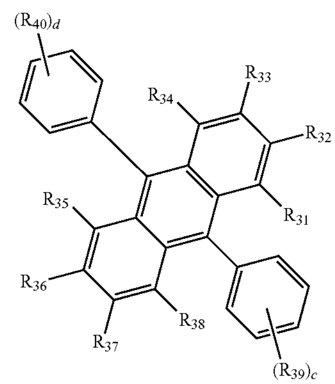

In Formula E-1, $R_{31}$ to $R_{40}$ may be each independently a hydrogen atom, a deuterium atom, a halogen atom, a substituted or unsubstituted silyl group, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, and/or combined with an adjacent group to form a ring. In one or more embodiments, $R_{31}$ to $R_{40}$ may be combined with an adjacent group to form a saturated hydrocarbon ring or an unsaturated hydrocarbon ring.

In Formula E-1, "c" and "d" may be each independently an integer of 0 to 5.

Formula E-1 may be represented by any one among Compound E1 to Compound E19 below.

-continued
E1
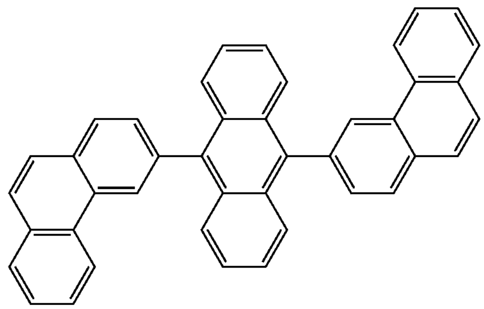
E2
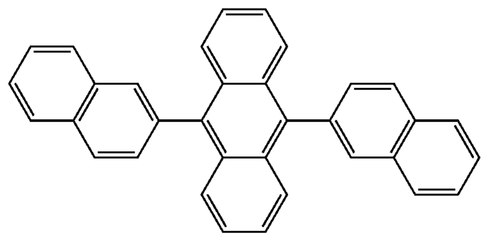
E3
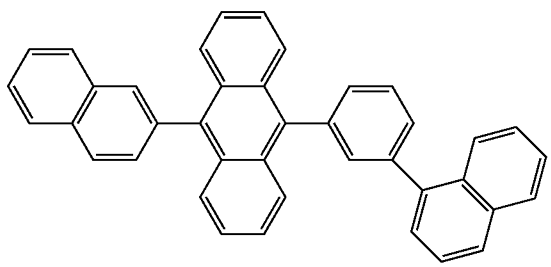
E4
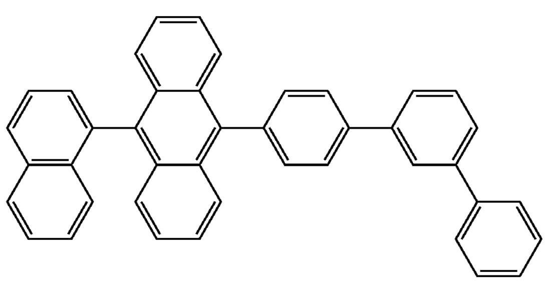
E5
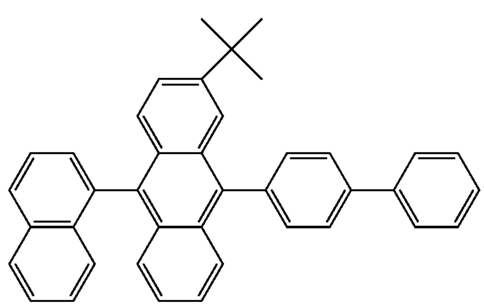
E6
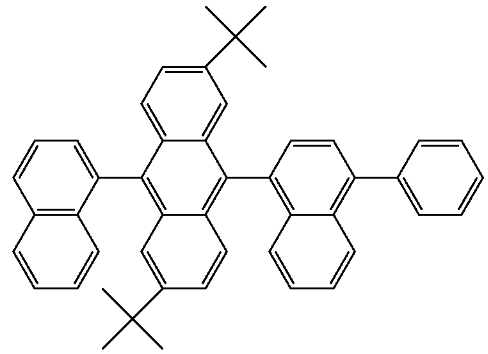
E7
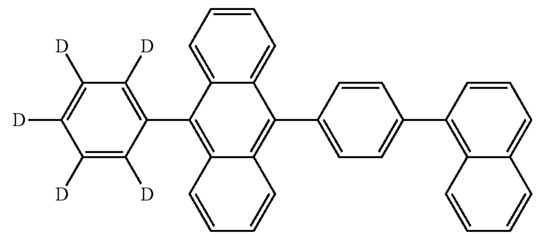
E8
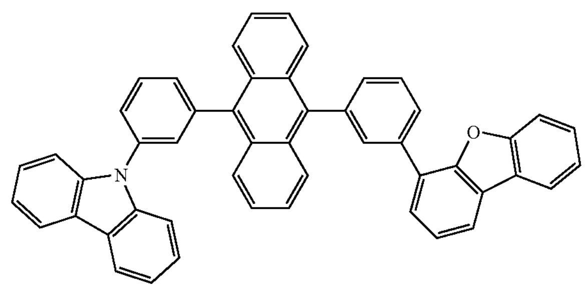
E9
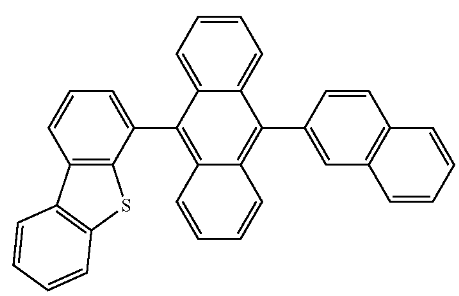
E10
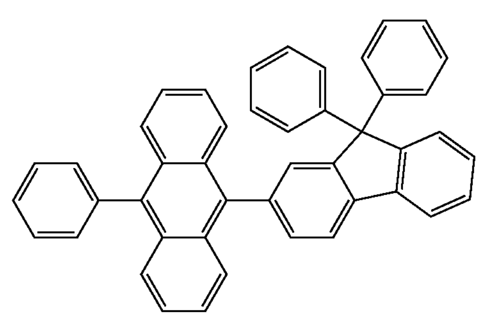

-continued
E11
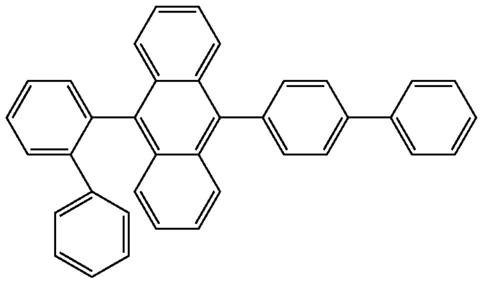
E12
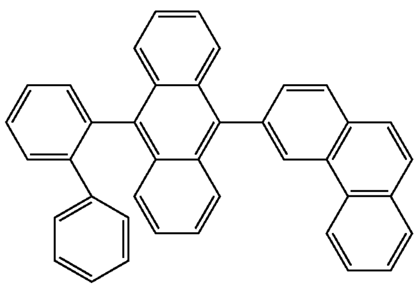
E13
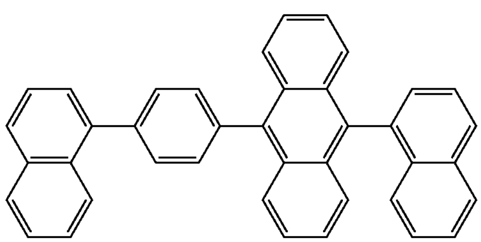
E14
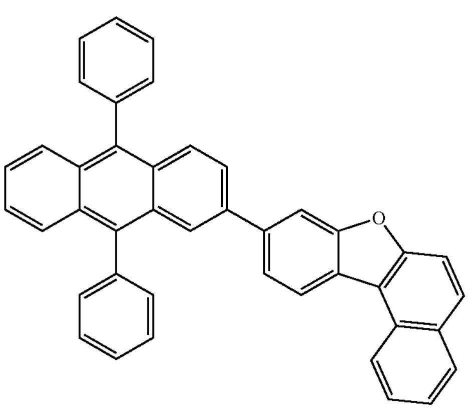
-continued
E15
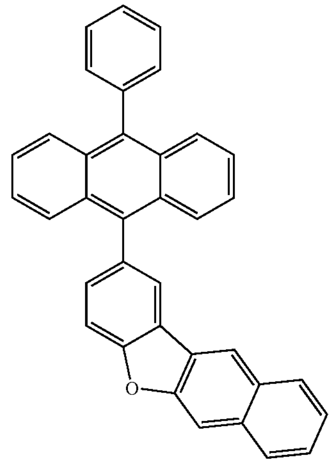
E16
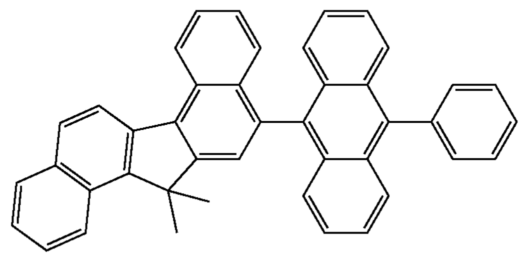
E17
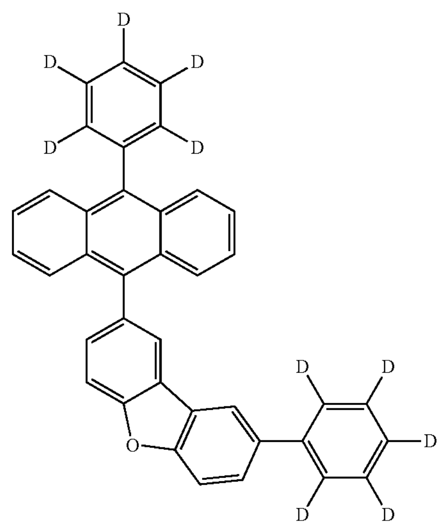
E18
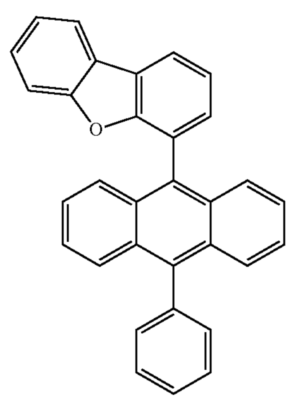

-continued

E19

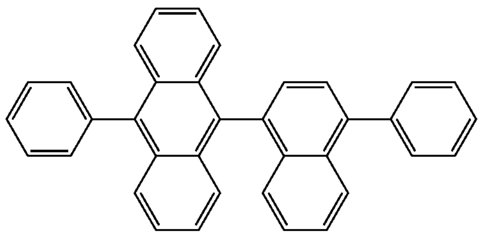

In an embodiment, the emission layer EML may include a compound represented by Formula E-2a or Formula E-2b below. The compound represented by Formula E-2a or Formula E-2b below may be utilized as a phosphorescence host material or a delayed fluorescence host material.

Formula E-2a

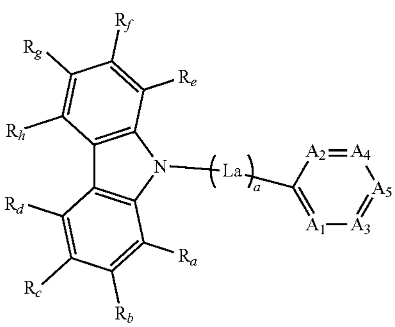

In Formula E-2b, "a" may be an integer of 0 to 10, $L_a$ may be a direct linkage, a substituted or unsubstituted arylene group having 6 to 30 ring-forming carbon atoms, or a substituted or unsubstituted heteroarylene group having 2 to 30 ring-forming carbon atoms. In one or more embodiments, when "a" is an integer of 2 or more, multiple $L_a$ may be each independently a substituted or unsubstituted arylene group having 6 to 30 ring-forming carbon atoms, or a substituted or unsubstituted heteroarylene group having 2 to 30 ring-forming carbon atoms.

In addition, in Formula E-2a, $A_1$ to $A_5$ may be each independently N or CRi. $R_a$ to $R_i$ may be each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be combined with an adjacent group to form a ring. $R_a$ to $R_i$ may be combined with an adjacent group to form a hydrocarbon ring or a heterocycle including N, O, S, etc. as a ring-forming atom.

In one or more embodiments, in Formula E-2a, two or three groups selected from $A_1$ to $A_5$ may be N, and the remainder groups may be $CR_i$.

Formula E-2b $$(Cbz1)\text{—}(L_b)_b\text{—}(Cbz2)$$

In Formula E-2b, Cbz1 and Cbz2 may be each independently an unsubstituted carbazole group, or a carbazole group substituted with an aryl group having 6 to 30 ring-forming carbon atoms. $L_b$ may be a direct linkage, a substituted or unsubstituted arylene group having 6 to 30 ring-forming carbon atoms, or a substituted or unsubstituted heteroarylene group having 2 to 30 ring-forming carbon atoms. "b" is an integer of 0 to 10, and when "b" is an integer of 2 or more, multiple $L_b$ may be each independently a substituted or unsubstituted arylene group having 6 to 30 ring-forming carbon atoms, or a substituted or unsubstituted heteroarylene group having 2 to 30 ring-forming carbon atoms.

The compound represented by Formula E-2a or Formula E-2b may be represented by any one among the compounds in Compound Group E-2 below. However, the compounds shown in Compound Group E-2 below are only examples, and the compound represented by Formula E-2a or Formula E-2b is not limited to the compounds represented in Compound Group E-2 below.

[Compound Group E-2]

E-2-1

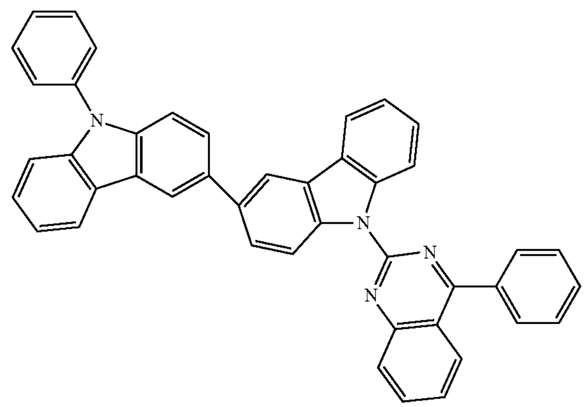

E-2-2

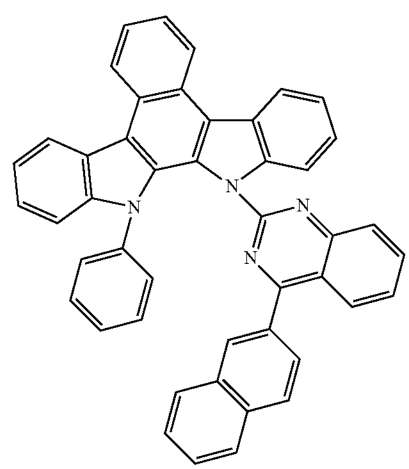

E-2-3
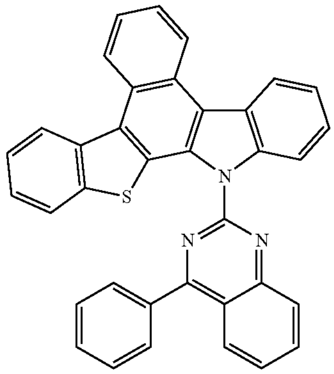
E-2-4
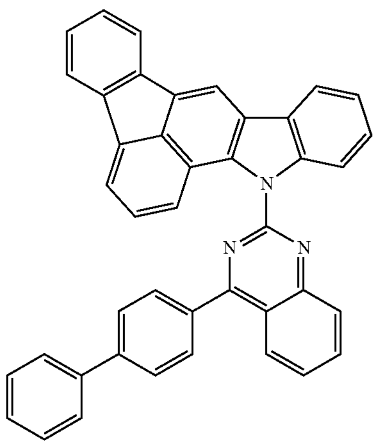
E-2-5
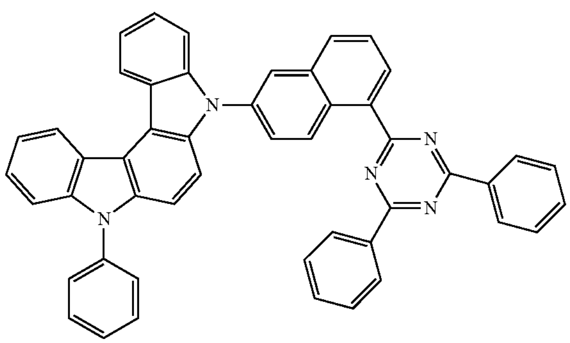
E-2-6
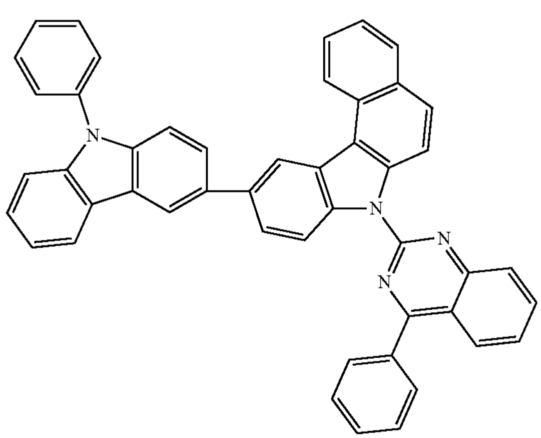
E-2-7
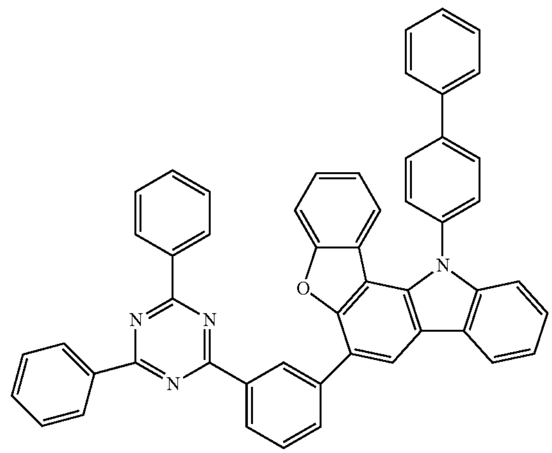
E-2-8
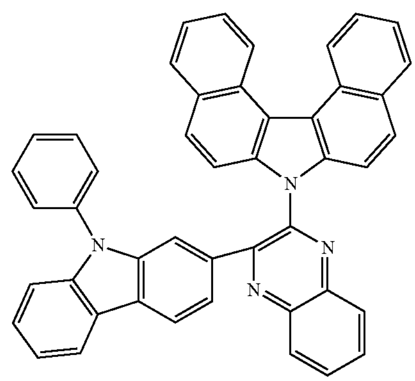
E-2-9
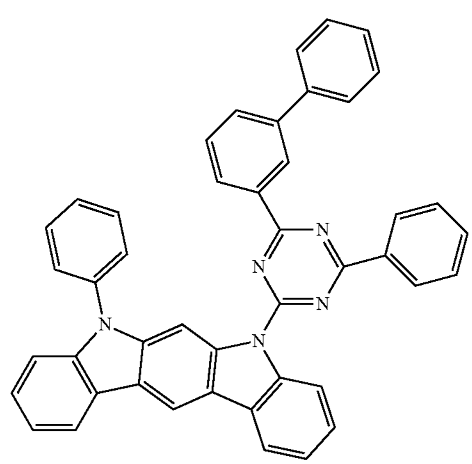

-continued
E-2-10
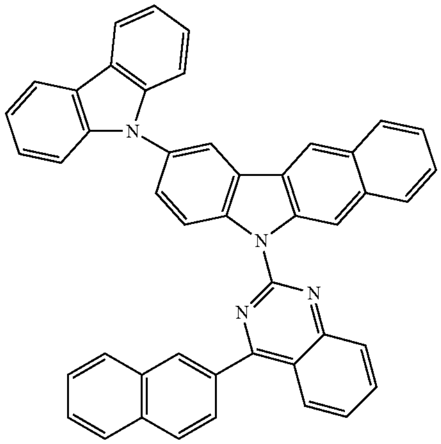
E-2-11
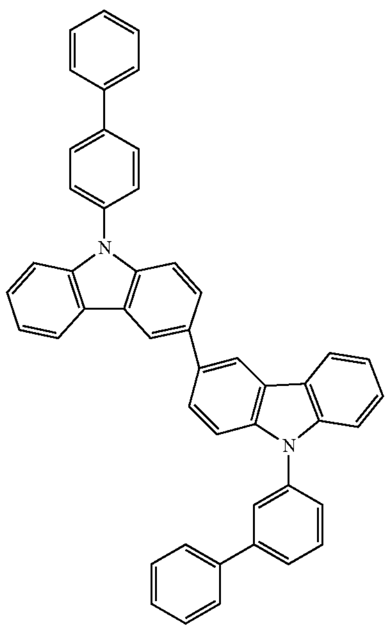
E-2-12
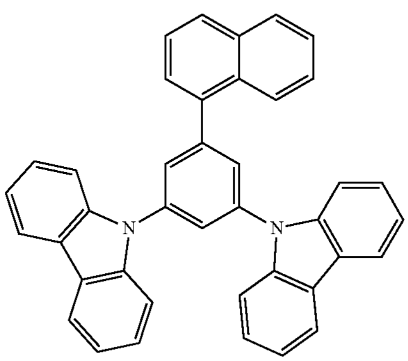
-continued
E-2-13
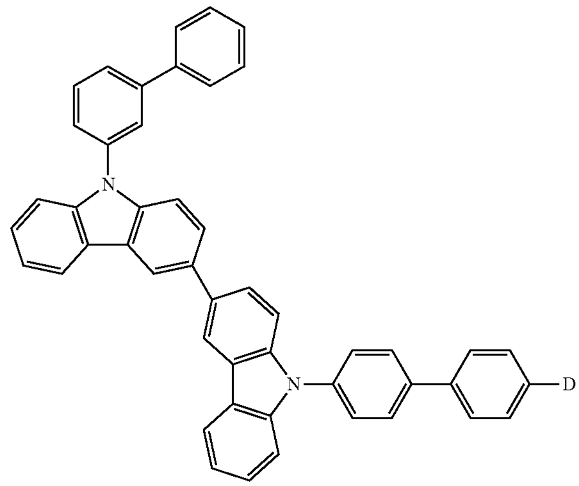
E-2-14
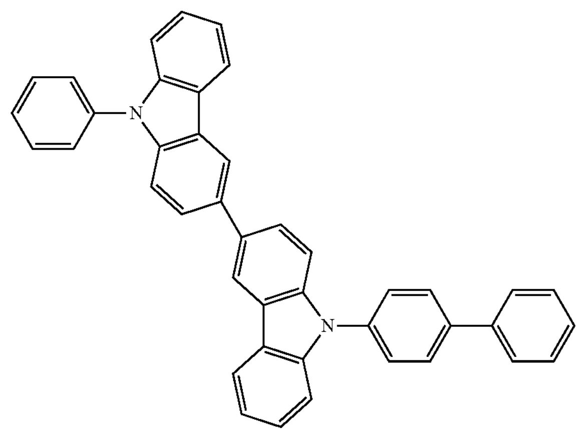
E-2-15
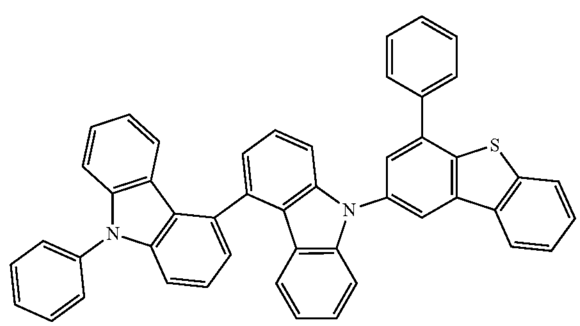

-continued
E-2-16
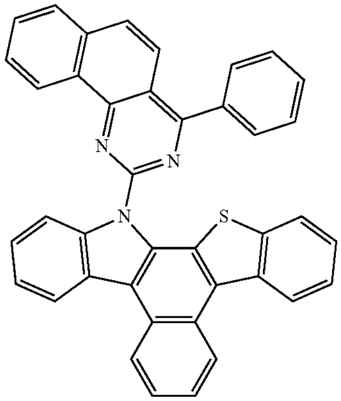
E-2-17
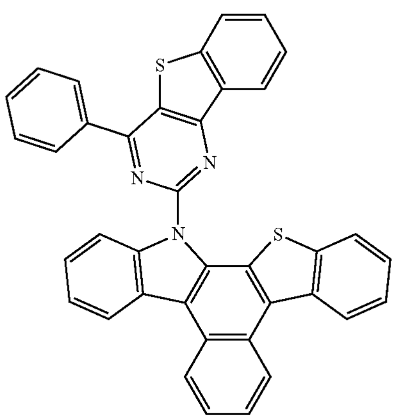
E-2-18
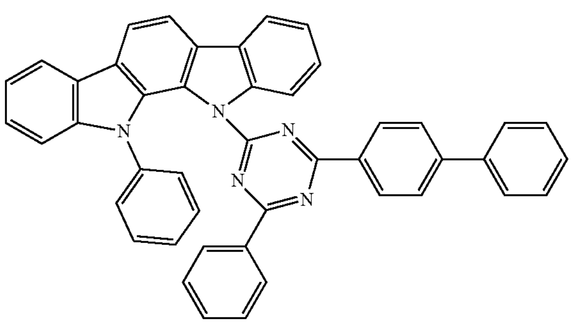
E-2-19
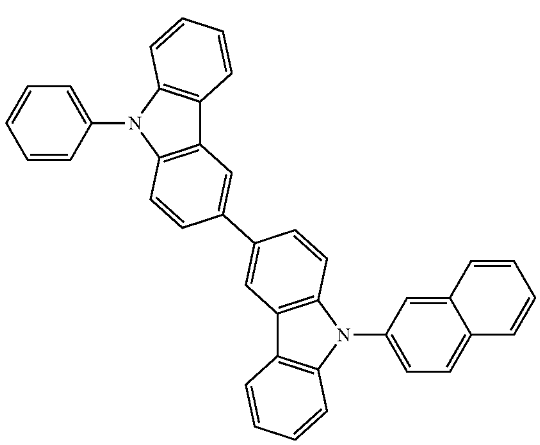
-continued
E-2-20
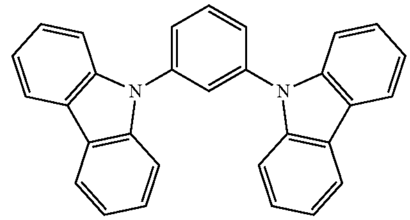
E-2-21
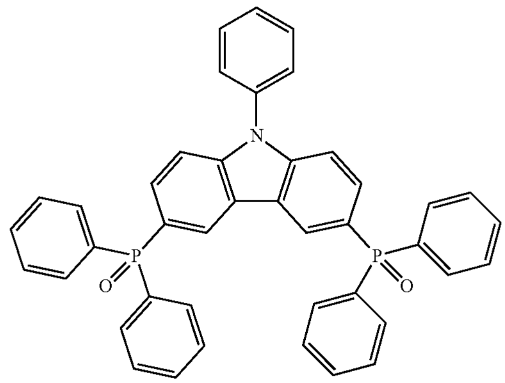
E-2-22
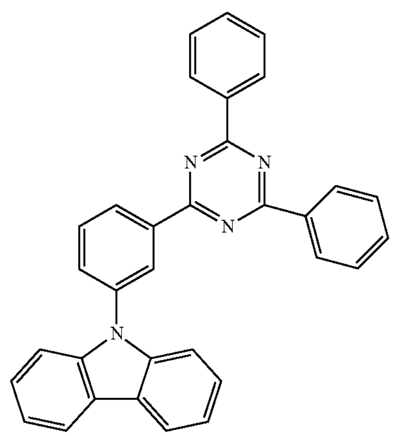
E-2-23
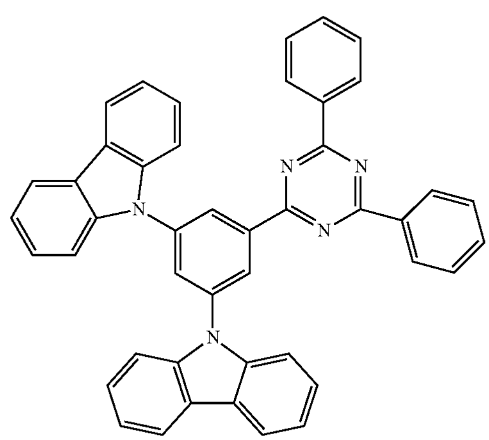

-continued

E-2-24

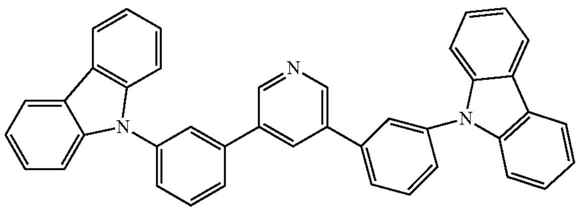

E-2-25

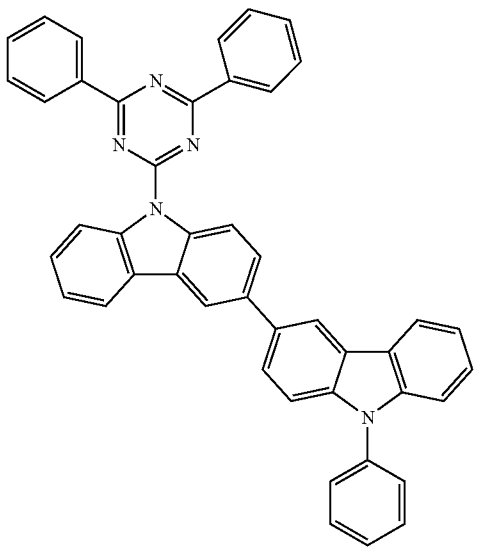

The emission layer EML may further include a suitable material (e.g., a common material known in the art) as a host material. For example, the emission layer EML may include as a host material, at least one of bis[2-(diphenylphosphino) phenyl]ether oxide (DPEPO), 4,4'-bis(carbazol-9-yl)biphenyl (CBP), 1,3-bis(carbazol-9-yl)benzene (mCP), 2,8-bis (diphenylphosphoryl)dibenzo[b,d]furan (PPF), 4,4',4"-tris (carbazol-9-yl)-triphenylamine (TCTA), or 1,3,5-tris(1-phenyl-1H-benzo[d]imidazole-2-yl)benzene (TPBi). However, the present disclosure is not limited thereto. For example, tris(8-hydroxyquinolino)aluminum ($Alq_3$), 4,4'-bis (N-carbazolyl)-1,1'-biphenyl (CBP), poly(N-vinylcarbazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBi), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis (triphenylsilyl)benzene (UGH2), hexaphenylcyclotrisiloxane ($DPSiO_3$), octaphenylcyclotetra siloxane ($DPSiO_4$), 2,8-bis(diphenylphosphoryl)dibenzofuran (PPF), etc. may be utilized as the host material.

The emission layer EML may include a compound represented by Formula M-a or Formula M-b below. The compound represented by Formula M-a or Formula M-b may be utilized as a phosphorescence dopant material.

Formula M-a

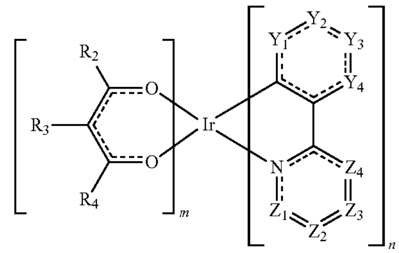

In Formula M-a, $Y_1$ to $Y_4$, and $Z_1$ to $Z_4$ may be each independently $CR_1$ or N, and $R_1$ to $R_4$ may be each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be combined with an adjacent group to form a ring. In Formula M-a, “m” is 0 or 1, and “n” is 2 or 3. In Formula M-a, when “m” is 0, “n” is 3, and when “m” is 1, “n” is 2.

The compound represented by Formula M-a may be utilized as a red phosphorescence dopant or a green phosphorescence dopant.

The compound represented by Formula M-a may be represented by any one among Compounds M-a1 to M-a19 below. However, Compounds M-a1 to M-a19 below are examples, and the compound represented by Formula M-a is not limited to the compounds represented by Compounds M-a1 to M-a19 below.

M-a1

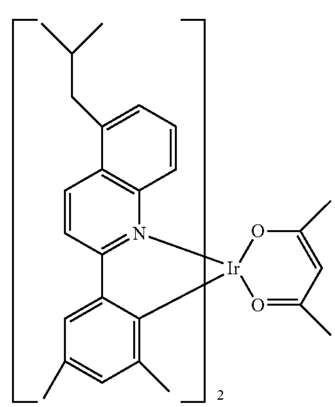

-continued
M-a2
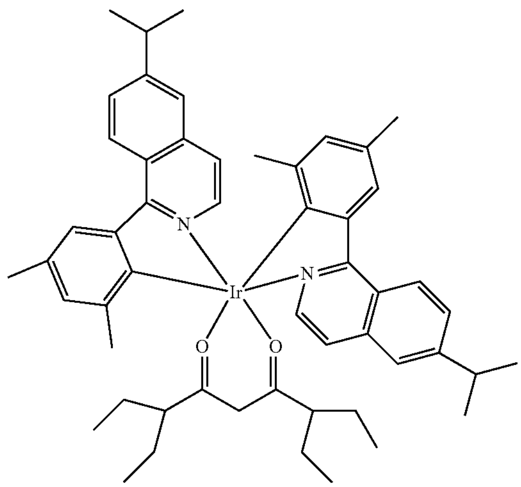
M-a3
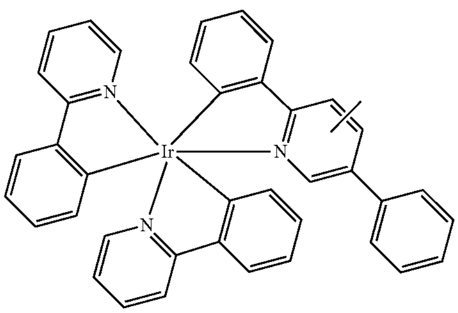
M-a4
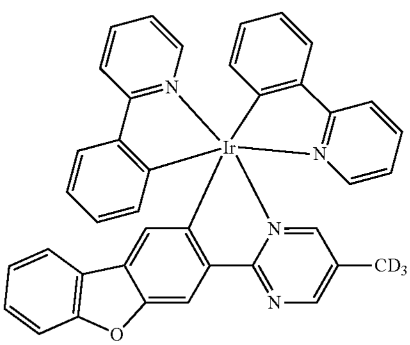
M-a5
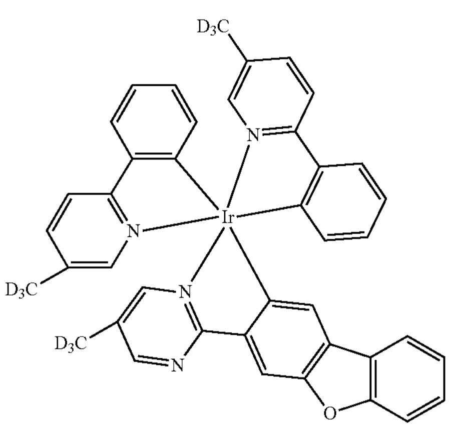
-continued
M-a6
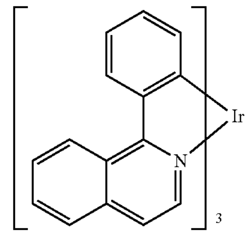
M-a7
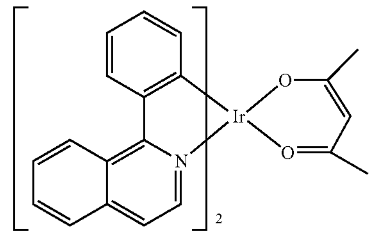
M-a8
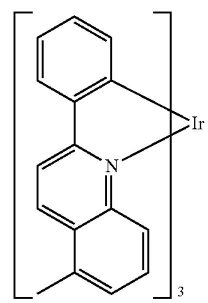
M-a9
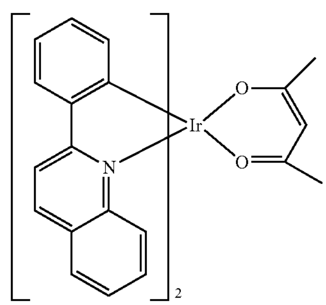
M-a10
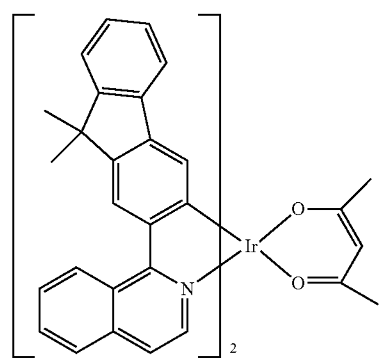

-continued
M-a11
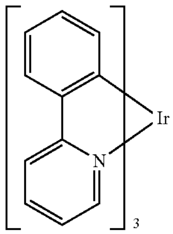
M-a12
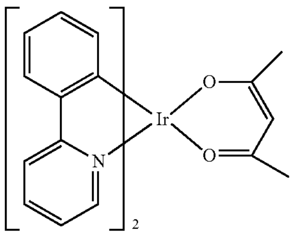
M-a13
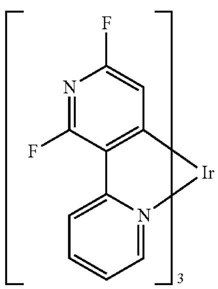
M-a14
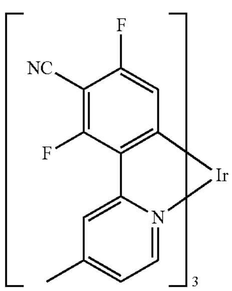
M-a15
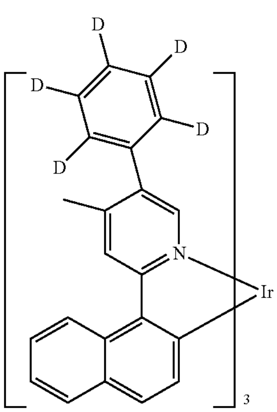
-continued
M-a16
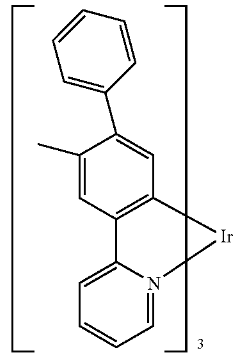
M-a17
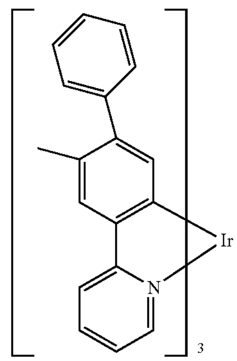
M-a18
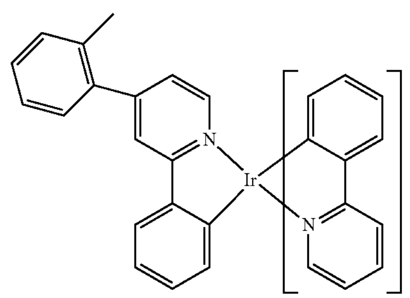
M-a19
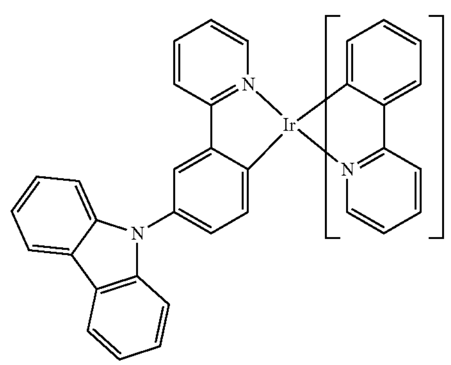
Compound M-a1 (and Compound M-a2 may be utilized as red dopant materials, and Compound M-a3 to Compound M-a5 may be utilized as green dopant materials.

Formula M-b

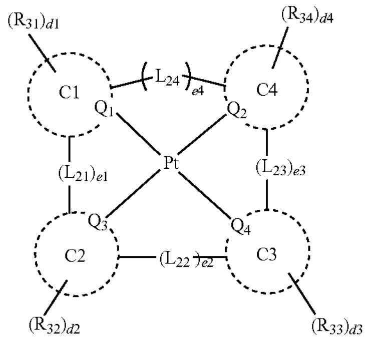

In Formula M-b, $Q_1$ to $Q_4$ are each independently C or N, and C1 to C4 are each independently a substituted or unsubstituted hydrocarbon ring of 5 to 30 ring-forming carbon atoms, or a substituted or unsubstituted heterocycle of 2 to 30 ring-forming carbon atoms. $L_{21}$ to $L_{24}$ are each independently a direct linkage,

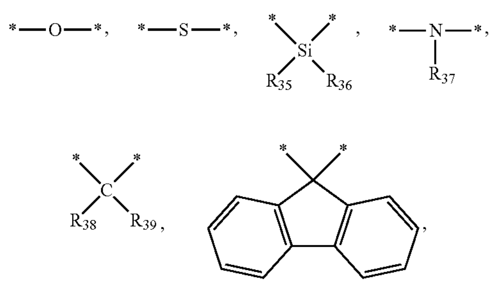

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, and e1 to e4 are each independently 0 or 1. $R_{31}$ to $R_{39}$ are each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or combined with an adjacent group to form a ring, and d1 to d4 are each independently an integer of 0 to 4.

The compound represented by Formula M-b may be utilized as a blue phosphorescence dopant or a green phosphorescence dopant.

The compound represented by Formula M-b may be represented by any one among the compounds below. However, the compounds below are illustrations, and the compound represented by Formula M-b is not limited to the compounds represented below.

M-b-1

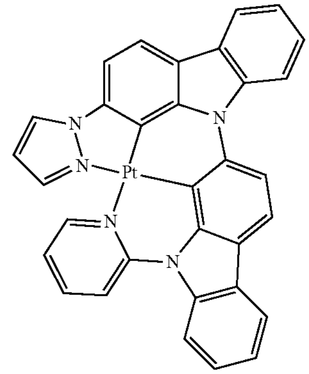

M-b-2

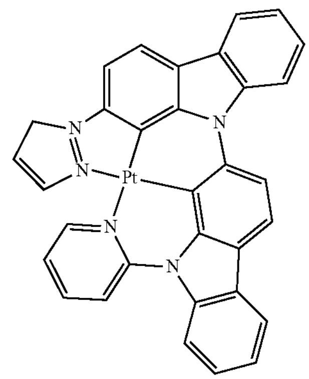

M-b-3

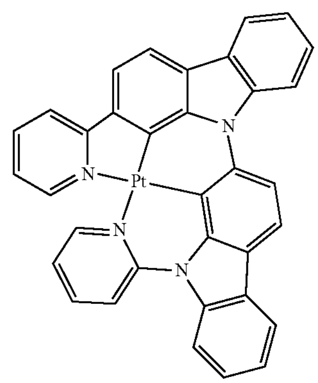

M-b-4

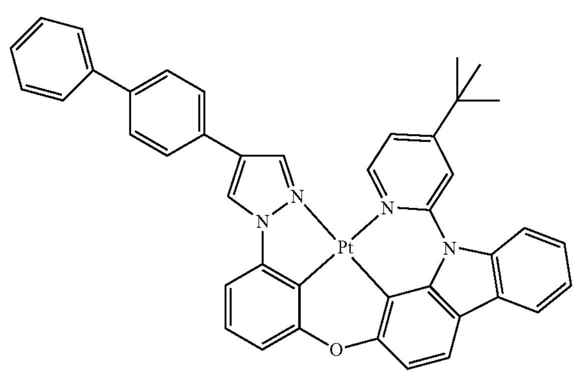

-continued
M-b-5
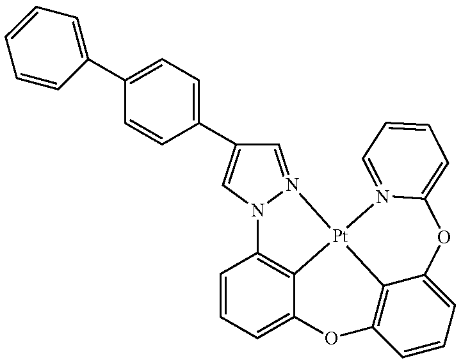
M-b-6
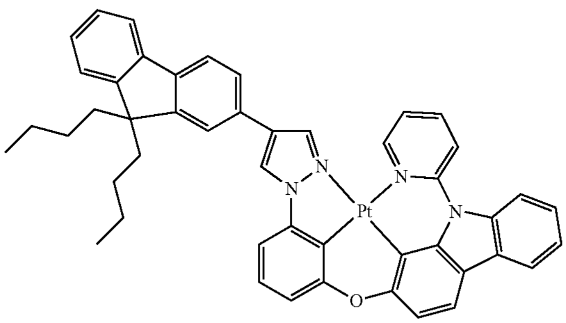
M-b-7
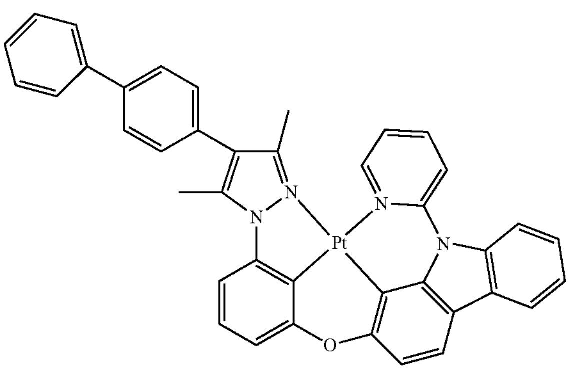
M-b-8
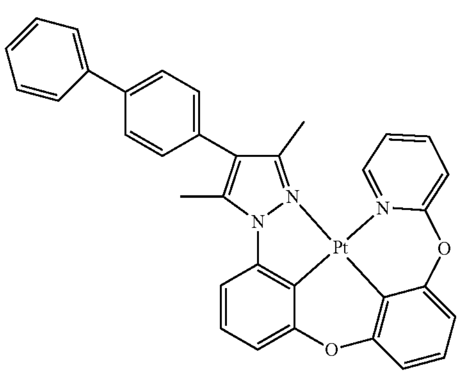
-continued
M-b-9
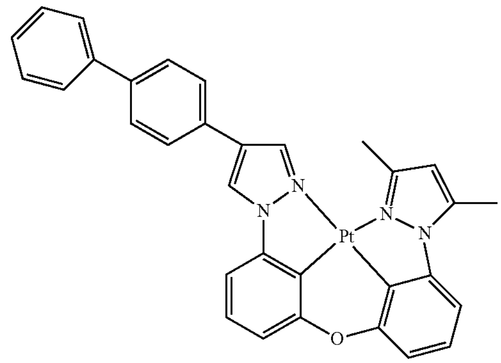
M-b-10
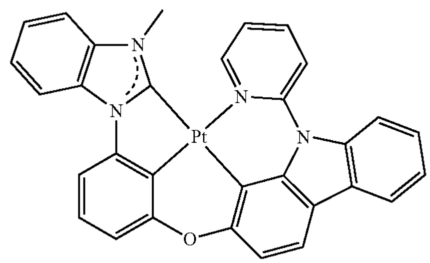
M-b-11
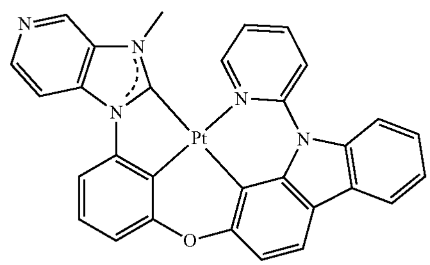
M-b-12
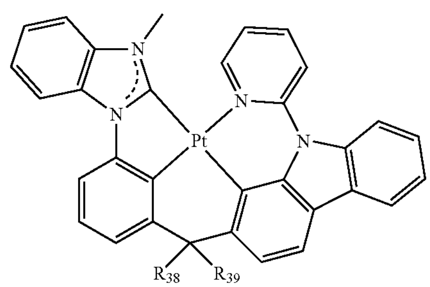
M-b-13
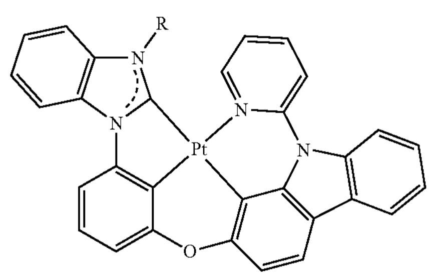
In the compounds above, R, $R_{38}$, and $R_{39}$ may be each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

The emission layer EML may include a compound represented by any one among Formula F-a to Formula F-c below. The compounds represented by Formula F-a to Formula F-c below may be utilized as fluorescence dopant materials.

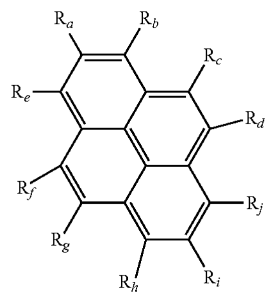

In Formula F-a, two groups selected from $R_a$ to $R_j$ may be each independently substituted with —* $NAr_1Ar_2$. The remainder groups among $R_a$ to $R_j$ not substituted with —* $NAr_1Ar_2$ may be each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In —* $NAr_1Ar_2$, $Ar_1$ and $Ar_2$ may be each independently a substituted or unsubstituted aryl group having 6 to 30 ring-forming carbon atoms, or a substituted or unsubstituted heteroaryl group having 2 to 30 ring-forming carbon atoms. For example, $Ar_1$ and/or $Ar_2$ may be a heteroaryl group including O or S as a ring-forming atom.

Formula F-b

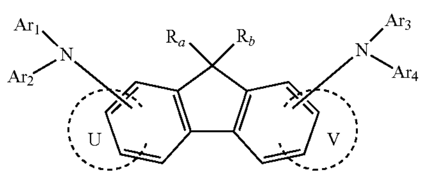

In Formula F-b, $R_a$ and $R_b$ may be each independently a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be combined with an adjacent group to form a ring.

In Formula F-b, U and V may be each independently a substituted or unsubstituted hydrocarbon ring of 5 to 30 ring-forming carbon atoms, or a substituted or unsubstituted heterocycle of 2 to 30 ring-forming carbon atoms.

In Formula F-b, the number of rings represented by U and V may be each independently 0 or 1. For example, in Formula F-b, when the number of U or V is 1, it represents that one ring forms a fused ring at the part designated by U or V, and when the number of U or V is 0, a ring designated as U or V is not present. For example, when the number of U is 0, and the number of V is 1, or when the number of U is 1, and the number of V is 0, a fused ring having the fluorene core of Formula F-b may be a cyclic (e.g., ring) compound with four rings. In addition, when the number of both U and V is each 0, the fused ring of Formula F-b may be a cyclic (e.g., ring) compound with three rings. In addition, when the number of both U and V is each 1, a fused ring having the fluorene core of Formula F-b may be a cyclic (e.g., ring) compound with five rings.

Formula F-c

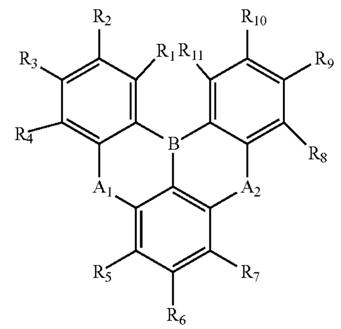

In Formula F-c, $A_1$ and $A_2$ may be each independently O, S, Se, or $NR_m$, and $R_m$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $R_1$ to $R_{11}$ are each independently a hydrogen atom, a deuterium atom, a halogen atom, a cyano group, a substituted or unsubstituted amine group, a substituted or unsubstituted boron group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or combined with an adjacent group to form a ring.

In Formula F-c, $A_1$ and $A_2$ may be each independently combined with the substituents of an adjacent ring to form a fused ring. For example, when $A_1$ and $A_2$ are each independently $NR_m$, $A_1$ may be combined with $R_4$ or $R_5$ to form a ring. In addition, $A_2$ may be combined with $R_7$ or $R_8$ to form a ring.

In an embodiment, the emission layer EML may include as a suitable (e.g., known) dopant material, styryl derivatives (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), N-(4-((E)-2-(6-((E)-4-(diphenylamino)styryl)naphthalen-2-yl)vinyl)phenyl)-N-phenylbenzenamine (N-BDAVBi), and/or 4,4'-bis[2-(4-(N,N-diphenylamino)phenyl)vinyl]biphenyl (DPAVBi)), perylene and the derivatives thereof (for example, 2,5,8,11-tetra-t-butylperylene (TBP)), pyrene and the derivatives thereof (for example, 1,1-dipyrene, 1,4-dipyrenylbenzene, and/or 1,4-bis(N,N-diphenylamino)pyrene), etc.

The emission layer EML may include any suitable (e.g., known) phosphorescence dopant material. For example, the phosphorescence dopant may use a metal complex including iridium (Ir), platinum (Pt), osmium (Os), gold (Au), titanium (Ti), zirconium (Zr), hafnium (Hf), europium (Eu), terbium (Tb) or thulium (Tm). For example, iridium (III) bis(4,6-difluorophenylpyridinato-N,C2')picolinate (FIrpic), bis(2,4-difluorophenylpyridinato)-tetrakis(1-pyrazolyl)borate iridium (III) (Fir6), and/or platinum octaethyl porphyrin (PtOEP) may be utilized as the phosphorescence dopant. However, the present disclosure is not limited thereto.

The emission layer EML may include a quantum dot material. The core of the quantum dot may be selected from a Group II-VI compound, a Group III-VI compound, a Group I-III-VI compound, a Group III-V compound, a Group III-II-V compound, a Group IV-VI compound, a Group IV element, a Group IV compound, and combinations thereof.

The Group II-VI compound may be selected from the group consisting of: a binary compound selected from the group consisting of CdSe, CdTe, CdS, ZnS, ZnSe, ZnTe, ZnO, HgS, HgSe, HgTe, MgSe, MgS, and mixtures thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

The Group III-V compound may include a binary compound such as $In_2S_3$, and/or $In_2Se_3$, a ternary compound such as $InGaS_3$, and/or $InGaSe_3$, or a combination thereof.

The Group I-III-VI compound may be selected from a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$ and mixtures thereof, and/or a quaternary compound such as $AgInGaS_2$, and/or $CuInGaS_2$.

The Group III-V compound may be selected from the group consisting of a binary compound selected from the group consisting of GaN, GaP, GaAs, GaSb, AlN, AlP, AlAs, AlSb, InN, InP, InAs, InSb, and mixtures thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and mixtures thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof. In one or more embodiments, the Group III-V compound may further include a Group II metal. For example, InZnP, etc. may be selected as a Group III-II-V compound.

The Group IV-VI compound may be selected from the group consisting of a binary compound selected from the group consisting of SnS, SnSe, SnTe, PbS, PbSe, PbTe, and mixtures thereof, a ternary compound selected from the group consisting of SnSeS, SnSeTe, SnSTe, PbSeS, PbSeTe, PbSTe, SnPbS, SnPbSe, SnPbTe, and mixtures thereof, and a quaternary compound selected from the group consisting of SnPbSSe, SnPbSeTe, SnPbSTe, and mixtures thereof. The Group IV element may be selected from the group consisting of Si, Ge, and a mixture thereof. The Group IV compound may be a binary compound selected from the group consisting of SiC, SiGe, and a mixture thereof.

In one or more embodiments, the binary compound, the ternary compound or the quaternary compound may be present at a uniform concentration in a particle or may be present at a partially different concentration distribution state in the same particle. In addition, the quantum dot may have a core/shell structure in which one quantum dot wraps (e.g., wraps around or surrounds) another quantum dot. The interface of the core and the shell may have a concentration gradient in which the concentration of an element present in the shell is decreased toward the center of the core.

In some embodiments, the quantum dot may have the above-described core-shell structure including a core including a nanocrystal and a shell surrounding the core. The shell of the quantum dot may serve as (e.g., play the role of) a protection layer for preventing or reducing the chemical deformation of the core to maintain semiconductor properties, and/or serve as a charging layer for imparting the quantum dot with electrophoretic properties. The shell may have a single layer or a multilayer. Examples of the shell of the quantum dot may include a metal oxide, a non-metal oxide, a semiconductor compound, or a combination thereof.

For example, the metal oxide and/or non-metal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$ and/or NiO, and/or a ternary compound such as $MgAl_2O_4$, $CoFe_2O_4$, $NiFe_2O_4$ and/or $CoMn_2O_4$, but the present disclosure is not limited thereto.

Also, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but the present disclosure is not limited thereto.

The quantum dot may have a full width at half maximum (FWHM) of the light emission wavelength spectrum of about 45 nm or less, about 40 nm or less, or about 30 nm or less. Within these ranges, color purity and/or color reproducibility may be improved. In addition, light emitted via such quantum dot is emitted in all directions, and thus a wide viewing angle may be obtained.

In addition, the shape of the quantum dot may be any suitable generally utilized shapes in the art, without specific limitation. For example, the quantum dot may have the shape of spherical, pyramidal, multi-arm, and/or cubic nanoparticle, nanotube, nanowire, nanofiber, nanoplate particle, etc.

The quantum dot may control the color of light emitted according to the particle size, and accordingly, the quantum dot may have various suitable emission colors such as blue, red and/or green.

In each light emitting device ED of an embodiment, as shown in FIG. 3 to FIG. 6, the electron transport region ETR is provided on the emission layer EML. The electron transport region ETR may include at least one of an electron blocking layer HBL, an electron transport layer ETL or an electron injection layer EIL. However, the present disclosure is not limited thereto.

The electron transport region ETR may have a single layer formed utilizing a single material, a single layer formed utilizing multiple different materials, or a multilayer structure having multiple layers formed utilizing multiple different materials.

For example, the electron transport region ETR may have a single layer structure of an electron injection layer EIL or an electron transport layer ETL, or a single layer structure formed utilizing an electron injection material and an electron transport material. Further, the electron transport region ETR may have a single layer structure formed utilizing multiple different materials, or a structure of electron transport layer ETL/electron injection layer EIL, or hole blocking layer HBL/electron transport layer ETL/electron injection layer EIL, each stacked from the emission layer EML in the respective stated order. However, the present disclosure is not limited thereto. The thickness of the electron transport region ETR may be, for example, from about 1,000 Å to about 1,500 Å.

The electron transport region ETR may be formed utilizing various suitable methods such as a vacuum deposition method, a spin coating method, a cast method, a Langmuir-Blodgett (LB) method, an inkjet printing method, a laser printing method, and/or a laser induced thermal imaging (LITI) method.

The electron transport region ETR may include a compound represented by Formula ET-1 below.

Formula ET-1

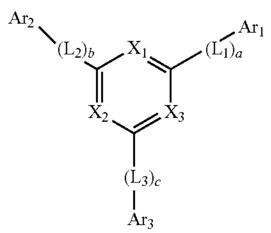

In Formula ET-1, at least one among $X_1$ to $X_3$ is N, and the remainder ones are each $CR_a$. $R_a$ may be a hydrogen atom, a deuterium atom, a substituted or unsubstituted alkyl of 1 to 20 carbon atoms, a substituted or unsubstituted aryl group having 6 to 30 ring-forming carbon atoms, or a substituted or unsubstituted heteroaryl group having 2 to 30 ring-forming carbon atoms. $Ar_1$ to $Ar_3$ may be each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula ET-1, "a" to "c" may be each independently an integer of 0 to 10. In Formula ET-1, $L_1$ to $L_3$ may be each independently a direct linkage, a substituted or unsubstituted arylene group having 6 to 30 ring-forming carbon atoms, or a substituted or unsubstituted heteroarylene group having 2 to 30 ring-forming carbon atoms. In one or more embodiments, when "a" to "c" are integers of 2 or more, $L_1$ to $L_3$ may be each independently a substituted or unsubstituted arylene group having 6 to 30 ring-forming carbon atoms, or a substituted or unsubstituted heteroarylene group having 2 to 30 ring-forming carbon atoms.

The electron transport region ETR may include an anthracene-based compound. However, the present disclosure is not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate ($Bebq_2$), 9,10-di(naphthalene-2-yl) anthracene (ADN), 1,3-bis[3,5-di(pyridin-3-yl)phenyl] benzene (BmPyPhB), or a mixture thereof.

The electron transport region ETR may include at least one selected from among Compounds ET1 to ET36 below.

ET1

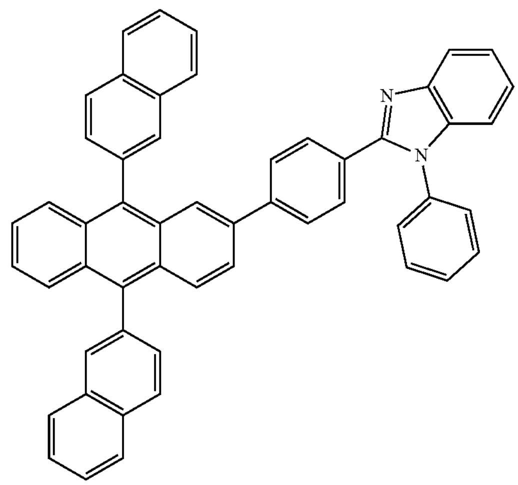

ET2

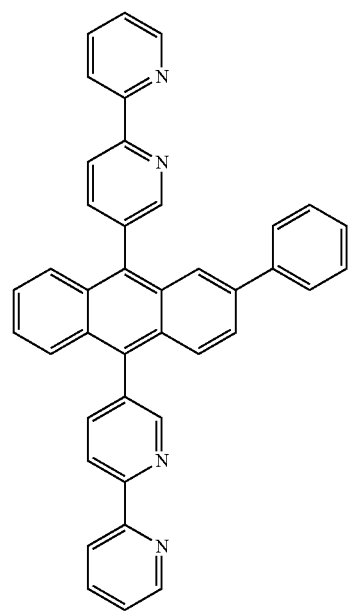

ET3

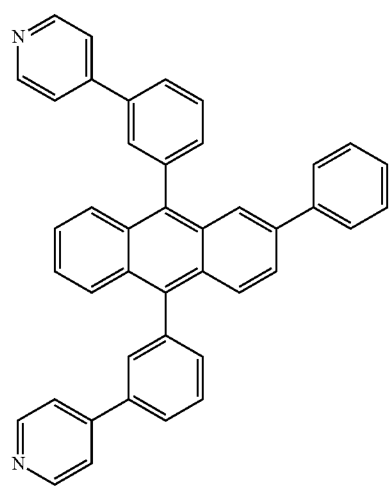

-continued
ET4
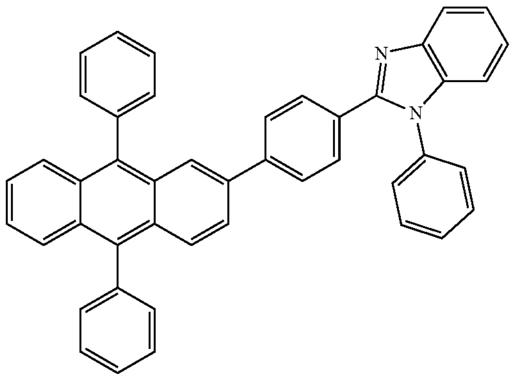
ET5
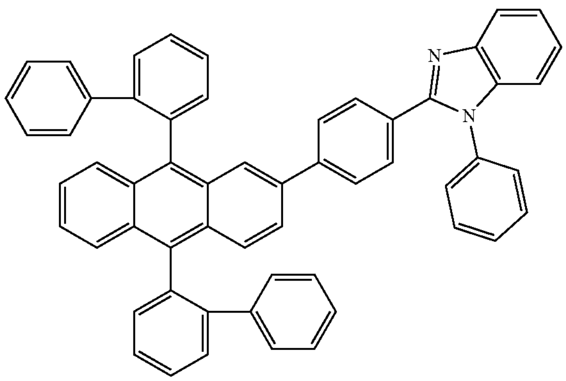
ET6
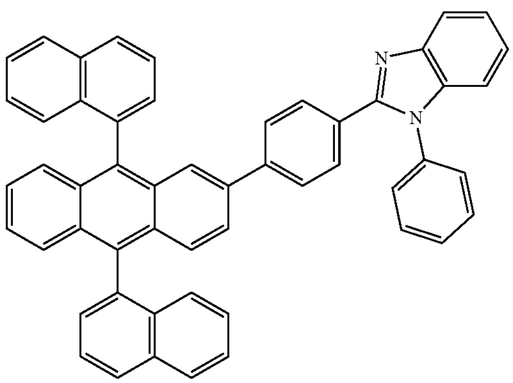
ET7
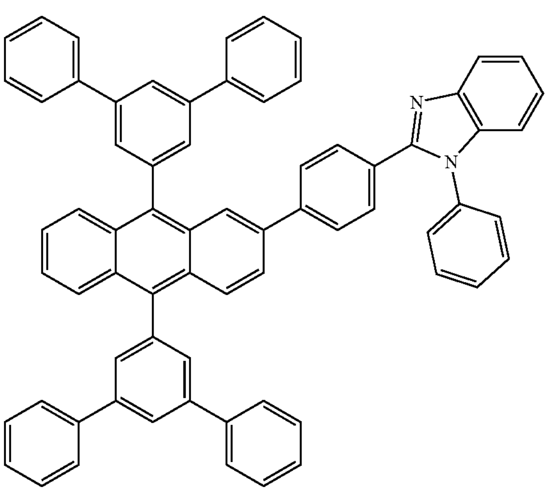
-continued
ET8
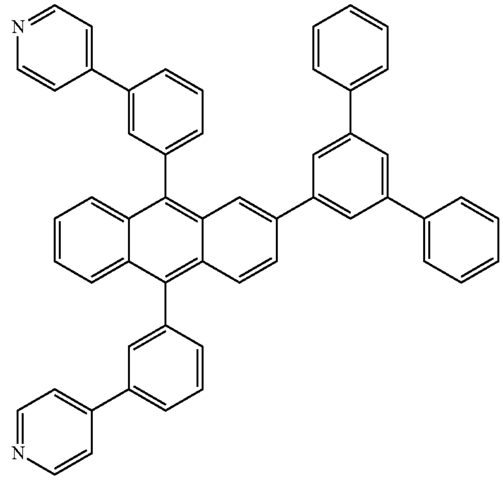
ET9
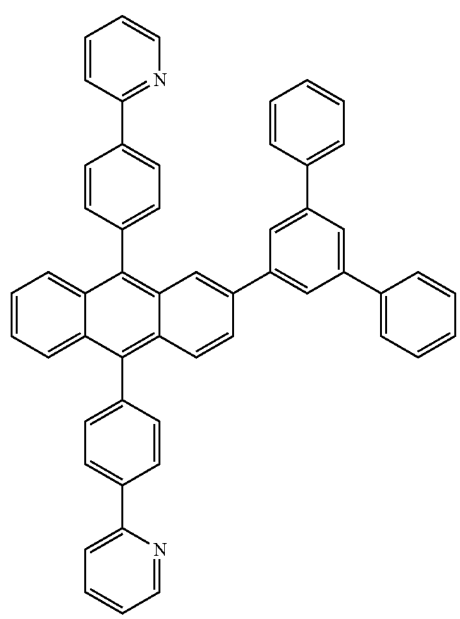

-continued
ET10
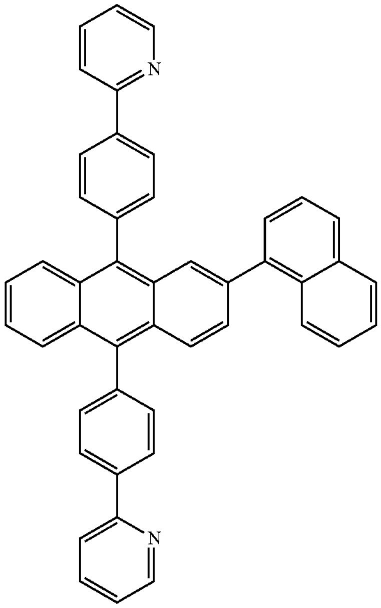
ET11
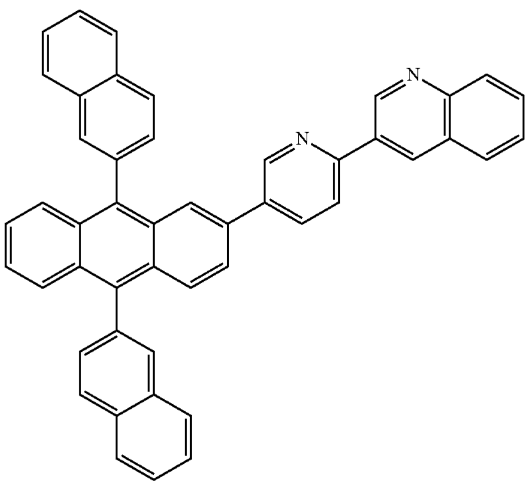
ET12
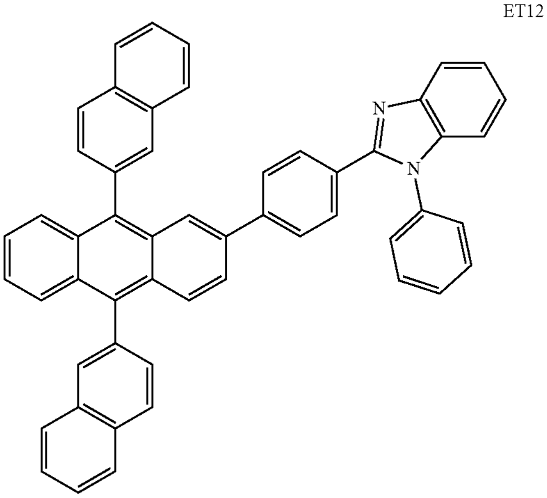
-continued
ET13
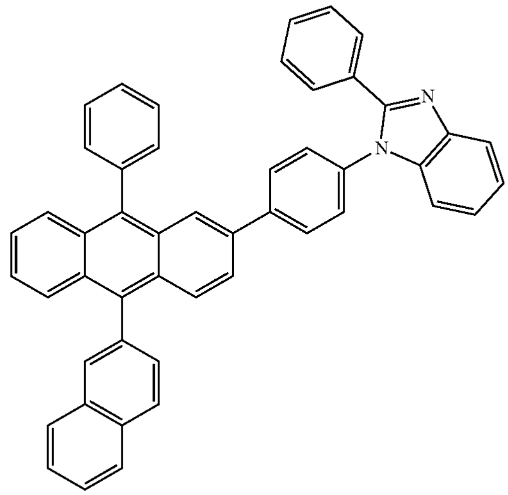
ET14
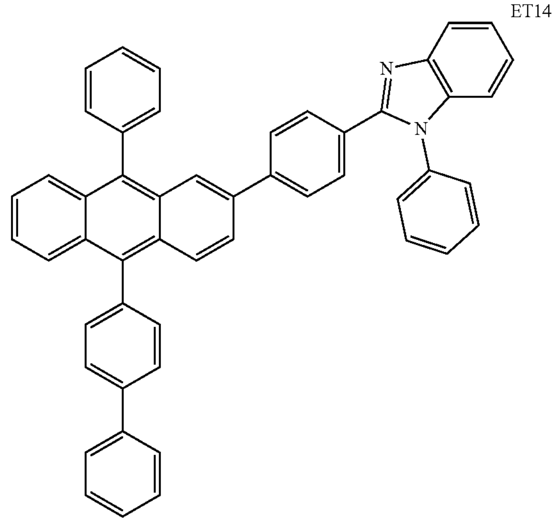
ET15
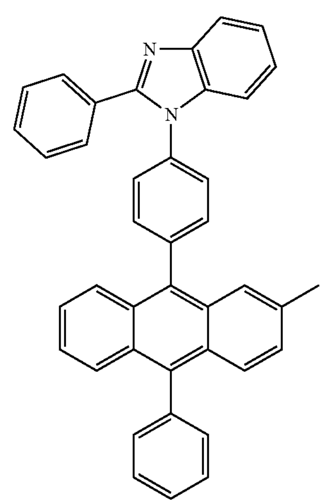

-continued
ET16
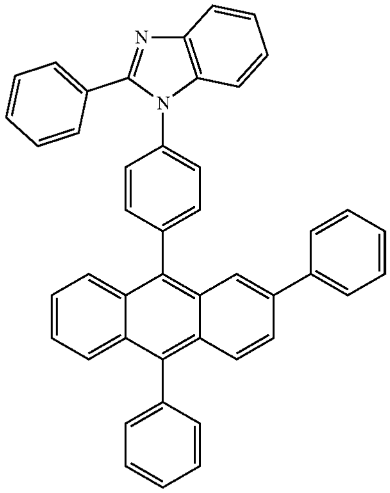
ET17
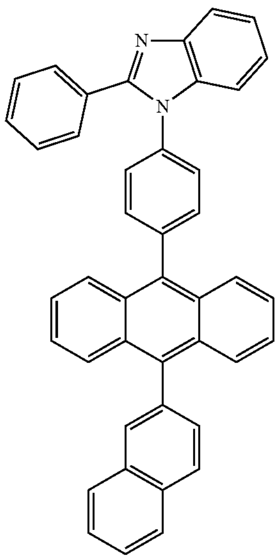
ET18
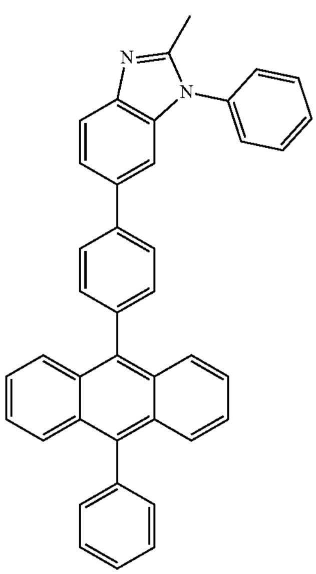
-continued
ET19
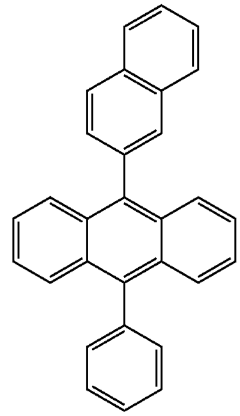
ET20
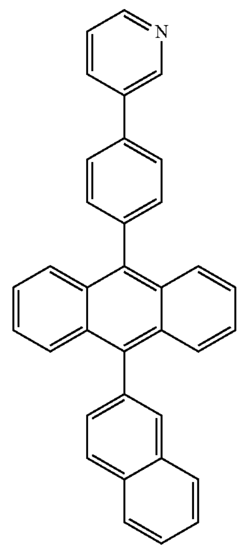
ET21
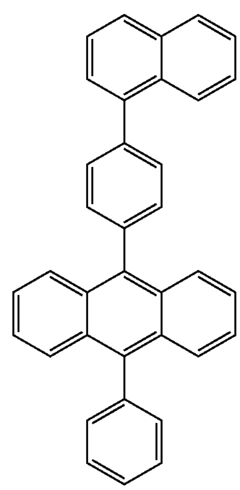

-continued
ET22
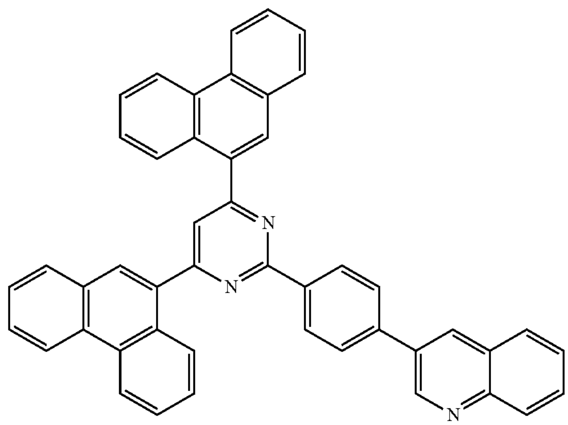
ET23
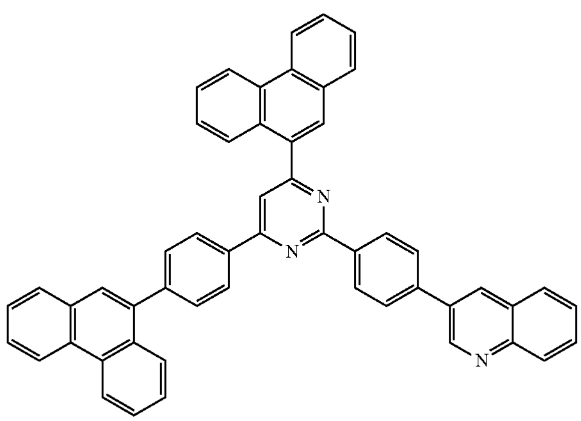
ET24
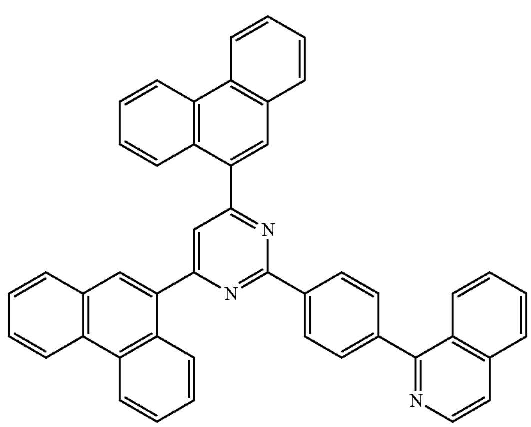
-continued
ET25
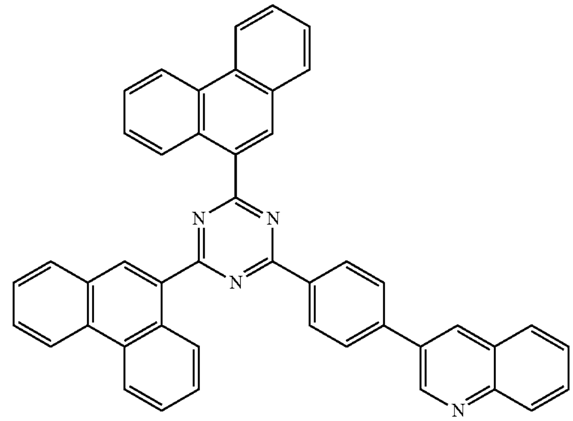
ET26
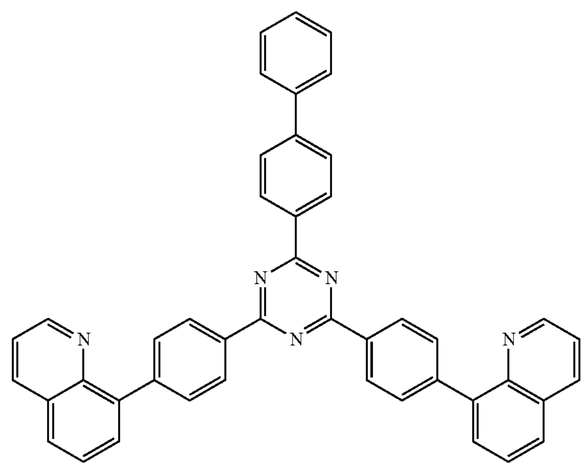
ET27
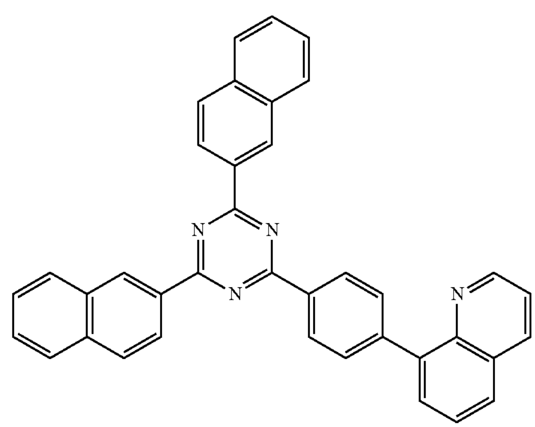

-continued
ET28
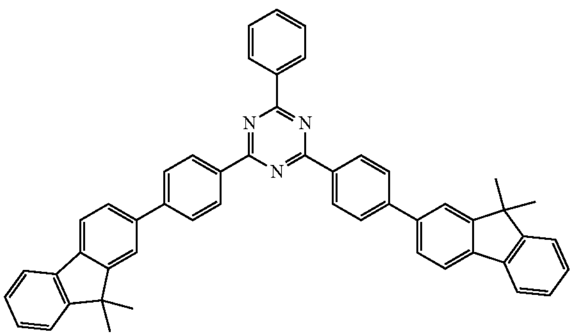
ET29
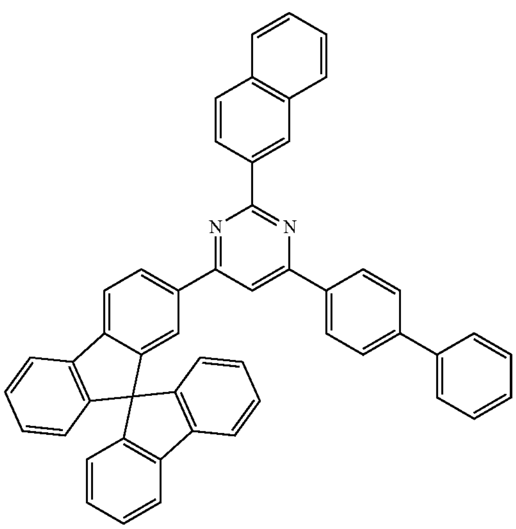
ET30
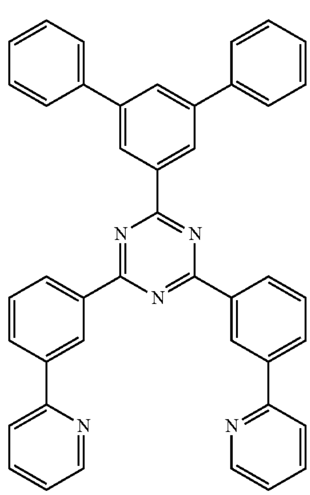
-continued
ET31
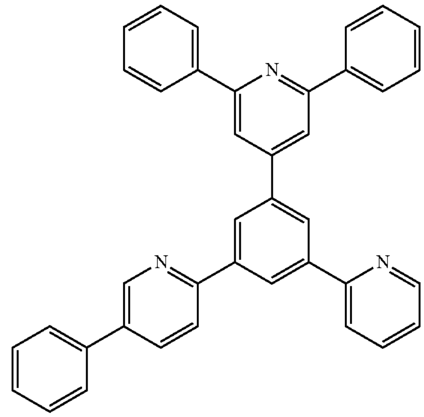
ET32
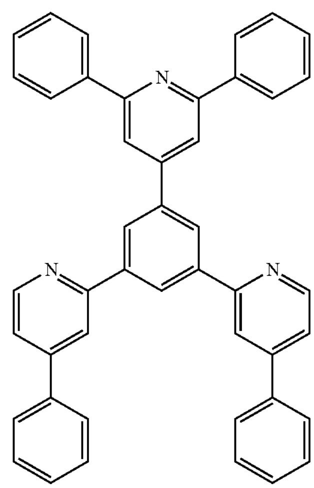
ET33
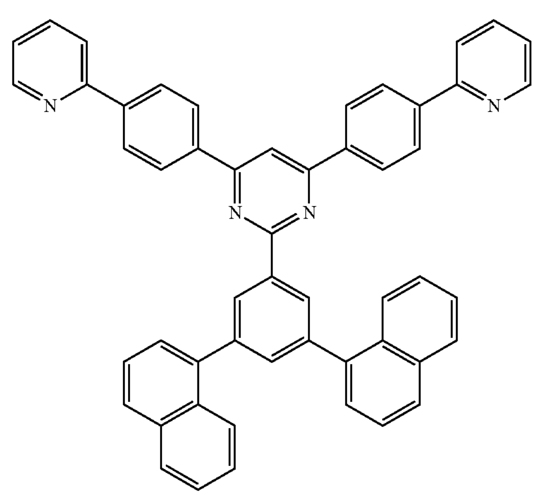

-continued

ET34

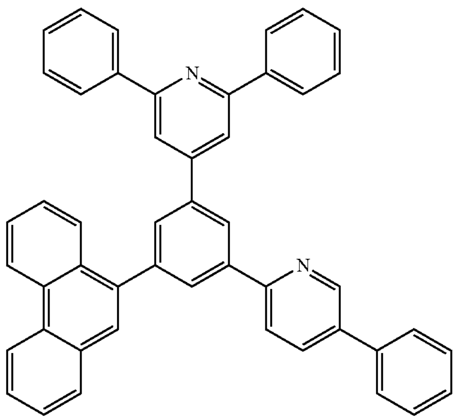

ET35

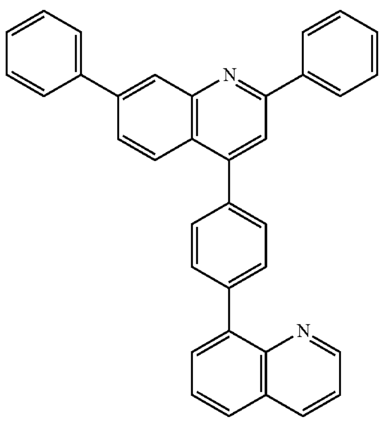

ET36

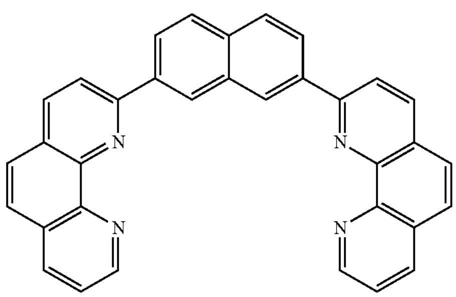

In addition, the electron transport region ETR may include a metal halide such as LiF, NaCl, CsF, RbCl, RbI, CuI, and/or KI, a lanthanide metal such as Yb, or a co-deposited material of the metal halide and the lanthanide metal. For example, the electron transport region ETR may include KI:Yb, RbI:Yb, etc., as the co-deposited material. In one or more embodiments, the electron transport region ETR may utilize a metal oxide such as $Li_2O$ and/or BaO, and/or 8-hydroxy-lithium quinolate (Liq). However, the present disclosure is not limited thereto. The electron transport region ETR may also be formed utilizing a mixture material of an electron transport material and an insulating organo metal (e.g., organometallic) salt. The organo metal salt may be a material having an energy band gap of about 4 eV or more. In one or more embodiments, the organo metal salt may include, for example, metal acetates, metal benzoates, metal acetoacetates, metal acetylacetonates, and/or metal stearates.

The electron transport region ETR may further include at least one of 2,9-dimethyl-4,7-diphenyl-1,10-phenanthroline (BCP), or 4,7-diphenyl-1,10-phenanthroline (Bphen) in addition to the aforementioned materials. However, the present disclosure is not limited thereto.

The electron transport region ETR may include the compounds of the electron transport region in at least one among an electron injection layer EIL, an electron transport layer ETL, and a hole blocking layer HBL.

When the electron transport region ETR includes the electron transport layer ETL, the thickness of the electron transport layer ETL may be from about 100 Å to about 1,000 Å, for example, from about 150 Å to about 500 Å. When the thickness of the electron transport layer ETL satisfies the above-described ranges, satisfactory electron transport properties may be obtained without a substantial increase of a driving voltage. When the electron transport region ETR includes the electron injection layer EIL, the thickness of the electron injection layer EIL may be from about 1 Å to about 100 Å, or from about 3 Å to about 90 Å. When the thickness of the electron injection layer EIL satisfies the above described ranges, satisfactory electron injection properties may be obtained without inducing substantial increase of the driving voltage.

The second electrode EL2 is provided on the electron transport region ETR. The second electrode EL2 may be a common electrode. The second electrode EL2 may be a cathode or an anode, but the present disclosure is not limited thereto. For example, when the first electrode EL1 is an anode, the second cathode EL2 may be a cathode, and when the first electrode EL1 is a cathode, the second electrode EL2 may be an anode.

The second electrode EL2 may be a transmissive electrode, a transflective electrode or a reflective electrode. When the second electrode EL2 is the transmissive electrode, the second electrode EL2 may include a transparent metal oxide, for example, ITO, IZO, ZnO, ITZO, etc.

When the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, In, Zn, Sn, a compound thereof, or a mixture thereof (for example, AgMg, AgYb, and/or MgAg). In one or more embodiments, the second electrode EL2 may have a multilayered structure including a reflective layer or a transflective layer formed utilizing the above-described materials and a transparent conductive layer formed utilizing ITO, IZO, ZnO, ITZO, etc. For example, the second electrode EL2 may include the aforementioned metal materials, combinations of two or more metal materials selected from the aforementioned metal materials, and/or oxides of the aforementioned metal materials.

In one or more embodiments, the second electrode EL2 may be connected with an auxiliary electrode. When the second electrode EL2 is connected with the auxiliary electrode, the resistance of the second electrode EL2 may decrease.

In one or more embodiments, a capping layer CPL may be further disposed on the second electrode EL2 in the light emitting device ED of an embodiment. The capping layer CPL may include a multilayer or a single layer.

In an embodiment, the capping layer CPL may be an organic layer or an inorganic layer. For example, when the capping layer CPL includes an inorganic material, the inorganic material may include an alkali metal compound such as LiF, and/or an alkaline earth metal compound such as $MgF_2$, SiON, SiNx, SiOy, etc.

For example, when the capping layer CPL includes an organic material, the organic material may include α-NPD, NPB, TPD, m-MTDATA, $Alq_3$, CuPc, N4,N4,N4',N4'-tetra (biphenyl-4-yl) biphenyl-4,4'-diamine (TPD15), 4,4',4"-tris (carbazol sol-9-yl) triphenylamine (TCTA), etc., an epoxy resin, and/or an acrylate such as methacrylate. In addition, a capping layer CPL may include at least one selected from among Compounds P1 to P5 below, but the present disclosure is not limited thereto.

P1

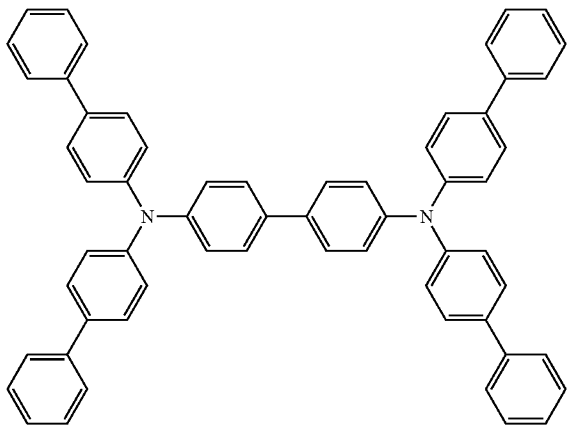

P2

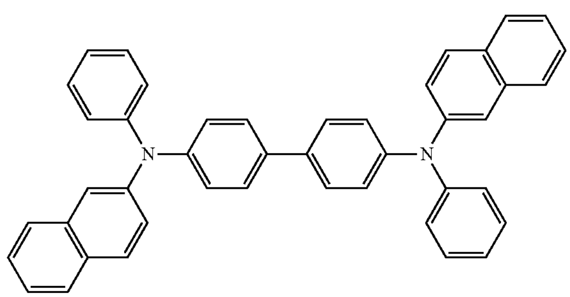

P3

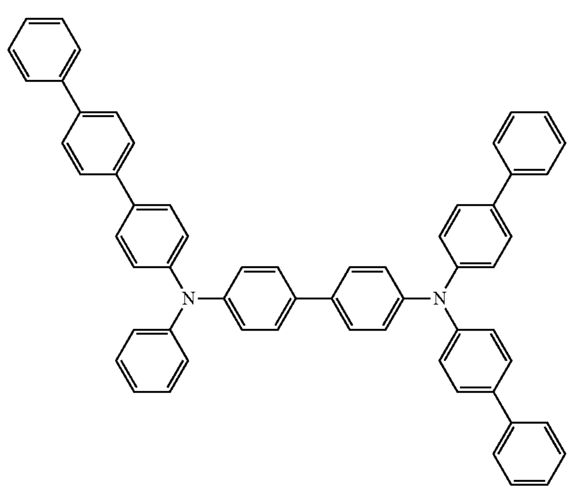

-continued

P4

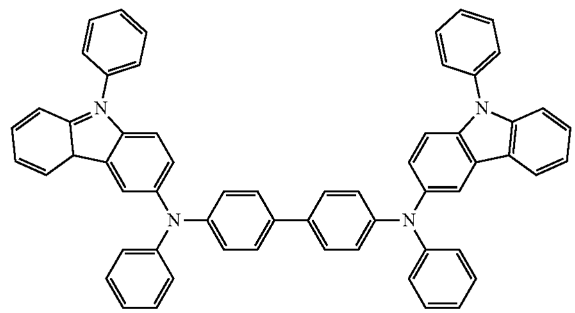

P5

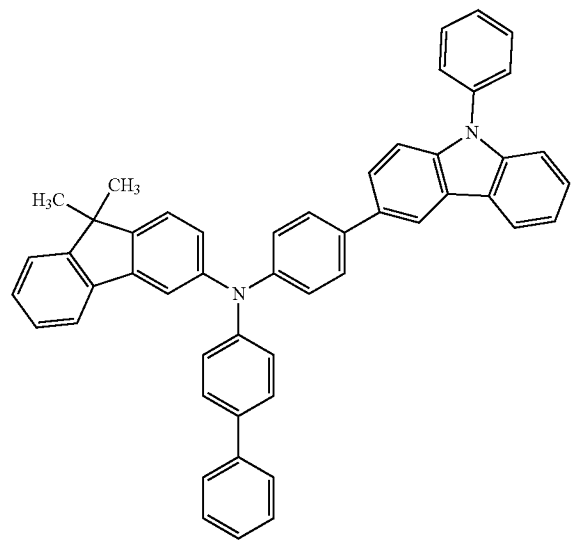

In one or more embodiments, the refractive index of the capping layer CPL may be about 1.6 or more. For example, the refractive index of the capping layer CPL with respect to light in a wavelength range of about 550 nm to about 660 nm may be about 1.6 or more.

Figure 7:
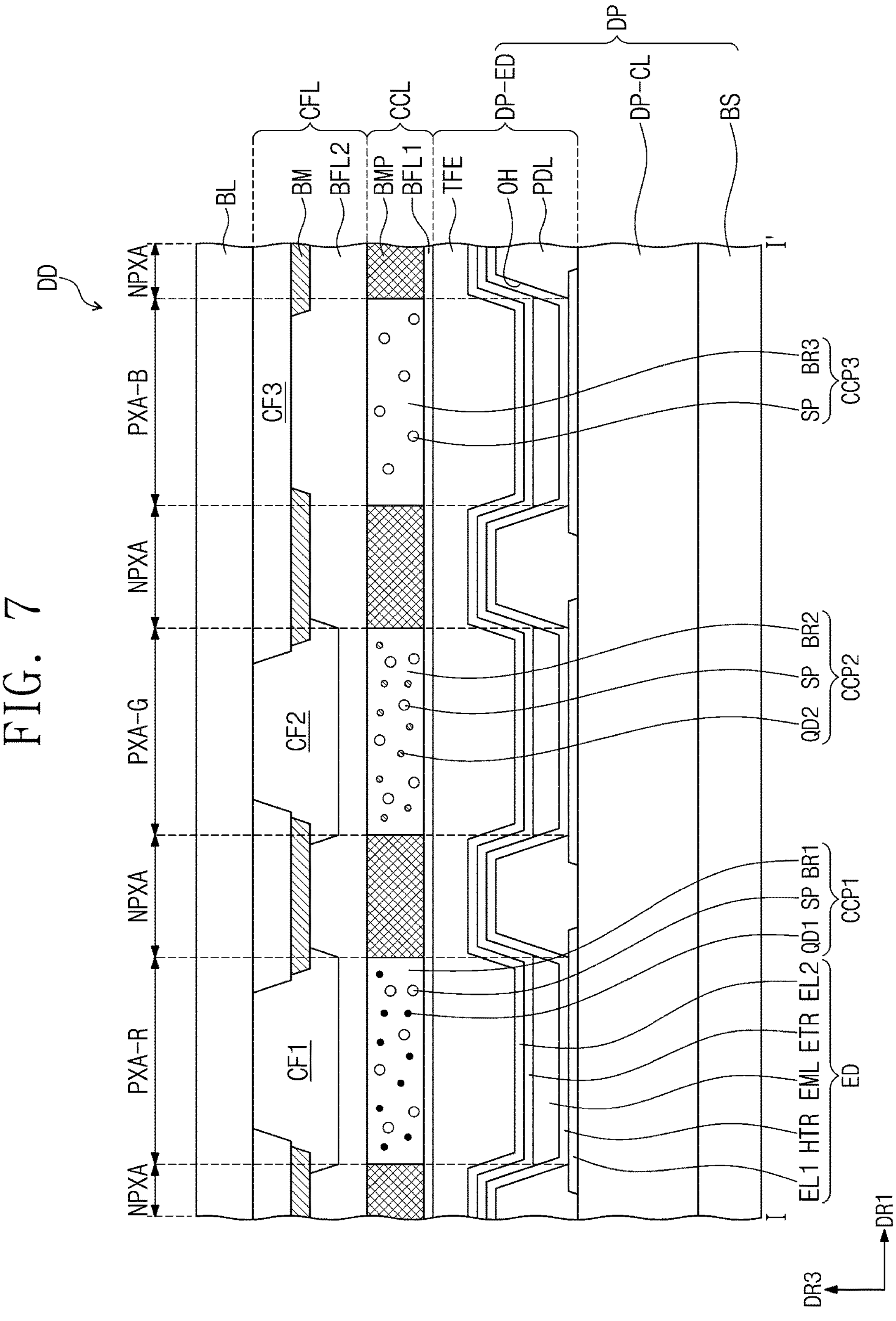
FIG. 7 is a cross-sectional view of a display apparatus according to an embodiment of the present disclosure.
Figure 8:
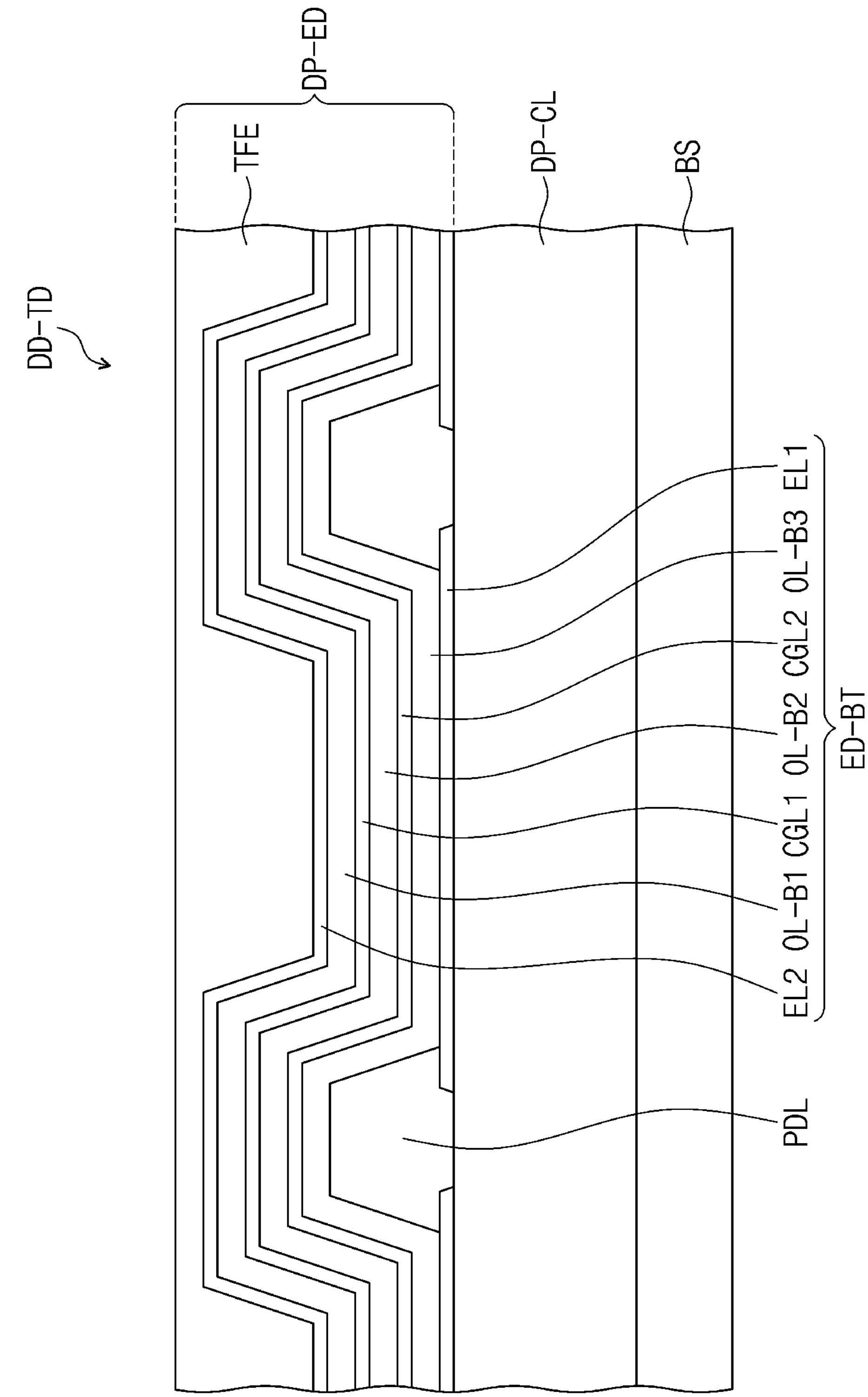
FIG. 8 is a cross-sectional view of a display apparatus according to an embodiment of the present disclosure.

FIG. 7 and FIG. 8 are each a cross-sectional view of a display apparatus according to a respective embodiment. In the explanation on the display apparatuses of embodiments with reference to FIG. 7 and FIG. 8, the overlapping parts with the explanation on FIG. 1 to FIG. 6 will not be explained again, and the different features will be mainly explained.

Referring to FIG. 7, the display apparatus DD according to an embodiment may include a display panel DP including a display device layer DP-ED, a light controlling layer CCL disposed on the display panel DP and a color filter layer CFL.

In an embodiment shown in FIG. 7, the display panel DP includes a base layer BS, a circuit layer DP-CL provided on the base layer BS and a display device layer DP-ED, and the display device layer DP-ED may include a light emitting device ED.

The light emitting device ED may include a first electrode EL1, a hole transport region HTR disposed on the first electrode EL1, an emission layer EML disposed on the hole transport region HTR, an electron transport region ETR disposed on the emission layer EML, and a second electrode EL2 disposed on the electron transport region ETR. In one or more embodiments, the same structures of the light emitting devices of FIG. 3 to FIG. 6 as described above may be applied to the structure of the light emitting device ED shown in FIG. 7.

Referring to FIG. 7, the emission layer EML may be disposed in an opening part OH defined in a pixel definition layer PDL. For example, the emission layer EML divided by the pixel definition layer PDL and correspondingly provided to each of the luminous areas PXA-R, PXA-G, and PXA-B may emit light in the same wavelength region. In the display apparatus DD of an embodiment, the emission layer EML may emit blue light. In one or more embodiments, different from the drawings, in an embodiment, the emission layer EML may be provided as a common layer for all luminous areas PXA-R, PXA-G, and PXA-B.

The light controlling layer CCL may be disposed on the display panel DP. The light controlling layer CCL may include a light converter (e.g., a light conversion member). The light converter may be a quantum dot and/or a phosphor. The light converter may transform the wavelength of light provided and then emit light having a different wavelength. That is, the light controlling layer CCL may be a layer including a quantum dot and/or a layer including a phosphor.

The light controlling layer CCL may include multiple light controlling parts CCP1, CCP2 and CCP3. The light controlling parts CCP1, CCP2 and CCP3 may be separated from one another.

Referring to FIG. 7, a partition pattern BMP may be disposed between the separated light controlling parts CCP1, CCP2 and CCP3, but the present disclosure is not limited thereto. In FIG. 7, the partition pattern BMP is shown to not overlap with the light controlling parts CCP1, CCP2 and CCP3, but in one or more embodiments, at least a portion of the edge of the light controlling parts CCP1, CCP2 and CCP3 may overlap with the partition pattern BMP.

The light controlling layer CCL may include a first light controlling part CCP1 including a first quantum dot QD1 to convert a first color light provided from the light emitting device ED into a second color light, a second light controlling part CCP2 including a second quantum dot QD2 to convert the first color light into a third color light, and a third light controlling part CCP3 to transmit the first color light.

In an embodiment, the first light controlling part CCP1 may provide red light as the second color light, and the second light controlling part CCP2 may provide green light as the third color light. The third color controlling part CCP3 may transmit and provide blue light as the first color light provided from the light emitting device ED. For example, the first quantum dot QD1 may be a red quantum dot (e.g., a red-light emitting quantum dot), and the second quantum dot QD2 may be a green quantum dot (e.g., a green-light emitting quantum dot). The same contents as those described above may be applied to quantum dots QD1 and QD2.

In addition, the light controlling layer CCL may further include a scatterer SP. The first light controlling part CCP1 may include the first quantum dot QD1 and the scatterer SP, the second light controlling part CCP2 may include the second quantum dot QD2 and the scatterer SP, and the third light controlling part CCP3 may not include a quantum dot but include the scatterer SP.

The scatterer SP may be an inorganic particle. For example, the scatterer SP may include at least one selected from among $TiO_2$, ZnO, $Al_2O_3$, $SiO_2$, and hollow silica. The scatterer SP may include at least one selected from among $TiO_2$, ZnO, $Al_2O_3$, $SiO_2$, and hollow silica, or may be a mixture of two or more materials selected from among $TiO_2$, ZnO, $Al_2O_3$, $SiO_2$, and hollow silica.

The first light controlling part CCP1, the second light controlling part CCP2, and the third light controlling part CCP3 may respectively include base resins BR1, BR2 and BR3 to disperse the quantum dots QD1 and QD2 and the scatterer SP. In an embodiment, the first light controlling part CCP1 may include the first quantum dot QD1 and the scatterer SP dispersed in the first base resin BR1, the second light controlling part CCP2 may include the second quantum dot QD2 and the scatterer SP dispersed in the second base resin BR2, and the third light controlling part CCP3 may include the scatterer particle SP dispersed in the third base resin BR3. The base resins BR1, BR2 and BR3 are mediums in which the quantum dots QD1 and QD2 and the scatterer SP are dispersed, and may be composed of various suitable resin compositions which may be generally referred to as a binder. For example, the base resins BR1, BR2 and BR3 may be acrylic resins, urethane-based resins, silicone-based resins, epoxy-based resins, etc. The base resins BR1, BR2 and BR3 may be transparent resins. In an embodiment, the first base resin BR1, the second base resin BR2 and the third base resin BR3 may be the same as or different from each other.

The light controlling layer CCL may include a barrier layer BFL1. The barrier layer BFL1 may play the role of blocking (e.g., may serve to block) the penetration of moisture and/or oxygen (hereinafter, will be referred to as "humidityloxygen"). The barrier layer BFL1 may be disposed on the light controlling parts CCP1, CCP2 and CCP3 to block the exposure of the light controlling parts CCP1, CCP2 and CCP3 to humidity/oxygen. In one or more embodiments, the barrier layer BFL1 may cover the light controlling parts CCP1, CCP2 and CCP3. In addition, the barrier layer BFL2 may be provided between the light controlling parts CCP1, CCP2 and CCP3 and the color filter layer CFL.

The barrier layers BFL1 and BFL2 may include at least one inorganic layer. That is, the barrier layers BFL1 and BFL2 may be formed by including (e.g., formed utilizing) an inorganic material. For example, the barrier layers BFL1 and BFL2 may be formed by including silicon nitride, aluminum nitride, zirconium nitride, titanium nitride, hafnium nitride, tantalum nitride, silicon oxide, aluminum oxide, titanium oxide, tin oxide, cerium oxide and/or silicon oxynitride and/or a metal thin film with a suitable light transmittance. In one or more embodiments, the barrier layers BFL1 and BFL2 may further include an organic layer. The barrier layers BFL1 and BFL2 may be composed of a single layer or multiple layers.

In the display apparatus DD of an embodiment, the color filter layer CFL may be disposed on the light controlling layer CCL. For example, the color filter layer CFL may be disposed directly on the light controlling layer CCL. In one or more embodiments, the barrier layer BFL2 may be omitted.

The color filter layer CFL may include a light blocking part BM and filters CF-1, CF-2 and CF-3. The color filter layer CFL may include a first filter CF1 configured to transmit the second color light, a second filter CF2 configured to transmit the third color light, and a third filter CF3 configured to transmit the first color light. For example, the first filter CF1 may be a red filter, the second filter CF2 may be a green filter, and the third filter CF3 may be a blue filter. Each of the filters CF1, CF2 and CF3 may include a polymeric photosensitive resin and a pigment and/or dye. The first filter CF1 may include a red pigment and/or dye, the second filter CF2 may include a green pigment and/or dye, and the third filter CF3 may include a blue pigment and/or dye. However, the present disclosure is not limited thereto, and the third filter CF3 may not include the pigment and/or dye. The third filter CF3 may include a polymeric photosensitive resin and may not include a pigment and/or dye. The third filter CF3 may be transparent. The third filter CF3 may be formed utilizing a transparent photosensitive resin.

In addition, in an embodiment, the first filter CF1 and the second filter CF2 may each be a yellow filter. The first filter CF1 and the second filter CF2 may be provided as one filter without distinction (e.g., without being separated to distinct filers).

The light blocking part BM may be a black matrix. The light blocking part BM may be formed by including an organic light blocking material and/or an inorganic light blocking material including a black pigment and/or black dye. The light blocking part BM may prevent or reduce light leakage and divide (e.g., separate) the boundaries among adjacent filters CF1, CF2 and CF3. In addition, in an embodiment, the light blocking part BM may be formed of a blue filter.

The first to third filters CF1, CF2 and CF3 may be disposed to correspond to the red luminous area PXA-R, the green luminous area PXA-G, and the blue luminous area PXA-B respectively.

On the color filter layer CFL, an upper base layer BL may be disposed. The upper base layer BL may be a member providing a base surface on which the color filter layer CFL, the light controlling layer CCL, etc. are disposed. The upper base layer BL may be a glass substrate, a metal substrate, a plastic substrate, etc. However, the present disclosure is not limited thereto, and the upper base layer BL may be an inorganic layer, an organic layer, or a composite material layer. In an embodiment, different from the drawing, the upper base layer BL may be omitted.

FIG. 8 is a cross-sectional view showing a portion of the display apparatus according to an embodiment. In FIG. 8, the cross-sectional view corresponds to the portion of the display panel DP shown in FIG. 7. In a display apparatus DD-TD of an embodiment, the light emitting device ED-BT may include multiple light emitting structures OL-B1, OL-B2 and OL-B3. The light emitting device ED-BT may include oppositely disposed first electrode EL1 and second electrode EL2, and the multiple light emitting structures OL-B1, OL-B2 and OL-B3 sequentially stacked in the stated order in a thickness direction and provided between the first electrode EL1 and the second electrode EL2. Each of the light emitting structures OL-B1, OL-B2 and OL-B3 may include an emission layer EML (FIG. 7), and a hole transport region HTR and an electron transport region ETR disposed with the emission layer EML (FIG. 7) therebetween.

That is, the light emitting device ED-BT included in the display apparatus DD-TD of an embodiment may be a light emitting device of a tandem structure including multiple emission layers.

In an embodiment shown in FIG. 8, light emitted from the light emitting structures OL-B1, OL-B2 and OL-B3 may all be blue light. However, the present disclosure is not limited thereto, and the wavelength regions of light emitted from the light emitting structures OL-B1, OL-B2 and OL-B3 may be different from each other. For example, the light emitting device ED-BT including the multiple light emitting structures OL-B1, OL-B2 and OL-B3, each emitting light in a different wavelength region, may emit white light.

Between neighboring light emitting structures OL-B1, OL-B2 and OL-B3, a charge generating layer CGL may be disposed. The charge generating layer CGL may include a p-type charge generating layer and/or an n-type charge generating layer.

The fused polycyclic compound of an embodiment includes a structure in which two or more quinolinoacridineon or quinolinoacridineon derivative are connected via a linker or direct linkage. Because the fused polycyclic compound according to an embodiment has a wide conjugation structure represented by Formula 1, when the fused polycyclic compound of an embodiment is utilized as a material for a light emitting device, high efficiency of the light emitting device may be achieved.

Hereinafter, the fused polycyclic compound according to an embodiment and the light emitting device of an embodiment will be explained in more detail by referring to embodiments and comparative embodiments. The embodiments below are only examples to assist the understanding of the present disclosure, and the scope of the present disclosure is not limited thereto.

Examples

1. Synthesis of Fused Polycyclic Compound

First, the synthetic method of fused polycyclic compound according to an embodiment will be explained in more detail by illustrating the synthetic methods of Compounds 2, 25, 35, 44, 50, 53, 78 and 81. In addition, the synthetic methods of the fused polycyclic compounds explained hereinafter are embodiments, and the synthetic method of the fused polycyclic compound according to an embodiment of the present disclosure is not limited to the embodiments below.

(1) Synthesis of Compound 2

Synthesis of Intermediate Compound 2-a

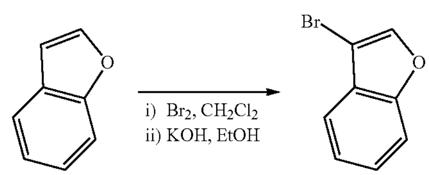

2-a

Under an argon atmosphere, in a 2 L flask, benzofuran (100 g, 1.18 mol) was dissolved in 1 L of $CH_2Cl_2$, and cooled to about 0° C. utilizing an ice-water bath. Bromine (1.1 equiv.) was slowly added thereto dropwisely, and the reaction solution was stirred for about 1 hour. To terminate the reaction, an aqueous NaOH solution was poured into the reaction vessel, and $Na_2S_2O_3$ was added thereto dropwisely. The reaction solution was extracted with $CH_2Cl_2$, organic layers were collected, dried with $MgSO_4$ and filtered. The solvent in the filtrate solution was removed under a reduced pressure to obtain a yellow solid. The solid thus obtained was dissolved again in 1 L of ethanol and cooled to about 0° C. Continuously, an aqueous KOH solution was slowly added. Then, the reaction solution was stirred and refluxed for about 12 hours and cooled. 10 mL of water was added dropwisely to the reaction solution to terminate the reaction. After cooling, water (1 L) and ethyl acetate (300 ml) were added, and extraction was performed. Organic layers were collected, dried with $MgSO_4$, and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 2-a (dark yellow liquid, 85 g, 52%). Through ESI-LCMS and $^1$H-NMR, the yellow liquid obtained was identified as Intermediate Compound 2-a.

ESI-LCMS: $[M]^+$: $C_8H_5BrO$. 195.9423.

$^1$H-NMR (400 MHz, $CDCl_3$): 8.14 (s, 1H), 7.84 (d, 1H), 7.59 (d, 1H), 7.31 (m, 2H).

Synthesis of Intermediate Compound 2-b

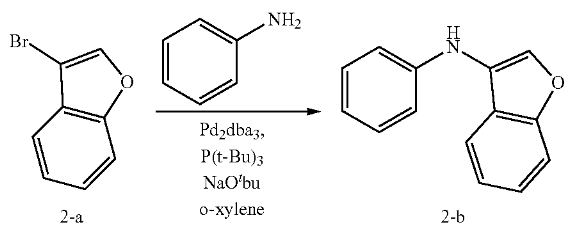

Under an argon atmosphere, to a 2 L flask, Intermediate Compound 2-a (80 g, 406 mmol), aniline (39 g, 406 mmol), tert-butyl phosphine (18 mL, 40.6 mmol), and $Pd_2dba_3$ (18 g, 20.3 mmol) were added and dissolved in 1 L of o-xylene, and the reaction solution was stirred at about 140° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 2-b (yellow solid, 70 g, 83%). Through ESI-LCMS, the yellow solid obtained was identified as Intermediate Compound 2-b.

ESI-LCMS: $[M]^+$: $C_{14}H_{11}NO$. 209.1124.

Synthesis of Intermediate Compound 2-c

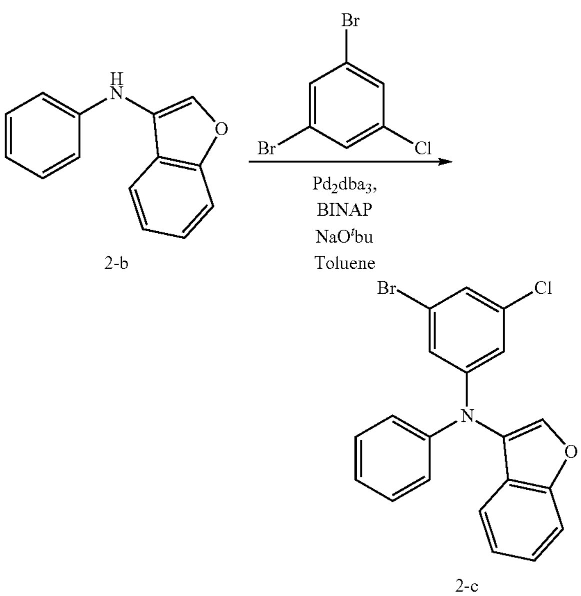

Under an argon atmosphere, to a 2 L flask, Intermediate Compound 2-b (70 g, 334 mmol), 3,5-dibromo-chlorobenzene (90 g, 334 mmol), BINAP (20 g, 33.4 mmol), and $Pd_2dba_3$ (15 g, 16.7 mmol) were added and dissolved in 1 L of toluene, and the reaction solution was stirred at about 100° C. for about 15 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 2-c (white solid, 69 g, 52%).

ESI-LCMS: $[M]^+$: $C_{20}H_{13}NOBrCl$. 209.1124.

Synthesis of Intermediate Compound 2-d

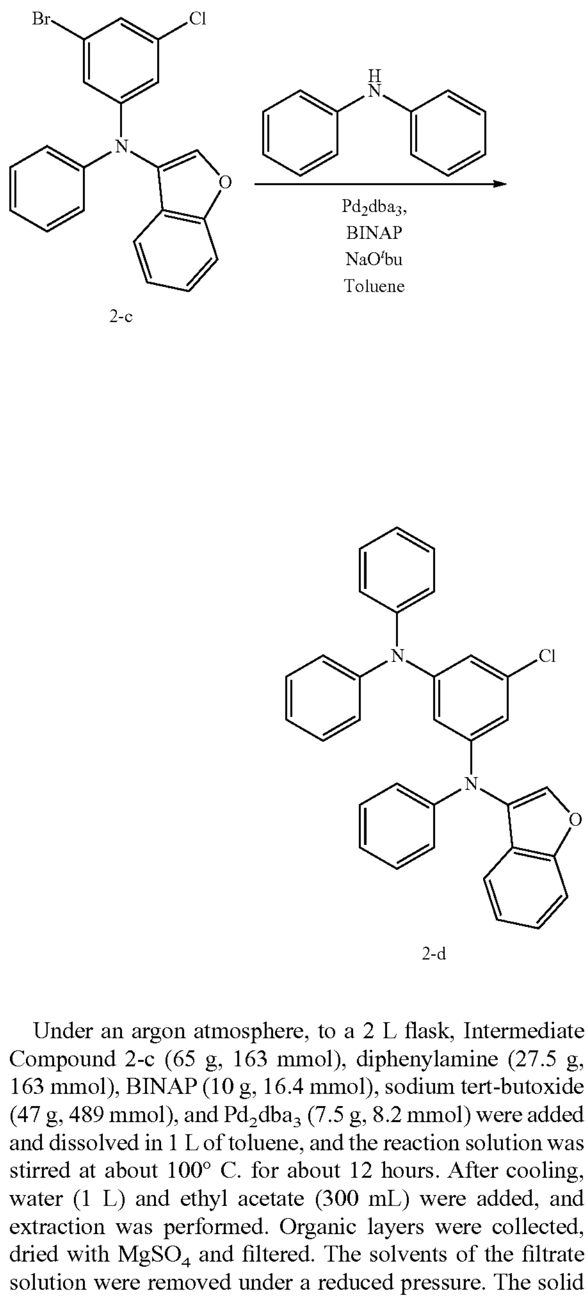

Under an argon atmosphere, to a 2 L flask, Intermediate Compound 2-c (65 g, 163 mmol), diphenylamine (27.5 g, 163 mmol), BINAP (10 g, 16.4 mmol), sodium tert-butoxide (47 g, 489 mmol), and $Pd_2dba_3$ (7.5 g, 8.2 mmol) were added and dissolved in 1 L of toluene, and the reaction solution was stirred at about 100° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 2-d (white solid, 52 g, 66%).

ESI-LCMS: $[M]^+$: $C_{32}H_{23}N_2OCl$. 486.1437.

Synthesis of Intermediate Compound 2-e

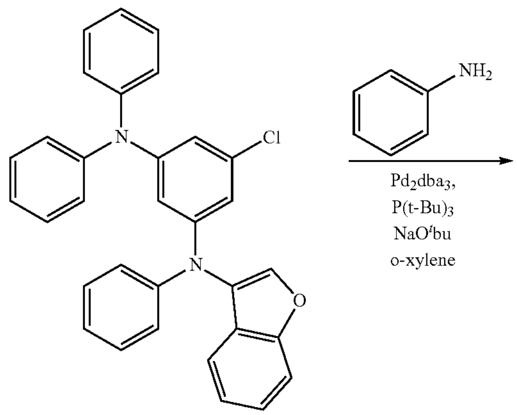

2-d

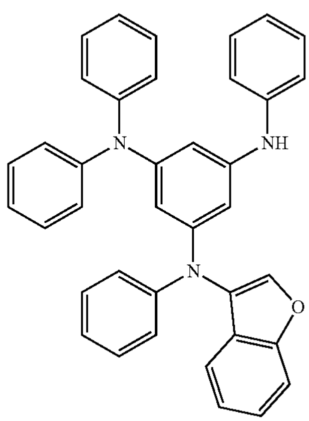

2-e

Under an argon atmosphere, to a 2 L flask, Intermediate Compound 2-d (50 g, 102 mmol), aniline (9.8 g, 102 mmol), tert-butyl phosphine (5.0 mL, 10.2 mmol), sodium tert-butoxide (30 g, 306 mmol), and $Pd_2dba_3$ (4.7 g, 5.1 mmol) were added and dissolved in 800 mL of o-xylene, and the reaction solution was stirred at about 140° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 2-e (yellow solid, 39 g, 71%). Through ESI-LCMS, the yellow solid obtained was identified as Intermediate Compound 2-e.

ESI-LCMS: $[M]^+$: $C_{38}H_{29}N_3O$. 543.2127.

Synthesis of Intermediate Compound 2-f

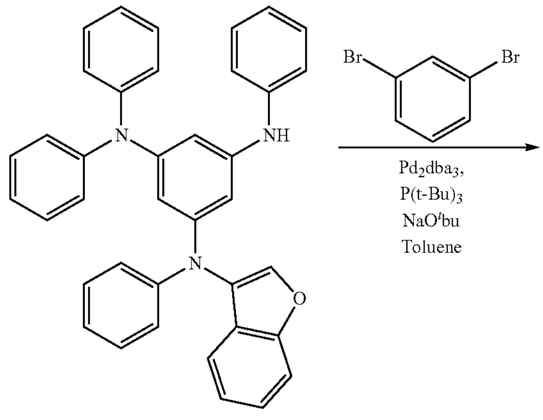

2-e

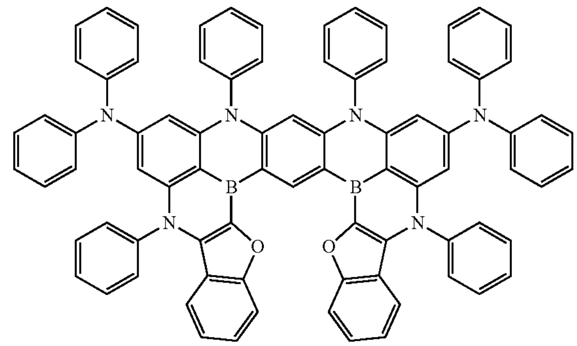

2-f

Under an argon atmosphere, to a 2 L flask, Intermediate Compound 2-e (39 g, 72 mmol), 1,3-dibromobenzene (8.6 g, 36 mmol), tert-butyl phosphine (1.6 mL, 3.6 mmol), sodium tert-butoxide (10.3 g, 108 mmol), and $Pd_2dba_3$ (1.6 g, 1.8 mmol) were added and dissolved in 500 mL of toluene, and the reaction solution was stirred at about 100° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 2-f (white solid, 51 g, 61%). Through ESI-LCMS, the white solid obtained was identified as Intermediate Compound 2-f.

ESI-LCMS: $[M]^+$: $C_{82}H_{60}N_6O_2$. 1160.4832.

Synthesis of Compound 2

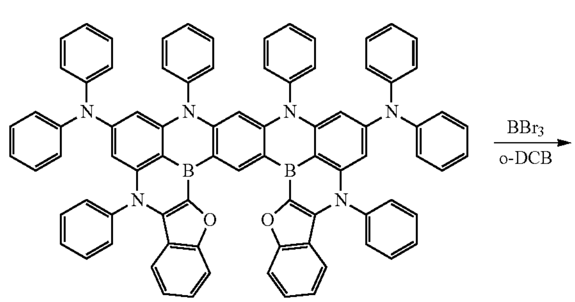

2-f

-continued

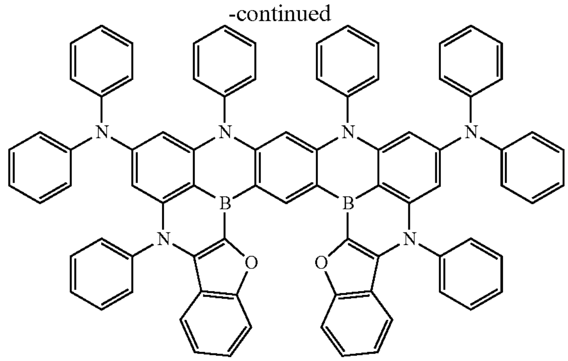

2

Under an argon atmosphere, in a 1 L flask, Intermediate Compound 2-f (33 g, 28 mmol) was dissolved in 500 mL of o-dichlorobenzene and cooled to about 0° C. in an ice-water bath. Boron tribromide (5 eq) was slowly added dropwisely to the reaction solution, the temperature was slowly elevated to room temperature, and stirring was performed for about 20 minutes. The reaction solution was heated to about 180° C. and stirred for about 12 hours. After cooling, triethylamine (5 mL) was slowly added thereto dropwisely to quench the reaction, and all solvents were removed under a reduced pressure. The solid thus obtained was washed with MeOH and separated by column chromatography utilizing silica gel and a developing solvent of $CH_2Cl_2$ and hexane to obtain Compound 2 (yellow solid, 4.0 g, 12%). Through ESI-LCMS and $^1$H-NMR, the yellow solid obtained was identified as Compound 2.

ESI-LCMS: $[M+H]^+$: $C_{82}H_{54}B_2N_6O_2$. 1176.4532.

$^1$H-NMR (400 MHz, $CDCl_3$): 10.21 (s, 1H), 7.84 (d, 2H), 7.59 (d, 2H), 7.35 (t, 4H), 7.24 (m, 16H), 7.05 (m, 24H), 6.83 (s, 1H), 6.49 (s, 4H).

(2) Synthesis of Compound 25

Synthesis of Intermediate Compound 25-a

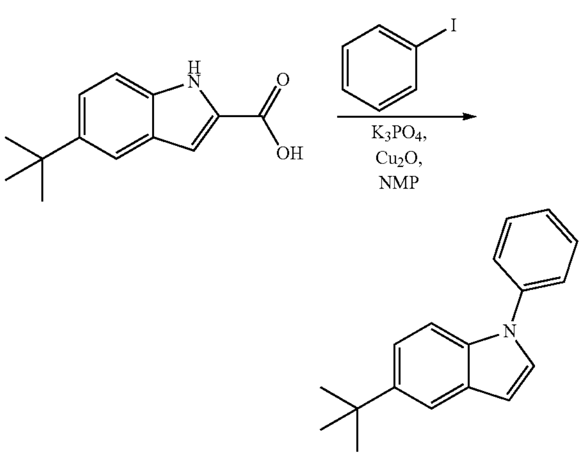

25-a

Under an argon atmosphere, to a 2 L flask, 5-(tert-butyl)-1H-indole-2-carboxylic acid (50 g, 230 mmol) was added and dissolved in 1 L of NMP, then $Cu_2O$ (3.2 g, 23 mmol), and $K_3PO_4$ (220 g, 1.15 mol) were added dropwisely. After stirring at about 200° C. for about 24 hours, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 25-a (brown solid, 24.6 g, 43%). Through ESI-LCMS and $^1$H-NMR, the brown solid obtained was identified as Intermediate Compound 25-a.

ESI-LCMS: $[M]^+$: $C_{18}H_{19}N$. 249.1233.

$^1$H-NMR (400 MHz, $CDCl_3$): 8.95 (s, 1H), 7.86 (d, 1H), 7.60 (m, 4H), 7.11 (d, 1H), 6.52 (d, 1H), 1.43 (s, 9H).

Synthesis of Intermediate Compound 25-b

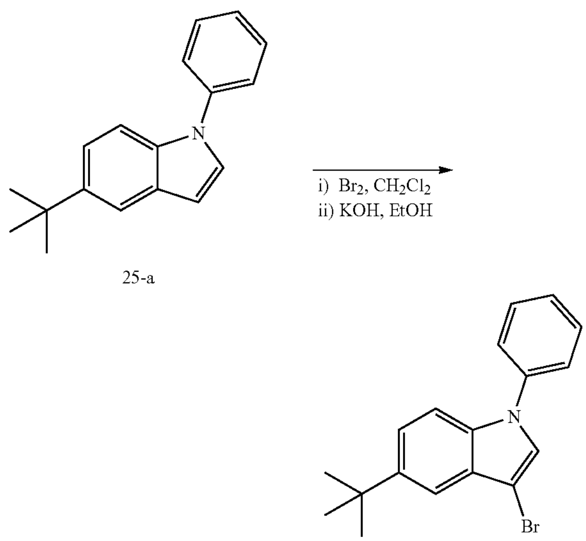

25-b

Under an argon atmosphere, in a 2 L flask, Intermediate Compound 25-a (24 g, 96 mmol) was dissolved in 300 mL of $CH_2Cl_2$, and cooled to about 0° C. utilizing an ice-water bath. Bromine (1.1 equiv.) was slowly added thereto dropwisely, and the reaction solution was stirred for about 1 hour. To terminate the reaction, an aqueous NaOH solution was poured into the reaction vessel, and $Na_2S_2O_3$ was added thereto dropwisely. The reaction solution was extracted with $CH_2Cl_2$, organic layers were collected, dried with $MgSO_4$ and filtered. The solvent in the filtrate solution was removed under a reduced pressure to obtain a yellow solid. The solid thus obtained was dissolved again in 1 L of ethanol and cooled to about 0° C. Continuously, an aqueous KOH solution was slowly added. Then, the reaction solution was stirred and refluxed for about 12 hours and cooled. 10 mL of water was added dropwisely to the reaction solution to terminate the reaction. After cooling, water (1 L) and ethyl acetate (300 ml) were added, and extraction was performed. Organic layers were collected, dried with $MgSO_4$, and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 25-b (dark yellow liquid, 24 g, 76%). Through ESI-LCMS and $^1$H-NMR, the yellow liquid obtained was identified as Intermediate Compound 25-b.

ESI-LCMS: $[M]^+$: $C_{18}H_{18}BrN$. 327.0429.

$^1$H-NMR (400 MHz, $CDCl_3$): 9.21 (s, 1H), 7.85 (d, 1H), 7.55 (m, 5H), 7.35 (s, 1H), 1.43 (s, 9H).

Synthesis of Intermediate Compound 25-c

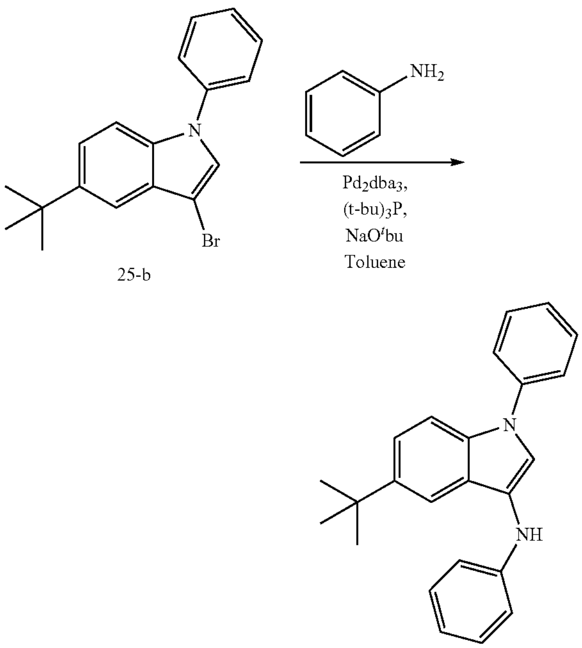

25-b 25-c

Under an argon atmosphere, to a 2 L flask, Intermediate Compound 25-b (24 g, 73 mmol), aniline (9.1 g, 95 mmol), sodium tert-butoxide (21 g, 219 mmol), tris-tert-butyl phosphine (3.4 mL, 7.2 mmol), and $Pd_2dba_3$ (3.3 g, 3.6 mmol) were added and dissolved in 1 L of toluene, and the reaction solution was stirred at about 100° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 25-c (brown liquid, 20.4 g, 72%). Through ESI-LCMS, the brown liquid obtained was identified as Intermediate Compound 25-c.

ESI-LCMS: $[M]^+$: $C_{24}H_{24}N_2$. 340.1239.

Synthesis of Intermediate Compound 25-d

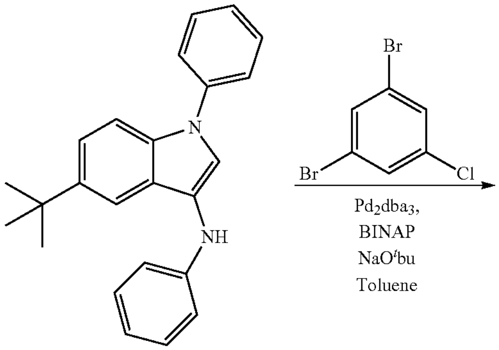

25-c

-continued

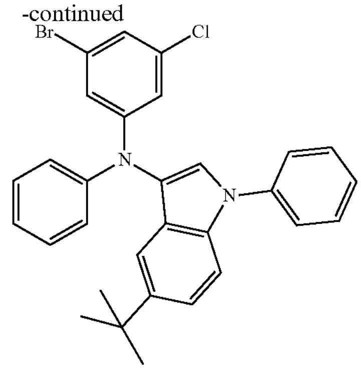

25-d

Under an argon atmosphere, to a 1 L flask, Intermediate Compound 25-c (20 g, 59 mmol), 3,5-dibromo-chlorobenzene (15.8 g, 59 mmol), BINAP (3.7 g, 5.9 mmol), and $Pd_2dba_3$ (2.7 g, 2.9 mmol) were added and dissolved in 500 mL of toluene, and the reaction solution was stirred at about 100° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 25-d (white solid, 20 g, 65%). Through ESI-LCMS, the white solid obtained was identified as Intermediate Compound 25-d.

ESI-LCMS: $[M]^+$: $C_{30}H_{26}N_2BrCl$. 528.0994.

Synthesis of Intermediate Compound 25-e

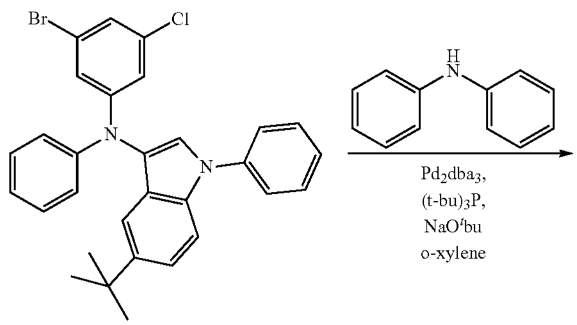

25-d

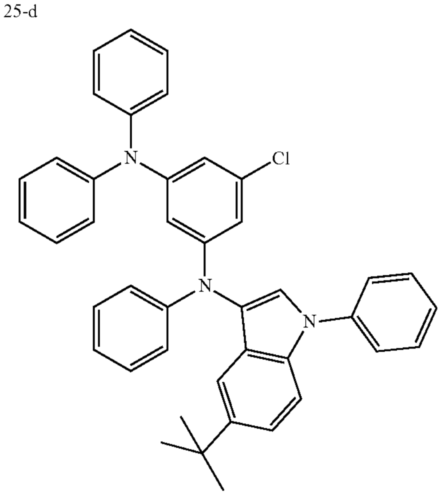

25-e

Under an argon atmosphere, to a 1 L flask, Intermediate Compound 25-d (20 g, 38 mmol), diphenylamine (6.4 g, 38 mmol), sodium tert-butoxide (11 g, 114 mmol), tris-tert-butyl phosphine (1.7 mL, 3.8 mmol), and $Pd_2dba_3$ (1.7 g, 1.9 mmol) were added and dissolved in 400 mL of toluene, and the reaction solution was stirred at about 100° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 25-e (white solid, 16 g, 68%). Through ESI-LCMS, the white solid obtained was identified as Intermediate Compound 25-e.

ESI-LCMS: $[M]^+$: $C_{42}H_{36}N_3Cl$. 617.2538.

Synthesis of Intermediate Compound 25-f

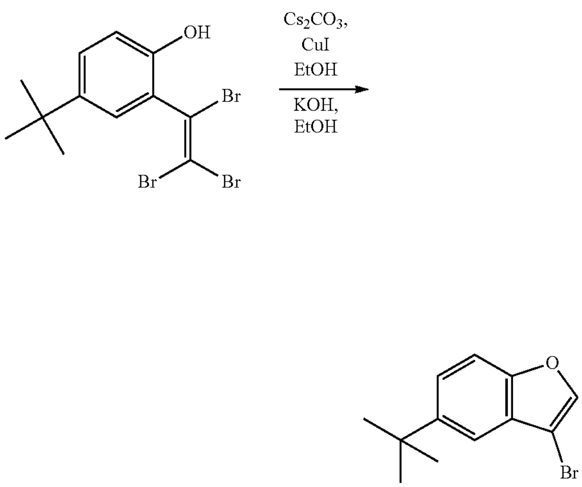

25-f

Under an argon atmosphere, in a 2 L flask, 4-(tert-butyl)-2-(1,2,2-tribromovinyl)phenol (50 g, 120 mmol), cesium carbonate (85 g, 360 mmol), and CuI (22.8 g, 120 mmol) were dissolved in 1 L of EtOH and stirred and refluxed. After cooling, the reaction solvent was removed under a reduced pressure, and the resultant product was filtered utilizing a celite pad and silica gel and washed with $CH_2Cl_2$ multiple times. After removing the organic solvent under a reduced pressure, the product was added without further separation together with KOH (6.7 g, 120 mmol) to 1 L EtOH and refluxed while stirring. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 25-f (yellow liquid, 11 g, 37%). Through ESI-LCMS and $^1$H-NMR, the yellow liquid obtained was identified as Intermediate Compound 25-f.

ESI-LCMS: $[M]^+$: $C_{12}H_{13}BrO$. 252.0017.

$^1$H-NMR (400 MHz, $CDCl_3$): 8.14 (s, 1H), 7.75 (s, 1H), 7.52 (d, 1H), 7.45 (s, 1H), 1.36 (s, 9H).

Synthesis of Intermediate Compound 25-g

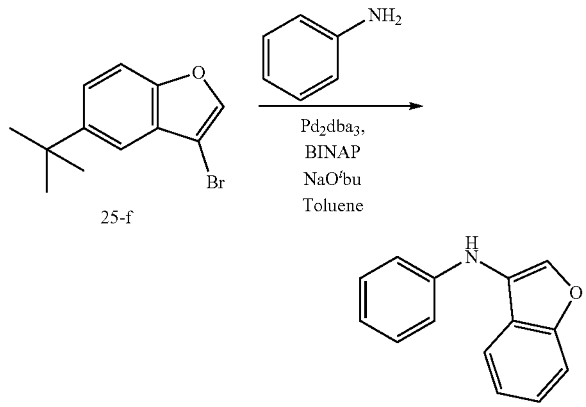

25-f 25-g

Under an argon atmosphere, to a 1 L flask, Intermediate Compound 25-f (11 g, 43 mmol), aniline (5.4 g, 56 mmol), BINAP (2.7 g, 4.3 mmol), and $Pd_2dba_3$ (2.0 g, 2.2 mmol) were added and dissolved in 300 mL of toluene, and the reaction solution was stirred at about 100° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 25-g (brown liquid, 7.5 g, 83%). Through ESI-LCMS, the brown liquid obtained was identified as Intermediate Compound 25-g.

ESI-LCMS: $[M]^+$: $C_{14}H_{11}NO$. 209.0819.

Synthesis of Intermediate Compound 25-h

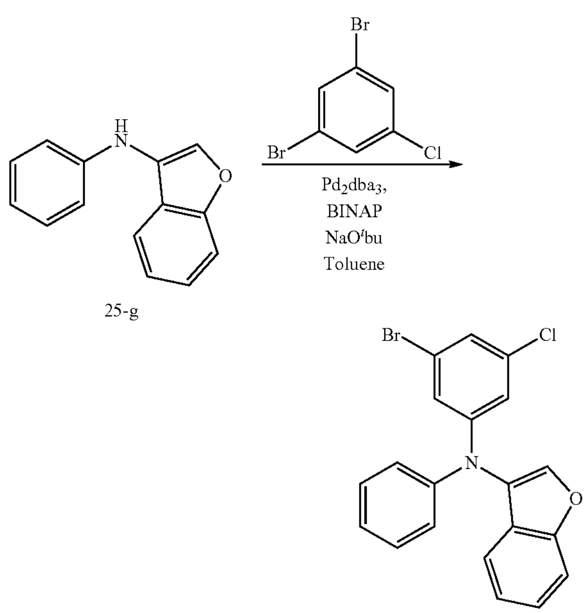

25-g 25-h

Under an argon atmosphere, to a 500 mL flask, Intermediate Compound 25-g (7.5 g, 36 mmol), 3,5-dibromo-chlorobenzene (9.6 g, 36 mmol), BINAP (2.2 g, 3.6 mmol), and $Pd_2dba_3$ (1.6 g, 1.8 mmol) were added and dissolved in 150 mL of toluene, and the reaction solution was stirred at about 100° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 25-h (white solid, 10.9 g, 76%). Through ESI-LCMS, the white solid obtained was identified as Intermediate Compound 25-h.

ESI-LCMS: $[M]^+$: $C_{20}H_{13}NOBrCl$. 396.9919.

Synthesis of Intermediate Compound 25-4

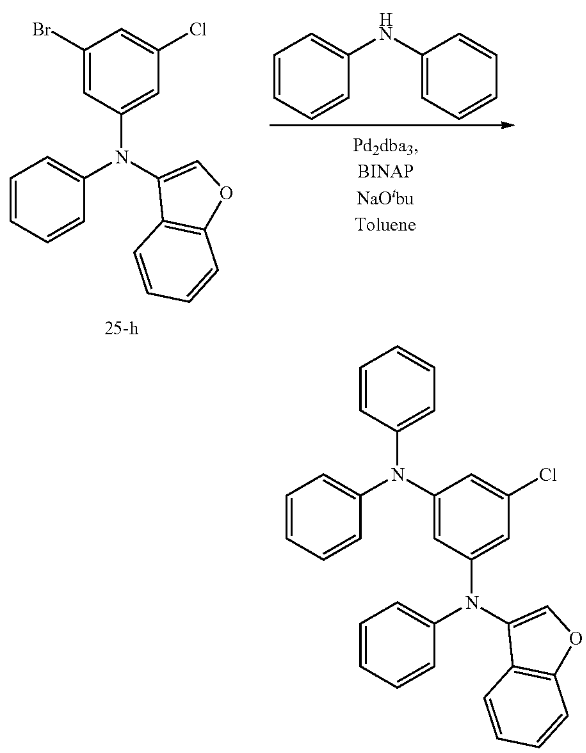

25-h 25-i

Under an argon atmosphere, to a 500 mL flask, Intermediate Compound 25-h (10 g, 25 mmol), diphenylamine (4.2 g, 25 mmol), BINAP (1.6 g, 2.5 mmol), and $Pd_2dba_3$ (1.1 g, 1.3 mmol) were added and dissolved in 150 mL toluene, and the reaction solution was stirred at about 100° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 25-i (white solid, 9.5 g, 78%). Through ESI-LCMS, the white solid obtained was identified as Intermediate Compound 25-i.

ESI-LCMS: $[M]^+$: $C_{32}H_{23}N_2OCl$. 486.1444.

Synthesis of Intermediate Compound 25-j

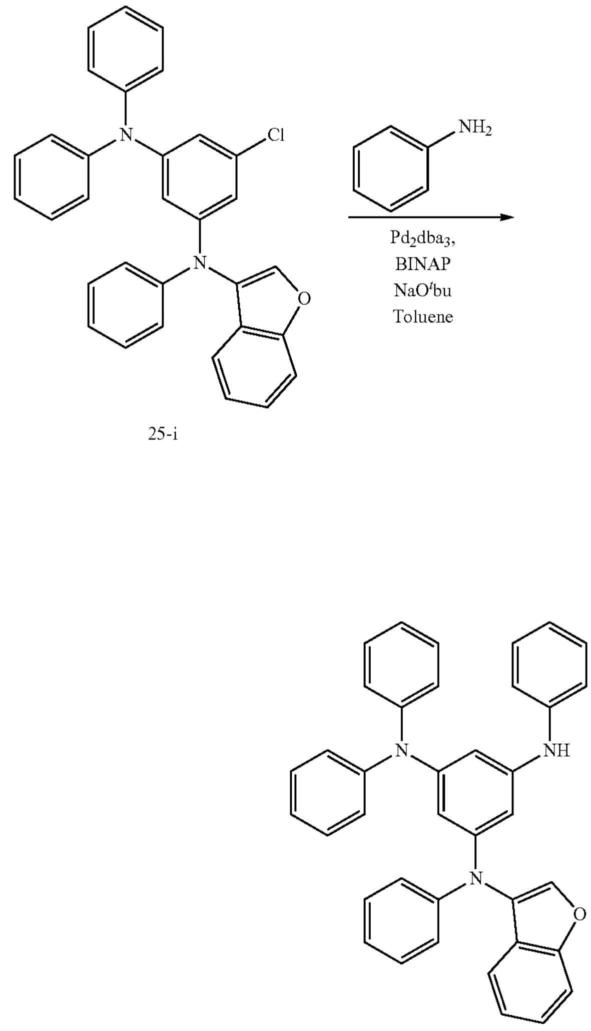

25-i 25-j

Under an argon atmosphere, to a 500 mL flask, Intermediate Compound 25-i (9.5 g, 19 mmol), aniline (2.4 g, 25 mmol), BINAP (1.2 g, 1.9 mmol), and $Pd_2dba_3$ (0.9 g, 0.9 mmol) were added and dissolved in 150 mL toluene, and the reaction solution was stirred at about 100° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 25-j (brown solid, 7.6 g, 74%). Through ESI-LCMS, the brown solid obtained was identified as Intermediate Compound 25-j.

ESI-LCMS: $[M]^+$: $C_{38}H_{29}N_3O$. 543.2211.

Synthesis of Intermediate Compound 25-k

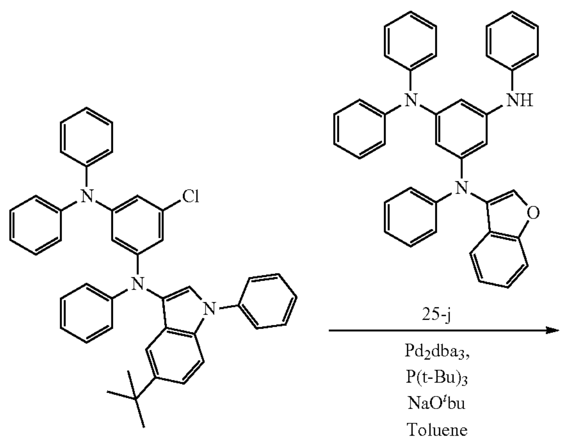

25-e

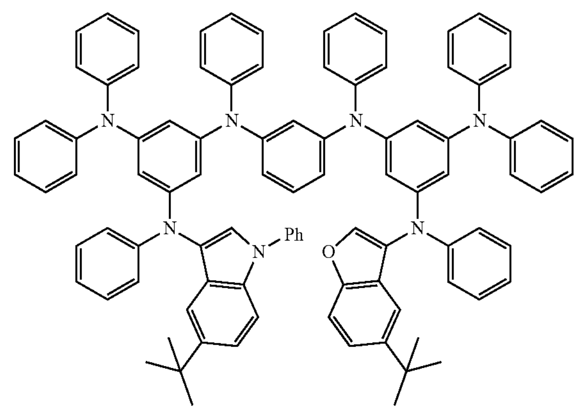

25-k

Under an argon atmosphere, to a 500 mL flask, Intermediate Compound 25-e (10 g, 16 mmol), Intermediate Compound 25-j (8.8 g, 16 mmol), tris-tert-butyl phosphine (0.8 mL, 1.6 mmol), and $Pd_2dba_3$ (0.73 g, 0.8 mmol) were added and dissolved in 150 mL of toluene, and the reaction solution was stirred at about 100° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 25-k (white solid, 13.8 g, 64%). Through ESI-LCMS, the white solid obtained was identified as Intermediate Compound 25-k.

ESI-LCMS: $[M]^+$: $C_{96}H_{81}N_7O$. 1347.6316.

Synthesis of Compound 25

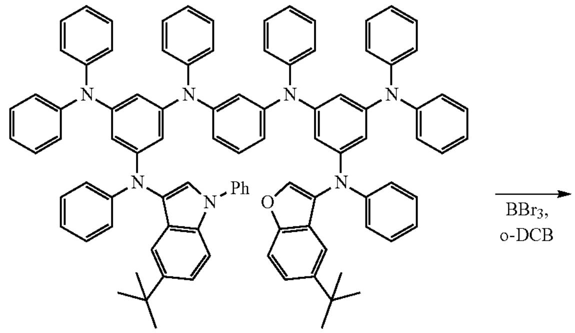

25-k

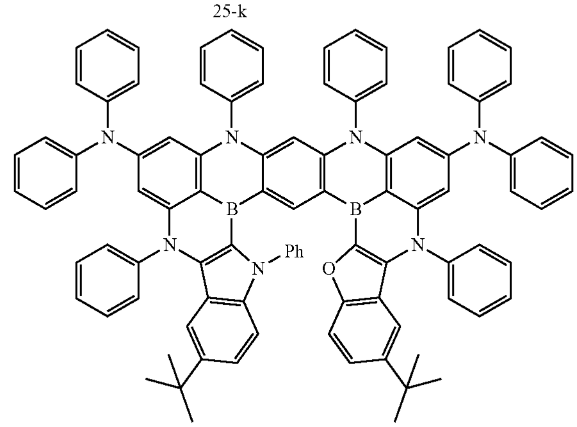

25

Under an argon atmosphere, in a 1 L flask, Intermediate Compound 25-k (13 g, 9.6 mmol) was dissolved in 500 mL of o-dichlorobenzene and cooled to about 0° C. in an ice-water bath. Boron tribromide (5 eq) was slowly added dropwisely to the reaction solution, the temperature was slowly elevated to room temperature, and stirring was performed for about 20 minutes. The reaction solution was heated to about 180° C. and stirred for about 12 hours. After cooling, triethylamine (5 mL) was slowly added thereto dropwisely to quench the reaction, and all solvents were removed under a reduced pressure. The solid thus obtained was washed with MeOH and separated by column chromatography utilizing silica gel and a developing solvent of $CH_2Cl_2$ and hexane to obtain Compound 25 (yellow solid, 1.4 g, 11%). Through ESI-LCMS and $^1H$-NMR, the yellow solid obtained was identified as Compound 25.

ESI-LCMS: $[M]^+$: $C_{96}H_{81}B_2N_7O$. 1347.3449.

$^1H$-NMR (400 MHz, $CDCl_3$): 10.23 (s, 1H), 8.95 (s, 1H), 7.77 (d, 1H), 7.75 (s, 1H), 7.53 (m, 8H), 7.24 (m, 16H), 7.00 (m, 24H), 6.83 (s, 1H), 6.49 (s, 4H), 1.37 (s, 18H).

(3) Synthesis of Compound 35

Synthesis of Intermediate Compound 35-a

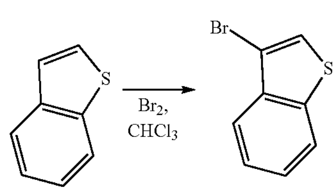

35-a

Under an argon atmosphere, to a 2 L flask, benzothiophene (50 g, 372 mmol) was added and dissolved in 1 L of chloroform, and bromine (1 equiv) was added dropwisely. After stirring at room temperature for about 12 hours, water (1 L) and dichloromethane (300 mL) were added, and extraction was performed. Organic layers were collected, dried with $MgSO_4$ and filtered. The solvents of the filtrate solution were removed under a reduced pressure. The solid thus obtained was recrystallized with ethanol to obtain Intermediate Compound 35-a (light yellow liquid, 65 g, 82%). Through ESI-LCMS and $^1$H-NMR, the yellow liquid obtained was identified as Intermediate Compound 35-a.

ESI-LCMS: $[M]^+$: $C_8H_5SBr$. 211.9092.

$^1$H-NMR (400 MHz, $CDCl_3$): 8.05 (d, 1H), 7.93 (d, 1H), 7.49 (m, 2H), 7.28 (s, 1H).

Synthesis of Intermediate Compound 35-b

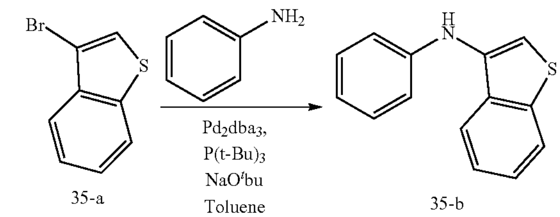

35-a 35-b

Under an argon atmosphere, to a 2 L flask, Intermediate Compound 35-a (65 g, 305 mmol), aniline (38 g, 396 mmol), sodium tert-butoxide (88 g, 915 mmol), tert-butyl phosphine (14 mL, 30.6 mmol), and $Pd_2dba_3$ (13.9 g, 15.3 mmol) were added and dissolved in 1 L of toluene, and the reaction solution was stirred at about 100° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 35-b (brown liquid, 48 g, 71%). Through ESI-LCMS, the brown liquid obtained was identified as Intermediate Compound 35-b.

ESI-LCMS: $[M]^+$: $C_{14}H_{11}NS$. 225.0312.

Synthesis of Intermediate Compound 35-c

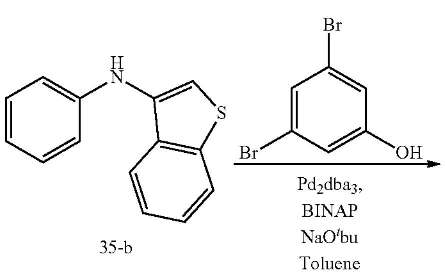

35-b

-continued

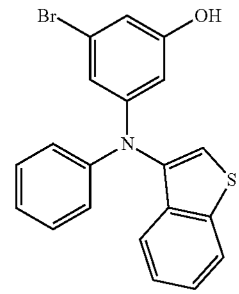

35-c

Under an argon atmosphere, to a 2 L flask, Intermediate Compound 35-b (48 g, 213 mmol), 3,5-dibromophenol (57.6 g, 213 mmol), sodium tert-butoxide (61 g, 639 mmol), BINAP (13 g, 21.3 mmol), and $Pd_2dba_3$ (9.8 g, 10.6 mmol) were added and dissolved in 1 L of toluene, and the reaction solution was stirred at about 100° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 35-c (white solid, 45 g, 51%). Through ESI-LCMS, the white solid obtained was identified as Intermediate Compound 35-c.

ESI-LCMS: $[M]^+$: $C_{20}H_{14}BrNOS$. 394.9917.

Synthesis of Intermediate Compound 35-d

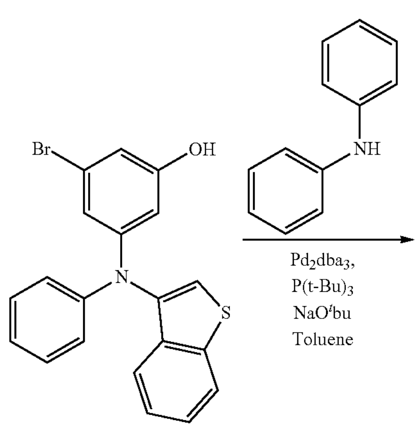

35-c

-continued

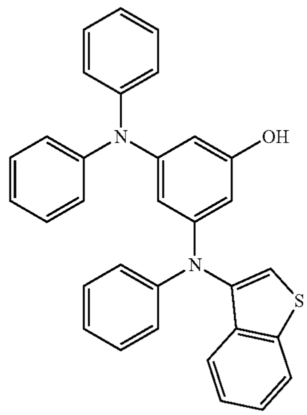

35-d

Under an argon atmosphere, to a 2 L flask, Intermediate Compound 35-c (45 g, 108 mmol), diphenylamine (18.3 g, 108 mmol), sodium tert-butoxide (31 g, 324 mmol), BINAP (6.7 g, 10.8 mmol), and $Pd_2dba_3$ (4.9 g, 5.4 mmol) were added and dissolved in 1 L of toluene, and the reaction solution was stirred at about 100° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 35-d (white solid, 36 g, 67%). Through ESI-LCMS, the white solid obtained was identified as Intermediate Compound 35-d.

ESI-LCMS: $[M]^+$: $C_{32}H_{24}N_2OS$. 484.6012.

Synthesis of Intermediate Compound 35-e

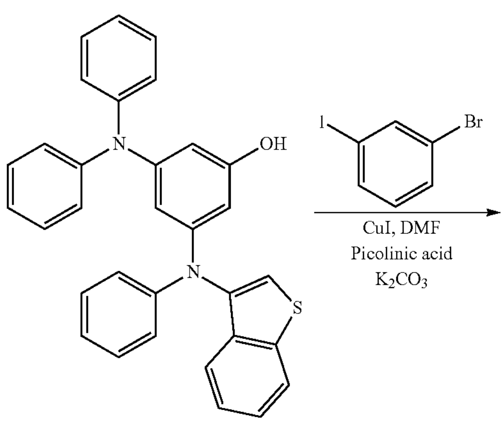

35-d

-continued

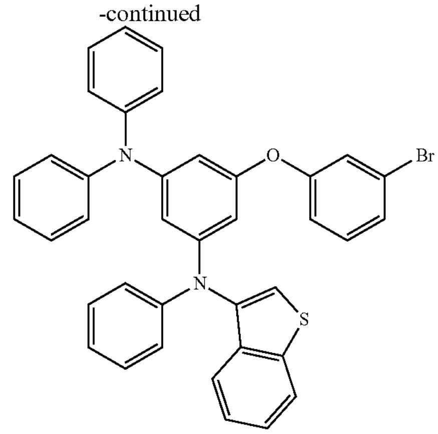

35-e

Under an argon atmosphere, to a 2 L flask, Intermediate Compound 35-d (36 g, 71.5 mmol), 3-iodo-bromobenzene (6.8 g, 71.5 mmol), CuI (13 g, 71.5 mmol), picolinic acid (8.8 g, 71.5 mmol), and $K_2CO_3$ (29 g, 213 mmol) were added and dissolved in 500 mL of DMF, and the reaction solution was stirred at about 180° C. for about 24 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 35-e (white solid, 28 g, 71%). Through ESI-LCMS, the white solid obtained was identified as Intermediate Compound 35-e.

ESI-LCMS: $[M]^+$: $C_{38}H_{27}N_2SBrO$. 638.1001.

Synthesis of Intermediate Compound 35-f

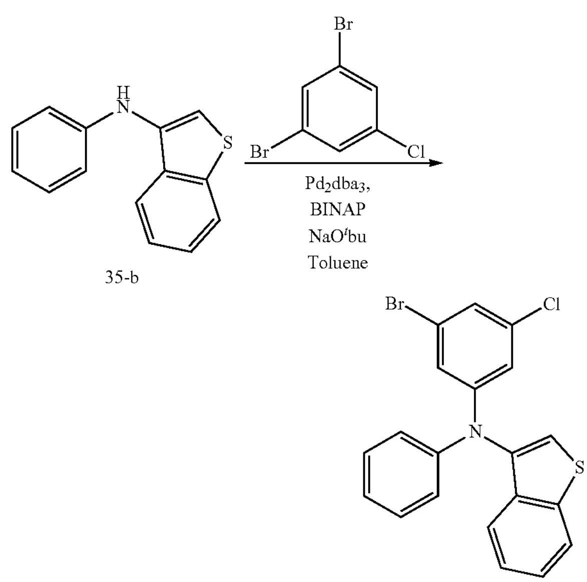

35-b 35-f

Under an argon atmosphere, to a 2 L flask, Intermediate Compound 35-b (30 g, 111 mmol), 3,5-dibromo-chlorobenzene (30 g, 111 mmol), sodium tert-butoxide (32.4 g, 333 mmol), BINAP (6.9 g, 11 mmol), and $Pd_2dba_3$ (5.0 g, 5.5 mmol) were added and dissolved in 1 L of toluene, and the reaction solution was stirred at about 100° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 35-f (white solid, 24 g, 53%). Through ESI-LCMS, the white solid obtained was identified as Intermediate Compound 35-f.

ESI-LCMS: $[M]^+$: $C_{20}H_{13}NBrClS$. 412.9017.

Synthesis of Intermediate Compound 35-g

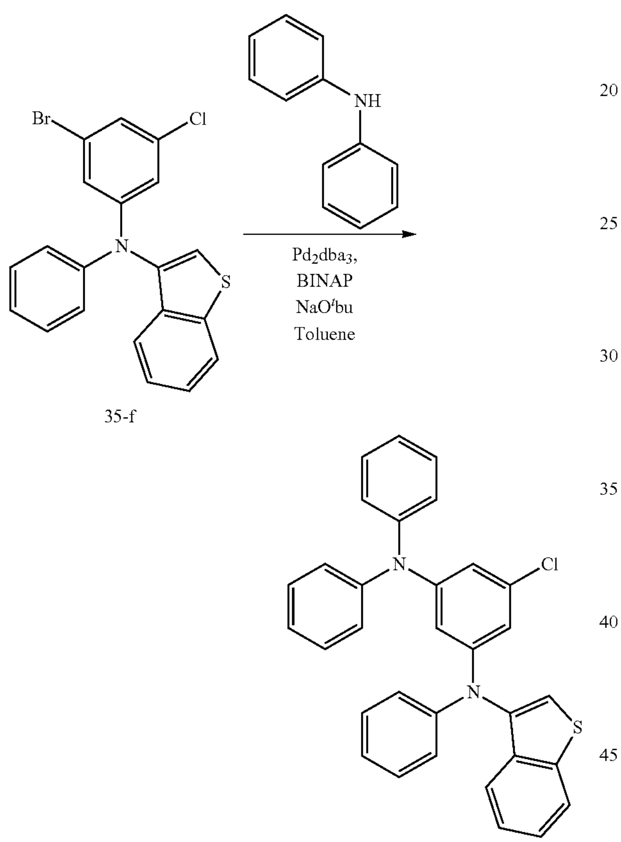

35-f 35-g

Under an argon atmosphere, to a 2 L flask, Intermediate Compound 35-f (24 g, 58 mmol), diphenylamine (9.8 g, 58 mmol), sodium tert-butoxide (16.7 g, 174 mmol), BINAP (3.6 g, 5.8 mmol), and $Pd_2dba_3$ (2.6 g, 2.9 mmol) were added and dissolved in 1 L of toluene, and the reaction solution was stirred at about 100° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 35-g (white solid, 19.8 g, 68%). Through ESI-LCMS, the white solid obtained was identified as Intermediate Compound 35-g.

ESI-LCMS: $[M]^+$: $C_{32}H_{23}N_2ClS$. 502.1038.

Synthesis of Intermediate Compound 35-h

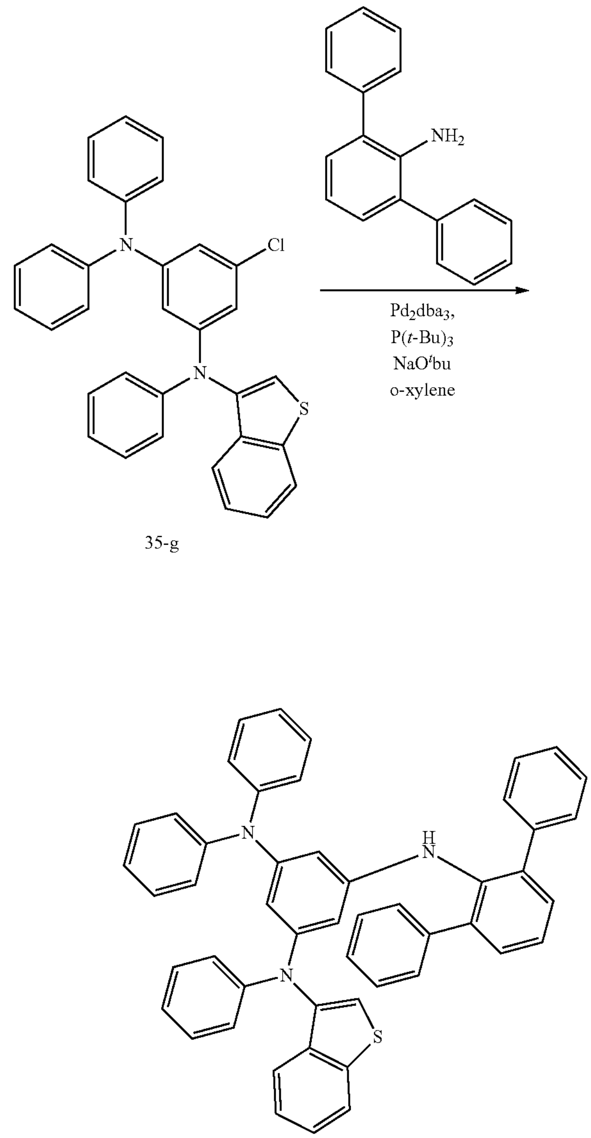

35-g 35-h

Under an argon atmosphere, to a 2 L flask, Intermediate Compound 35-g (19 g, 38 mmol), [1,1':3',1"-terphenyl]-2'-amine (9.3 g, 38 mmol), sodium tert-butoxide (10.9 g, 114 mmol), tris-tert-butyl phosphine (1.8 mL, 3.8 mmol), and $Pd_2dba_3$ (1.7 g, 1.9 mmol) were added and dissolved in 380 mL o-xylene, and the reaction solution was stirred at about 140° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 35-h (white solid, 19 g, 71%). Through ESI-LCMS, the white solid obtained was identified as Intermediate Compound 35-h.

ESI-LCMS: $[M]^+$: $C_{50}H_{37}N_3S$. 711.2317.

Synthesis of Intermediate Compound 35-i

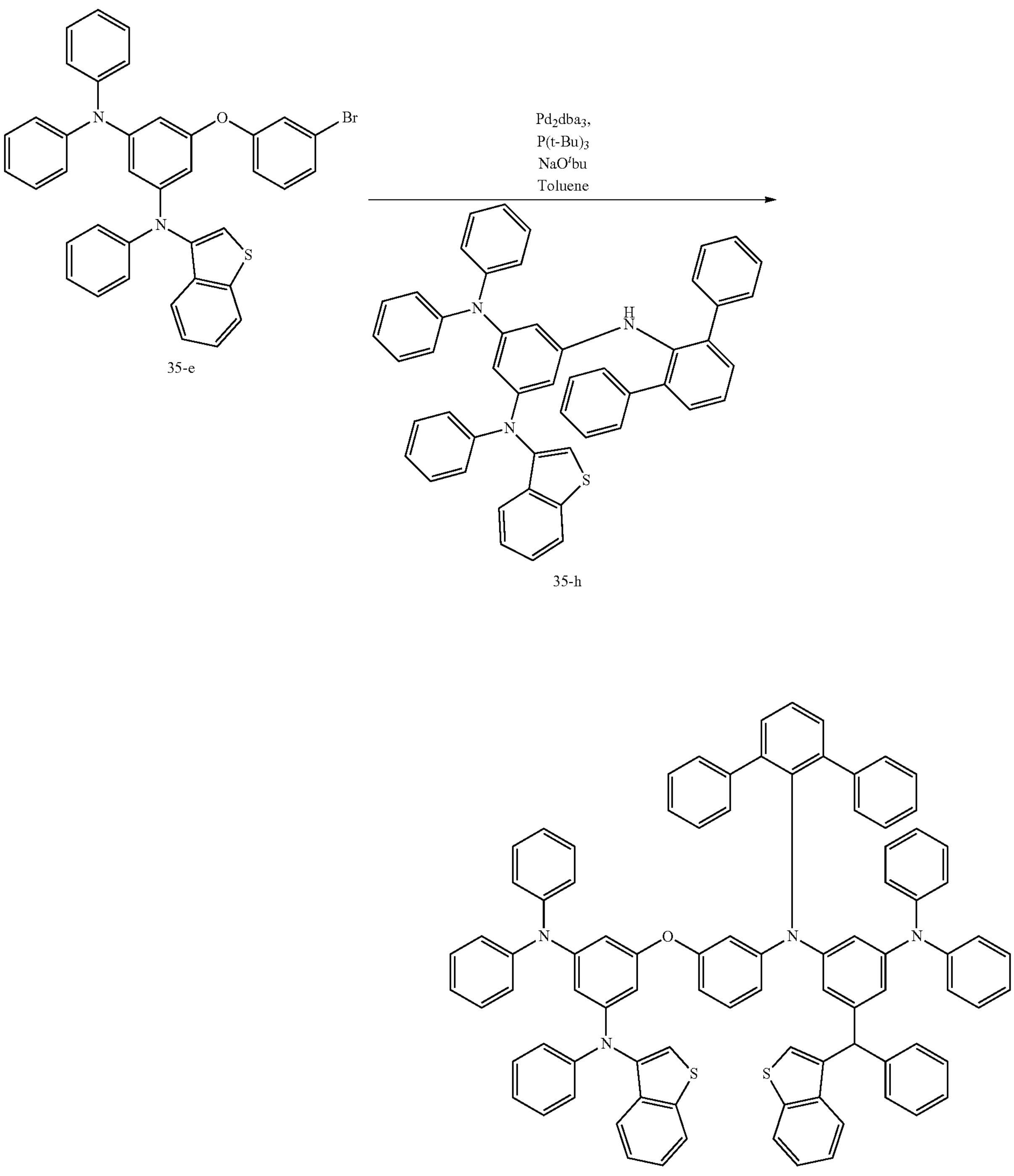

Under an argon atmosphere, to a 1 L flask, Intermediate Compound 35-e (30 g, 39 mmol), Intermediate Compound 35-h (27 g, 39 mmol), sodium tert-butoxide (11.2 g, 117 mmol), tris-tert-butyl phosphine (1.7 mL, 4 mmol), and $Pd_2dba_3$ (1.7 g, 1.95 mmol) were added and dissolved in 500 mL of o-xylene, and the reaction solution was stirred at about 190° C. for about 48 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 35-i (white solid, 25 g, 52%). Through ESI-LCMS, the white solid obtained was identified as Intermediate Compound 35-i.

ESI-LCMS: $[M]^+$: $C_{89}H_{64}N_4S_2O$. 1268.4343.

Synthesis of Compound 35

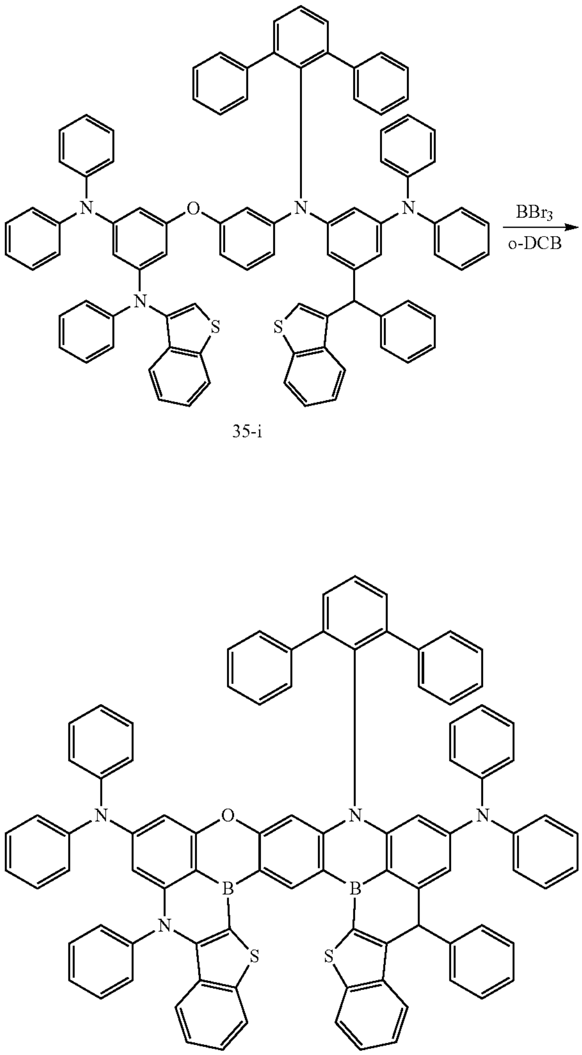

35-i

35

Under an argon atmosphere, in a 1 L flask, Intermediate Compound 35-i (33 g, 19 mmol) was dissolved in 500 mL of o-dichlorobenzene and cooled to about 0° C. in an ice-water bath. Boron tribromide (5 eq) was slowly added dropwisely to the reaction solution, the temperature was slowly elevated to room temperature, and stirring was performed for about 20 minutes. The reaction solution was heated to about 180° C. and stirred for about 12 hours. After cooling, triethylamine (5 mL) was slowly added thereto dropwisely to quench the reaction, and all solvents were removed under a reduced pressure. The solid thus obtained was washed with MeOH and separated by column chromatography utilizing silica gel, and a developing solvent of $CH_2Cl_2$ and hexane to obtain Compound 35 (yellow solid, 1.3 g, 7%). Through ESI-LCMS and $^1$H-NMR, the yellow solid obtained was identified as Compound 35.

ESI-LCMS: $[M+H]^+$: $C_{88}H_{57}B_2N_5OS_2$. 1285.4117.

$^1$H-NMR (400 MHz, $CDCl_3$): 10.46 (s, 1H), 8.20 (d, 2H), 8.07 (d, 2H), 7.93 (d, 2H), 7.43 (t, 2H), 7.39 (m, 5H), 7.24 (m, 12H), 7.03 (m, 22H), 6.86 (s, 1H), 6.52 (m, 4H).

(4) Synthesis of Compound 44

Synthesis of Intermediate Compound 4-a

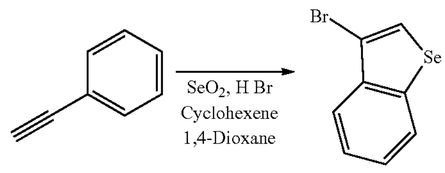

44-a

Under an argon atmosphere, to a 2 L flask, selenium dioxide (65.2 g, 588 mmol) was added and dissolved in 48% HBr (253 mL), and then, stirred at room temperature for about 15 minutes. 1 L of 1,4-dioxane solution dissolving phenylacetylene (102 g, 1 mol) and cyclohexene (40 g, 490 mmol) was slowly added thereto dropwisely utilizing a dropping funnel. The reaction solution was stirred at room temperature for about 24 hours. Ethyl acetate and water were added to quench the reaction. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 44-a (colorless liquid, 60 g, 48%). Through ESI-LCMS and $^1$H-NMR, the colorless liquid obtained was identified as Intermediate Compound 44-a.

ESI-LCMS: $[M]^+$: $C_8H_5BrSe$. 259.8783.

$^1$H-NMR (400 MHz, $CDCl_3$): 7.34 (m, 2H), 7.24 (m, 2H), 7.15 (s, 1H).

Synthesis of Intermediate Compound 44-b

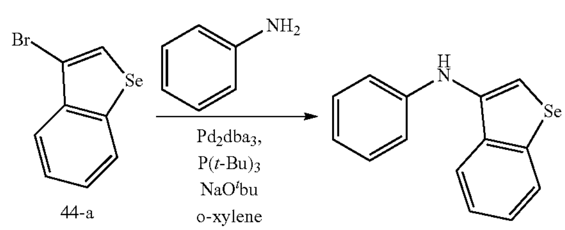

44-a 44-b

Under an argon atmosphere, in a 2 L flask, Intermediate Compound 44-a (60 g, 230 mmol), aniline (22 g, 230 mmol), tert-butyl phosphine (10.5 mL, 23 mmol), and $Pd_2dba_3$ (10.5 g, 11.5 mmol) were added and dissolved in 800 mL of toluene, and the reaction solution was stirred at about 100° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 44-b (yellow liquid, 42 g, 67%). Through ESI-LCMS, the yellow liquid obtained was identified as Intermediate Compound 44-b.

ESI-LCMS: $[M]^+$: $C_{14}H_{11}NSe$. 273.0114.

Synthesis of Intermediate Compound 44-c

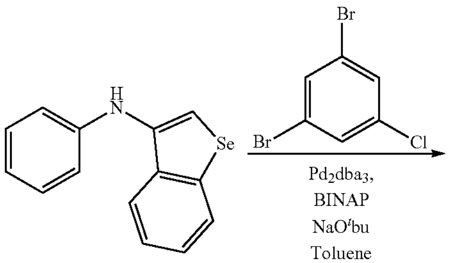

44-b

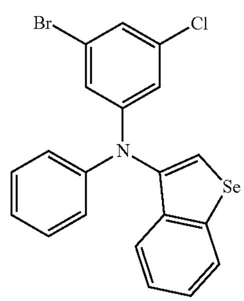

44-c

Under an argon atmosphere, to a 2 L flask, Intermediate Compound 44-b (42 g, 154 mmol), 3,5-dibromo-chloro-benzene (41.7 g, 154 mmol), BINAP (9.5 g, 15.4 mmol), and $Pd_2dba_3$ (7.0 g, 7.7 mmol) were added and dissolved in 600 mL of toluene, and the reaction solution was stirred at about 100° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 44-c (white solid, 41 g, 58%). Through ESI-LCMS, the white solid obtained was identified as Intermediate Compound 44-c.

ESI-LCMS: $[M]^+$: $C_{20}H_{13}NBrClSe$. 273.0114.

Synthesis of Intermediate Compound 44-d

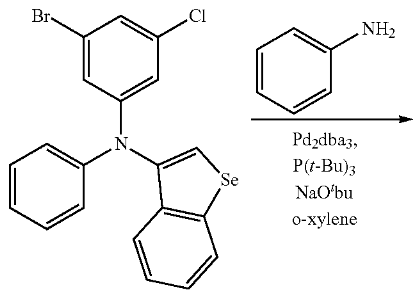

44-c

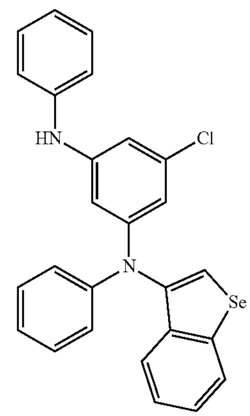

44-d

Under an argon atmosphere, to a 2 L flask, Intermediate Compound 44-c (40 g, 87 mmol), aniline (8.3 g, 87 mmol), tert-butyl phosphine (4.0 mL, 8.8 mmol), and $Pd_2dba_3$ (4.0 g, 4.4 mmol) were added and dissolved in 600 mL of toluene, and the reaction solution was stirred at about 100° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 44-d (yellow solid, 29.5 g, 75%). Through ESI-LCMS, the yellow solid obtained was identified as Intermediate Compound 44-d.

ESI-LCMS: $[M]^+$: $C_{26}H_{19}N_2ClSe$. 273.0114.

Synthesis of Intermediate Compound 44-e

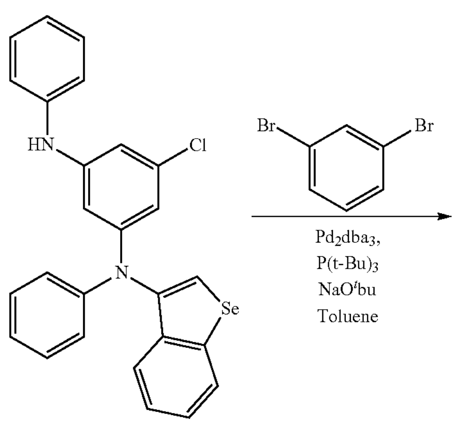

44-d

-continued

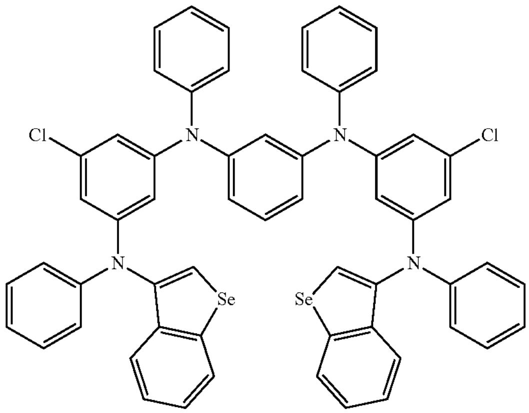

44-e

Under an argon atmosphere, to a 2 L flask, Intermediate Compound 44-d (29 g, 62 mmol), 1,3-dibromobenzene (6.7 g, 28 mmol), tert-butyl phosphine (1.3 mL, 2.8 mmol), and $Pd_2dba_3$ (1.3 g, 1.4 mmol) were added and dissolved in 400 mL of toluene, and the reaction solution was stirred at about 100° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 44-e (white solid, 48 g, 77%). Through ESI-LCMS, the white solid obtained was identified as Intermediate Compound 44-e.

ESI-LCMS: $[M]^+$: $C_{58}H_{40}N_4Cl_2Se_2$. 1023.1010.

Synthesis of Intermediate Compound 44-f

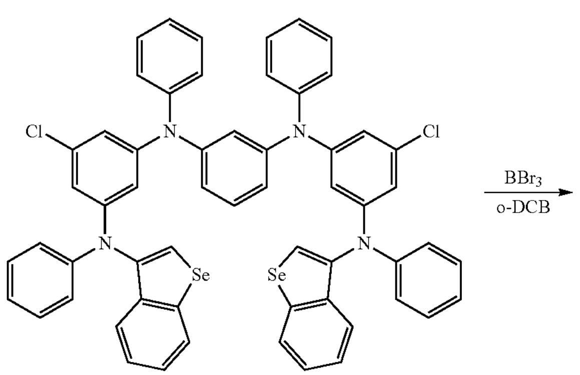

44-e

-continued

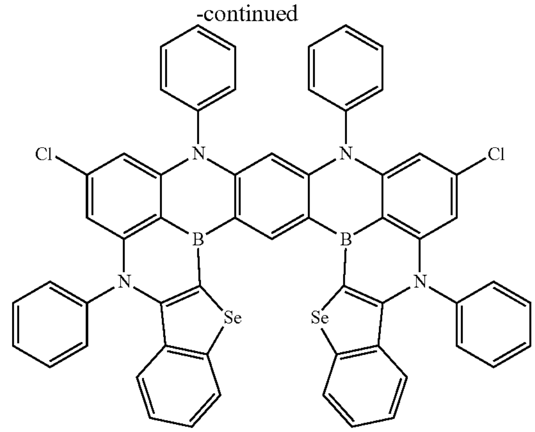

44-f

Under an argon atmosphere, in a 2 L flask, Intermediate Compound 2-e (45 g, 44 mmol) was dissolved in 1 L of o-dichlorobenzene and cooled to about 0° C. in an ice-water bath. Boron tribromide (5 eq) was slowly added dropwisely to the reaction solution, the temperature was slowly elevated to room temperature, and stirring was performed for about 20 minutes. The reaction solution was heated to about 180° C. and stirred for about 12 hours. After cooling, triethylamine (5 mL) was slowly added thereto dropwisely to quench the reaction, and all solvents were removed under a reduced pressure. The solid thus obtained was washed with MeOH and separated by column chromatography utilizing silica gel, and a developing solvent of $CH_2Cl_2$ and hexane to obtain Intermediate Compound 44-f (yellow solid, 6.8 g, 15%). Through ESI-LCMS, the yellow solid obtained was identified as Intermediate Compound 44-f.

ESI-LCMS: $[M+H]^+$: $C_{58}H_{34}B_2N_4Cl_2Se_2$. 1038.0549.

Synthesis of Compound 44

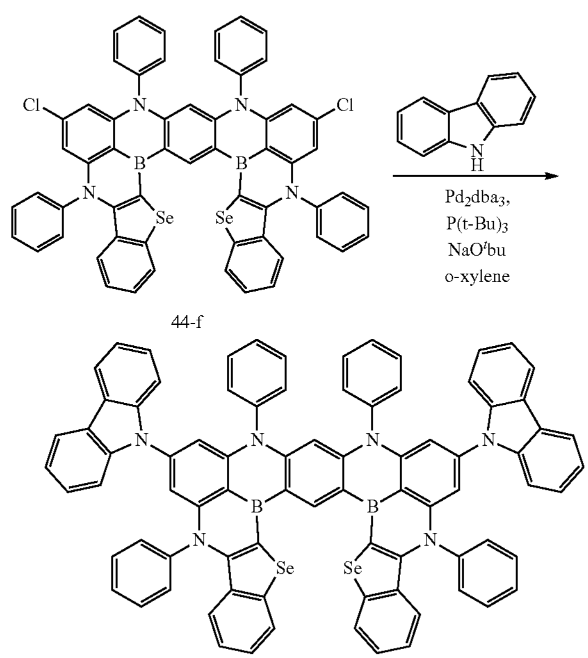

44

Under an argon atmosphere, in a 2 L flask, Intermediate Compound 44-f (6.5 g, 6.2 mmol), carbazole (2.1 g, 12.4 mmol), tert-butyl phosphine (0.3 mL, 0.62 mmol), $pd_2dba_3$ (0.3 g, 0.31 mmol), and sodium tert-butoxide (18.6 mmol) were dissolved in 50 mL of o-dichlorobenzene and cooled to about 0° C. in an ice-water bath. Boron tribromide (5 eq) was slowly added dropwisely to the reaction solution, the temperature was slowly elevated to room temperature, and stirring was performed for about 20 minutes. The reaction solution was heated to about 180° C. and stirred for about 12 hours. After cooling, triethylamine (5 mL) was slowly added thereto dropwisely to quench the reaction, and all solvents were removed under a reduced pressure. The solid thus obtained was washed with MeOH and separated by column chromatography utilizing silica gel and a developing solvent of $CH_2Cl_2$ and hexane to obtain Compound 44 (yellow solid, 0.7 g, 11%). Through ESI-LCMS and $^1$H-NMR, the yellow solid obtained was identified as Compound 44.

ESI-LCMS: $[M+H]^+$: $C_{82}H_{50}B_2N_6Se_2$. 1300.2626.

$^1$H-NMR (400 MHz, $CDCl_3$): 10.11 (s, 1H), 8.55 (d, 2H), 8.19 (d, 2H), 7.94 (d, 2H), 7.59 (d, 2H), 7.35 (m, 6H), 7.24 (m, 16H), 7.05 (m, 24H), 6.89 (s, 1H), 6.83 (s, 1H).

(5) Synthesis of Compound 50

Synthesis of Intermediate Compound 50-a

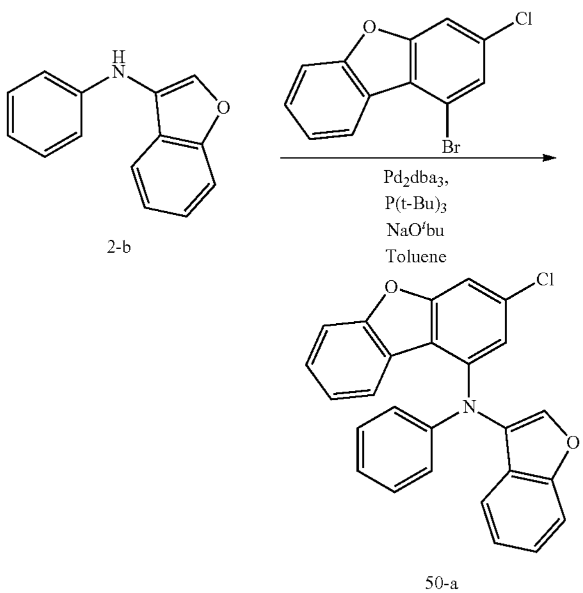

Under an argon atmosphere, to a 2 L flask, Intermediate Compound 2-b (30 g, 143 mmol), 1-bromo-3-chloro-dibenzofuran (40 g, 143 mmol), tert-butyl phosphine (6.5 mL, 14.4 mmol), and $Pd_2dba_3$ (6.5 g, 7.2 mmol) were added and dissolved in 800 mL of toluene, and the reaction solution was stirred at about 100° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 50-a (white solid, 49 g, 84%). Through ESI-LCMS and $^1$H-NMR, the white solid obtained was identified as Intermediate Compound 50-a.

ESI-LCMS: $[M]^+$: $C_{26}H_{16}NClO_2$. 409.0898.

$^1$H-NMR (400 MHz, $CDCl_3$): 8.14 (s, 1H), 7.98 (d, 1H), 7.84 (d, 1H), 7.54 (d, 2H), 7.34 (m, 6H), 7.05 (m, 4H), 6.92 (s, 1H).

Synthesis of Intermediate Compound 50-b

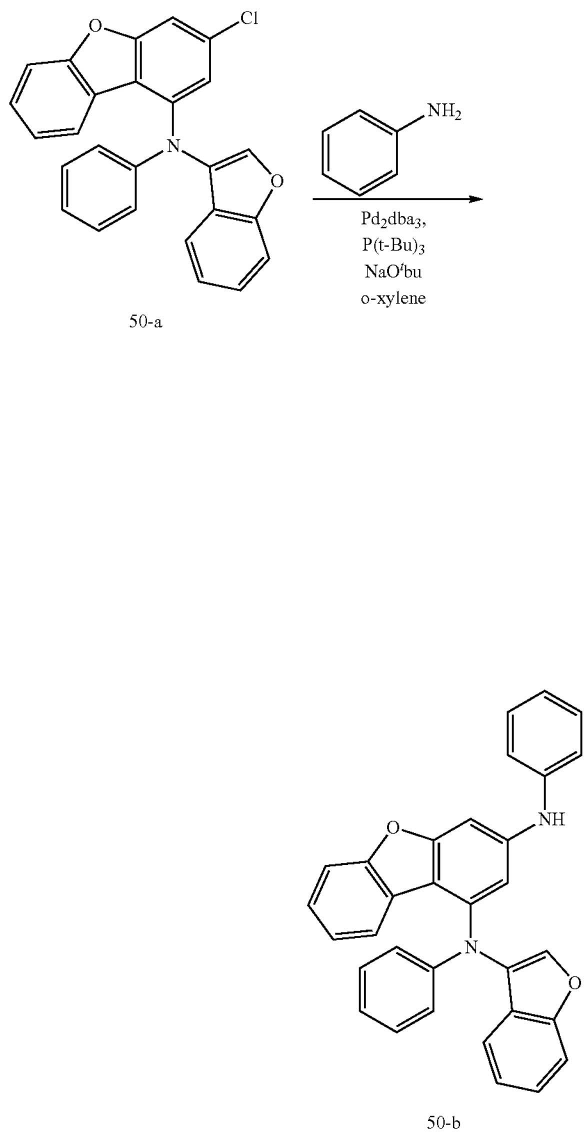

Under an argon atmosphere, to a 2 L flask, Intermediate Compound 50-a (45 g, 109 mmol), aniline (10.5 g, 109 mmol), tert-butyl phosphine (5.5 mL, 11.0 mmol), and $Pd_2dba_3$ (5.0 g, 5.5 mmol) were added and dissolved in 600 mL of o-xylene, and the reaction solution was stirred at about 100° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 50-b (yellow liquid, 38 g, 75%). Through ESI-LCMS, the yellow liquid obtained was identified as Intermediate Compound 50-b.

ESI-LCMS: $[M]^+$: $C_{32}H_{22}N_2O_2$. 466.1661.

Synthesis of Intermediate Compound 50-c

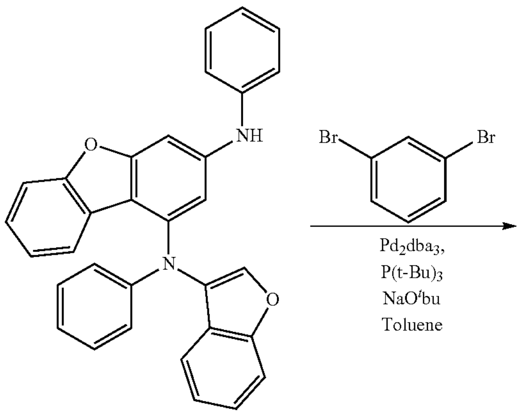

50-b

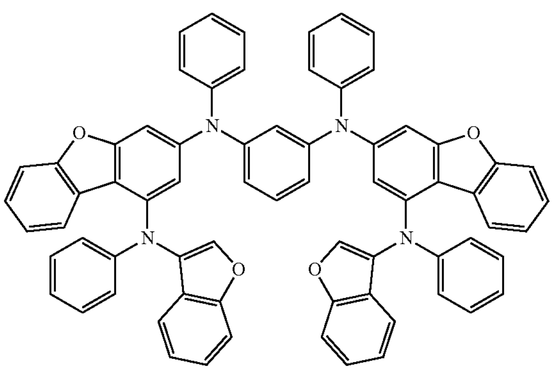

50-c

Under an argon atmosphere, to a 2 L flask, Intermediate Compound 50-b (35 g, 75 mmol), 1,3-dibromobenzene (8.0 g, 36 mmol), tert-butyl phosphine (1.6 mL, 3.6 mmol), and $Pd_2dba_3$ (1.6 g, 1.8 mmol) were added and dissolved in 400 mL of toluene, and the reaction solution was stirred at about 100° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 50-c (white liquid, 23 g, 65%). Through ESI-LCMS, the yellow solid obtained was identified as Intermediate Compound 50-c.

ESI-LCMS: $[M]^+$: $C_{70}H_{46}N_4O_4$. 1006.2337.

Synthesis of Compound 50

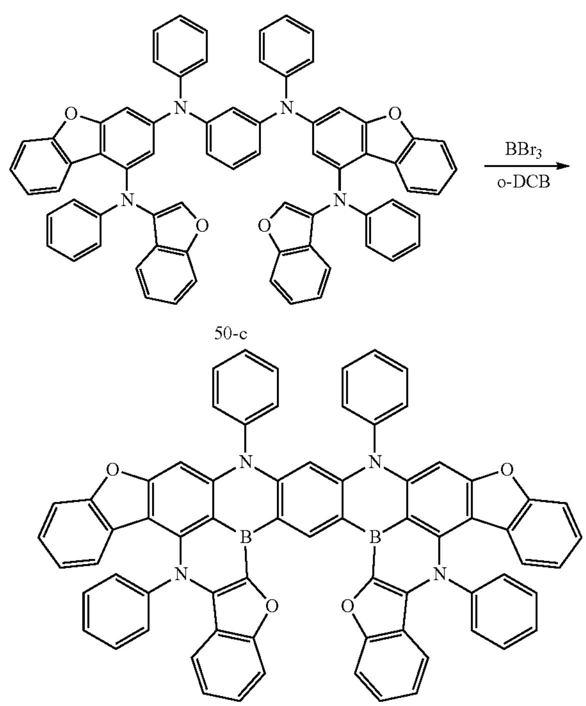

50-c

50

Under an argon atmosphere, in a 1 L flask, Intermediate Compound 50-c (23 g, 23 mmol) was dissolved in 400 mL of o-dichlorobenzene and cooled to about 0° C. in an ice-water bath. Boron tribromide (5 eq) was slowly added dropwisely to the reaction solution, the temperature was slowly elevated to room temperature, and stirring was performed for about 20 minutes. The reaction solution was heated to about 180° C. and stirred for about 12 hours. After cooling, triethylamine (5 mL) was slowly added thereto dropwisely to quench the reaction, and all solvents were removed under a reduced pressure. The solid thus obtained was washed with MeOH and separated by column chromatography utilizing silica gel and a developing solvent of $CH_2Cl_2$ and hexane to obtain Compound 50 (yellow solid, 2.1 g, 9%). Through ESI-LCMS and $^1$H-NMR, the yellow solid obtained was identified as Compound 50.

ESI-LCMS: $[M+H]^+$: $C_{70}H_{40}B_2N_4O_4$. 1022.1237.

$^1$H-NMR (400 MHz, $CDCl_3$): 10.36 (s, 1H), 7.98 (d, 2H), 7.84 (d, 2H), 7.69 (s, 1H), 7.54 (m, 4H), 7.39 (t, 6H), 7.24 (m, 6H), 7.03 (m, 12H), 6.83 (s, 1H).

(6) Synthesis of Compound 53

Synthesis of Intermediate Compound 55-a

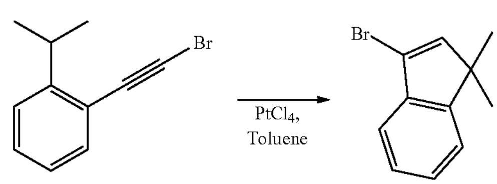

53-a

Under an argon atmosphere, to a 2 L flask, 1-(bromoethynyl)-2-isopropylbenzene (50 g, 224 mmol) and $PtCl_4$ (37 g, 112 mmol) were added and dissolved in 1 L of toluene, and the reaction solution was stirred and refluxed at about 120° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 53-a (brown liquid, 28 g, 56%). Through ESI-LCMS and $^1$H-NMR, the brown liquid obtained was identified as Intermediate Compound 53-a.

ESI-LCMS: $[M]^+$: $C_{11}H_{11}Br$. 220.0011.

$^1$H-NMR (400 MHz, $CDCl_3$): 7.34 (m, 3H), 7.18 (t, 1H), 6.84 (s, 1H), 1.77 (s, 9H).

Synthesis of Intermediate Compound 53-b

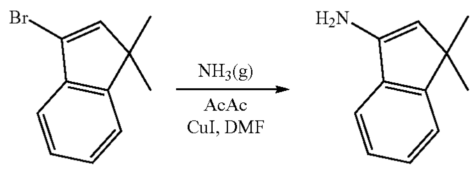

53-a 53-b

Under an argon atmosphere, to an autoclave, Intermediate Compound 53-a (28 g, 126 mmol), CuI (24 g, 126 mmol), cesium carbonate (140 g, 630 mmol) and acetylacetone (6.3 g, 63 mmol) were added and dissolved in 300 mL of DMF, and an aqueous ammonia solution (30 mL) was added thereto, followed by stirring and refluxing at about 150° C. for about 12 hours under a reduced pressure. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 53-b (brown liquid, 10 g, 54%). Through ESI-LCMS, the brown liquid obtained was identified as Intermediate Compound 53-b.

ESI-LCMS: $[M]^+$: $C_{11}H_{13}N$. 159.1007.

Synthesis of Intermediate Compound 53-c

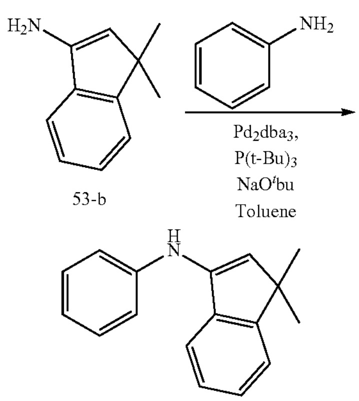

53-c

Under an argon atmosphere, to a 500 mL flask, Intermediate Compound 53-b (10 g, 63 mmol), aniline (7.8 g, 82 mmol), tert-butyl phosphine (3.0 mL, 6.4 mmol), and $Pd_2dba_3$ (2.9 g, 3.2 mmol) were added and dissolved in 150 mL of toluene, and the reaction solution was stirred at about 100° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 53-c (white solid, 12 g, 84%). Through ESI-LCMS, the white solid obtained was identified as Intermediate Compound 53-c.

ESI-LCMS: $[M]^+$: $C_{17}H_{17}N$. 356.1312.

Synthesis of Intermediate Compound 53-d

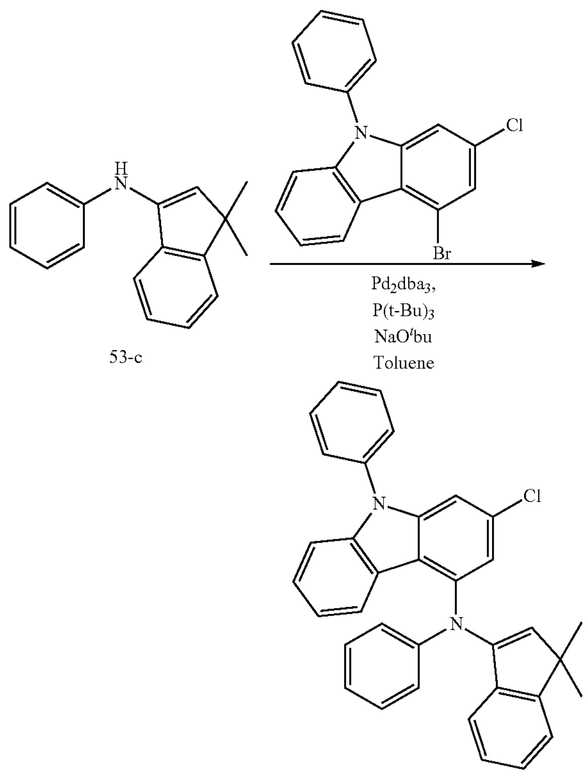

53-d

Under an argon atmosphere, to a 500 mL flask, Intermediate Compound 53-c (12 g, 51 mmol), 4-bromo-2-chloro-9-phenyl-9H-carbazole (18.2 g, 51 mmol), sodium tert-butoxide (15 g, 153 mmol), tert-butyl phosphine (2.4 mL, 5.0 mmol), and $Pd_2dba_3$ (2.3 g, 2.5 mmol) were added and dissolved in 200 mL of toluene, and the reaction solution was stirred at about 100° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 53-d (white solid, 20 g, 77%). Through ESI-LCMS, the white solid obtained was identified as Intermediate Compound 53-d.

ESI-LCMS: $[M]^+$: $C_{35}H_{27}N_2Cl$. 510.1819.

Synthesis of Intermediate Compound 53-e

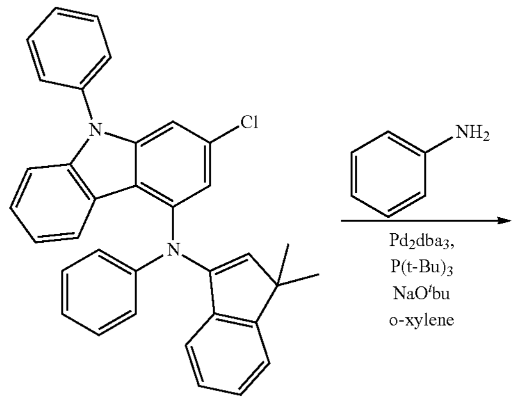

53-d

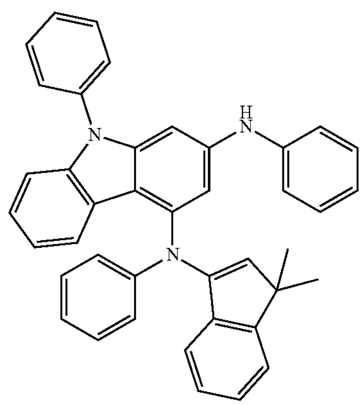

53-e

Under an argon atmosphere, to a 500 mL flask, Intermediate Compound 53-d (20 g, 39 mmol), aniline (4.8 g, 51 mmol), sodium tert-butoxide (11 g, 117 mmol), tert-butyl phosphine (1.7 mL, 3.8 mmol), and $Pd_2dba_3$ (1.7 g, 1.9 mmol) were added and dissolved in 150 mL of toluene, and the reaction solution was stirred at about 100° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 53-e (white solid, 14 g, 64%). Through ESI-LCMS, the white solid obtained was identified as Intermediate Compound 53-e.

ESI-LCMS: $[M]^+$: $C_{41}H_{33}N_3$. 567.2247.

Synthesis of Intermediate Compound 53-f

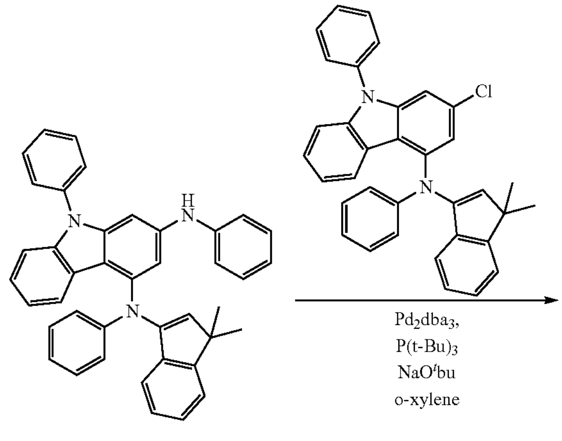

53-e

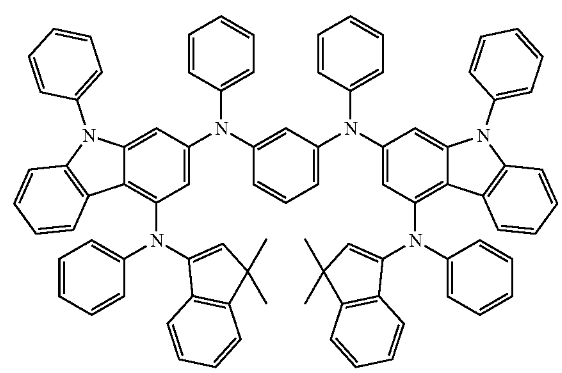

53-f

Under an argon atmosphere, to a 500 mL flask, Intermediate Compound 53-e (14 g, 25 mmol), Intermediate Compound 53-d (12.7 g, 25 mmol), sodium tert-butoxide (7.2 g, 75 mmol), tert-butyl phosphine (1.1 mL, 2.6 mmol), and $Pd_2dba_3$ (1.1 g, 1.3 mmol) were dissolved in 150 mL of toluene and the reaction solution was stirred at about 100° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 53-f (white solid, 17.8 g, 59%). Through ESI-LCMS, the white solid obtained was identified as Intermediate Compound 53-f.

ESI-LCMS: $[M]^+$: $C_{88}H_{68}N_6$. 1208.2649.

Synthesis of Compound 53

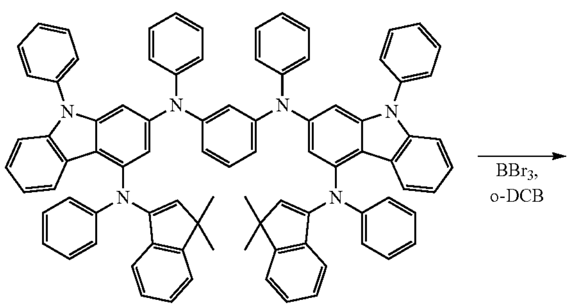

53-f

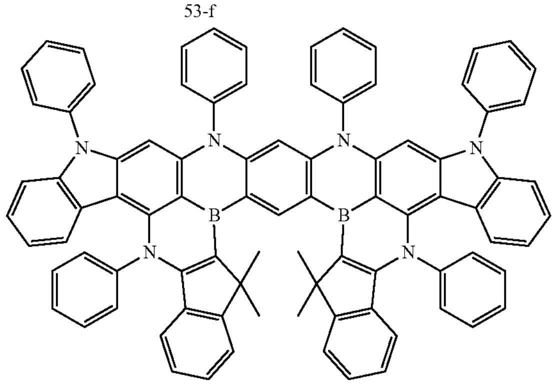

53

Under an argon atmosphere, in a 1 L flask, Intermediate Compound 53-f (17 g, 14 mmol) was dissolved in 400 mL of o-dichlorobenzene and cooled to about 0° C. in an ice-water bath. Boron tribromide (5 eq) was slowly added dropwisely to the reaction solution, the temperature was slowly elevated to room temperature, and stirring was performed for about 20 minutes. The reaction solution was heated to about 180° C. and stirred for about 12 hours. After cooling, triethylamine (5 mL) was slowly added thereto dropwisely to quench the reaction, and all solvents were removed under a reduced pressure. The solid thus obtained was washed with MeOH and separated by column chromatography utilizing silica gel and a developing solvent of $CH_2Cl_2$ and hexane to obtain Compound 53 (yellow solid, 2.1 g, 11%). Through ESI-LCMS and $^{1}$H-NMR, the yellow solid obtained was identified as Compound 53.

ESI-LCMS: $[M+H]^+$: $C_{88}H_{62}B_2N_6$. 1224.3431.

$^{1}$H-NMR (400 MHz, $CDCl_3$): 10.27 (s, 1H), 8.19 (d, 2H), 7.60 (m, 16H), 7.36 (m, 6H), 7.18 (m, 10H), 7.08 (d, 6H), 7.01 (m, 3H), 6.83 (s, 1H), 1.47 (s, 8H).

(7) Synthesis of Compound 78

Synthesis of Intermediate Compound 78-a

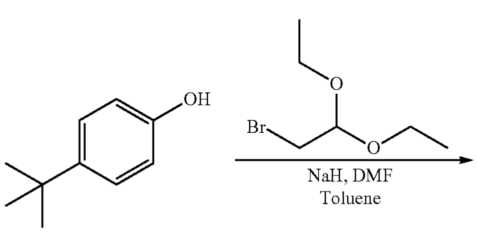

-continued

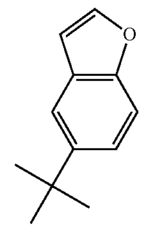

78-a

Under an argon atmosphere, in a 2 L flask, 4-tert-butyl phenol (50 g, 333 mmol) and NaH (1.1 equiv.) were dissolved in 1 L of anhydrous DMF and cooled to about 0° C. in an ice-water bath. 2-bromo-1,1-diethoxyethane (2 eq) was slowly added dropwisely to the reaction solution, the temperature was slowly elevated to room temperature, and stirring was performed for about 20 minutes. The reaction solution was heated to about 150° C. and stirred for about 12 hours. After cooling, triethylamine (5 mL) was slowly added thereto dropwisely to quench the reaction, and all solvents were removed under a reduced pressure. The solid thus obtained was dissolved in toluene again and stirred and refluxed at about 120° C. After cooling, separation was performed by column chromatography utilizing silica gel and a developing solvent of $CH_2Cl_2$ and hexane to obtain Intermediate Compound 78-a (colorless liquid, 31 g, 54%). Through ESI-LCMS and $^{1}$H-NMR, the colorless liquid obtained was identified as Intermediate Compound 78-a.

ESI-LCMS: $[M+H]^+$: $C_{12}H_{14}O$. 174.0894.

$^{1}$H-NMR (400 MHz, $CDCl_3$): 7.63 (d, 1H), 7.52 (m, 2H), 7.22 (d, 1H), 6.76 (d, 1H), 1.52 (s, 9H).

Synthesis of Intermediate Compound 78-b

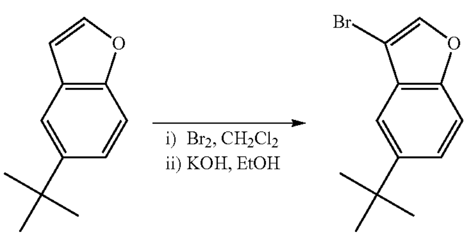

78-a 78-b

Under an argon atmosphere, to a 2 L flask, Intermediate Compound 78-a (31 g, 178 mmol) was added and dissolved in 1 L of chloroform, and bromine (1 equiv.) was slowly added dropwisely. After stirring at room temperature for about 12 hours, water (1 L) and dichloromethane (300 mL) were added, and extraction was performed. Organic layers were collected, dried with $MgSO_4$ and filtered. The solvents of the filtrate solution were removed under a reduced pressure. The solid thus obtained and KOH were dissolved in ethanol and then, stirred and refluxed. After cooling, recrystallization with EtOH was performed to obtain Intermediate Compound 78-b (light yellow liquid, 30 g, 62%). Through ESI-LCMS, the yellow liquid obtained was identified as Intermediate Compound 78-b.

ESI-LCMS: $[M]^+$: $C_{12}H_{13}BrO$. 252.0917.

Synthesis of Intermediate Compound 78-c

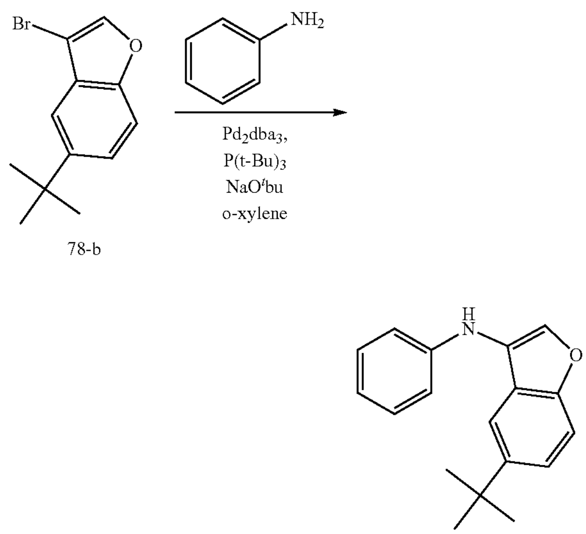

78-b 78-c

Under an argon atmosphere, to a 1 L flask, Intermediate Compound 78-b (30 g, 118 mmol), aniline (14.7 g, 154 mmol), sodium tert-butoxide (34 g, 354 mmol), tert-butyl phosphine (5.5 mL, 11.8 mmol), and $Pd_2dba_3$ (5.4 g, 5.9 mmol) were added and dissolved in 500 mL of toluene, and the reaction solution was stirred at about 100° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 78-c (yellow liquid, 22 g, 71%). Through ESI-LCMS, the yellow liquid obtained was identified as Intermediate Compound 78-c.

ESI-LCMS: $[M]^+$: $C_{18}H_{19}NO$. 265.1434.

Synthesis of Intermediate Compound 78-d

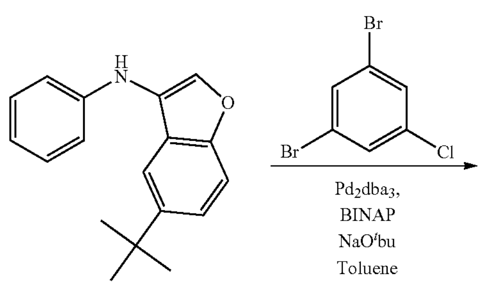

78-c

-continued

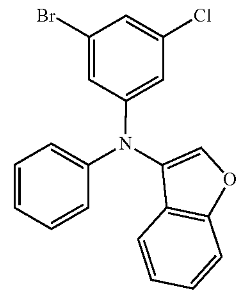

78-d

Under an argon atmosphere, to a 1 L flask, Intermediate Compound 78-c (22 g, 83 mmol), 3,5-dibromo-chlorobenzene (22.4 g, 83 mmol), sodium tert-butoxide (24 g, 249 mmol), BINAP (4.0 mL, 8.4 mmol), and $Pd_2dba_3$ (3.8 g, 4.2 mmol) were added and dissolved in 500 mL of toluene, and the reaction solution was stirred at about 100° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 78-d (white solid, 18 g, 56%). Through ESI-LCMS, the white solid obtained was identified as Intermediate Compound 78-d.

ESI-LCMS: $[M]^+$: $C_{20}H_{13}NBrClO$. 396.9978.

Synthesis of Intermediate Compound 78-e

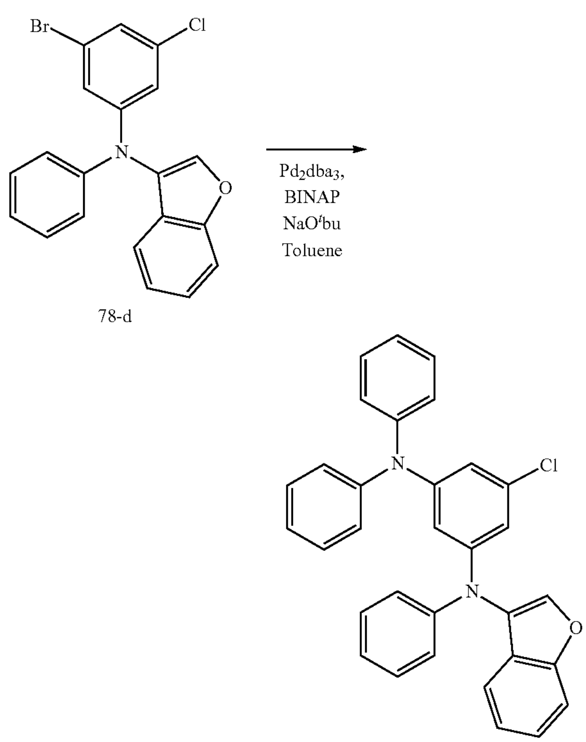

78-d 78-e

Under an argon atmosphere, to a 1 L flask, Intermediate Compound 78-d (18 g, 45 mmol), diphenylamine (7.6 g, 45 mmol), sodium tert-butoxide (12.9 g, 135 mmol), BINAP (2.8 g, 4.6 mmol), and $Pd_2dba_3$ (2.0 g, 2.3 mmol) were added and dissolved in 250 mL of toluene, and the reaction solution was stirred at about 100° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 78-e (white solid, 15 g, 72%). Through ESI-LCMS, the white solid obtained was identified as Intermediate Compound 78-e.

ESI-LCMS: $[M]^+$: $C_{32}H_{23}N_2ClO$. 486.1515.

Synthesis of Intermediate Compound 78-f

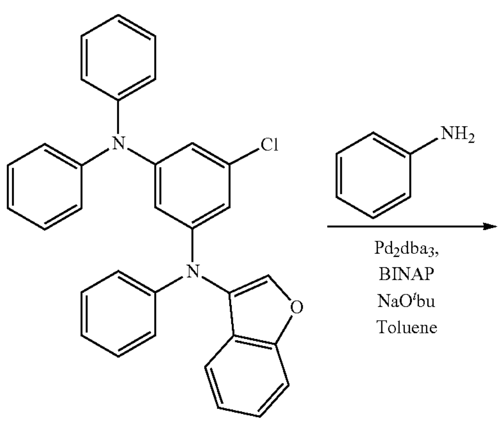

78-e

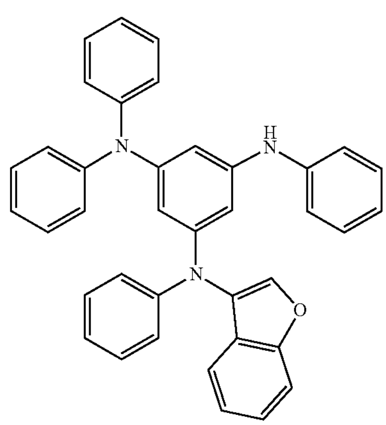

78-f

Under an argon atmosphere, to a 1 L flask, Intermediate Compound 78-e (15 g, 31 mmol), aniline (3.8 g, 40 mmol), sodium tert-butoxide (8.9 g, 93 mmol), BINAP (2.0 g, 3.2 mmol), and $Pd_2dba_3$ (1.4 g, 1.6 mmol) were added and dissolved in 250 mL of toluene, and the reaction solution was stirred at about 100° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 78-f (white solid, 11.5 g, 68%). Through ESI-LCMS, the white solid obtained was identified as Intermediate Compound 78-f.

ESI-LCMS: $[M]^+$: $C_{38}H_{29}N_3O$. 543.2323.

Synthesis of Intermediate Compound 78-g

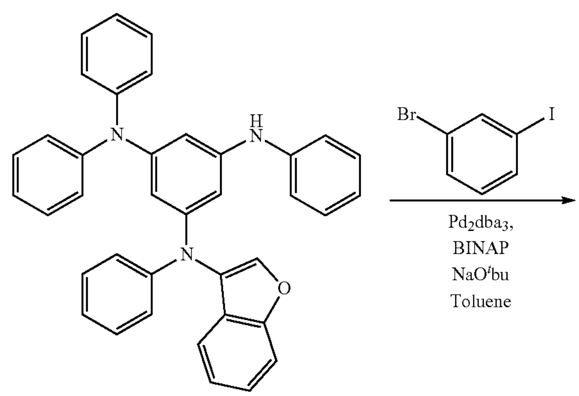

78-f

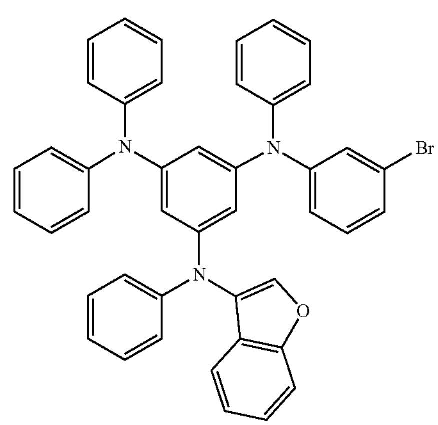

78-g

Under an argon atmosphere, to a 1 L flask, Intermediate Compound 78-f (11 g, 20 mmol), 3-iodo-bromobenzene (5.7 g, 20 mmol), sodium tert-butoxide (5.8 g, 60 mmol), BINAP (1.2 g, 2.0 mmol), and $Pd_2dba_3$ (0.9 g, 1.0 mmol) were added and dissolved in 150 mL of toluene, and the reaction solution was stirred at about 100° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 78-g (white solid, 8.5 g, 61%). Through ESI-LCMS, the white solid obtained was identified as Intermediate Compound 78-g.

ESI-LCMS: $[M]^+$: $C_{44}H_{32}N_3OBr$. 697.1727.

Synthesis of Intermediate Compound 78-h

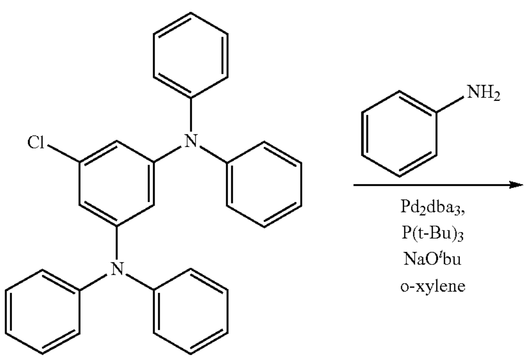

-continued

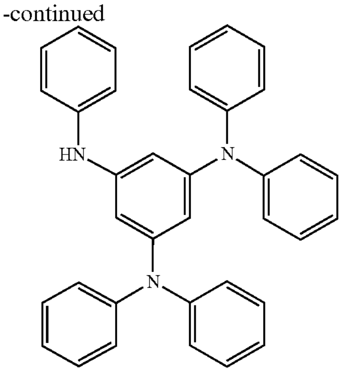

78-h

Under an argon atmosphere, to a 2 L flask, 5-chloro-N1,N1,N3,N3-tetraphenyl benzene-1,3-diamine (50 g, 112 mmol), aniline (14 g, 145 mmol), sodium tert-butoxide (32 g, 336 mmol), BINAP (7.0 g, 11.2 mmol), and $Pd_2dba_3$ (5.1 g, 5.6 mmol) were added and dissolved in 700 mL o-xylene, and the reaction solution was stirred at about 140° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 78-h (white solid, 37 g, 67%). Through ESI-LCMS, the white solid obtained was identified as Intermediate Compound 78-h.

ESI-LCMS: $[M]^+$: $C_{36}H_{29}N_3$. 503.2421.

Synthesis of Intermediate Compound 78-i

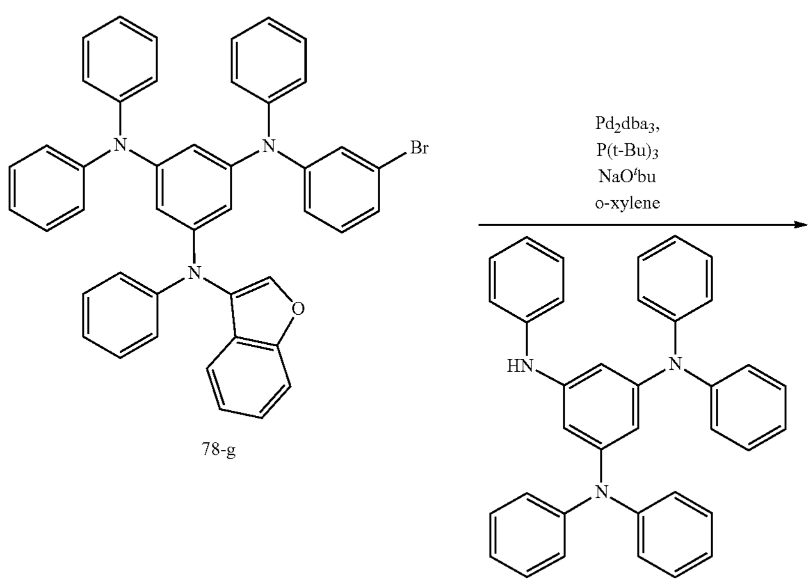

78-g 78-h

-continued

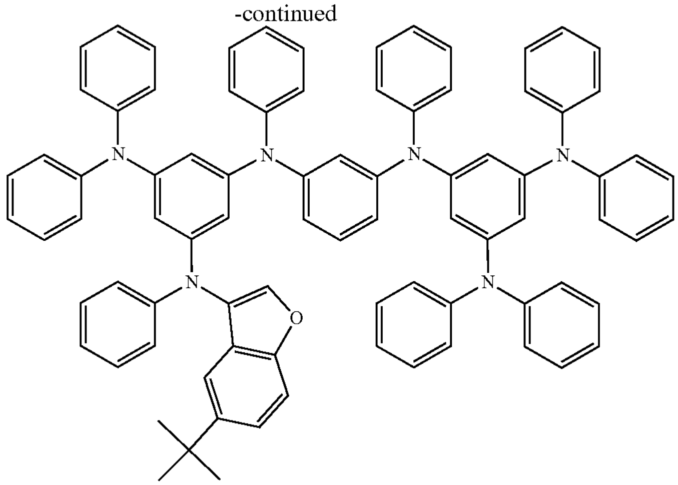

78-i

Under an argon atmosphere, to a 2 L flask, Intermediate Compound 78-g (8.5 g, 12 mmol), Intermediate Compound 78-h (6 g, 145 mmol), sodium tert-butoxide (3.4 g, 36 mmol), BINAP (0.74 g, 1.2 mmol), and $Pd_2dba_3$ (0.5 g, 0.6 mmol) were added and dissolved in 100 mL of toluene, and the reaction solution was stirred at about 100° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 78-i (white solid, 9.6 g, 68%). Through ESI-LCMS, the white solid obtained was identified as Intermediate Compound 78-i.

ESI-LCMS: $[M]^+$: $C_{84}H_{68}N_6O$. 1176.5431.

Synthesis of Compound 78

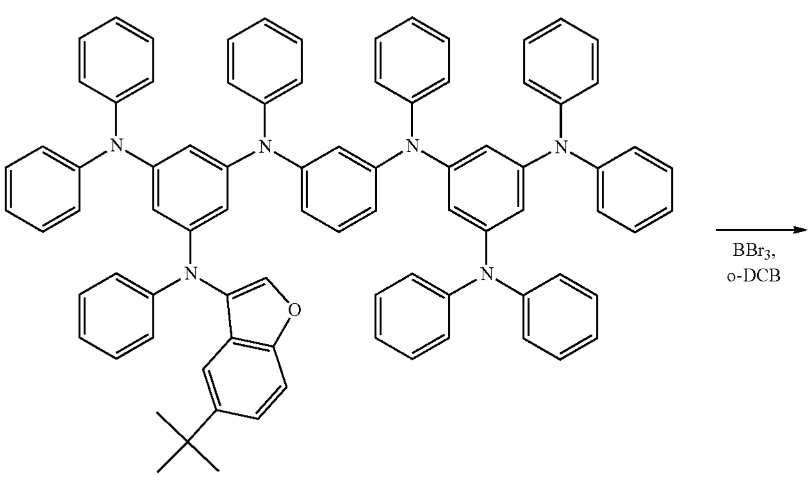

78-i

-continued

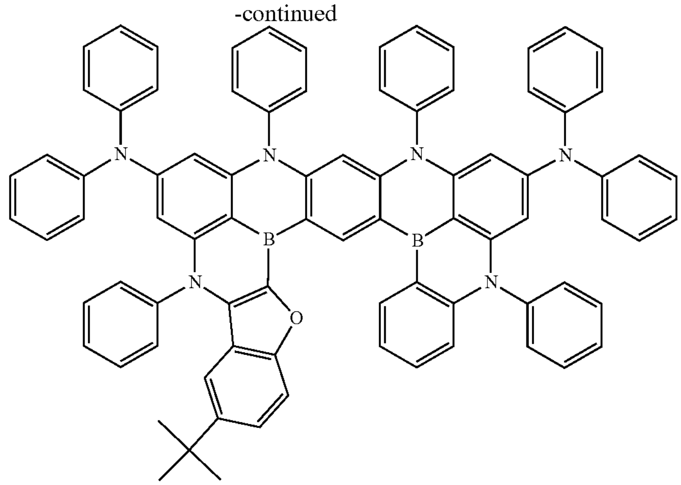

78

Under an argon atmosphere, in a 1 L flask, Intermediate 78-i (9 g, 7.6 mmol) was dissolved in 100 mL of o-dichlorobenzene and cooled to about 0° C. in an ice-water bath. Boron tribromide (5 eq) was slowly added dropwisely to the reaction solution, the temperature was slowly elevated to room temperature, and stirring was performed for about 20 minutes. The reaction solution was heated to about 180° C. and stirred for about 12 hours. After cooling, triethylamine (5 mL) was slowly added thereto dropwisely to quench the reaction, and all solvents were removed under a reduced pressure. The solid thus obtained was washed with MeOH and separated by column chromatography utilizing silica gel and a developing solvent of $CH_2Cl_2$ and hexane to obtain Compound 78 (yellow solid, 1.2 g, 12%). Through ESI-LCMS and $^1$H-NMR, the yellow solid obtained was identified as Compound 78.

ESI-LCMS: $[M]^+$: $C_{84}H_{62}B_2N_6O$. 1292.2343.

$^1$H-NMR (400 MHz, $CDCl_3$): 10.22 (s, 1H), 9.26 (d, 1H), 7.75 (m, 3H), 7.52 (d, 1H), 7.45 (d, 1H), 7.22 (m, 18H), 7.05 (m, 25H), 7.08 (d, 6H), 6.81 (s, 1H), 6.56 (s, 4H), 1.43 (s, 9H).

(8) Synthesis of Compound 81

Synthesis of Intermediate Compound 81-a

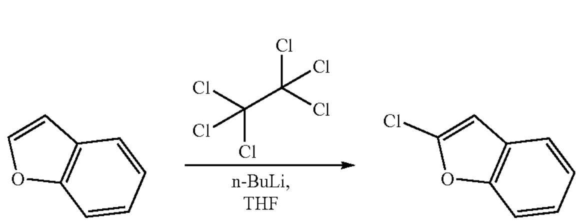

81-a

Under an argon atmosphere, in a 2 L flask, benzofuran (50 g, 423 mmol) was dissolved in 1 L of anhydrous THF and cooled to about −78° C. in a dry ice-acetone bath. n-BuLi in hexane (1.2 equiv.) was slowly added dropwisely to the reaction solution, and while keeping the temperature, stirring was performed for about 2 hours. Perchloroethane (1.5 equiv.) was added to the reaction solution dropwisely, and the temperature was slowly elevated to room temperature, followed by stirring for about 6 hours. 1N HCl (50 mL) was added to the reaction solution dropwisely to quench the reaction, and stirring was performed at room temperature for about 20 minutes. The reaction solution was poured to 1 L of water and extracted with ethyl acetate many times. Organic layers were collected, dried with $MgSO_4$ and filtered. The solvents of the filtrate solution were removed under a reduced pressure, and recrystallization was performed with hexane to obtain Intermediate Compound 81-a (white solid, 41 g, 64%). Through ESI-LCMS and $^1$H-NMR, the white solid obtained was identified as Intermediate Compound 81-a.

ESI-LCMS: $[M]^+$: $C_8H_5OCl$. 152.0012.

$^1$H-NMR (400 MHz, $CDCl_3$): 7.59 (m, 2H), 7.39 (t, 1H), 7.22 (m, 1H), 7.14 (s, 1H).

Synthesis of Intermediate Compound 81-b

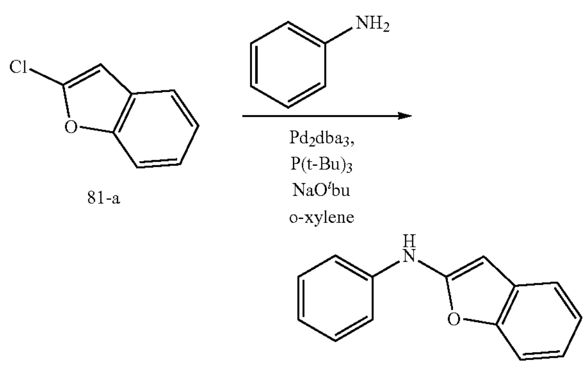

81-b

Under an argon atmosphere, to a 2 L flask, Intermediate Compound 81-a (40 g, 261 mmol), aniline (32 g, 339 mmol), sodium tert-butoxide (75 g, 783 mmol), BINAP (16.1 g, 26 mmol), and $Pd_2dba_3$ (12 g, 13 mmol) were added and dissolved in 700 mL of o-xylene, and the reaction solution was stirred at about 140° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 81-b (white solid, 40 g, 73%). Through ESI-LCMS, the white solid obtained was identified as Intermediate Compound 81-b.

ESI-LCMS: $[M]^+$: $C_{14}H_{11}NO$. 209.0819.

Synthesis of Intermediate Compound 81-c

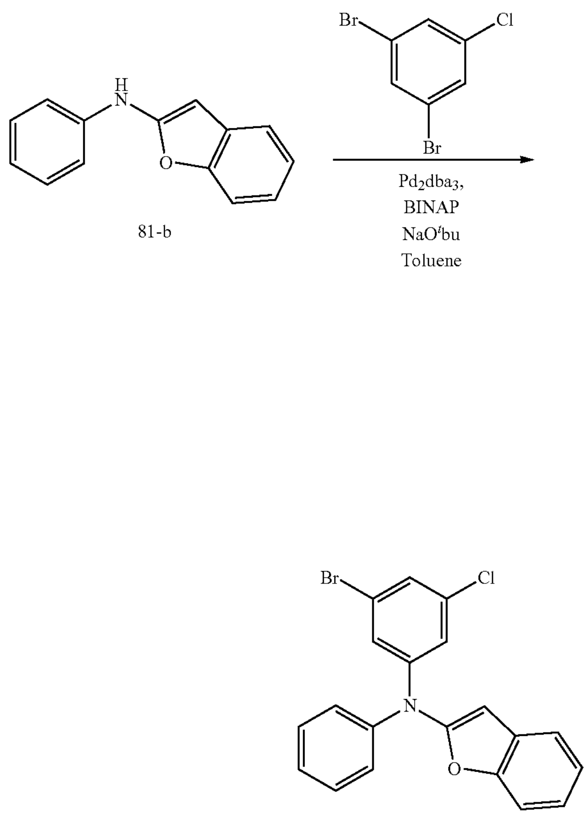

81-c

Under an argon atmosphere, to a 2 L flask, Intermediate Compound 81-b (40 g, 191 mmol), 3,5-dibromo-chlorobenzene (52 g, 191 mmol), sodium tert-butoxide (55 g, 573 mmol), BINAP (12 g, 19 mmol), and $Pd_2dba_3$ (8.7 g, 9.5 mmol) were added and dissolved in 700 mL of toluene, and the reaction solution was stirred at about 100° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 81-c (white solid, 38 g, 51%). Through ESI-LCMS, the white solid obtained was identified as Intermediate Compound 81-c.

ESI-LCMS: $[M]^+$: $C_{20}H_{13}NOBrCl$. 396.9912.

Synthesis of Intermediate Compound 81-d

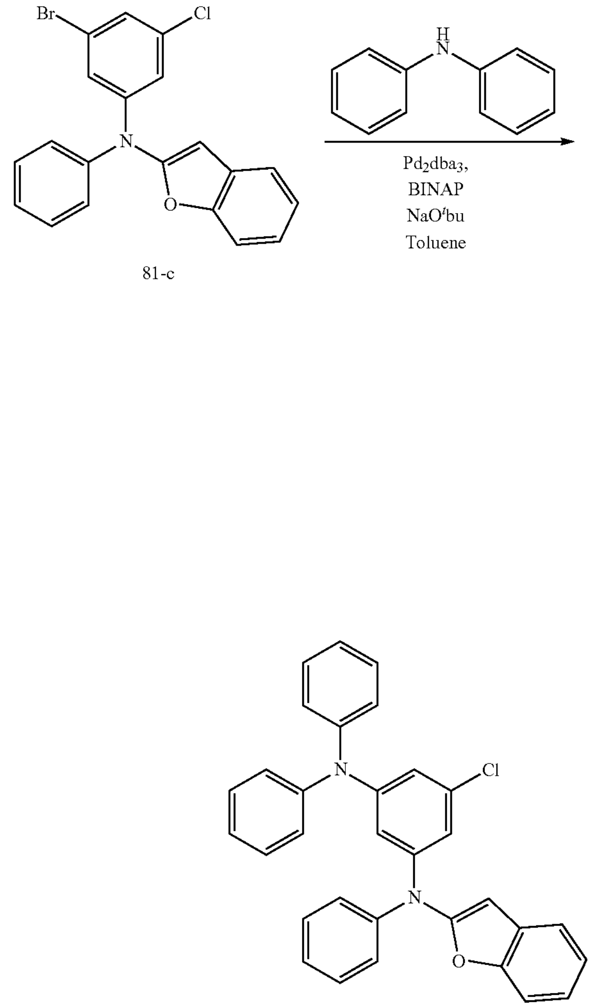

81-d

Under an argon atmosphere, to a 2 L flask, Intermediate Compound 81-c (38 g, 95.3 mmol), diphenylamine (16 g, 95.3 mmol), sodium tert-butoxide (27 g, 285 mmol), BINAP (6 g, 9.6 mmol), and $Pd_2dba_3$ (4.3 g, 4.8 mmol) were added and dissolved in 500 mL of toluene, and the reaction solution was stirred at about 100° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 81-d (white solid, 31 g, 68%). Through ESI-LCMS, the white solid obtained was identified as Intermediate Compound 81-d.

ESI-LCMS: $[M]^+$: $C_{32}H_{23}N_2OCl$. 486.1237.

Synthesis of Intermediate Compound 81-e

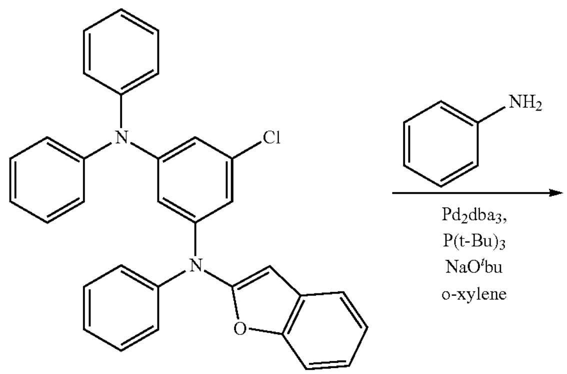

81-d

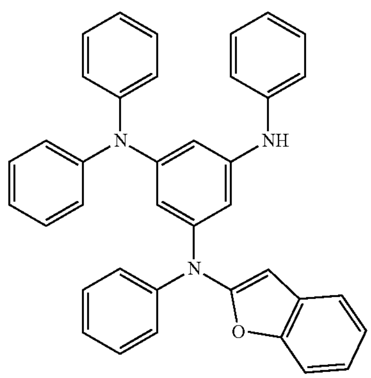

81-e

Under an argon atmosphere, to a 2 L flask, Intermediate Compound 81-d (30 g, 61 mmol), aniline (7.7 g, 80 mmol), sodium tert-butoxide (17 g, 183 mmol), BINAP (3.8 g, 6.2 mmol), and $Pd_2dba_3$ (2.8 g, 3.1 mmol) were added and dissolved in 500 mL o-xylene, and the reaction solution was stirred at about 140° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 81-e (white solid, 22 g, 69%). Through ESI-LCMS, the white solid obtained was identified as Intermediate Compound 81-e.

ESI-LCMS: $[M]^+$: $C_{38}H_{29}N_3O$. 543.2237.

Synthesis of Intermediate Compound 81-f

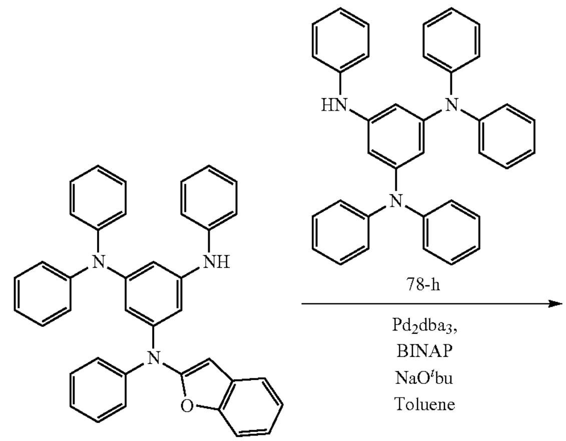

81-e

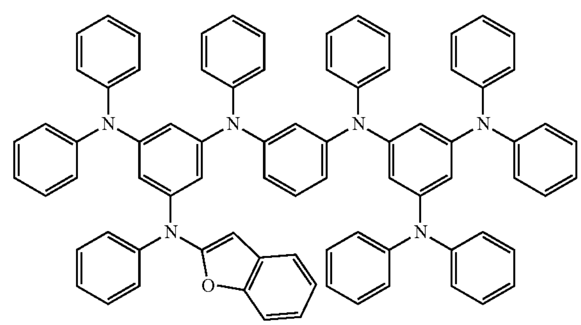

81-f

Under an argon atmosphere, to a 2 L flask, Intermediate Compound 81-e (20 g, 37 mmol), Intermediate Compound 78-h (18 g, 37 mmol), sodium tert-butoxide (11 g, 111 mmol), BINAP (2.2 g, 3.6 mmol), and $Pd_2dba_3$ (1.7 g, 1.8 mmol) were added and dissolved in 300 mL of toluene, and the reaction solution was stirred at about 100° C. for about 12 hours. After cooling, water (1 L) and ethyl acetate (300 mL) were added, and extraction was performed. Organic layers were collected, dried with $MgSO_4$ and filtered. The solvents of the filtrate solution were removed under a reduced pressure. The solid thus obtained was separated by column chromatography utilizing silica gel and a developing solvent of $CH_2Cl_2$ and hexane to obtain Intermediate Compound 81-f (white solid, 29 g, 71%). Through ESI-LCMS, the white solid obtained was identified as Intermediate Compound 81-f.

ESI-LCMS: $[M]^+$: $C_{80}H_{60}N_6O$. 1120.4841.

Synthesis of Compound 81

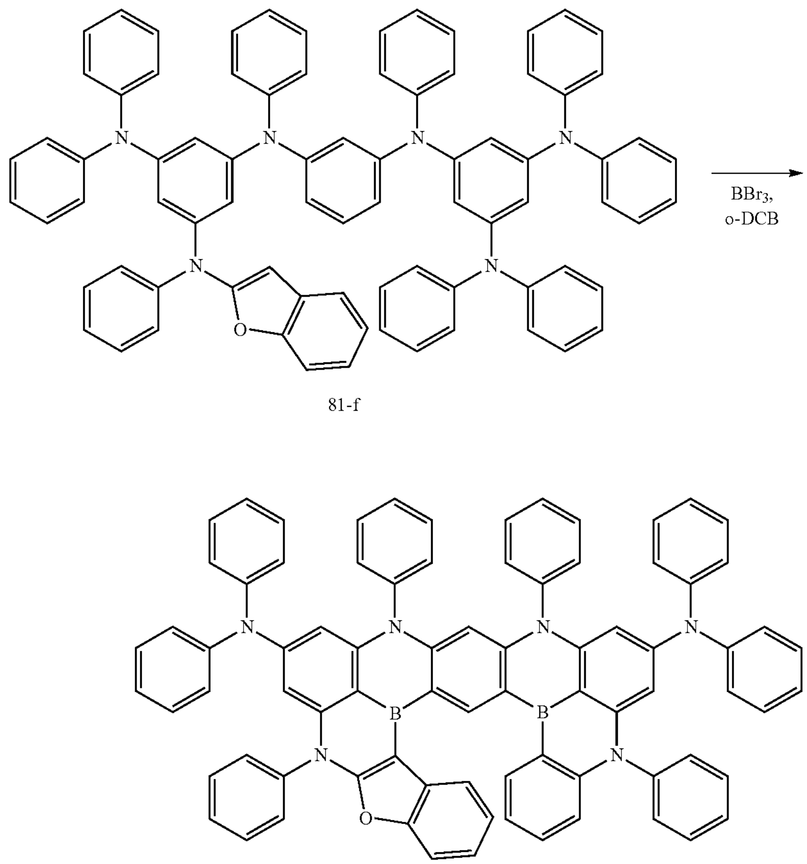

81-f

81

Under an argon atmosphere, in a 1 L flask, Intermediate Compound 81-f (29 g, 7.6 mmol) was dissolved in 100 mL of o-dichlorobenzene and cooled to about 0° C. in an ice-water bath. Boron tribromide (5 eq) was slowly added dropwisely to the reaction solution, the temperature was slowly elevated to room temperature, and stirring was performed for about 20 minutes. The reaction solution was heated to about 180° C. and stirred for about 12 hours. After cooling, triethylamine (5 mL) was slowly added thereto dropwisely to quench the reaction, and all solvents were removed under a reduced pressure. The solid thus obtained was washed with MeOH and separated by column chromatography utilizing silica gel and a developing solvent of $CH_2Cl_2$ and hexane to obtain Compound 81 (yellow solid, 2.4 g, 8%). Through ESI-LCMS and $^1$H-NMR, the yellow solid obtained was identified as Compound 81.

ESI-LCMS: $[M]^+$: $C_{80}H_{54}B_2N_6O$. 1136.4437.

$^1$H-NMR (400 MHz, $CDCl_3$): 10.32 (s, 1H), 9.26 (d, 1H), 7.84 (d, 1H), 7.71 (d, 1H), 7.59 (d, 1H), 7.39 (t, 1H), 7.24 (m, 20H), 7.00 (m, 24H), 6.83 (s, 1H), 6.48 (s, 4H).

2. Manufacture and Evaluation of Light Emitting Device Including Fused Polycyclic Compound Manufacture of Light Emitting Device The light emitting devices of Examples 1 to 8 were manufactured utilizing Compounds 2, 25, 35, 44, 50, 53, 78 and 81 respectively as dopant materials of an emission layer.

Example Compounds

2

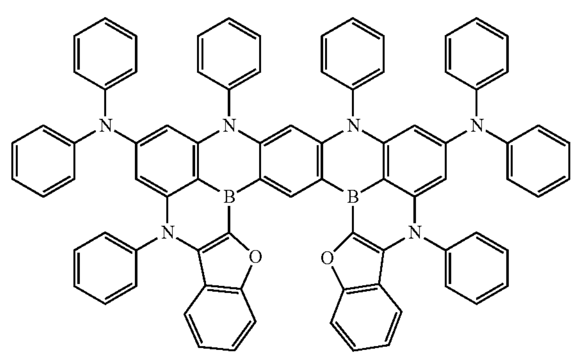

-continued
25
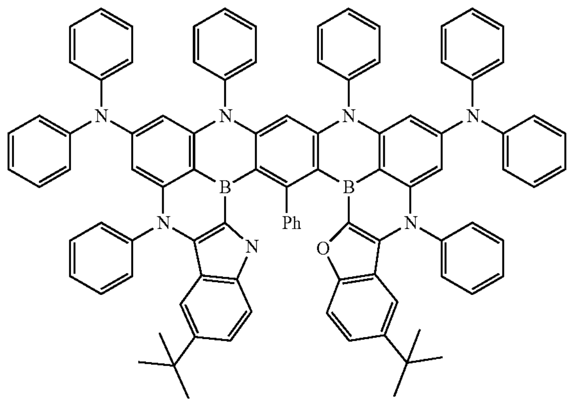
35
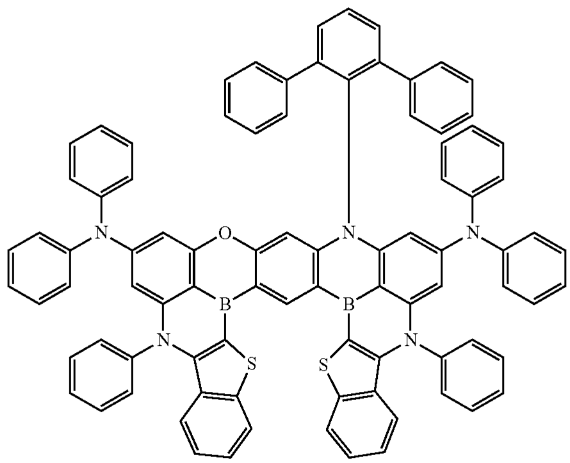
44
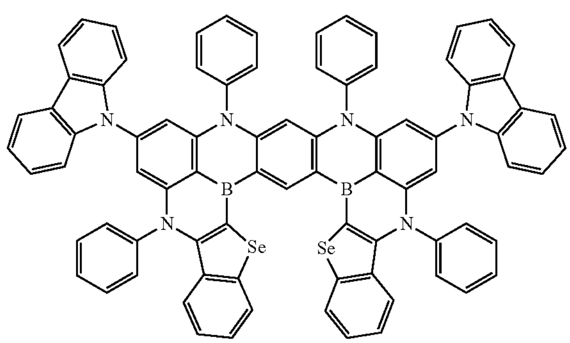
50
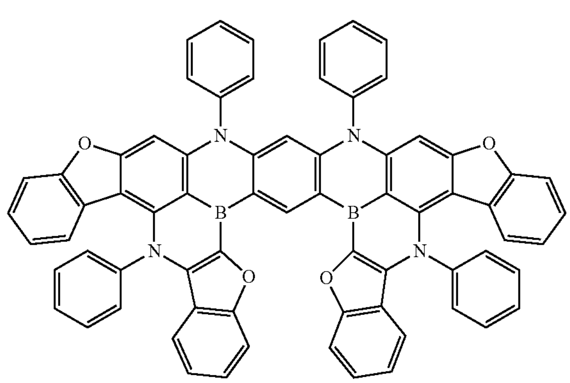
-continued
53
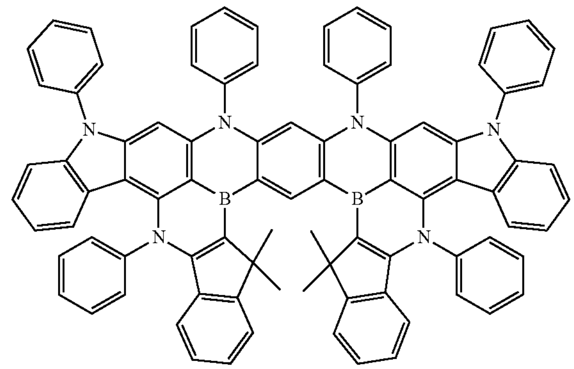
78
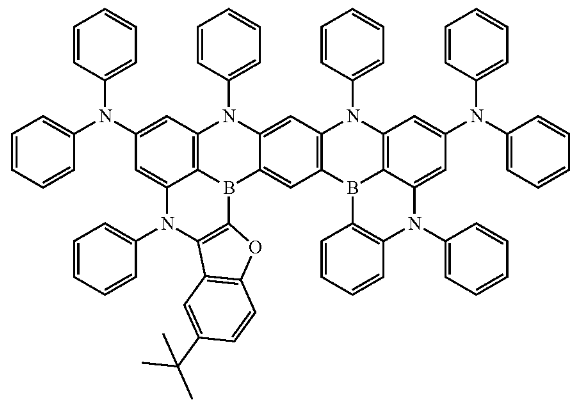
81
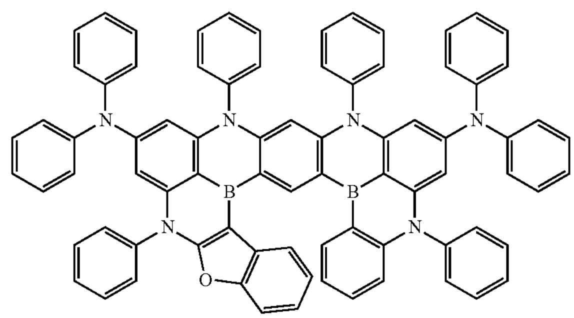
Comparative Compounds X-1 to X-4 below were utilized respectively for the manufacture of devices of the Comparative Examples 1 to 4.
Comparative Compounds
X-1
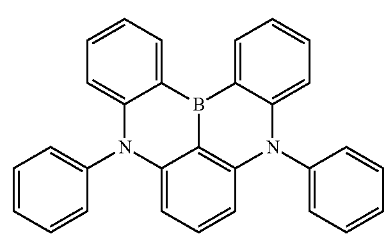

-continued

X-2

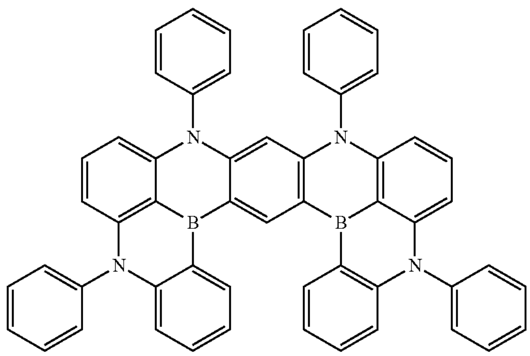

X-3

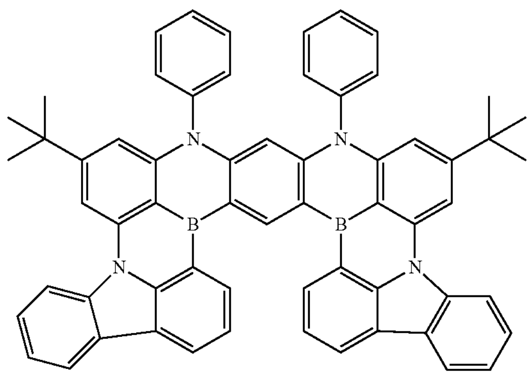

X-4

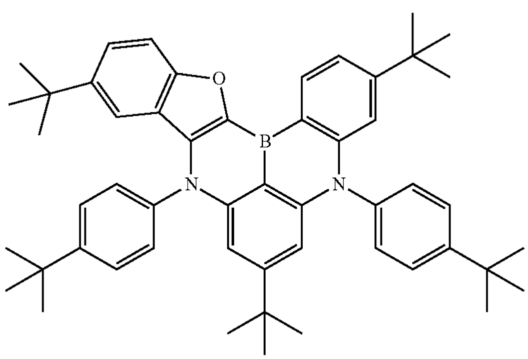

A light emitting device of an embodiment, including the fused polycyclic compound of an embodiment in an emission layer was manufactured by a method below. Example 1 to Example 8 correspond to light emitting devices manufactured by utilizing Compounds 2, 25, 35, 44, 50, 53, 78 and 81, which are aforementioned Example Compounds, as light emitting materials, respectively. Comparative Example 1 to Comparative Example 4 correspond to light emitting devices manufactured by utilizing Comparative Compound X-1 to Comparative Compound X-4 as light emitting materials, respectively.

A first electrode with a thickness of about 150 nm was formed utilizing ITO, a hole injection layer with a thickness of about 30 nm was formed on the first electrode utilizing N,N'-di(1-naphthyl)-N,N'-diphenyl-(1,1'-biphenyl)-4,4'-diamine (NPD), a hole transport layer with a thickness of about 20 nm was formed on the hole injection layer utilizing N-([1,1'-biphenyl]-4-yl)-9,9-diphenyl-N-(9-phenyl-9H-carbazol-3-yl)phenyl)-9H-fluoren-2-amine (H-1-19), an emission auxiliary layer with a thickness of about 10 nm was formed on the hole transport layer utilizing 9-(4-tert-butylphenyl)-3,6-bis(triphenylsilyl)-9H-carbazole (CzSi), an emission layer with a thickness of about 20 nm was formed on the emission auxiliary layer utilizing 1,3-bis(N-carbazolyl)benzene (mCP) doped with 3% of a respective Example Compound or a respective Comparative Compound, an electron transport layer with a thickness of about 20 nm was formed on the emission layer utilizing diphenyl [4-(triphenylsilyl)phenyl]phosphineoxide (TSPO1), a buffer layer with a thickness of about 30 nm was formed on the electron transport layer utilizing 2,2',2"-(1,3,5-benzenetriyl)-tris(1-phenyl-1-H-benzimidazole) (TPBI), an electron injection layer with a thickness of about 1 nm was formed on the buffer layer utilizing LiF, and a second electrode with a thickness of about 300 nm was formed on the electron injection layer utilizing Al. On the second electrode, a capping layer with a thickness of about 70 nm was formed utilizing P4. All layers were formed under a vacuum atmosphere by a deposition method.

The compounds utilized for the manufacture of the light emitting devices of the Examples and the Comparative Examples are shown below. The materials are known materials, and commercial materials were purified by sublimation and then utilized for the manufacture of the devices.

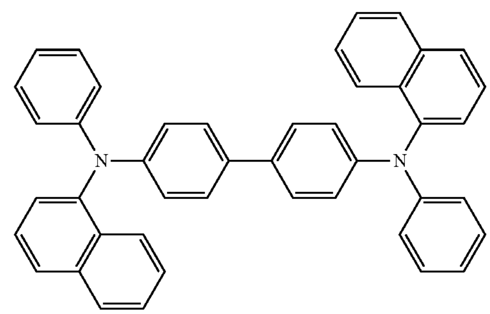

NPD

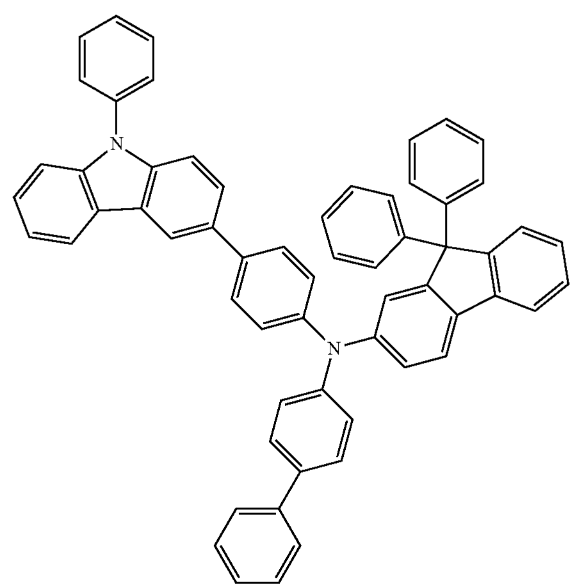

H-1-19

-continued

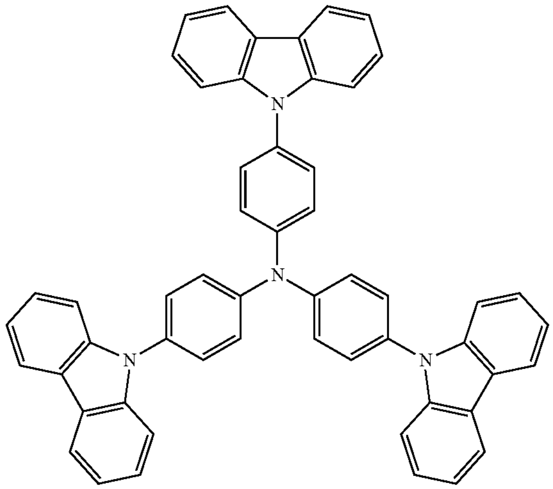

TCTA

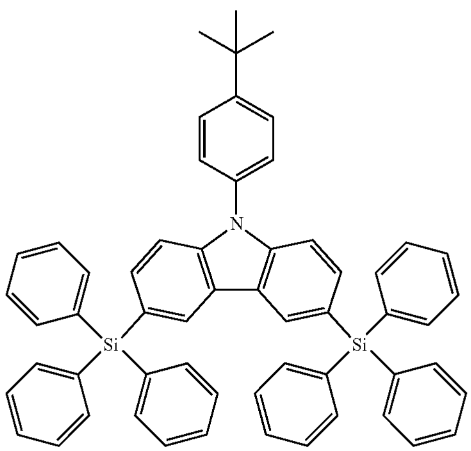

CzSI

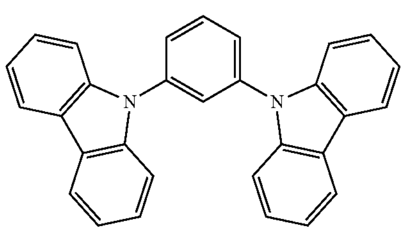

mCP

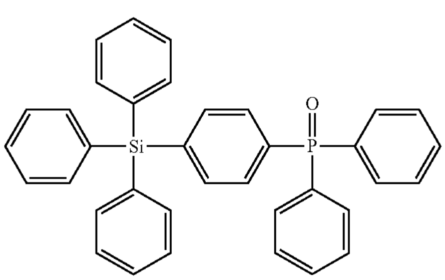

TSPO1

-continued

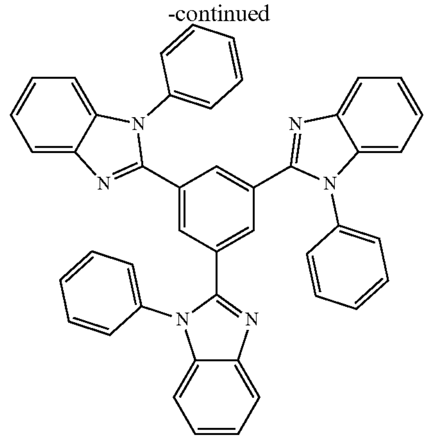

TPBi

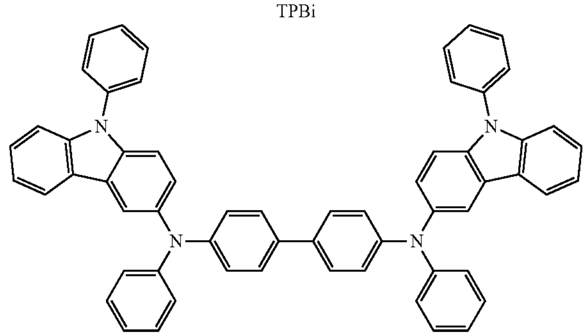

P4

Experimental Examples

The driving voltage, device efficiency and device life of each of the light emitting devices manufactured utilizing Compounds 2, 62 and 78, Comparative Compound X-1, and Comparative Compound X-2 were evaluated. Evaluation results are shown in Table 1 below. In the device evaluation, the driving voltage and device efficiency (cd/A) were measured at a current density of about 10 mA/cm$^2$. The device life shows a relative device life ratio with respect to Comparative Example 1. That is, the device life shown in Table 1 is a ratio between the device life of the device according to each of Examples and Comparative Examples and the device life of the device of Comparative Example 1.

TABLE 1

| Device manufacturing example | Dopant compound | Driving voltage (V) | Efficiency (cd/A) | Device life ($T_{95}$) |
|---|---|---|---|---|
| Example 1 | Compound 2 | 4.2 | 27.2 | 3.5 |
| Example 2 | Compound 25 | 4.3 | 24.8 | 2.7 |
| Example 3 | Compound 35 | 4.3 | 30.1 | 3.1 |
| Example 4 | Compound 44 | 4.2 | 34.4 | 2.9 |
| Example 5 | Compound 50 | 4.3 | 29.8 | 4.3 |
| Example 6 | Compound 53 | 4.3 | 22.1 | 1.2 |
| Example 7 | Compound 78 | 4.2 | 28.0 | 3.7 |
| Example 8 | Compound 81 | 4.3 | 26.7 | 3.2 |
| Comparative Example 1 | Comparative Compound X-1 | 4.5 | 15.7 | 1 |
| Comparative Example 2 | Comparative Compound X-2 | 4.4 | 20.8 | 1.4 |
| Comparative Example 3 | Comparative Compound X-3 | 4.8 | 18.7 | 0.6 |
| Comparative Example 4 | Comparative Compound X-4 | 4.4 | 17.8 | 0.4 |

Referring to the results of Table 1, it could be confirmed that each of the Examples of the light emitting devices utilizing the fused polycyclic compounds according to embodiments of the present disclosure as light emitting materials showed reduced driving voltage, improved emission efficiency and improved device life when compared with each of the Comparative Examples.

The Example Compounds each have a structure including at least one pentagonal aromatic ring in a wide plate-type skeleton structure with two baron atoms as the center, and form a wide conjugation structure to stabilize the polycyclic aromatic ring structure. In addition, multi-resonance effects may be increased, reverse intersystem crossing may be easily generated, and when each of the Example Compounds are utilized as thermally activated delayed fluorescence dopants, a full width at half maximum and a wavelength region may be suitable as blue emission materials, and emission efficiency may be improved. The light emitting device of an embodiment may include the fused polycyclic compound of an embodiment as the dopant of a thermally activated delayed fluorescence (TADF) emitting device, and may accomplish high device efficiency and long life in a blue wavelength region, for example, in a deep blue wavelength region.

Comparative Compound X-1 included in Comparative Example 1 does not include a pentagonal aromatic ring in a plate-type skeleton structure but has a structure including only one boron atom, and accordingly, it could be confirmed that the driving voltage was high, and the emission efficiency and the device life were degraded when compared with the Examples. In Comparative Compound X-2 included in Comparative Example 2, a plate-type skeleton with two boron atoms as the center is included but a pentagonal aromatic ring is not included in a plate-type skeleton structure, and accordingly, it could be confirmed that the driving voltage was high, and the emission efficiency and the device life were degraded when compared with the Examples. Comparative Compound X-3 included in Comparative Example 3 includes a plate-type skeleton with two boron atoms as the center and an additional fused structure, but the position of the additional fused structure formed is different from that of the Example Compound, and a wide conjugation structure could not be formed. Accordingly, it could be confirmed that the driving voltage was high, and the emission efficiency and the device life were degraded when compared with the Examples. Comparative Compound X-4 included in Comparative Example 4 includes a pentagonal aromatic ring in a plate-type skeleton structure but has a structure including only one boron atom, and accordingly, it could be confirmed that the driving voltage was high, and the emission efficiency and the device life were degraded when compared with the Examples.

The light emitting device of an embodiment may show improved device properties of high efficiency.

The fused polycyclic compound of an embodiment may be included in the emission layer of a light emitting device and may contribute to the increase of efficiency of a light emitting device.

Although the example embodiments of the present invention have been described, it is understood that the present invention should not be limited to these embodiments but various suitable changes and modifications can be made by one ordinary skilled in the art within the spirit and scope of the present invention as hereinafter claimed, and equivalents thereof.

What is claimed is:

1. A light emitting device, comprising:

a first electrode;

a second electrode facing the first electrode; and a plurality of organic layers between the first electrode and the second electrode, wherein at least one organic layer of the plurality of organic layers comprises a fused polycyclic compound, and the fused polycyclic compound is represented by Formula 1:

Formula 1

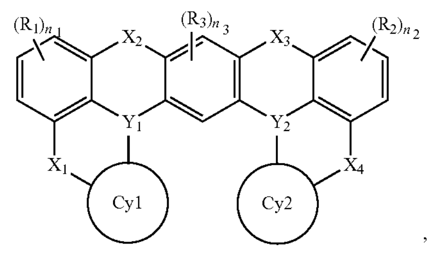

, wherein in Formula 1, $X_1$ to $X_4$ are each independently $CR_4R_5$, $NR_6$, O, S or Se, $Y_1$ and $Y_2$ are each B, $R_1$ to $R_6$ are each independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms, and/or combined with an adjacent group to form a ring, "$n_1$" and "$n_2$" are each independently an integer of 0 to 3, "$n_3$" is an integer of 0 to 2, Cy1 and Cy2 are each independently represented by Formula 2 or Formula 3, and at least one selected from among Cy1 and Cy2 is represented by Formula 2:

Formula 2

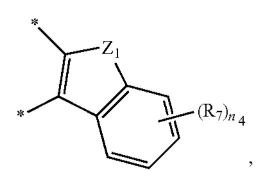

, wherein in Formula 2, $Z_1$ is $CR_8R_9$, $NR_{10}$, O, S, or Se, $R_7$ to $R_{10}$ are each independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms, and/or combined with an adjacent group to form a ring, "$n_4$" is an integer of 0 to 4, and —* represents a position connected with $X_1$ or $Y_1$, or a position connected with $X_4$ or $Y_2$,

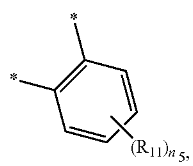

and wherein in Formula 3, $R_{11}$ is a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms, and/or combined with an adjacent group to form a ring, "$n_5$" is an integer of 0 to 4, and —* represents a position connected with $X_1$ or $Y_1$, or a position connected with $X_4$ or $Y_2$.

2. The light emitting device of claim 1, wherein the plurality of organic layers comprise:

a hole transport region on the first electrode;

an emission layer on the hole transport region; and an electron transport region on the emission layer, and the emission layer comprises the fused polycyclic compound.

3. The light emitting device of claim 2, wherein the emission layer is to emit delayed fluorescence.

4. The light emitting device of claim 2, wherein the emission layer is a delayed fluorescence emission layer comprising a host and a dopant, and the dopant comprises the fused polycyclic compound.

5. The light emitting device of claim 2, wherein the emission layer is to emit light having a central wavelength of about 430 nm to about 490 nm.

6. The light emitting device of claim 1, wherein the fused polycyclic compound represented by Formula 1 is represented by any one among Formula 4-1 to Formula 4-3:

Formula 4-1

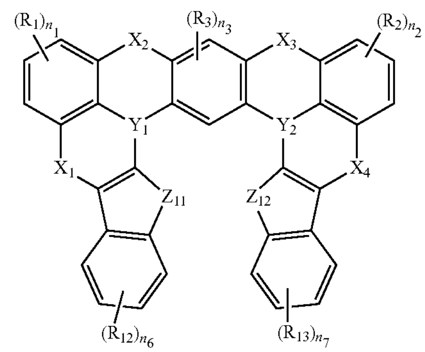

Formula 4-2

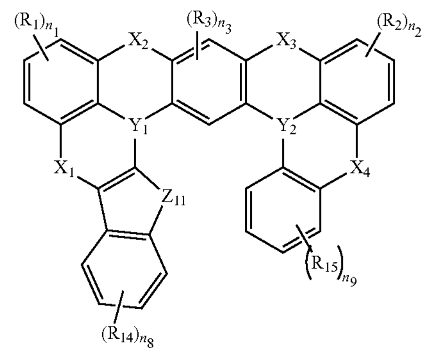

Formula 4-3

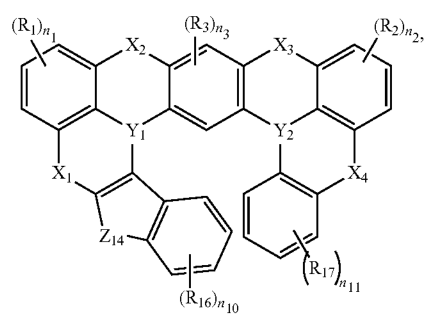

and wherein in Formula 4-1 to Formula 4-3, $Z_{11}$ to $Z_{14}$ are each independently $CR_{18}R_{19}$, $NR_{20}$, O, S, or Se, $R_{12}$ to $R_{20}$ are each independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms, and/or combined with an adjacent group to form a ring, "$n_6$" to "$n_{11}$" are each independently an integer of 0 to 4, and $X_1$ to $X_4$, $Y_1$, $Y_2$, $R_1$ to $R_3$, and $n_1$ to $n_3$ are the same as respectively defined in connection with Formula 1.

7. The light emitting device of claim 1, wherein the fused polycyclic compound represented by Formula 1 is represented by any one among Formula 5-1 to Formula 5-3:

Formula 5-1

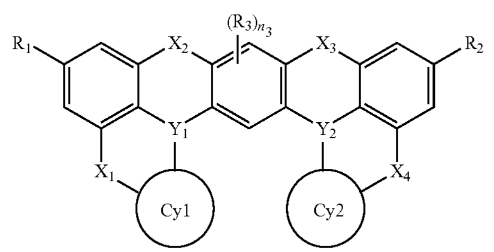

Formula 5-2

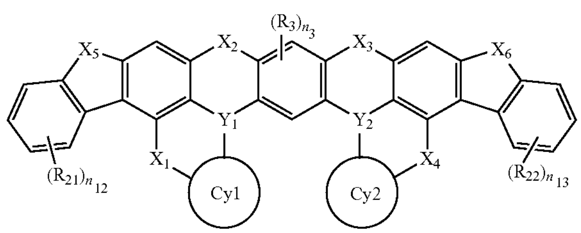

Formula 5-3

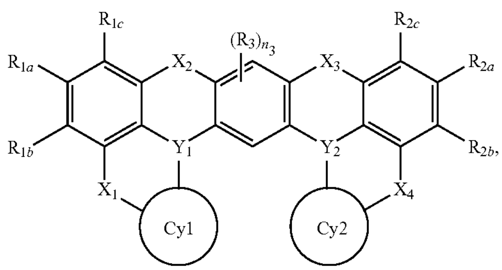

and wherein in Formula 5-1 to Formula 5-3, $X_5$ and $X_6$ are each independently $CR_{23}R_{24}$, $NR_{25}$, O, or S, $R_{21}$ to $R_{25}$ are each independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms, and/or combined with an adjacent group to form a ring, $R_{1a}$, $R_{1b}$, $R_{1c}$, $R_{2a}$, $R_{2b}$, and $R_{2c}$ are each independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms, $R_{1a}$ is combined with $R_{1b}$ and/or $R_{1c}$ to form a ring, $R_{2a}$ is combined with $R_{2b}$ and/or $R_{2c}$ to form a ring, "$n_{12}$" to "$n_{13}$" are each independently an integer of 0 to 4, and $X_1$ to $X_4$, $Y_1$, $Y_2$, $R_1$, $R_2$, $R_3$, $n_3$, Cy1 and Cy2 are the same as respectively defined in connection with Formula 1.

8. The light emitting device of claim 1, wherein Cy1 and/or Cy2 is represented by Formula 2-1 or Formula 2-2:

Formula 2-1

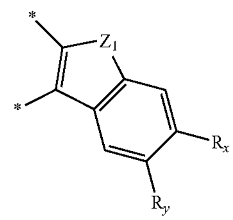

Formula 2-2

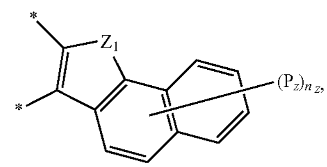

and wherein in Formula 2-1 and Formula 2-2, $R_x$, $R_y$ and $P_z$ are each independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms, and/or combined with an adjacent group to form a ring, "$n_z$" is an integer of 0 to 6, and $Z_1$ and —* are the same as respectively defined in connection with Formula 2.

9. The light emitting device of claim 1, wherein, in Formula 1, each of $X_1$ to $X_4$ are $NR_6$, and $R_6$ is a substituted or unsubstituted phenyl group.

10. The light emitting device of claim 1, wherein, in Formula 1 to Formula 3, $R_1$ to $R_{11}$ are each independently a hydrogen atom, a deuterium atom, a substituted or unsubstituted methyl group, a substituted or unsubstituted t-butyl group, a substituted or unsubstituted phenyl group, a substituted or unsubstituted terphenyl group, or a substituted or unsubstituted carbazole group.

11. The light emitting device of claim 1, further comprising a capping layer on the second electrode, the capping layer having a refractive index of about 1.6 or more.

12. The light emitting device of claim 1, wherein the fused polycyclic compound is at least one selected from among compounds in Compound Group 1:

Compound Group 1
1
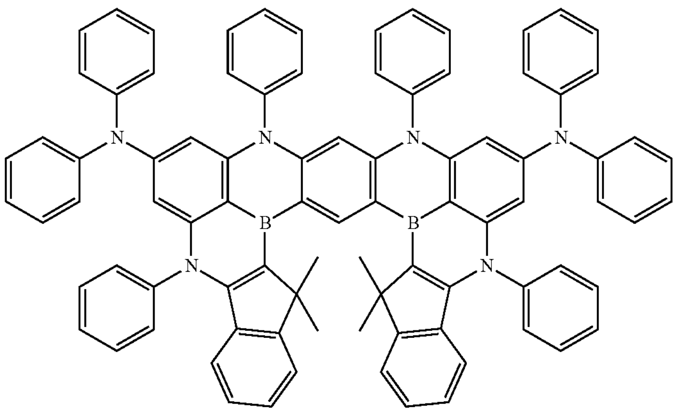
2
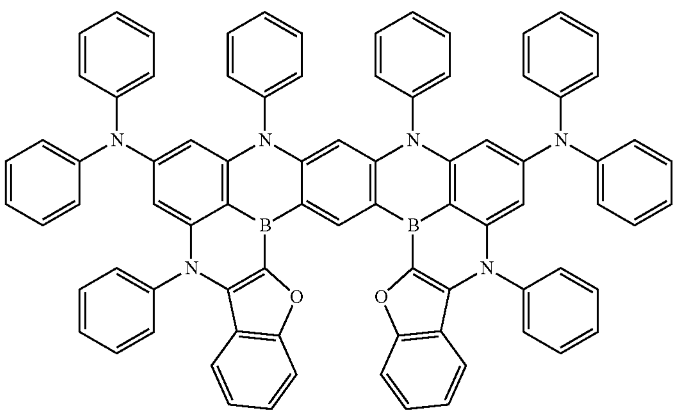
3
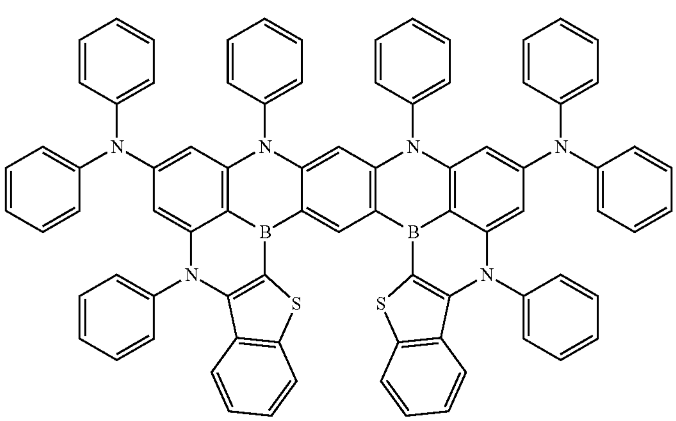

-continued
4
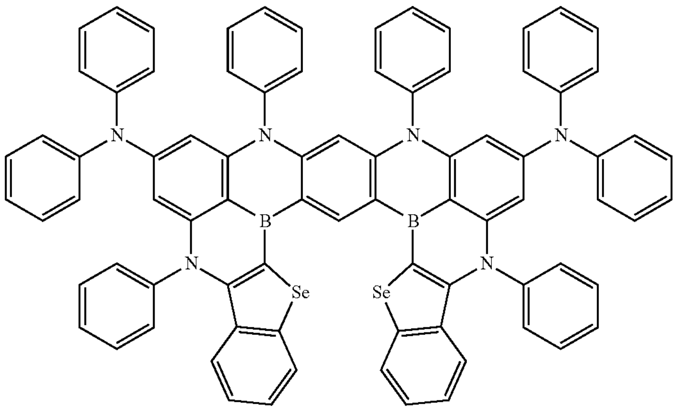
5
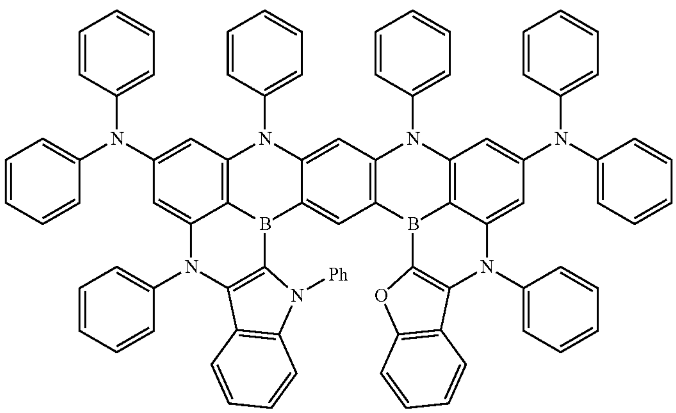
6
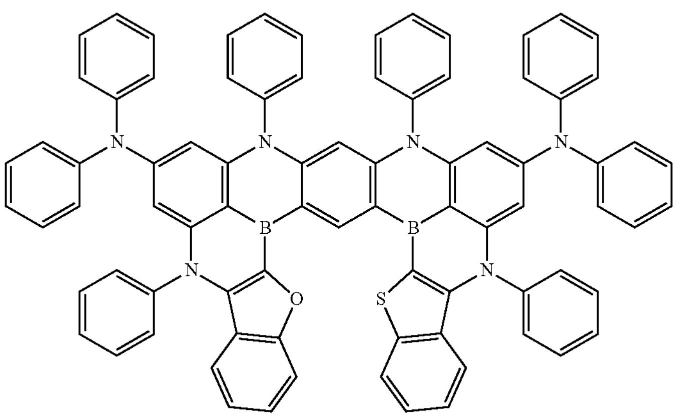
7
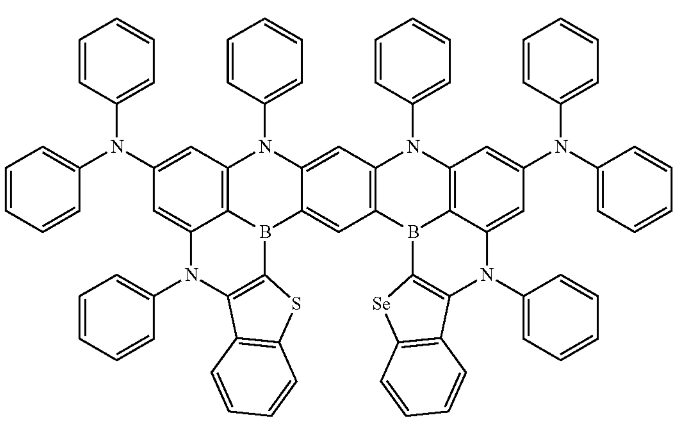

-continued
8
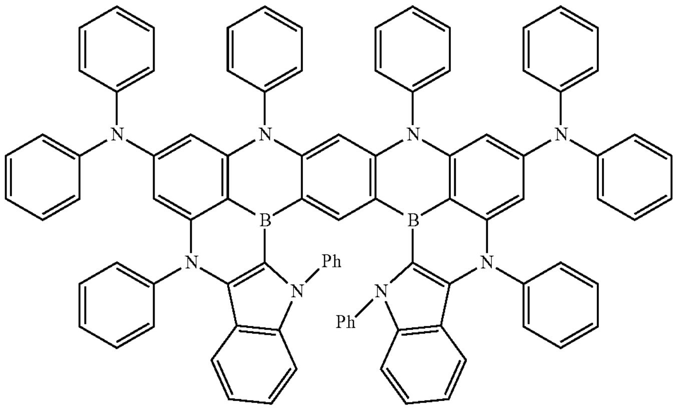
9
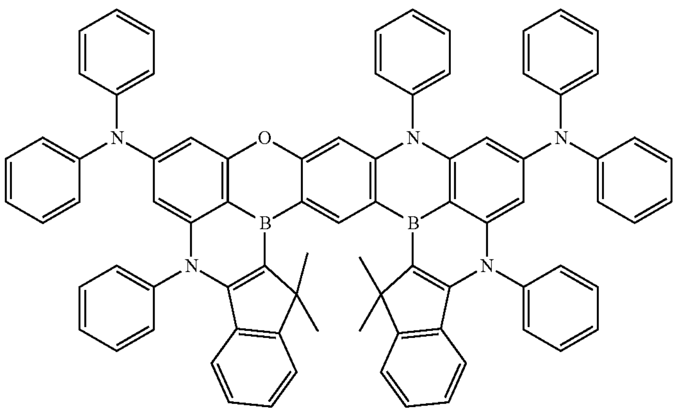
10
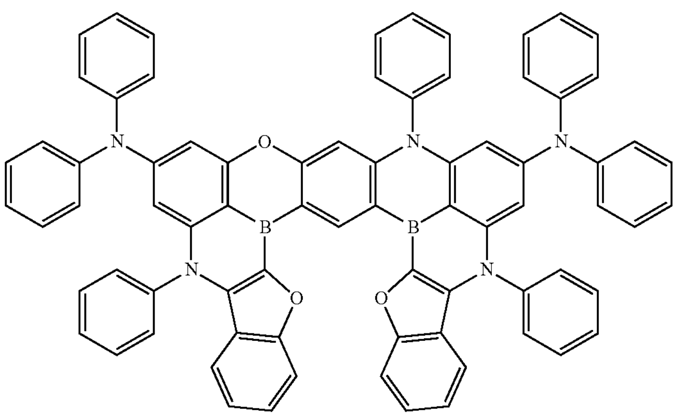
11
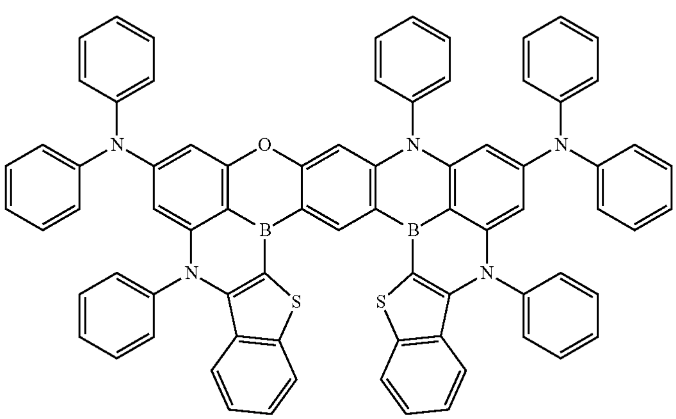

-continued
12
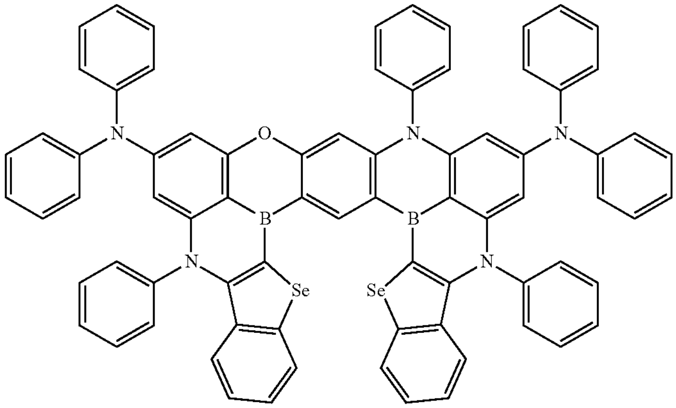
13
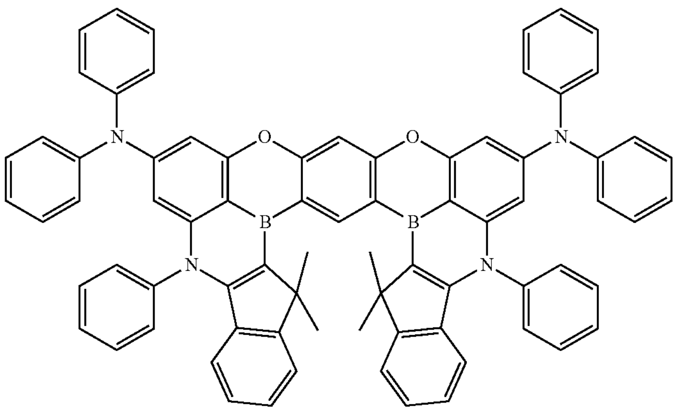
14
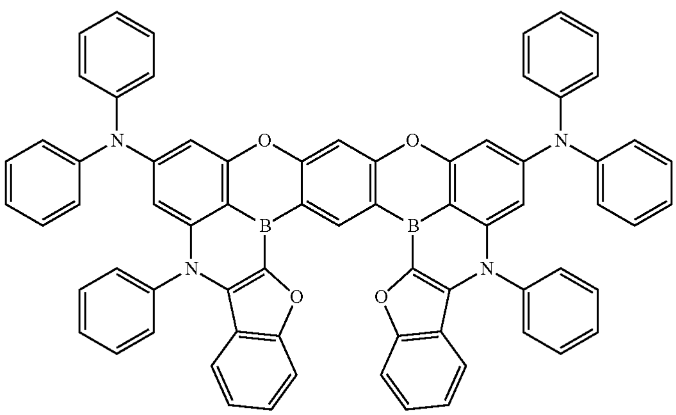
15
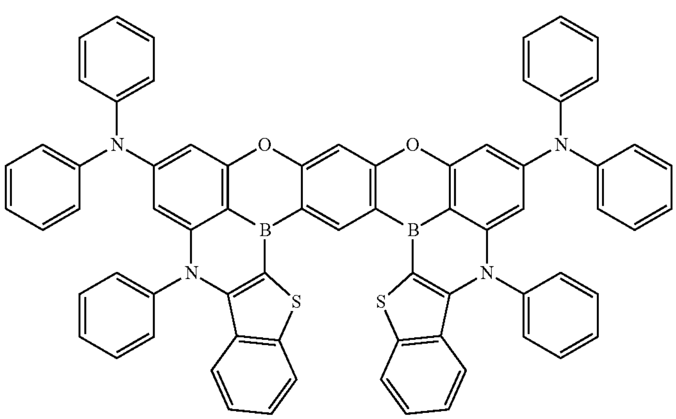

-continued
16
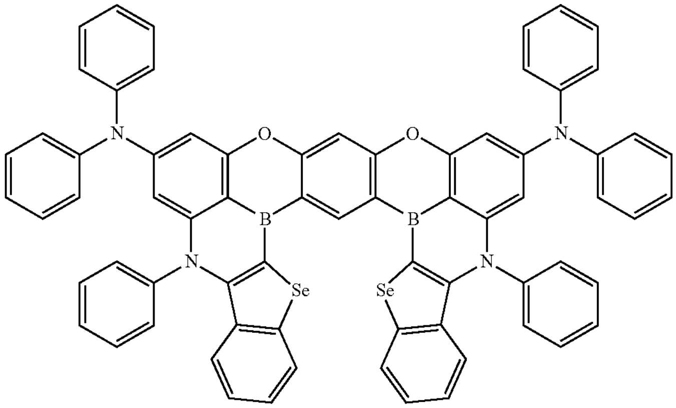
17
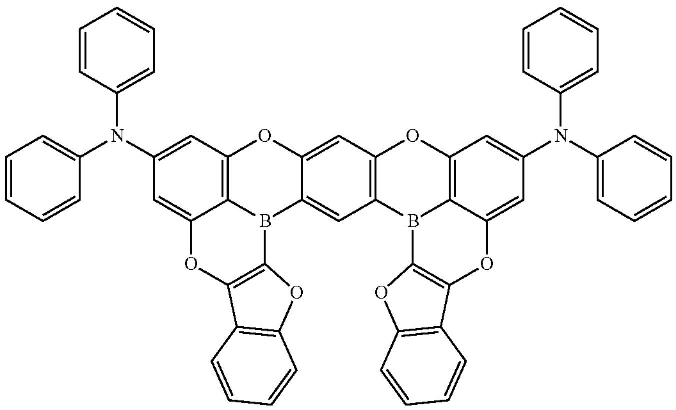
18
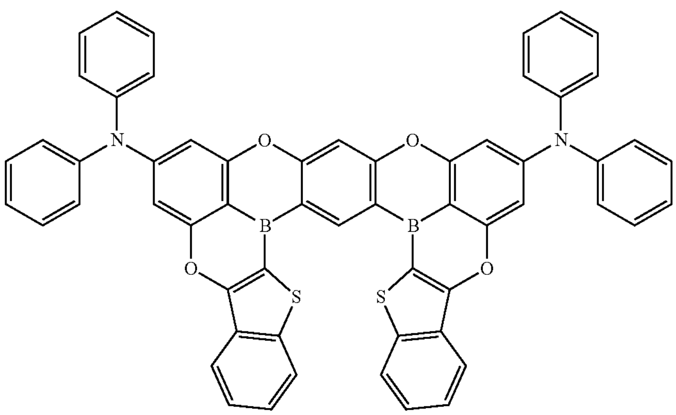
19
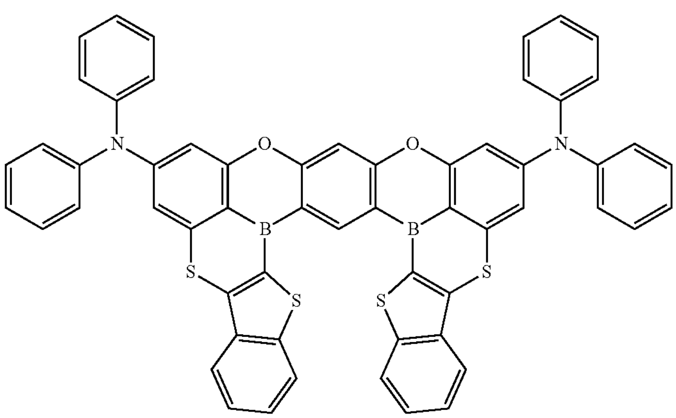

-continued
20
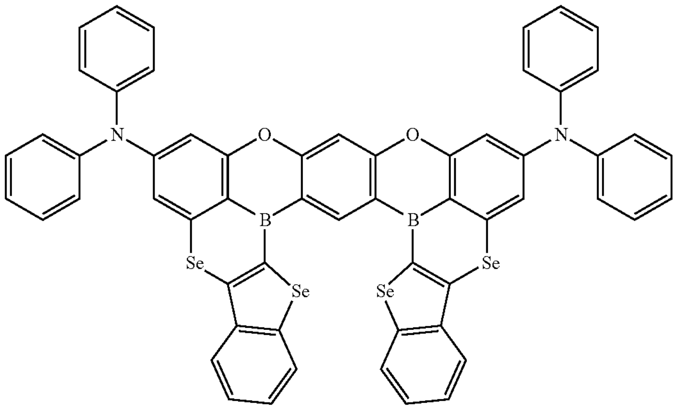
21
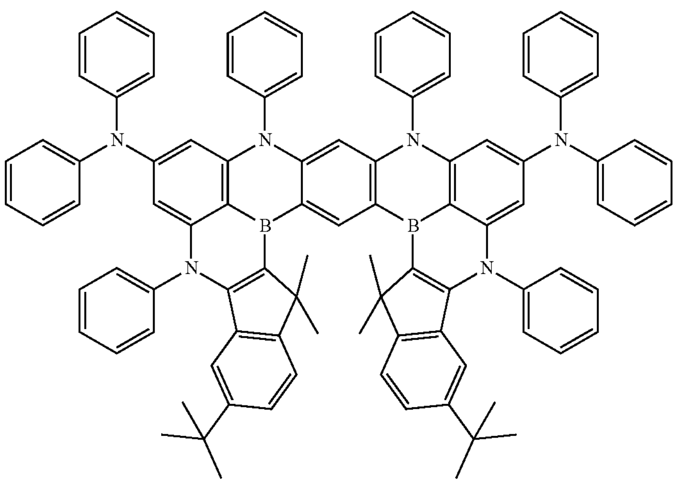
22
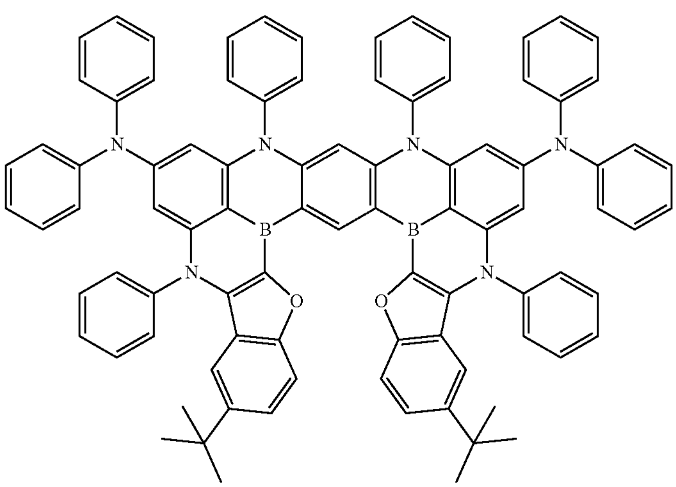

-continued
23
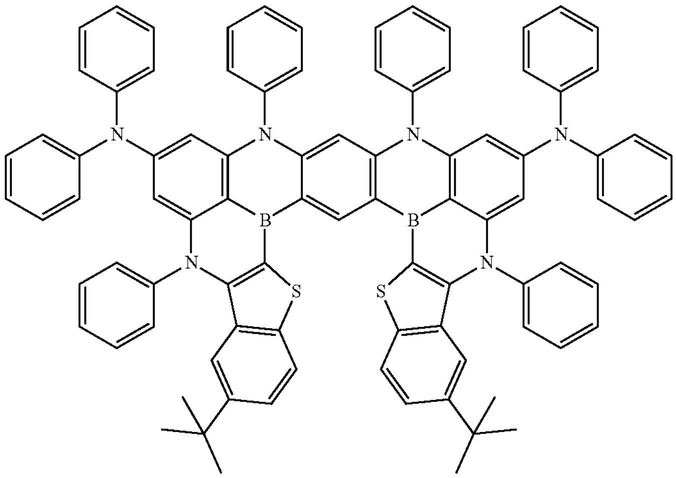
24
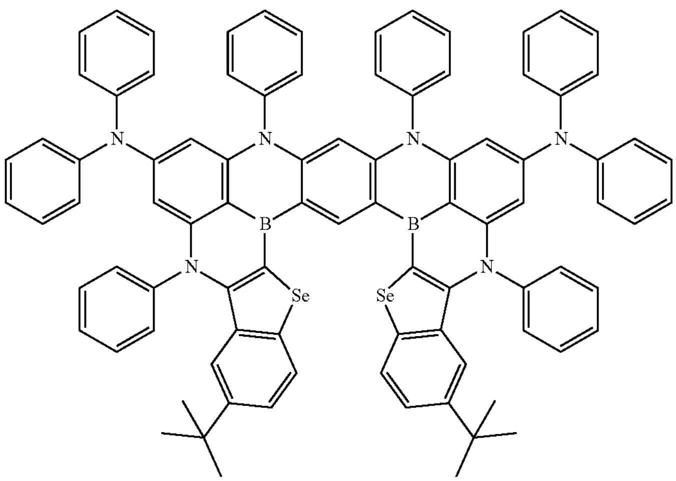
25
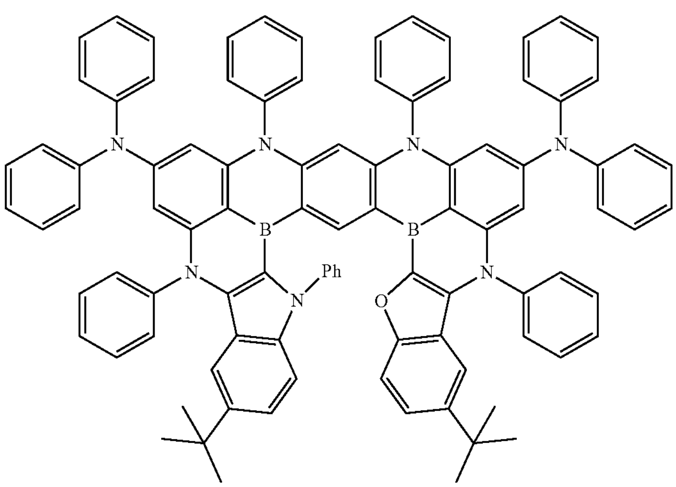

-continued
26
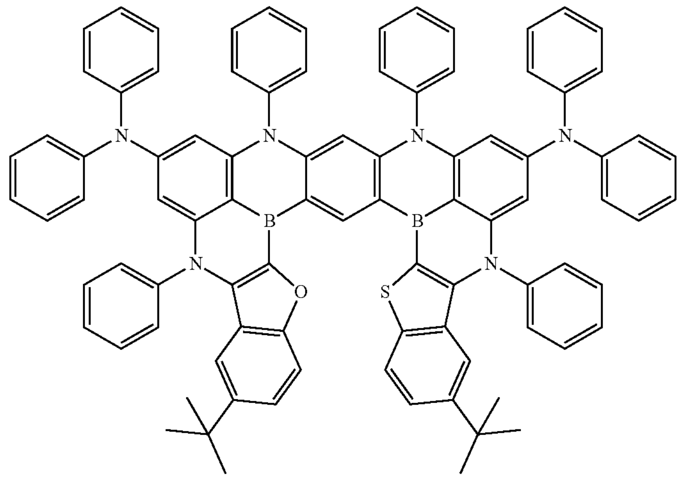
27
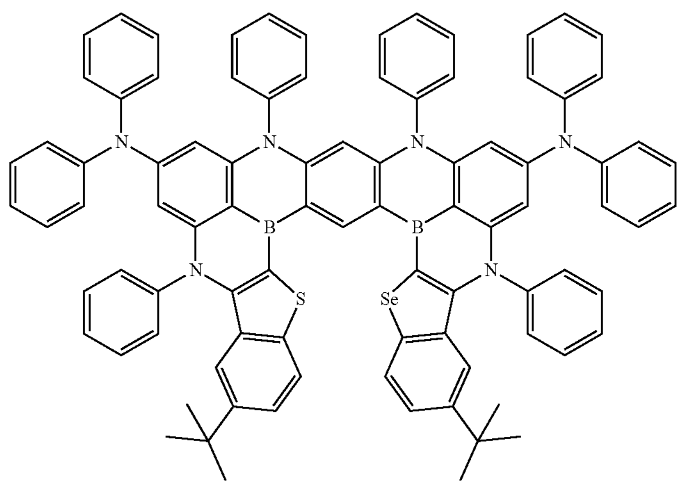
28
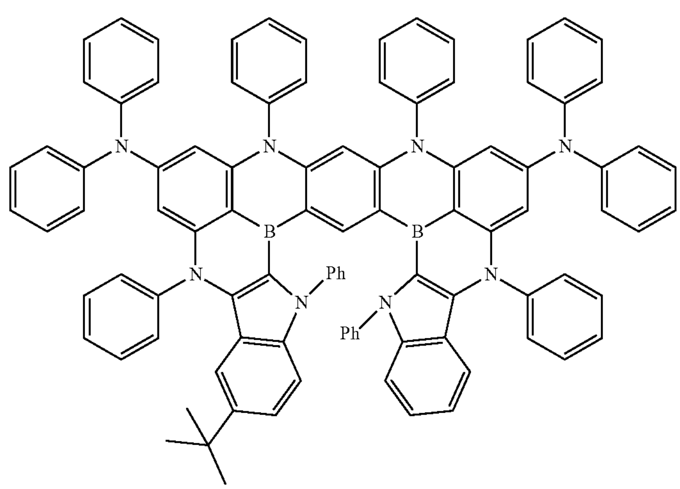

-continued
29
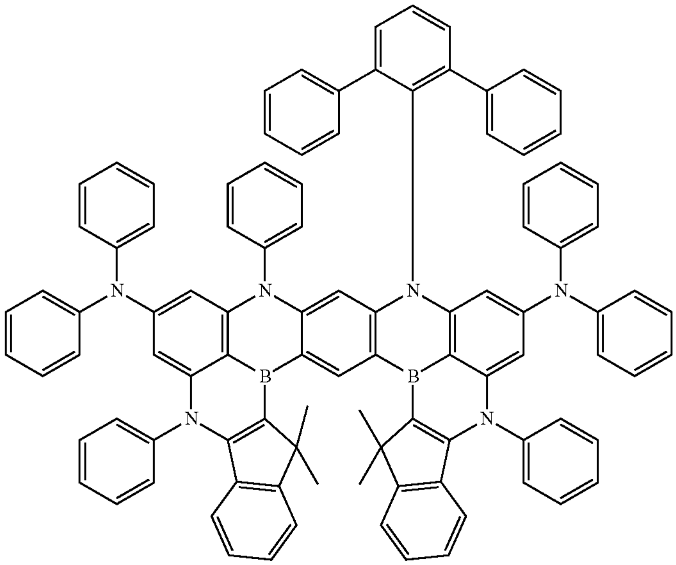
30
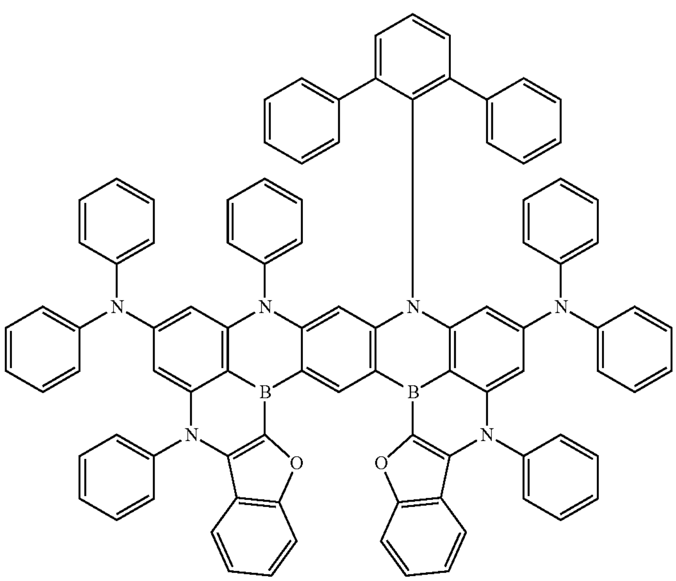

-continued
31
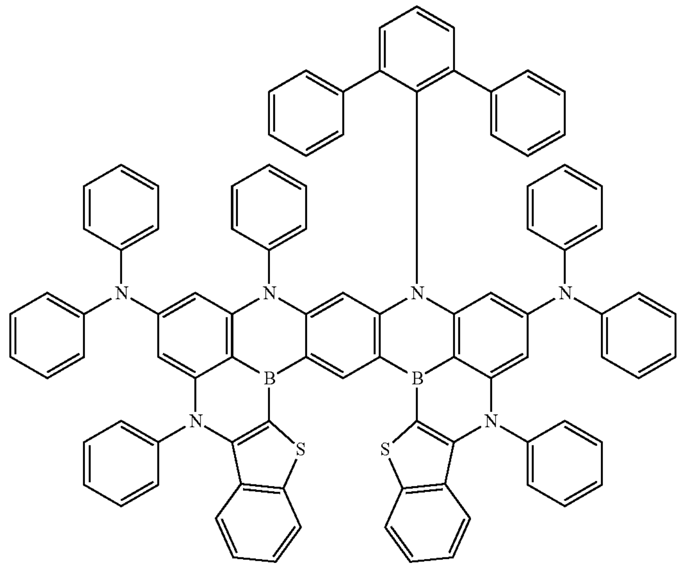
32
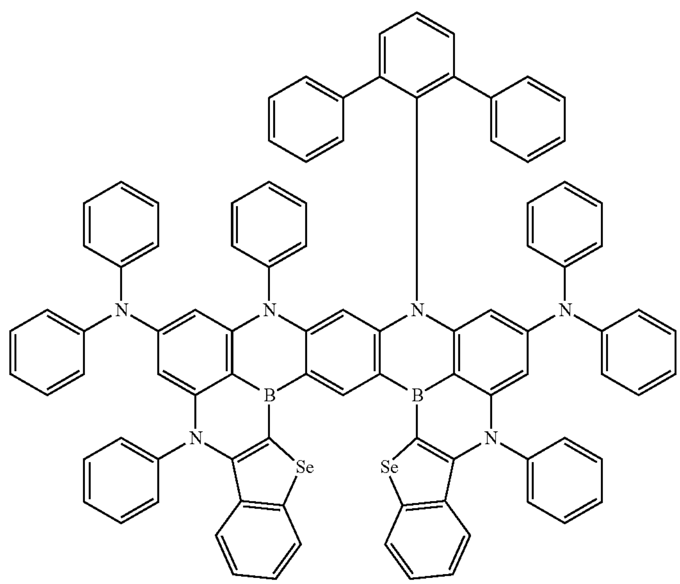

-continued
33
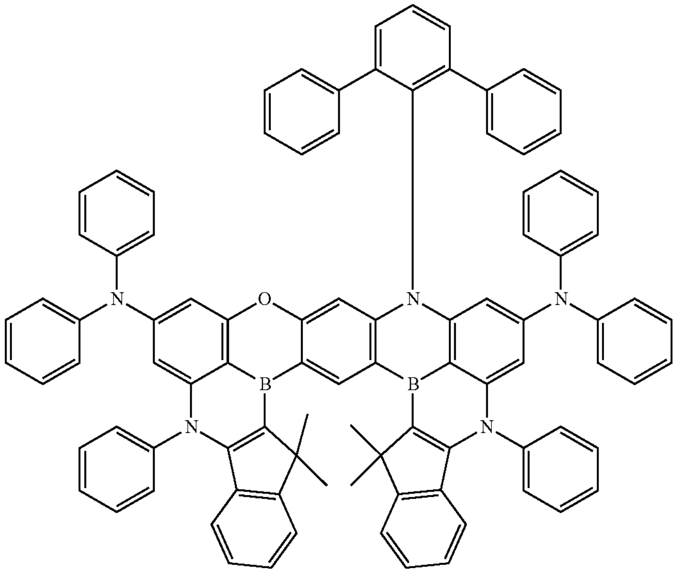
34
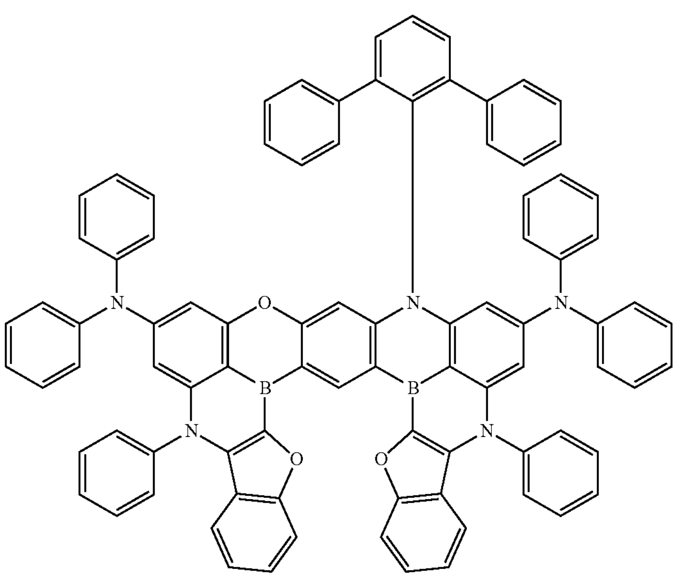

-continued
35
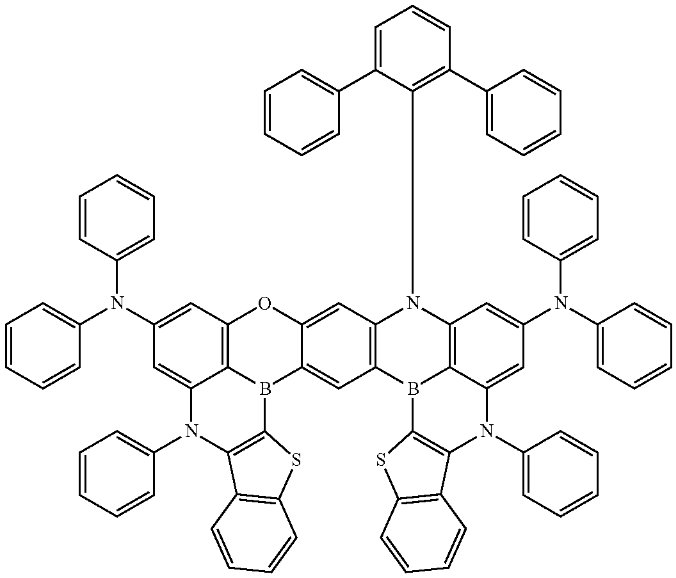
36
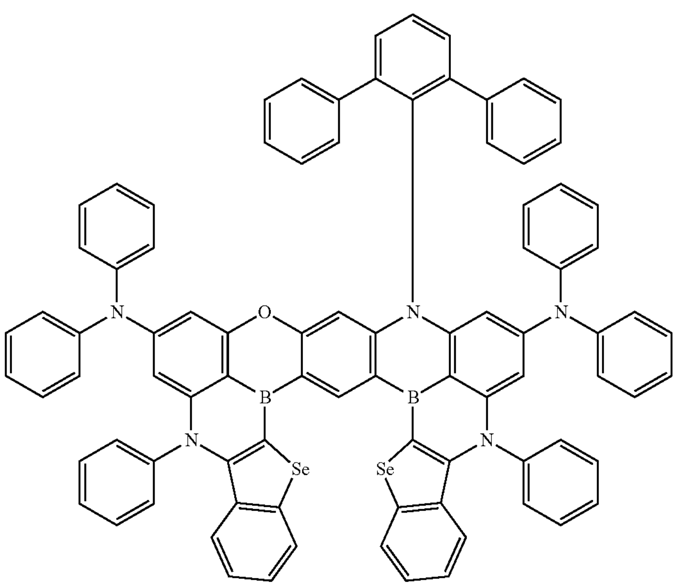

-continued
37
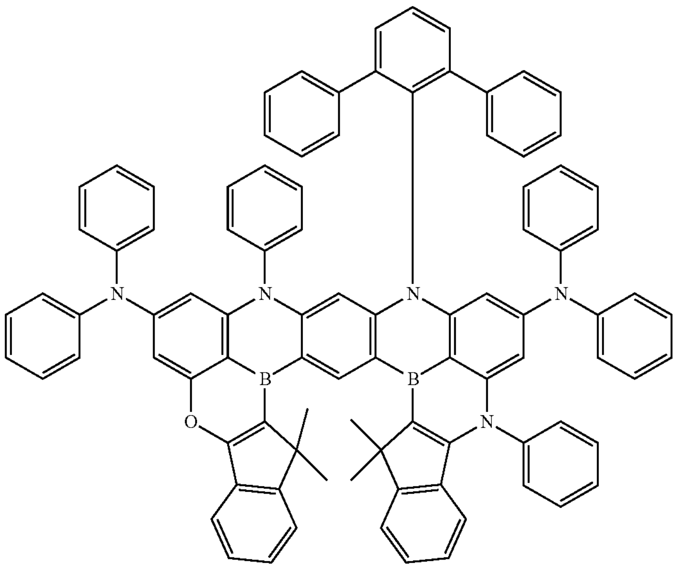
38
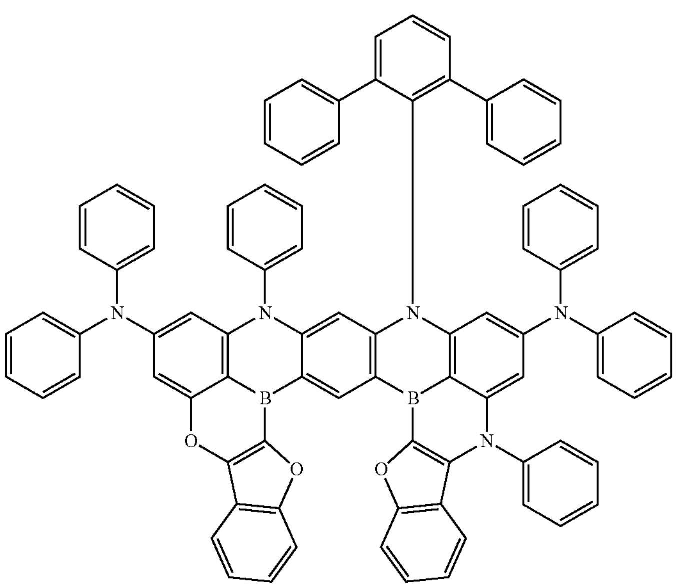

-continued
39
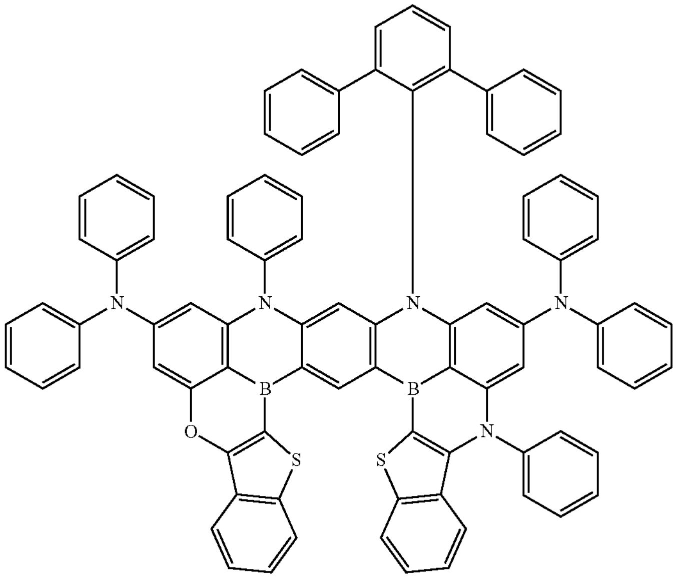
40
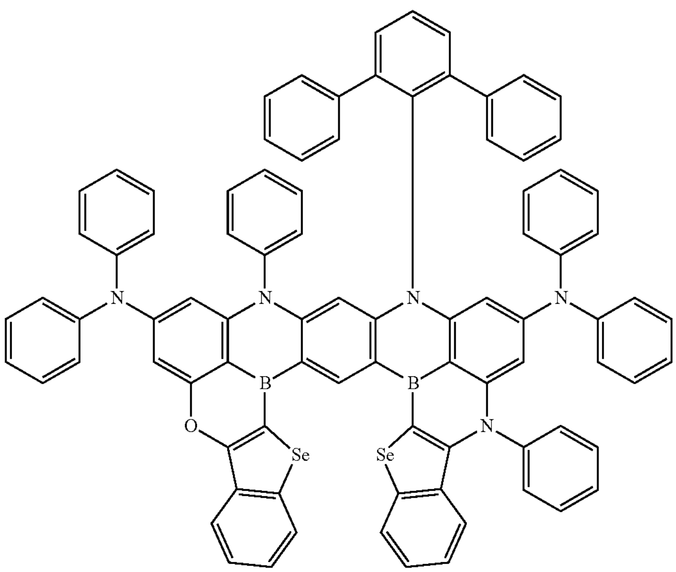
41
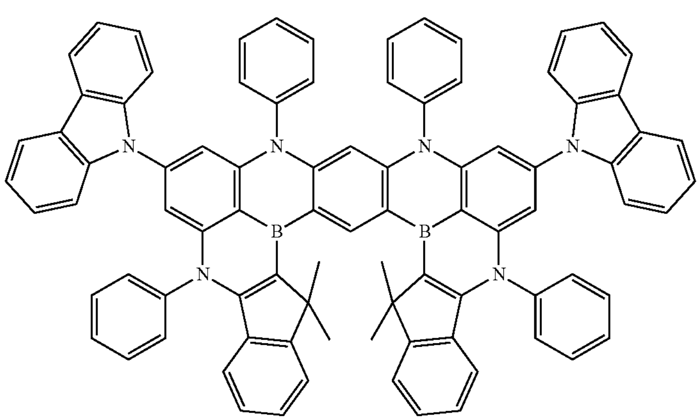

-continued
42
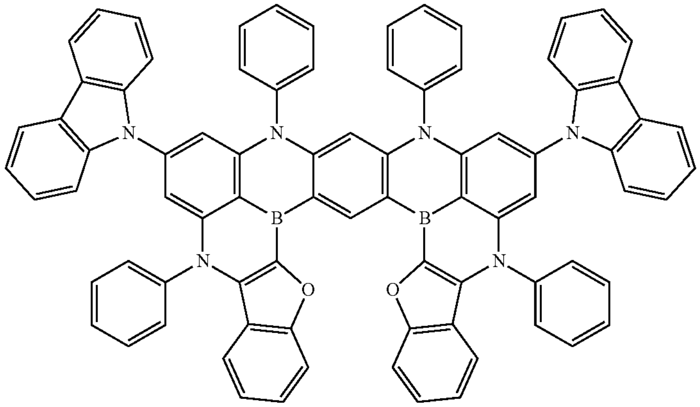
43
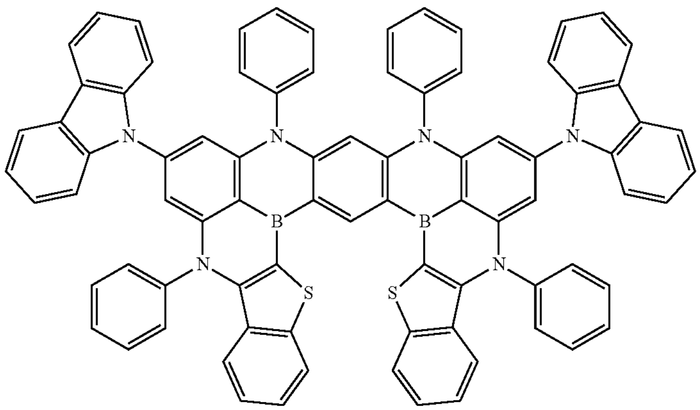
44
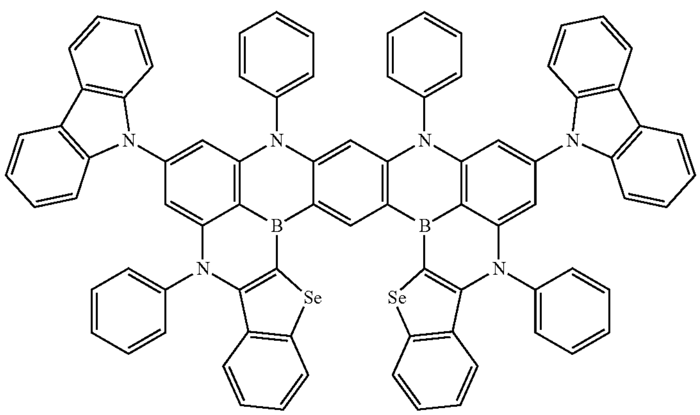
45
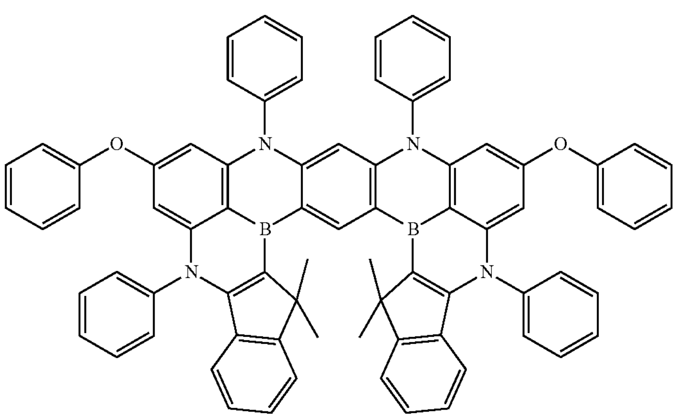

-continued
46
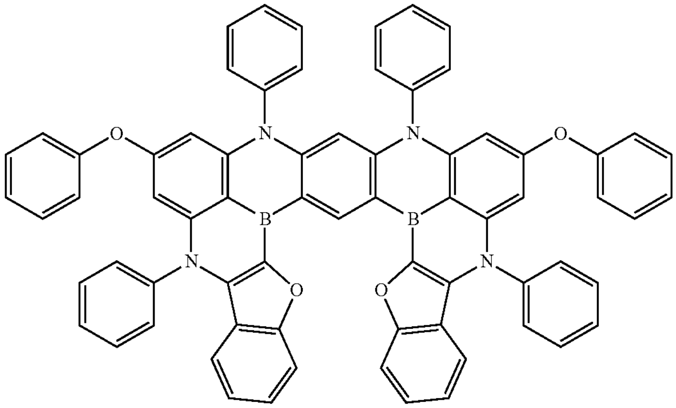
47
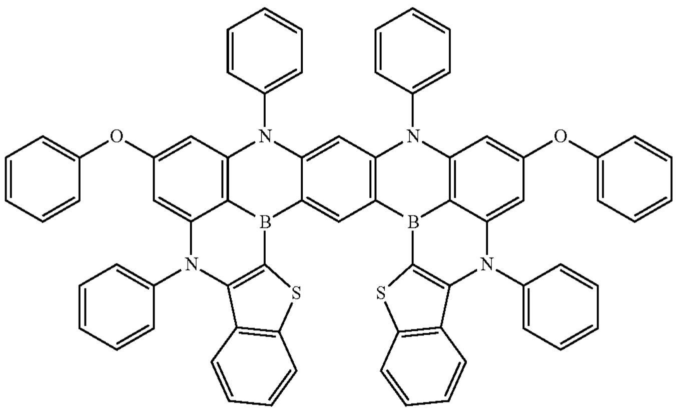
48
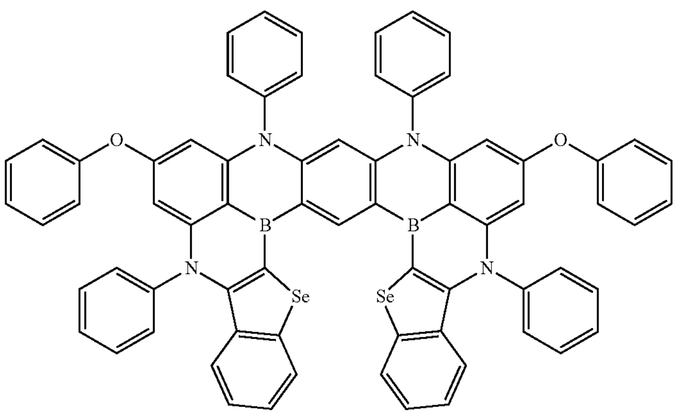
49
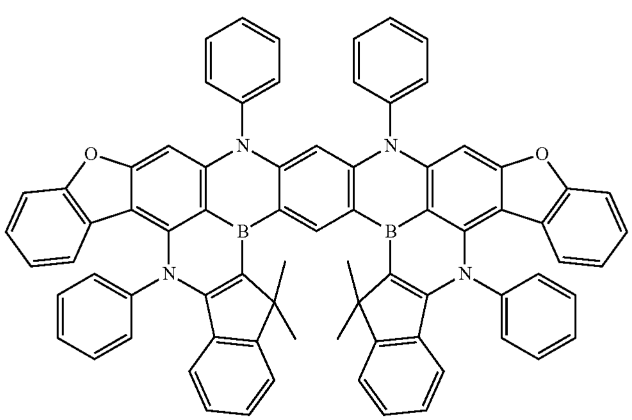

-continued
50
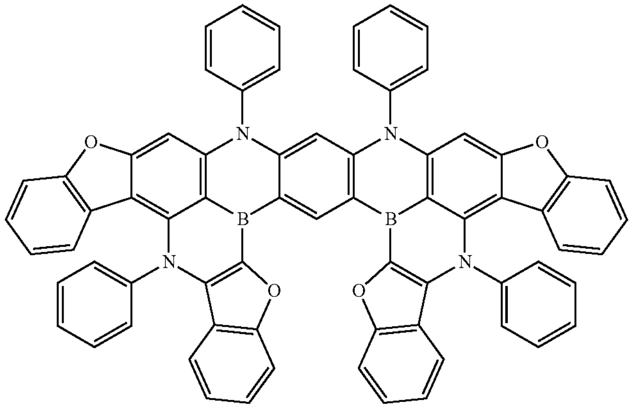
51
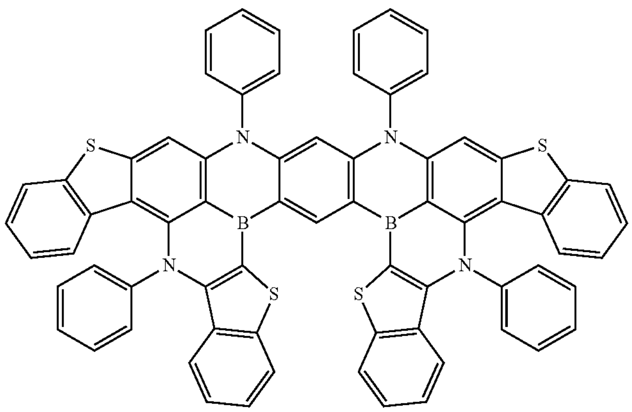
52
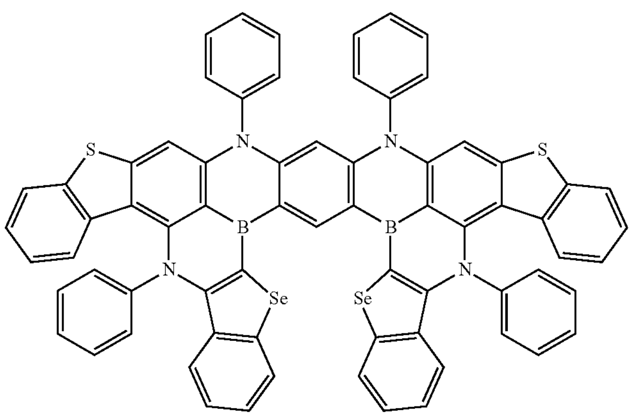
53
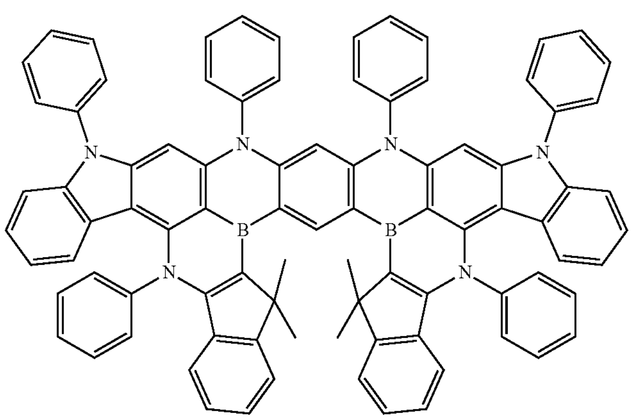

-continued
54
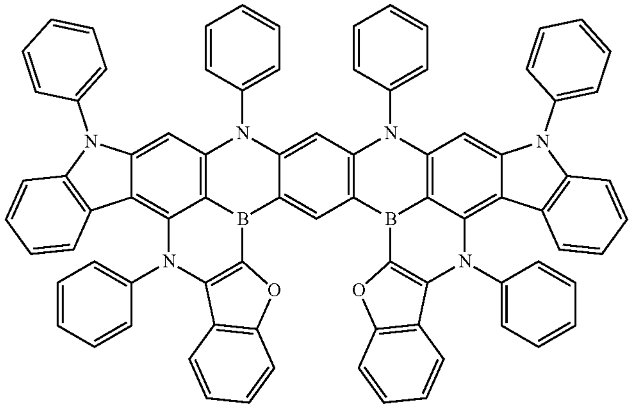
55
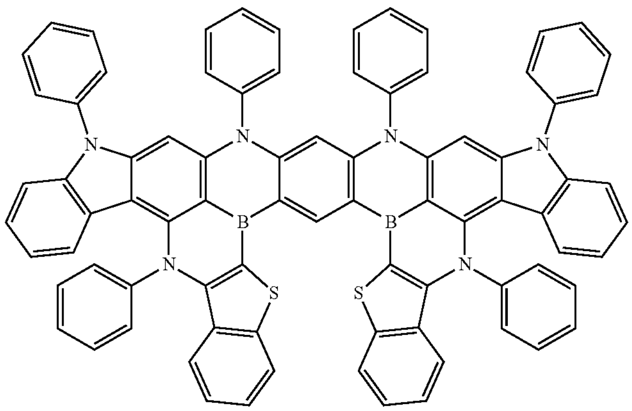
56
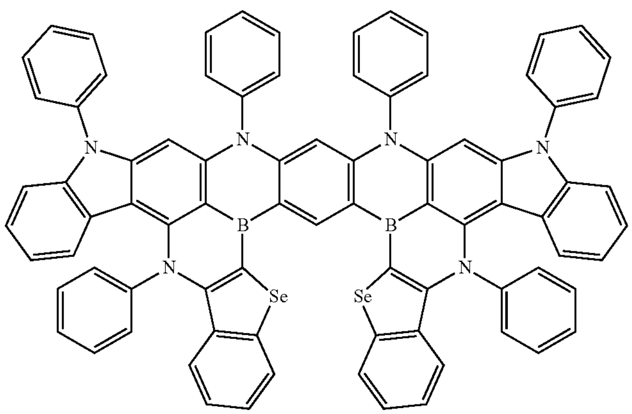
57
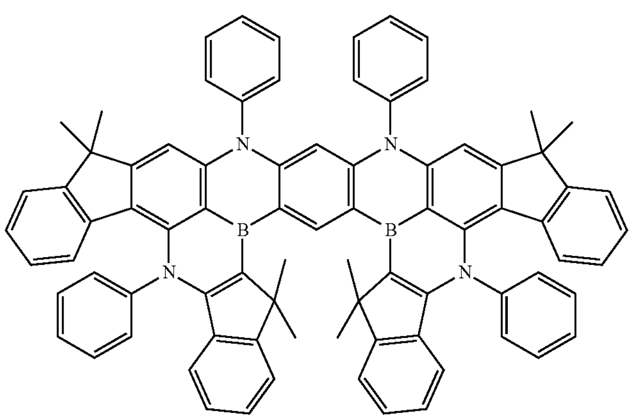

-continued
58
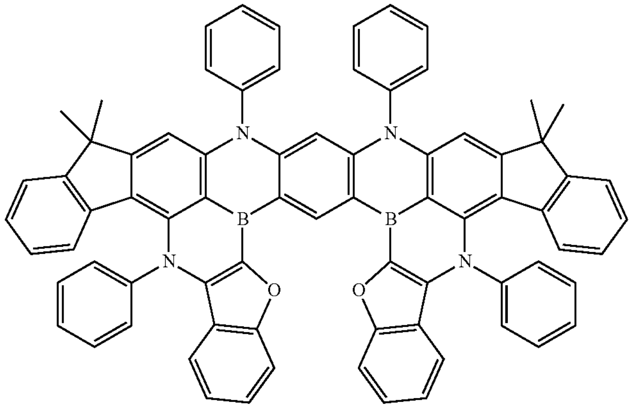
59
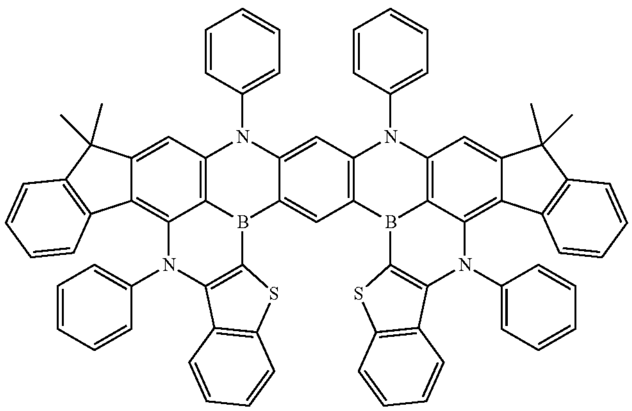
60
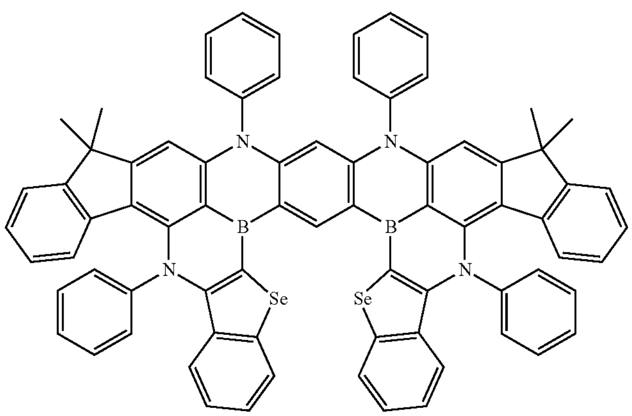
61
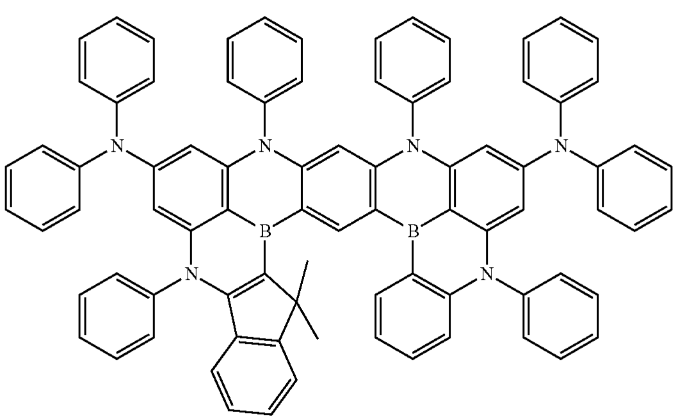

-continued
62
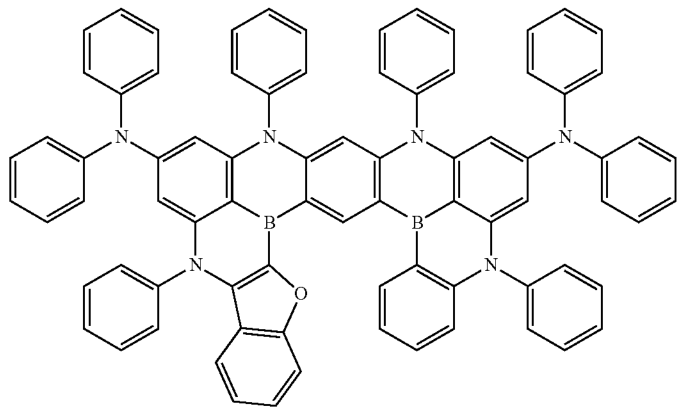
63
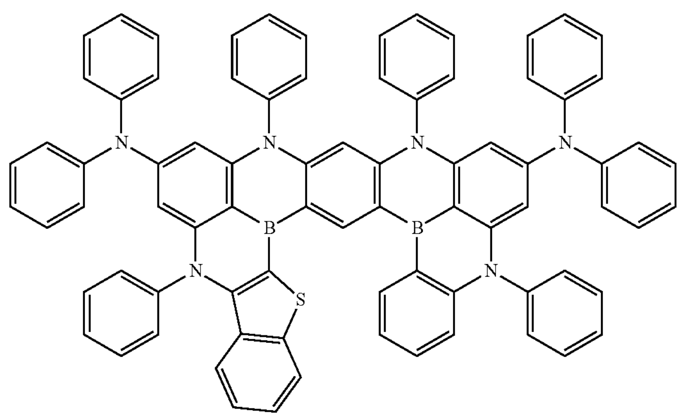
64
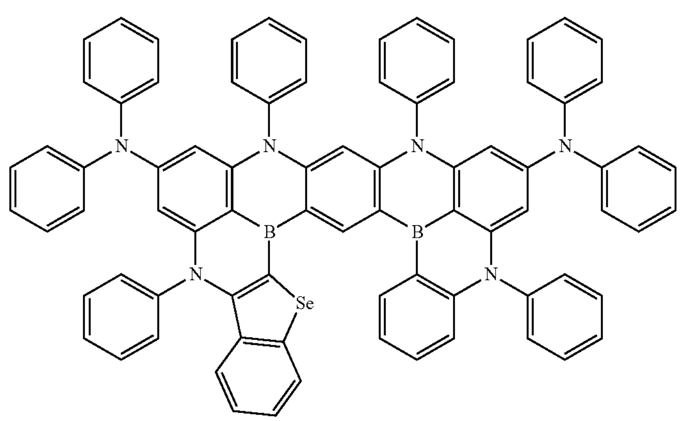

-continued
65
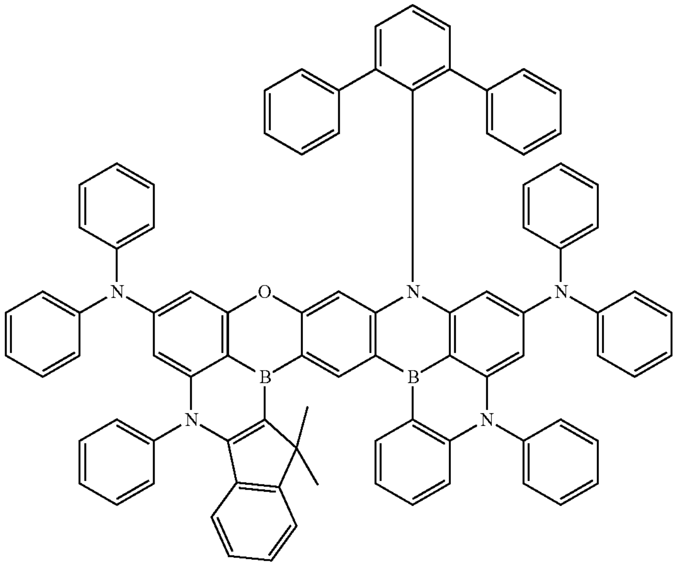
66
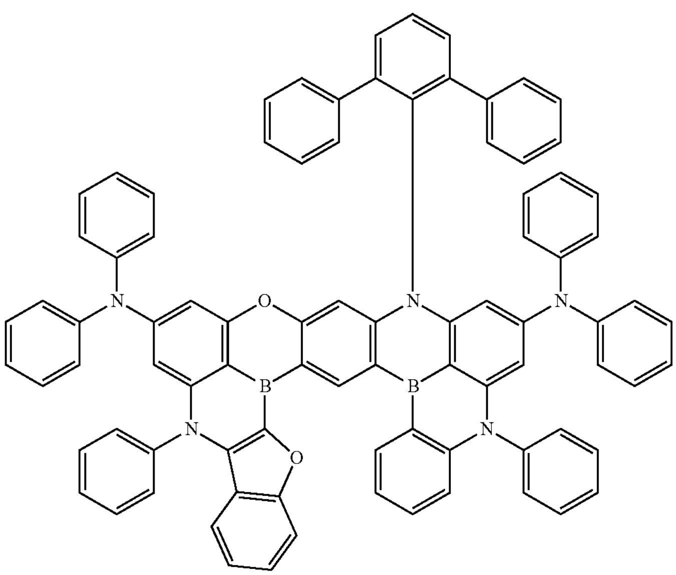

-continued
67
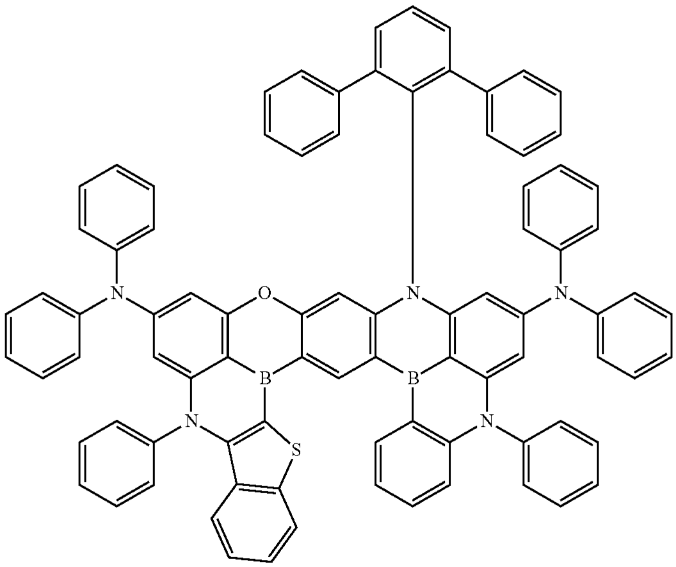
68
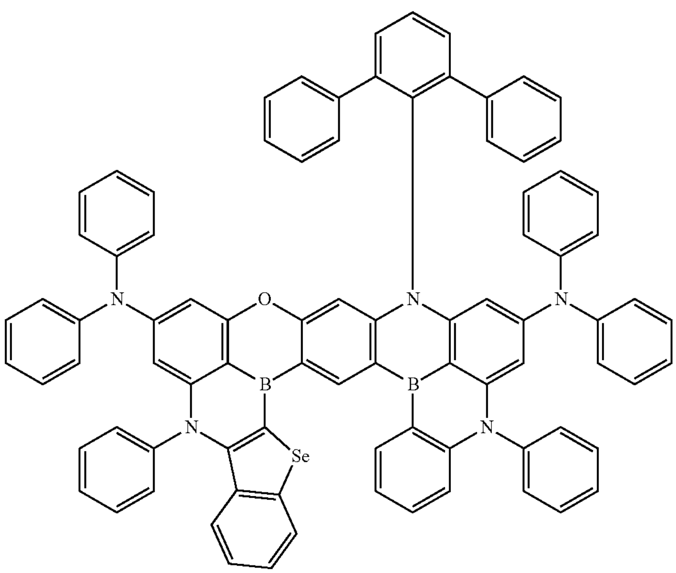
69
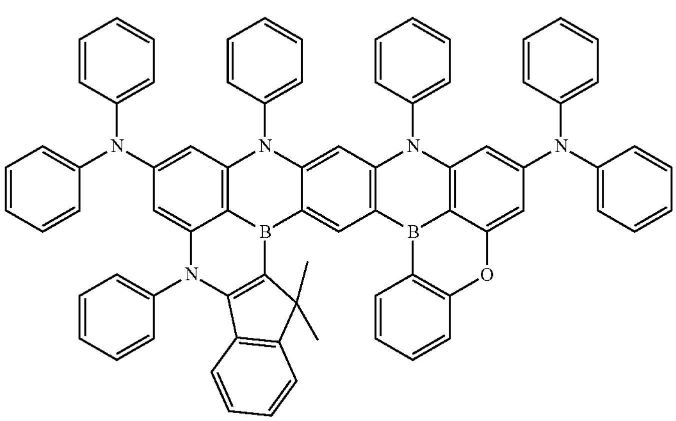

-continued
70
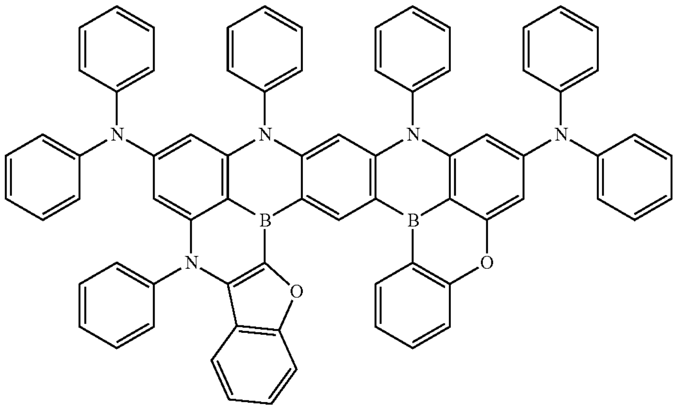
71
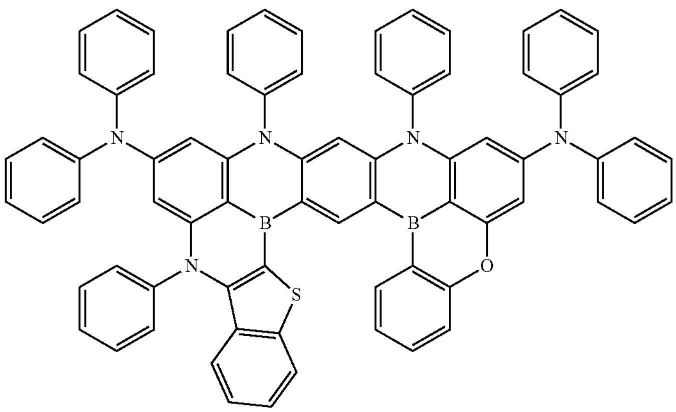
72
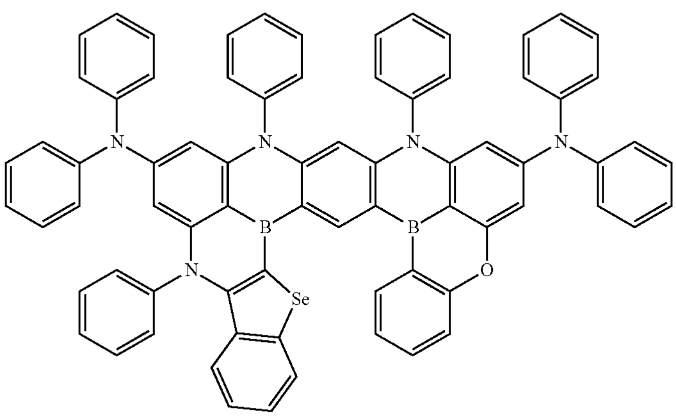
73
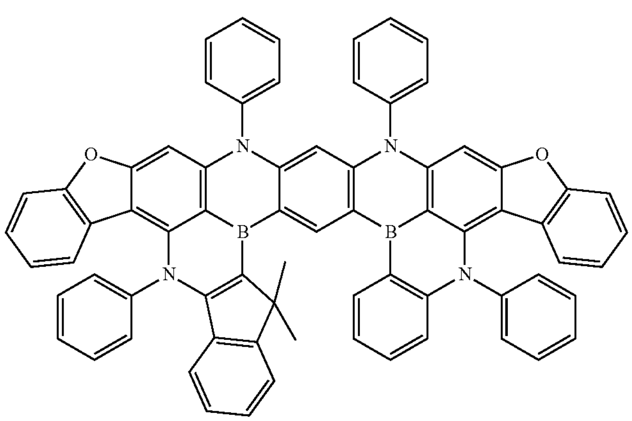

-continued
74
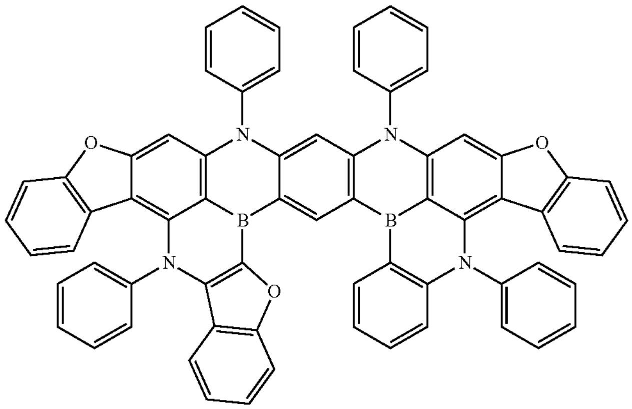
75
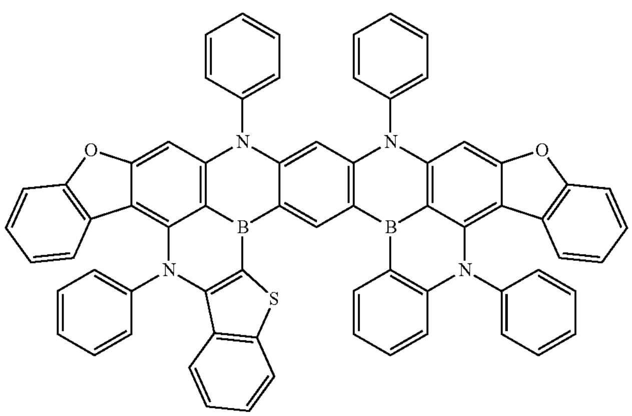
76
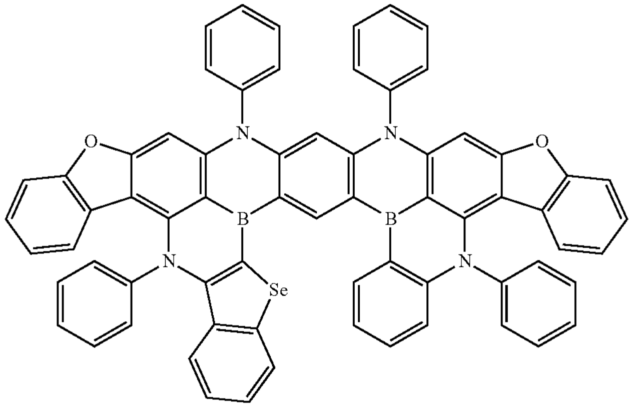

-continued
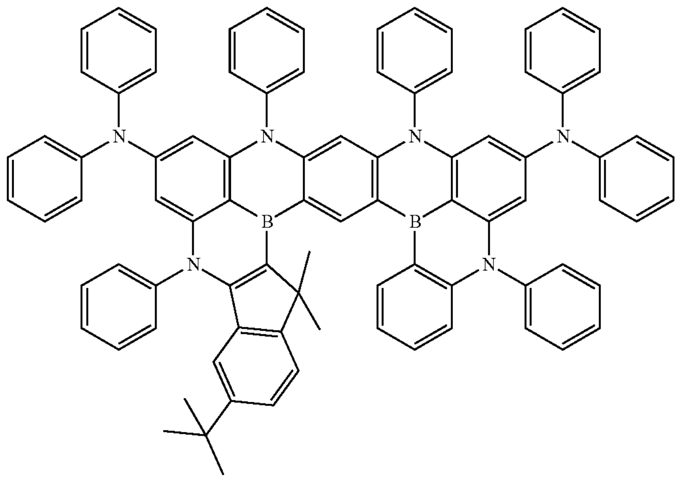
77
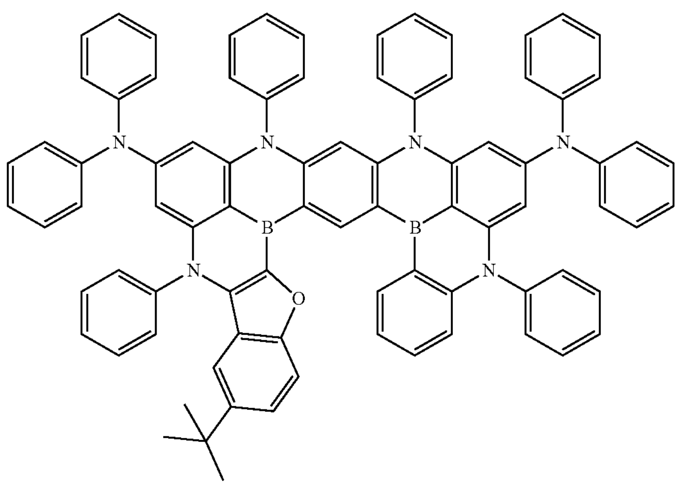
78
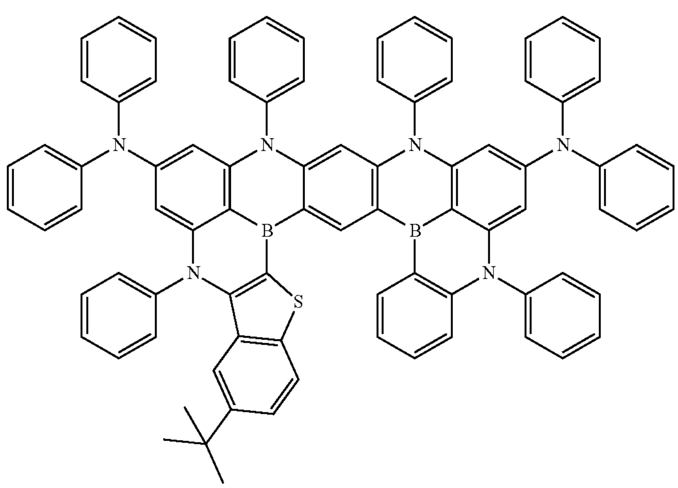
79

-continued
80
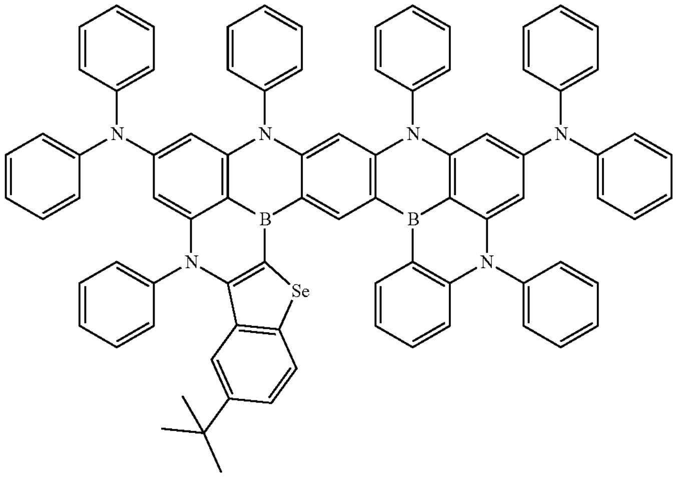
81
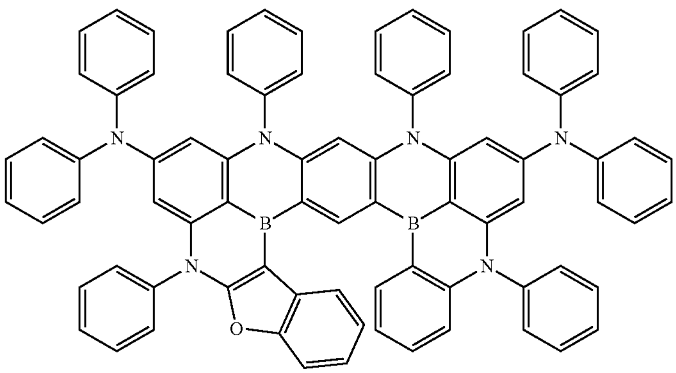
82
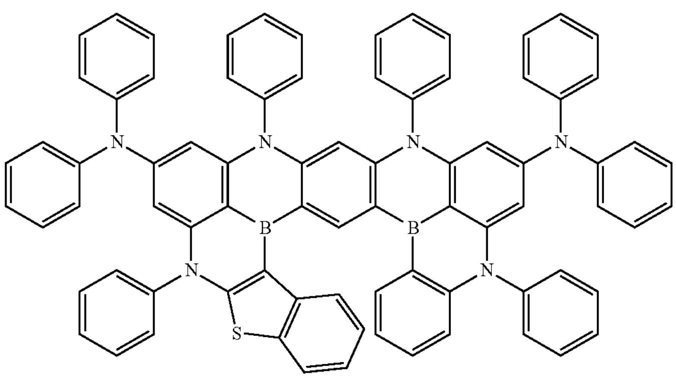
83
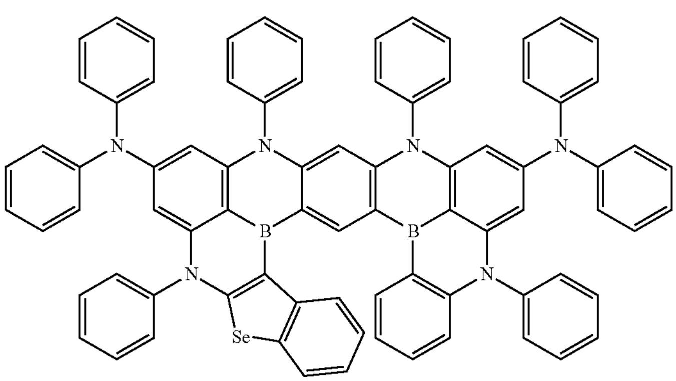

-continued
84
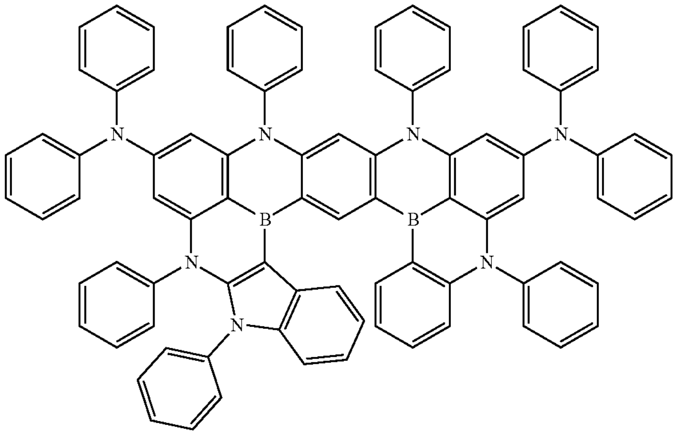
85
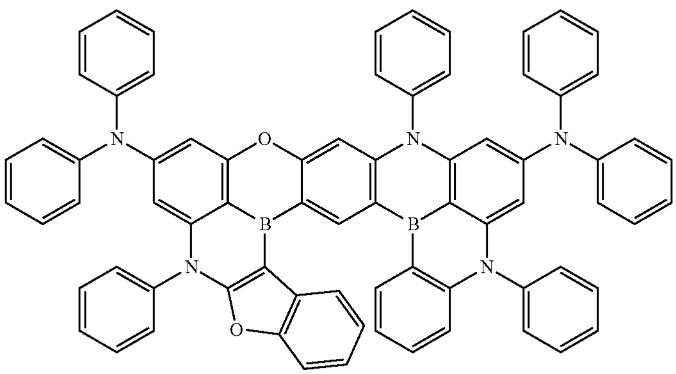
86
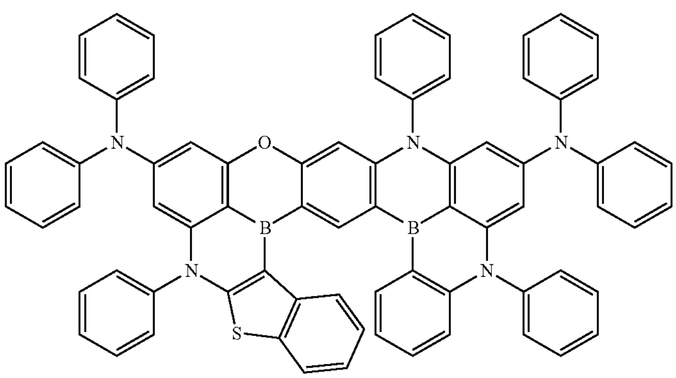
87
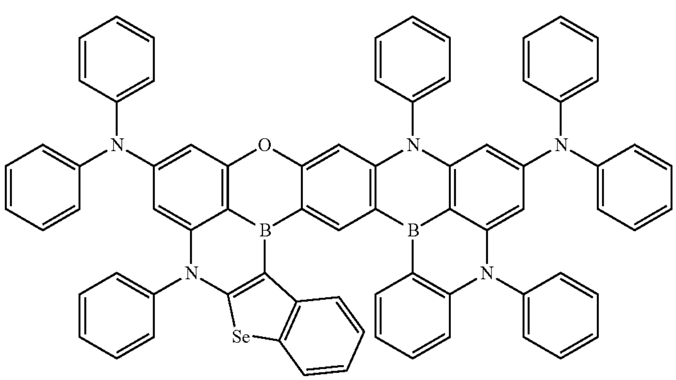

-continued
88
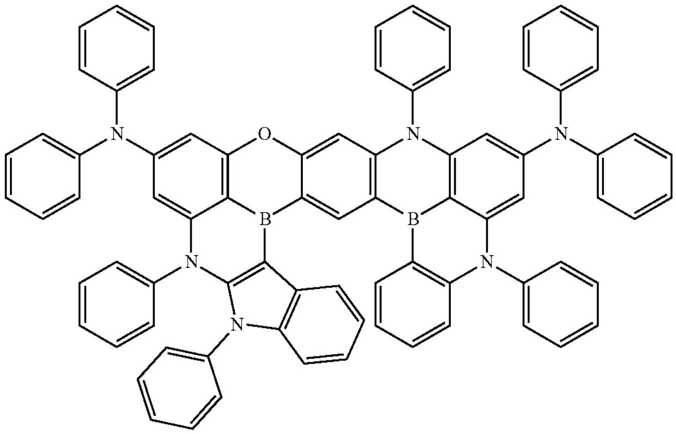
89
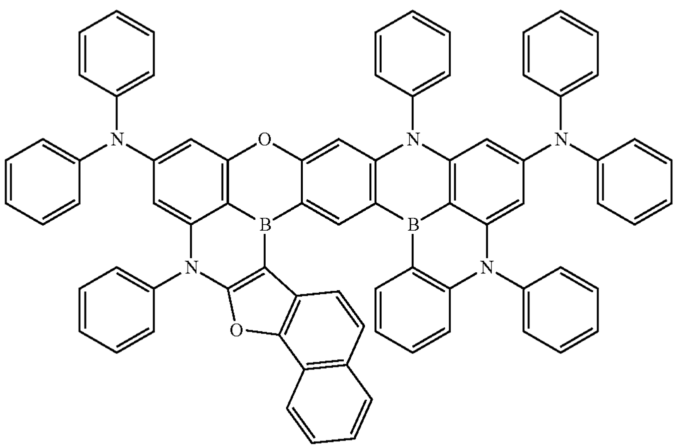
90
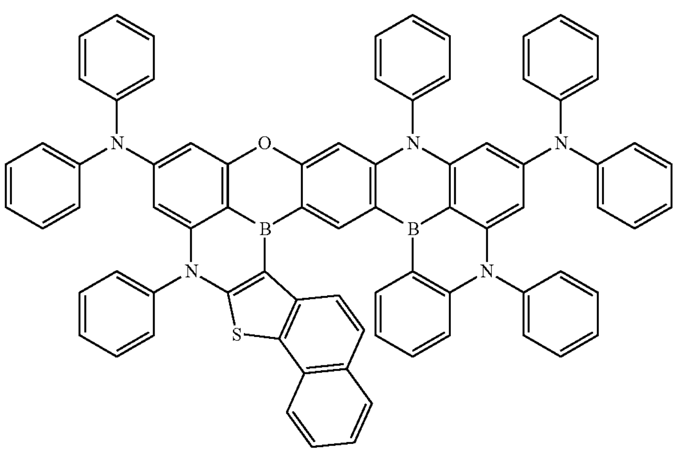

-continued
91
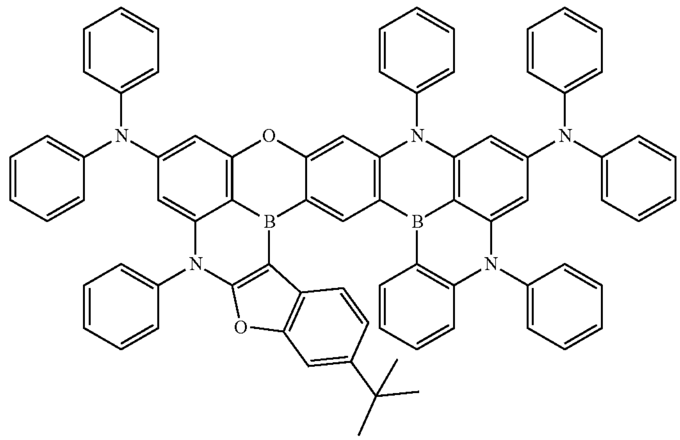
92
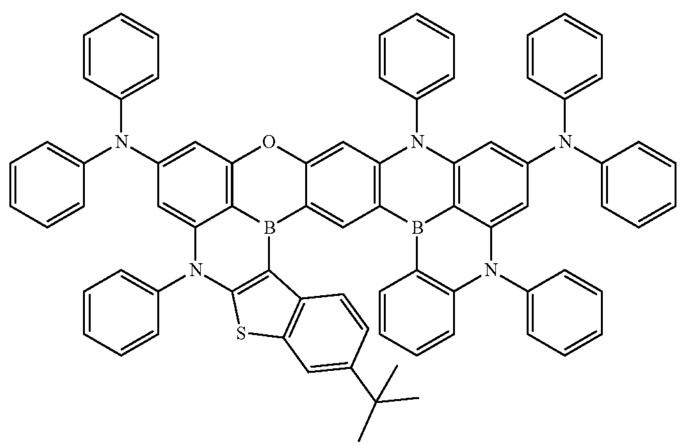
93
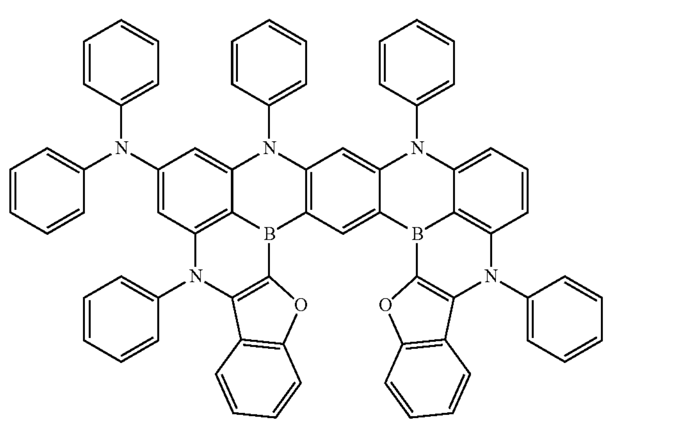

-continued
94
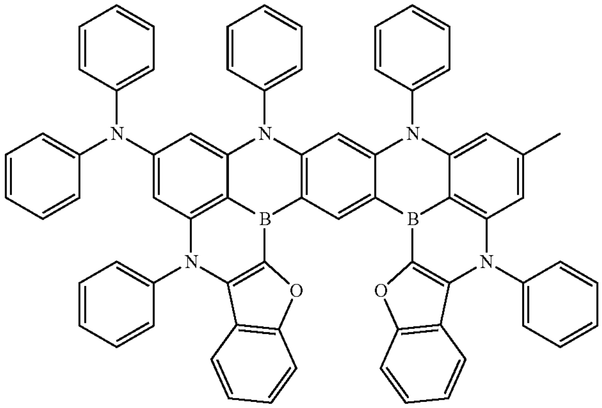
95
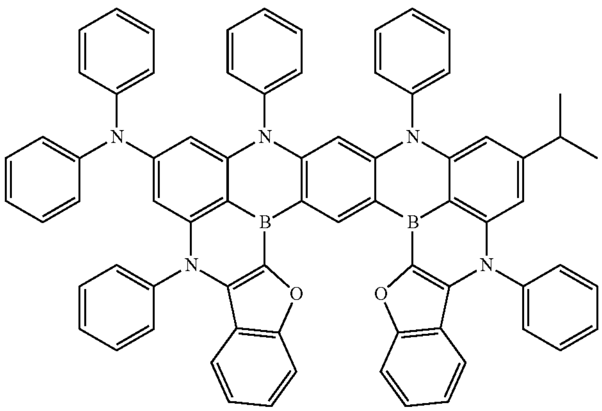
96
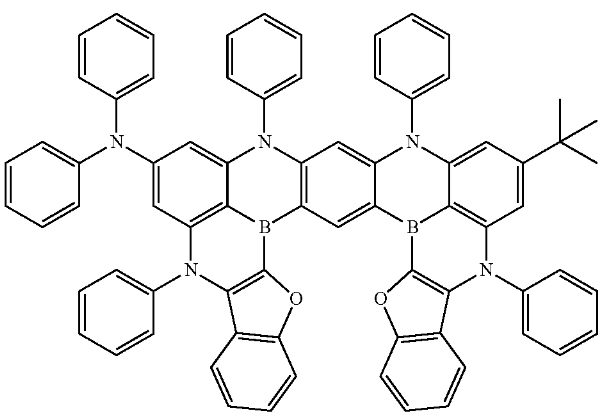
97
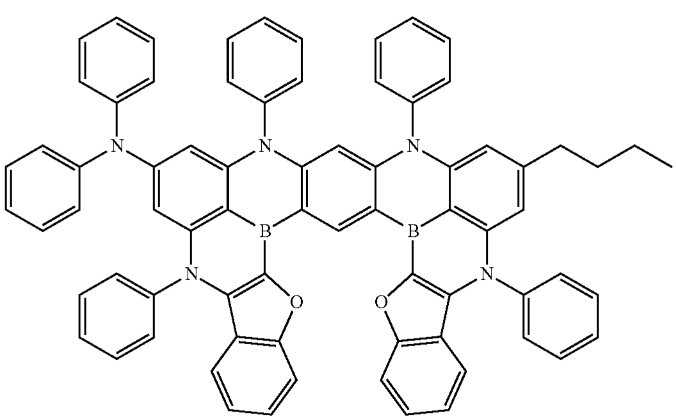

-continued
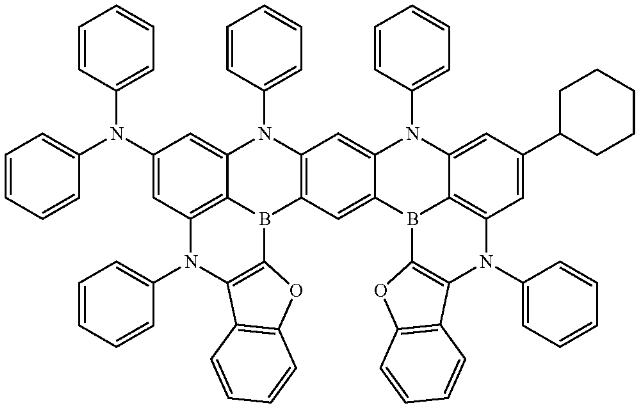
98
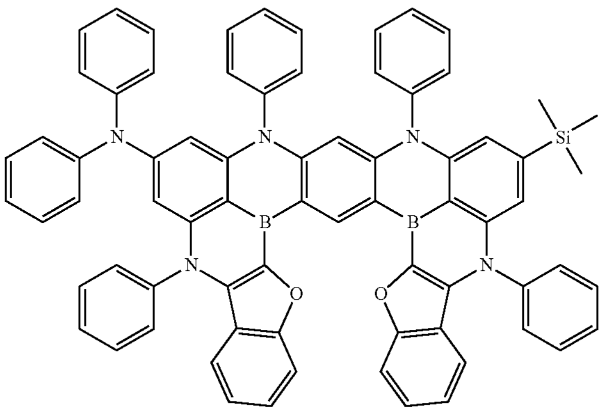
99
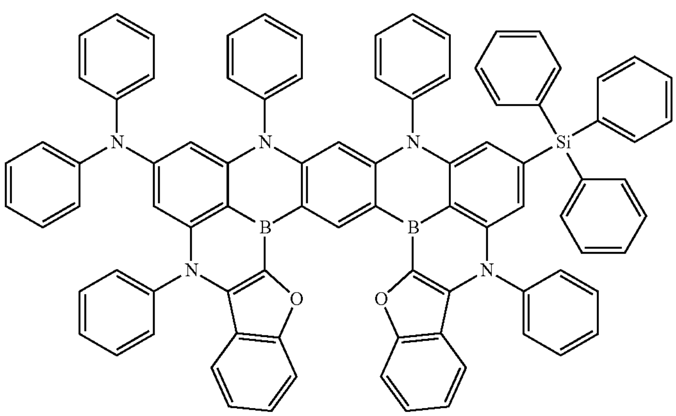
100
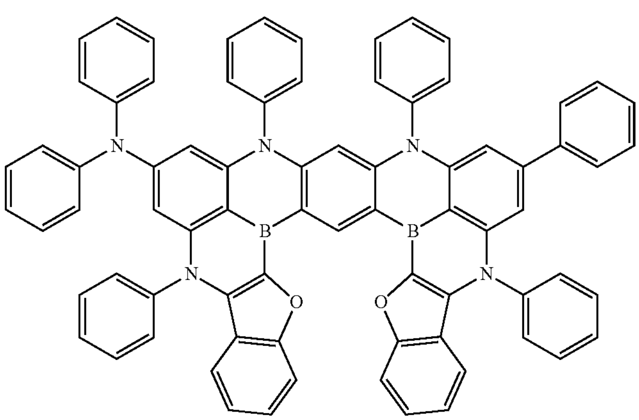
101

-continued
102
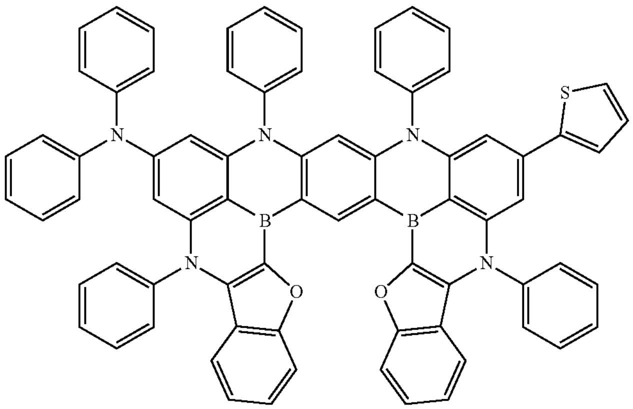
103
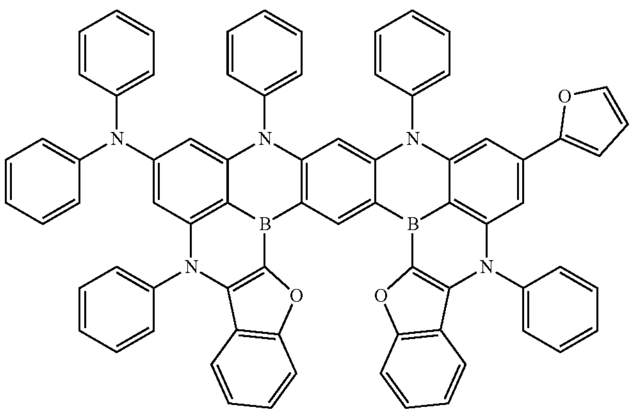
104
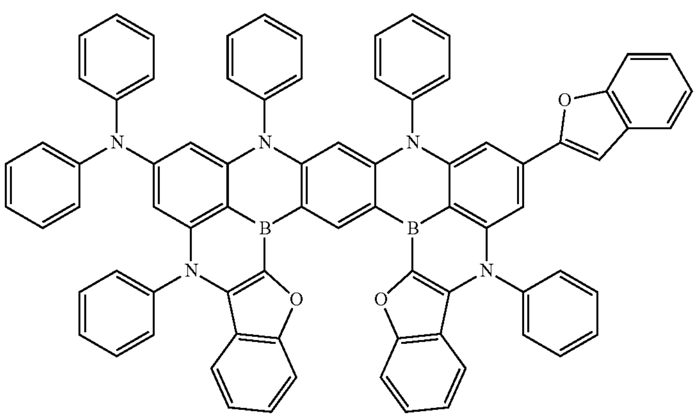
105
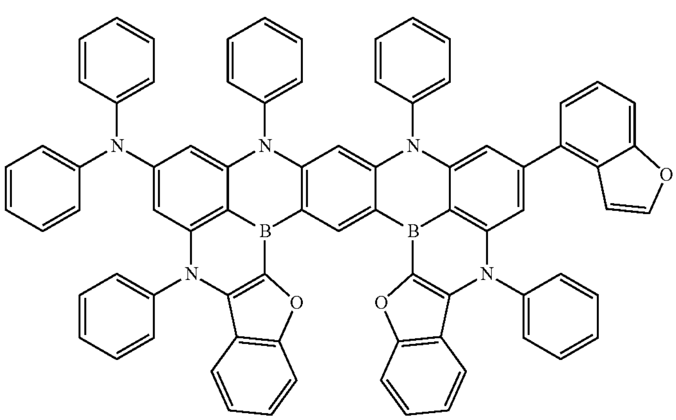

-continued
106
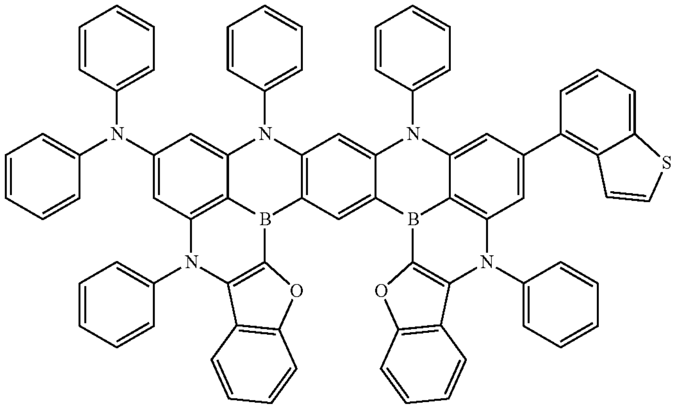
107
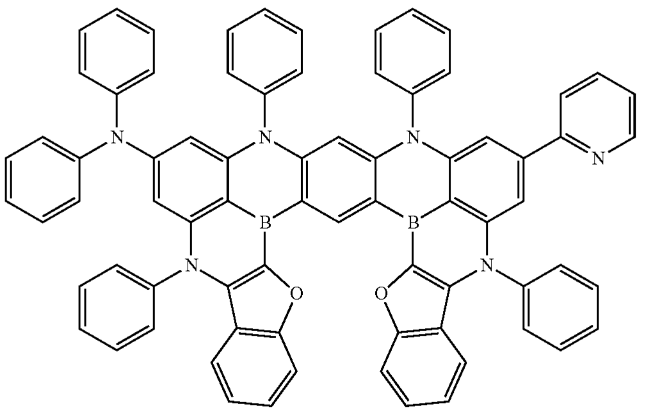
108
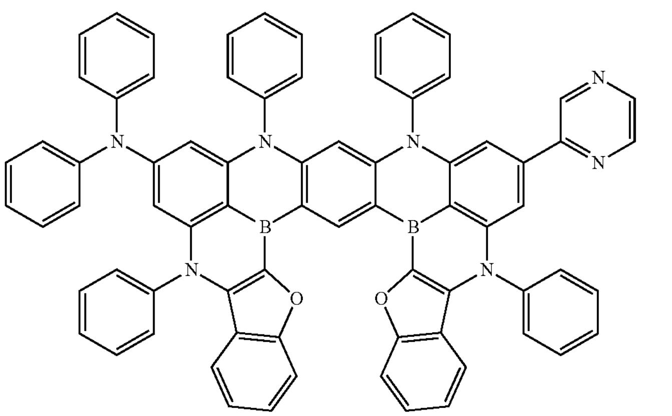
109
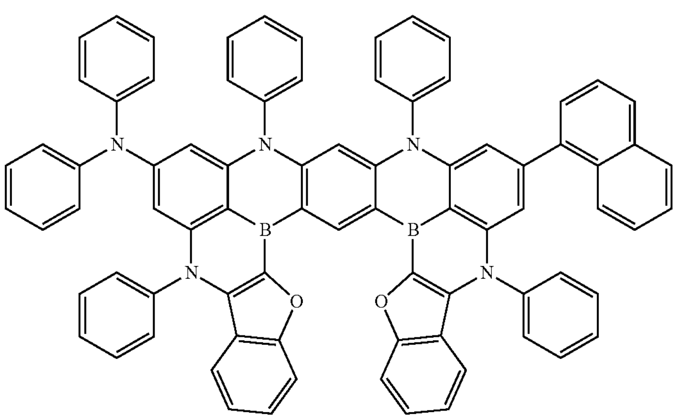

-continued
110
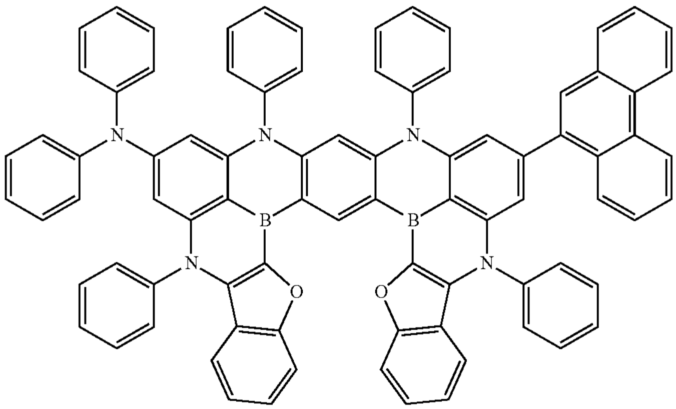
111
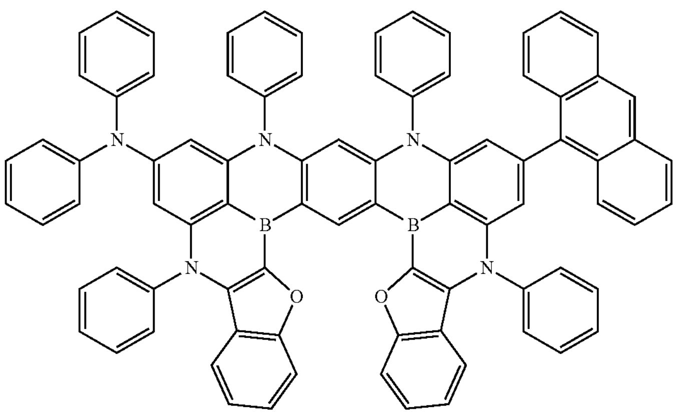
112
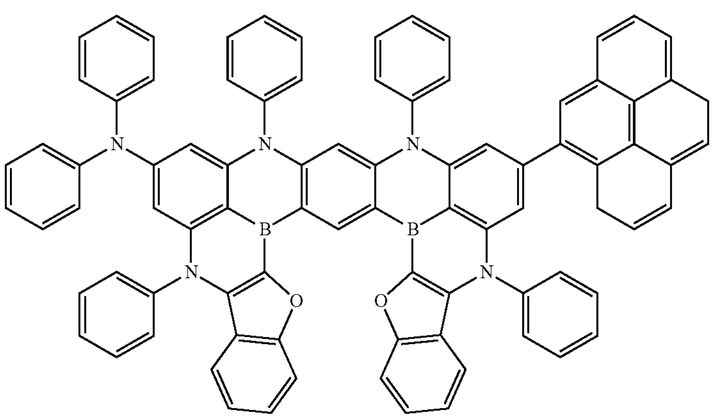
113
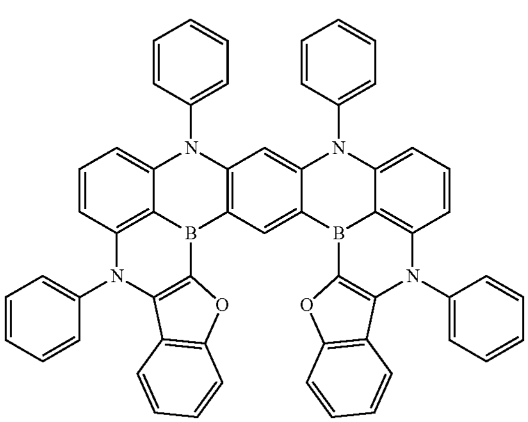

-continued
114
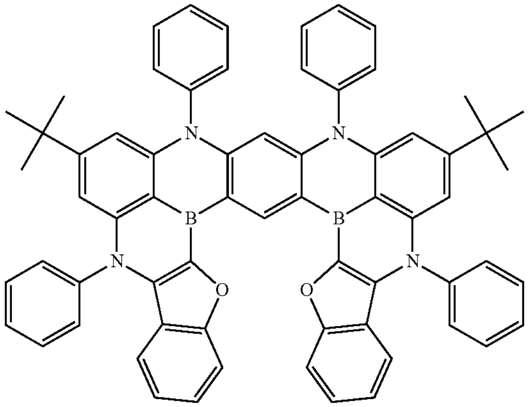
115
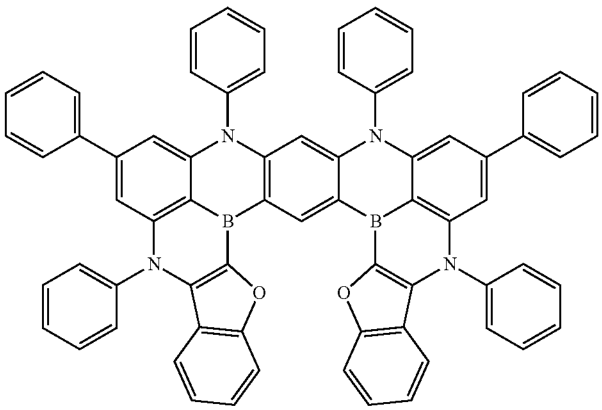
116
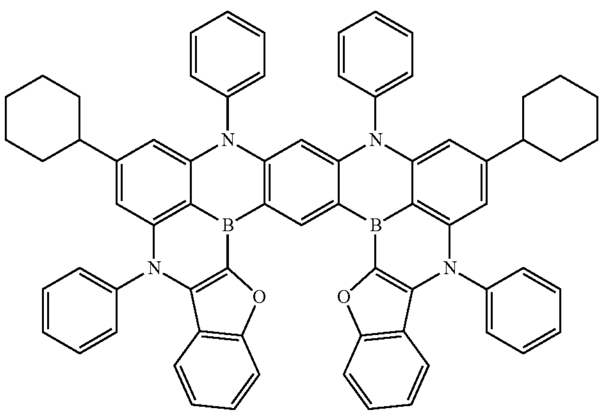
117
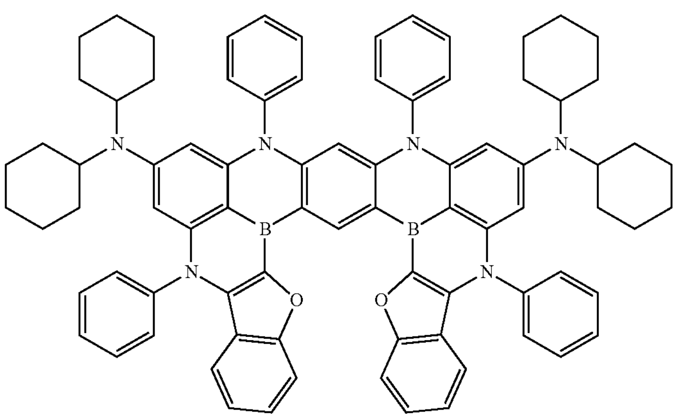

-continued
118
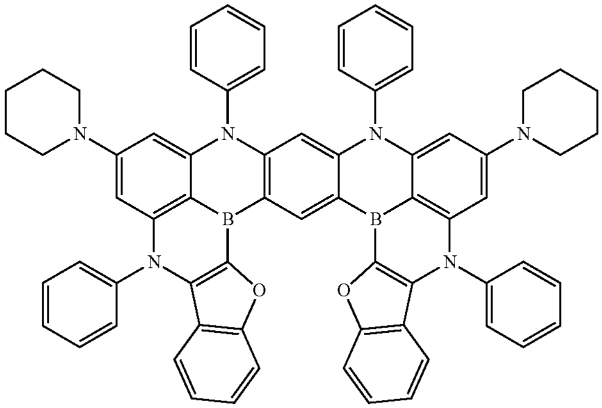
119
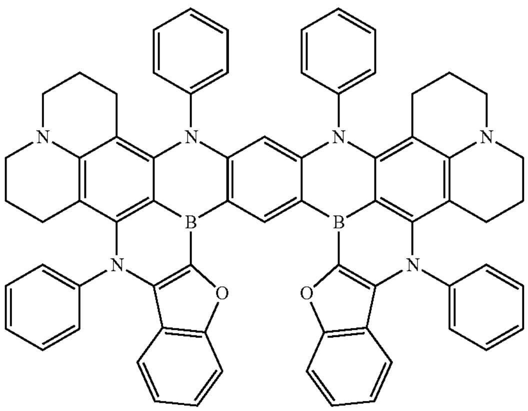
120
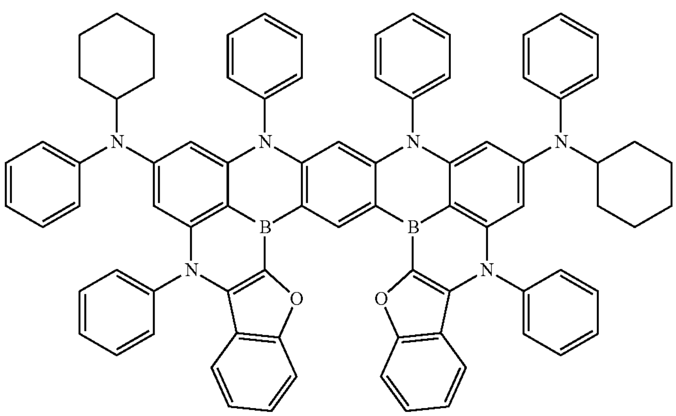
121
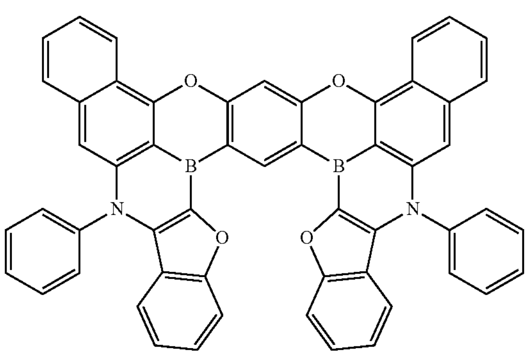

-continued
122
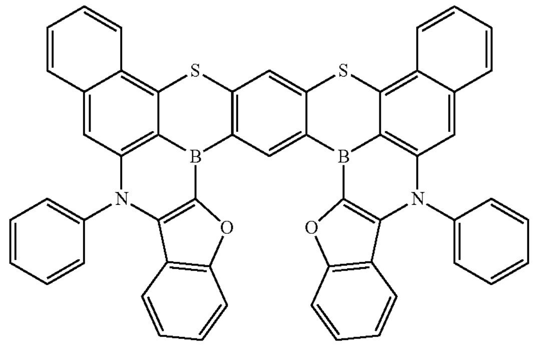
123
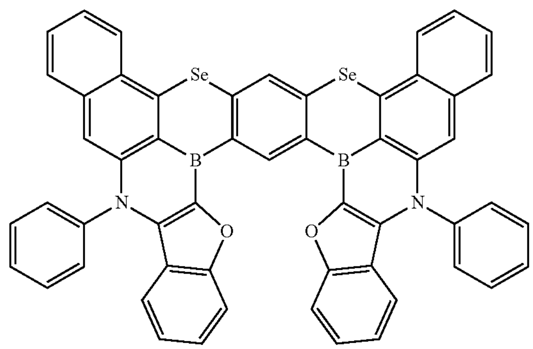
124
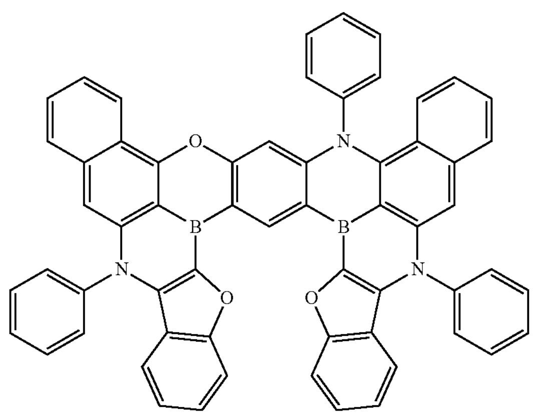
125
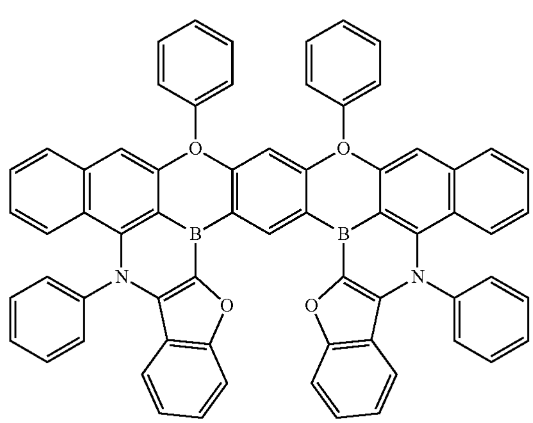

-continued
126
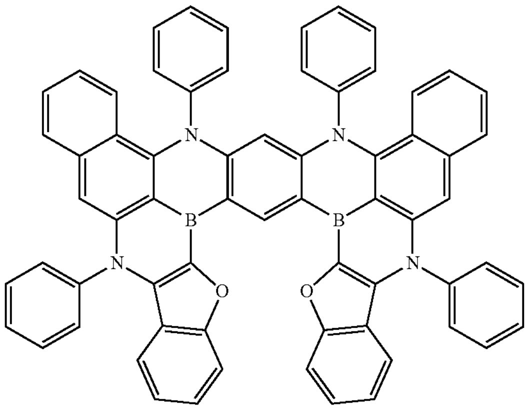
127
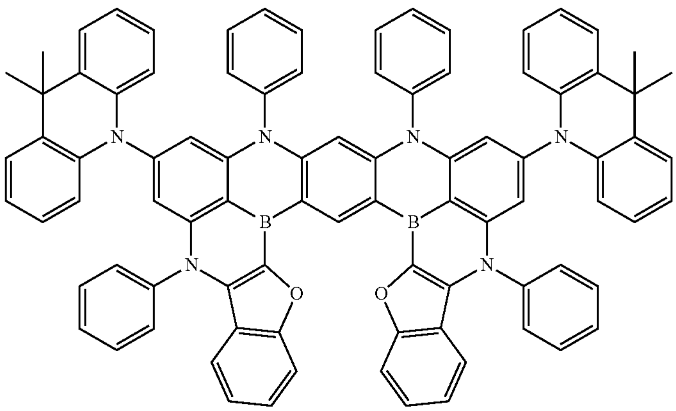
128
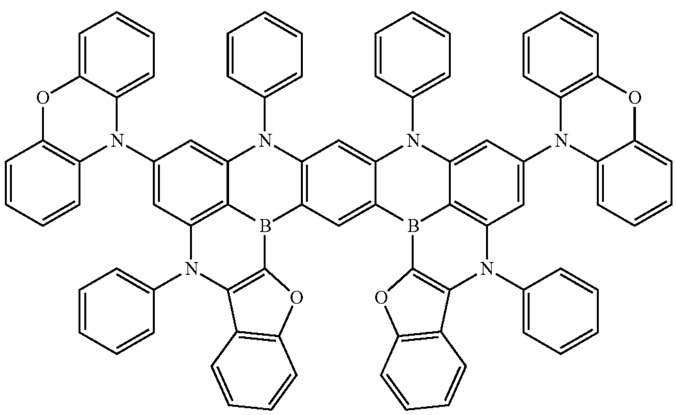
129
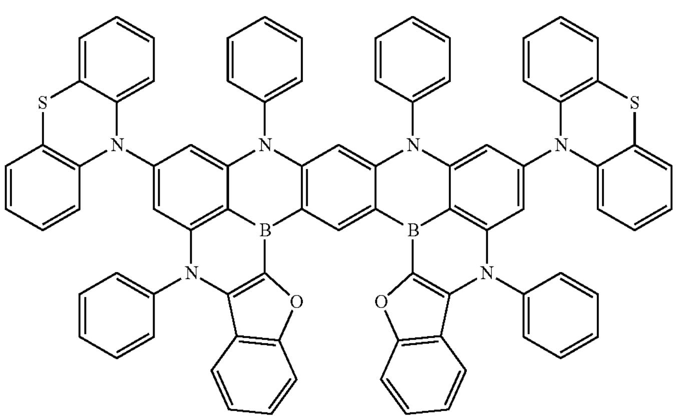

-continued

130

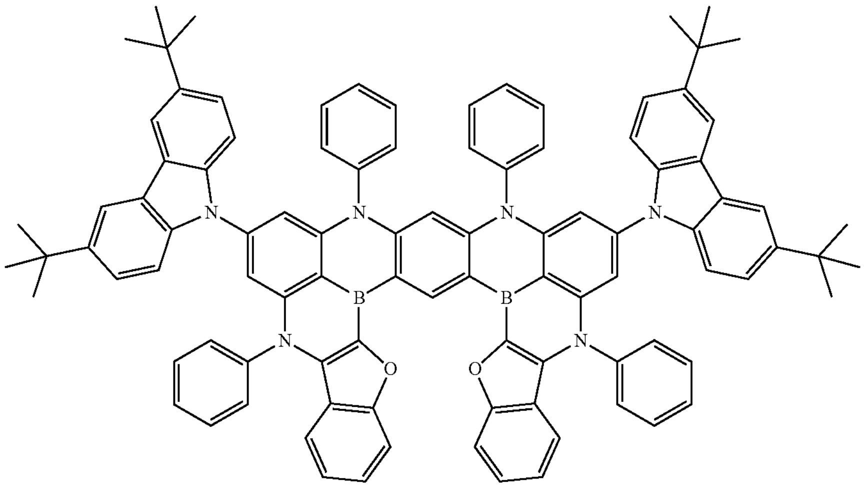

131

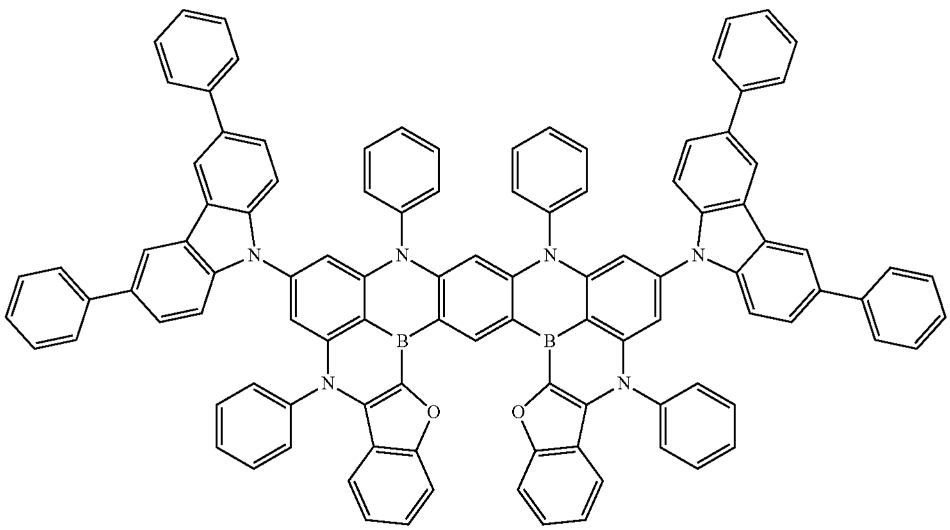

13. A light emitting device, comprising:

a first electrode;

a second electrode facing the first electrode; and an emission layer between the first electrode and the second electrode, wherein the emission layer comprises a host and a delayed fluorescence dopant, and the delayed fluorescence dopant comprises a fused polycyclic compound represented by Formula 1:

Formula 1

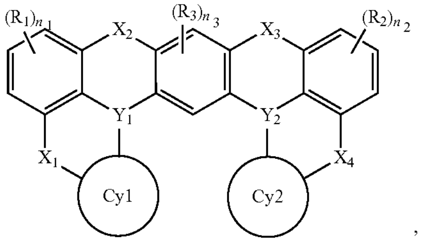

wherein in Formula 1, $X_1$ to $X_4$ are each independently $CR_4R_5$, $NR_6$, O, S or Se, $Y_1$ and $Y_2$ are each B, $R_1$ to $R_6$ are each independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms, and/or combined with an adjacent group to form a ring, "$n_1$" and "$n_2$" are each independently an integer of 0 to 3, "$n_3$" is an integer of 0 to 2, Cy1 and Cy2 are each independently represented by Formula 2 or Formula 3, and at least one selected from among Cy1 and Cy2 is represented by Formula 2:

Formula 2

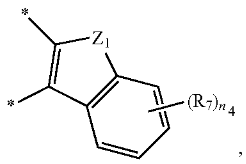

wherein in Formula 2, $Z_1$ is $CR_8R_9$, $NR_{10}$, O, S, or Se, $R_7$ to $R_{10}$ are each independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms, and/or combined with an adjacent group to form a ring, "$n_4$" is an integer of 0 to 4, —* represents a position connected with $X_1$ or $Y_1$, or a position connected with $X_4$ or $Y_2$,

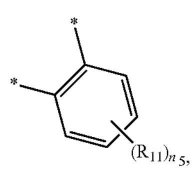

and wherein in Formula 3, $R_{11}$ is a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms, and/or combined with an adjacent group to form a ring, "$n_5$" is an integer of 0 to 4, and —* represents a position connected with $X_1$ or $Y_1$, or a position connected with $X_4$ or $Y_2$.

14. The light emitting device of claim 13, wherein the host comprises a compound represented by Formula E-2a or Formula E-2b:

Formula E-2a

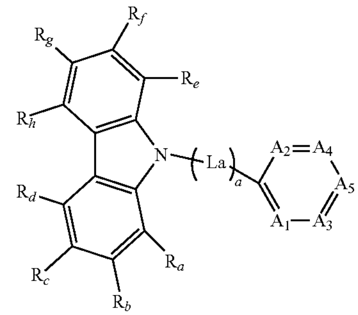

Formula E-2b $(Cbz1)\text{—}(L_b)_b\text{—}(Cbz2),$ wherein in Formula E-2a,

"a" is an integer of 0 to 10, $L_a$ is a direct linkage, a substituted or unsubstituted arylene group having 6 to 30 ring-forming carbon atoms, or a substituted or unsubstituted heteroarylene group having 2 to 30 ring-forming carbon atoms, $A_1$ to $A_5$ are each independently N or $CR_i$, $R_a$ to $R_i$ are each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or combined with an adjacent group to form a ring, and two or three groups selected from among $A_1$ to $A_5$ are each N, and remainder groups are each $CR_i$, and wherein in Formula E-2b, Cbz1 and Cbz2 are each independently an unsubstituted carbazole group, or a carbazole group substituted with an aryl group having 6 to 30 ring-forming carbon atoms, $L_b$ is a direct linkage, a substituted or unsubstituted arylene group having 6 to 30 ring-forming carbon atoms, or a substituted or unsubstituted heteroarylene group having 2 to 30 ring-forming carbon atoms, and "b" is an integer of 0 to 10.

15. The light emitting device of claim 13, further comprising a hole transport region between the first electrode and the emission layer, and the hole transport region comprises a compound represented by Formula H-a:

Formula H-a

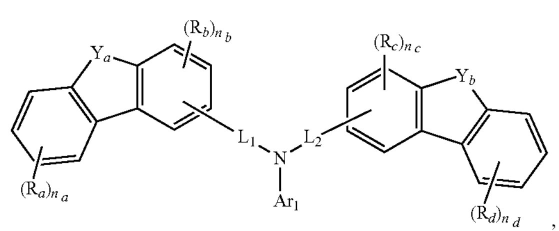

and wherein in Formula H-a, $Y_a$ and $Y_b$ are each independently $CR_eR_f$, $NR_g$, O, or S, $Ar_1$ is a substituted or unsubstituted aryl group having 6 to 30 ring-forming carbon atoms, or a substituted or unsubstituted heteroaryl group having 2 to 30 ring-forming carbon atoms, $L_1$ and $L_2$ are each independently a direct linkage, a substituted or unsubstituted arylene group having 6 to 30 ring-forming carbon atoms, or a substituted or unsubstituted heteroarylene group having 2 to 30 ring-forming carbon atoms, $R_a$ to $R_g$ are each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or combined with an adjacent group to form a ring, "$n_a$" and "$n_d$" are each independently an integer of 0 to 4, and "$n_b$" and "$n_c$" are each independently an integer of 0 to 3.

16. The light emitting device of claim 13, wherein the fused polycyclic compound represented by Formula 1 is represented by any one among Formula 4-1 to Formula 4-3:

Formula 4-1

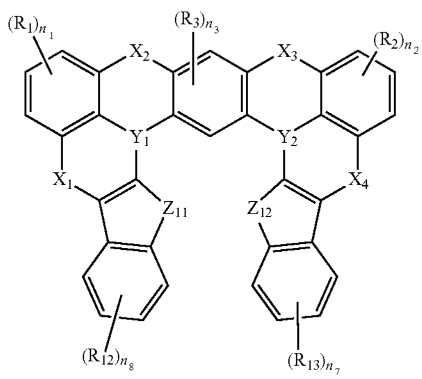

Formula 4-2

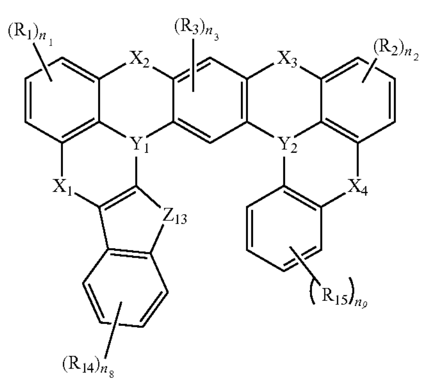

-continued

Formula 4-3

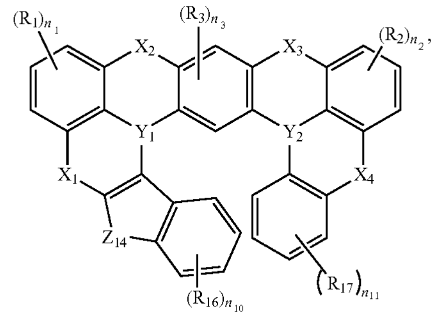

and wherein in Formula 4-1 to Formula 4-3, $Z_{11}$ to $Z_{14}$ are each independently $CR_{18}R_{19}$, $NR_{20}$, O, S, or Se, $R_{12}$ to $R_{20}$ are each independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms, and/or combined with an adjacent group to form a ring, "$n_6$" to "$n_{11}$" are each independently an integer of 0 to 4, and $X_1$ to $X_4$, $Y_1$, $Y_2$, $R_1$ to $R_3$, and "$n_1$" to "$n_3$" are the same as respectively defined in connection with Formula 1.

17. The light emitting device of claim 13, wherein the fused polycyclic compound represented by Formula 1 is represented by any one among Formula 5-1 to Formula 5-3:

Formula 5-1

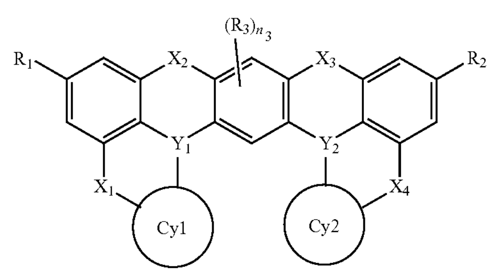

Formula 5-2

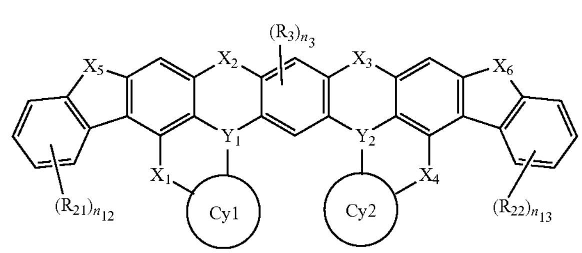

-continued

Formula 5-3

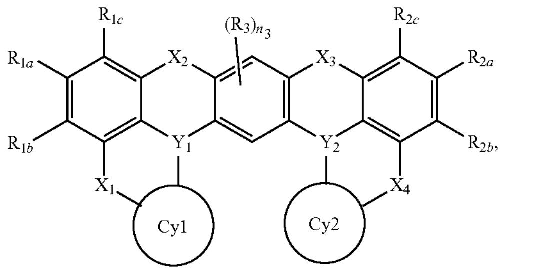

and wherein in Formula 5-1 to Formula 5-3, $X_5$ and $X_6$ are each independently $CR_{23}R_{24}$, $NR_{25}$, O, or S, $R_{21}$ to $R_{25}$ are each independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms, and/or combined with an adjacent group to form a ring, $R_{1a}$, $R_{1b}$, $R_{1c}$, $R_{2a}$, $R_{2b}$, and $R_{2c}$ are each independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms, $R_{1a}$ is combined with $R_{1b}$ and/or $R_{1c}$ to form a ring, $R_{2a}$ is combined with $R_{2b}$ and/or $R_{2c}$ to form a ring, "$n_{12}$" to "$n_{13}$" are each independently an integer of 0 to 4, and $X_1$ to $X_4$, $Y_1$, $Y_2$, $R_1$, $R_2$, $R_3$, "$n_3$", Cy1 and Cy2 are the same as respectively defined in Formula 1.

18. The light emitting device of claim 13, wherein Cy1 and/or Cy2 is represented by Formula 2-1 or Formula 2-2:

Formula 2-1

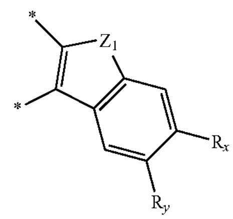

Formula 2-2

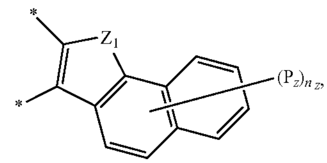

and in Formula 2-1 and Formula 2-2, $R_x$, $R_y$, and $P_z$ are each independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms, and/or combined with an adjacent group to form a ring, "$n_z$" is an integer of 0 to 6, and $Z_1$ and —* are the same as respectively defined in connection Formula 2.

19. The light emitting device of claim 13, wherein, in Formula 1 to Formula 3, $R_1$ to $R_{11}$ are each independently a hydrogen atom, a deuterium atom, a substituted or unsubstituted methyl group, a substituted or unsubstituted t-butyl group, a substituted or unsubstituted phenyl group, a substituted or unsubstituted terphenyl group, or a substituted or unsubstituted carbazole group.

20. The light emitting device of claim 13, wherein the fused polycyclic compound is at least one selected from among compounds in Compound Group 1:

Compound Group 1

1

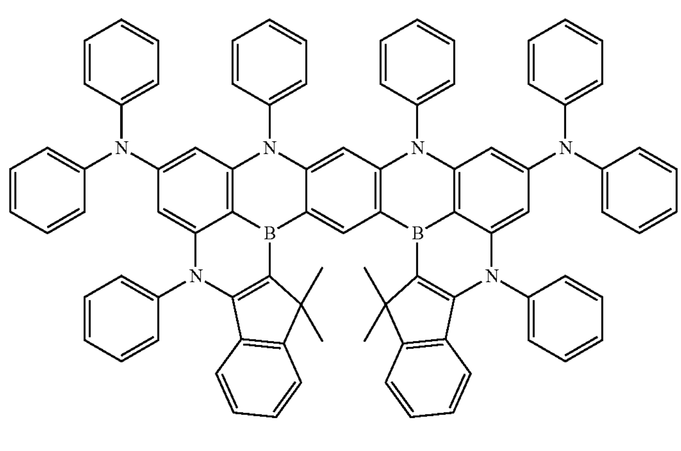

-continued
2
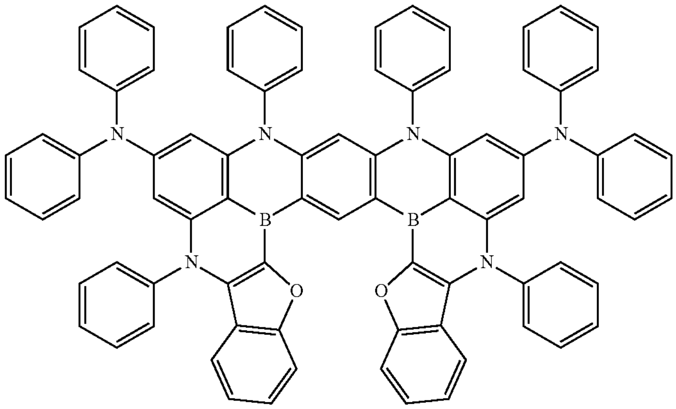
3
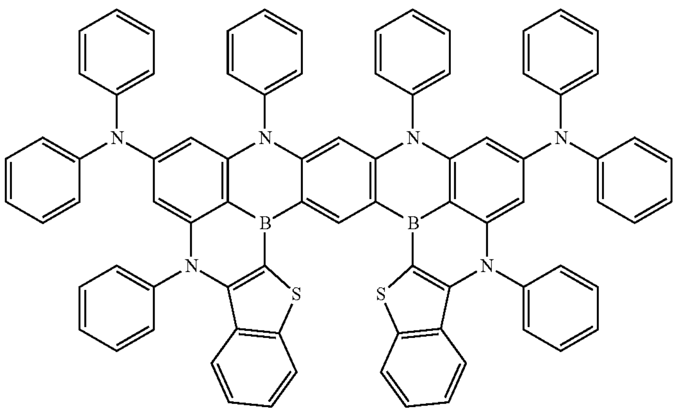
4
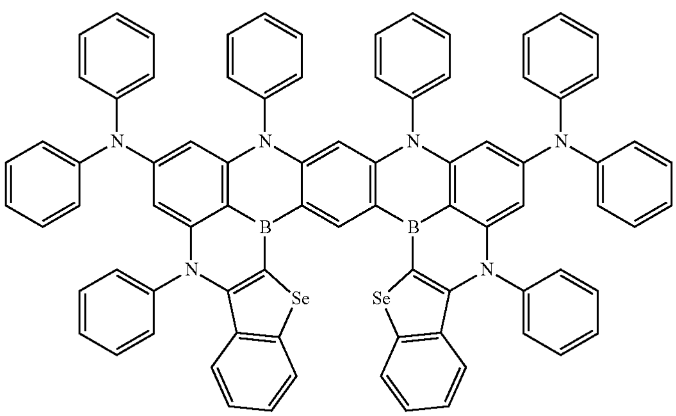
5
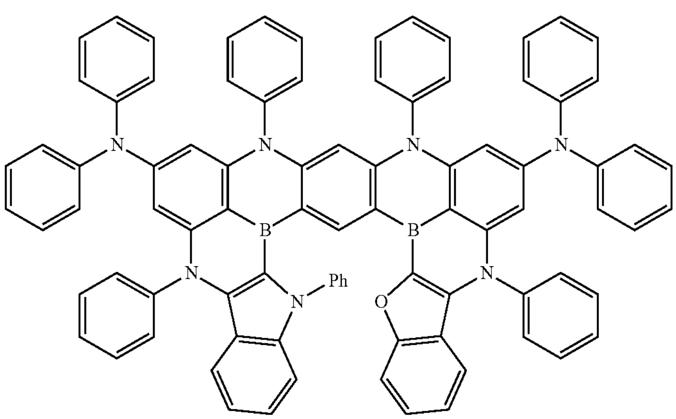

-continued
6
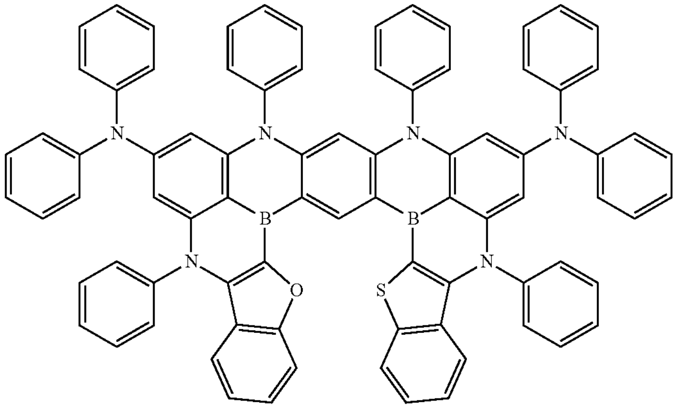
7
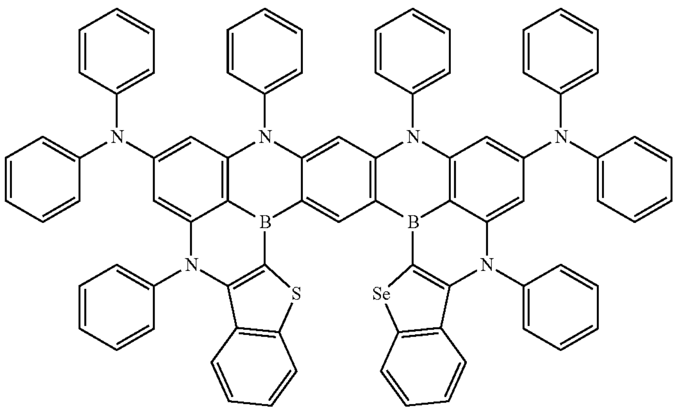
8
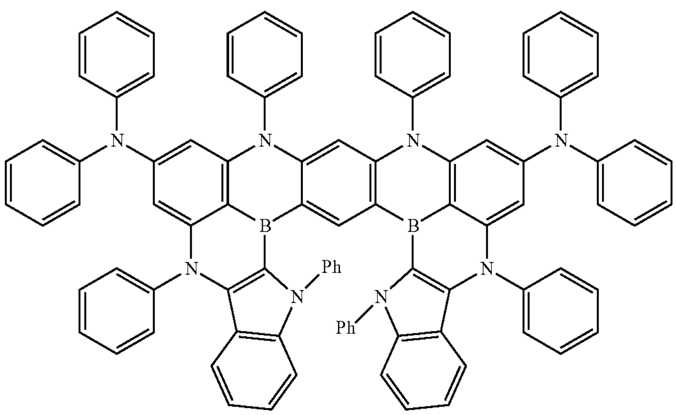
9
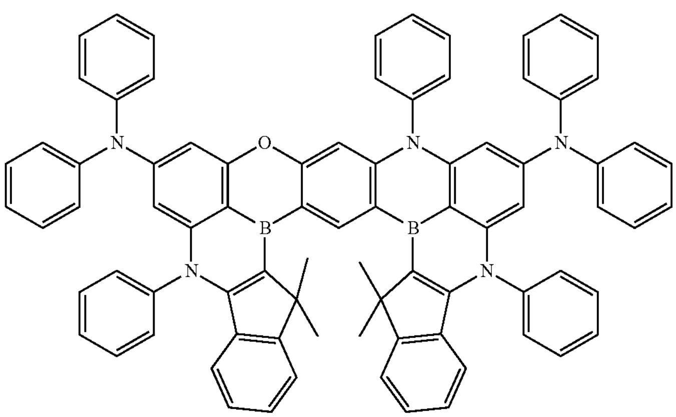

-continued
10
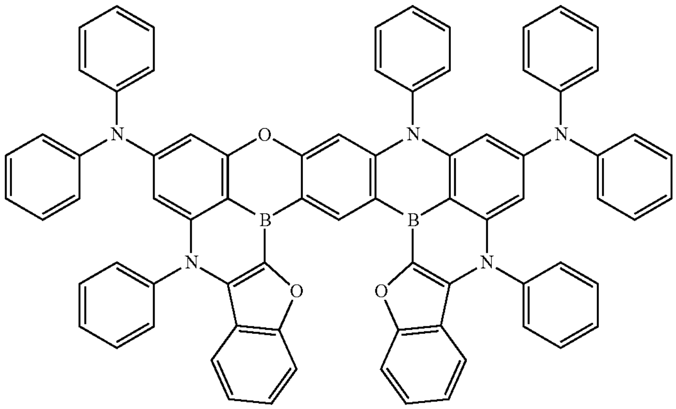
11
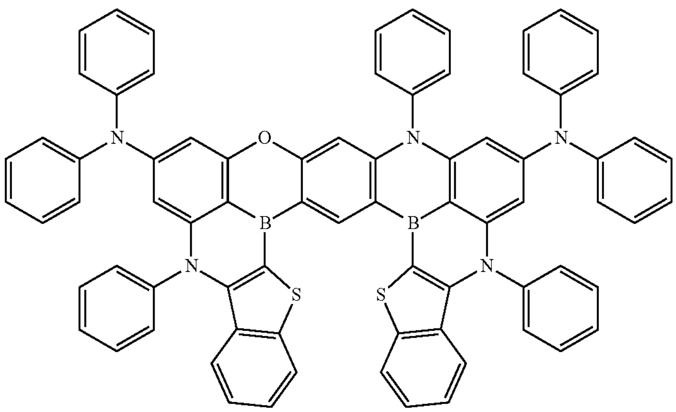
12
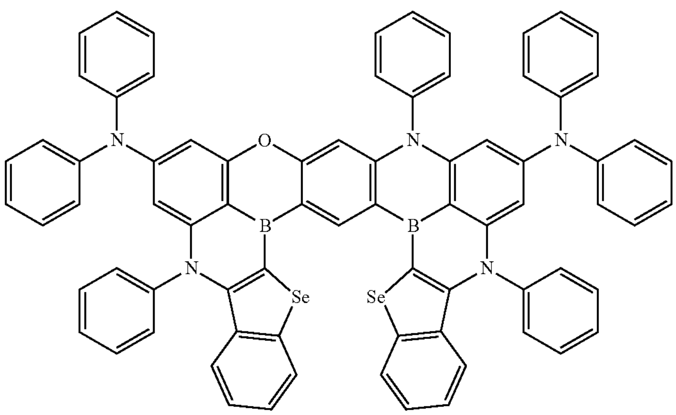
13
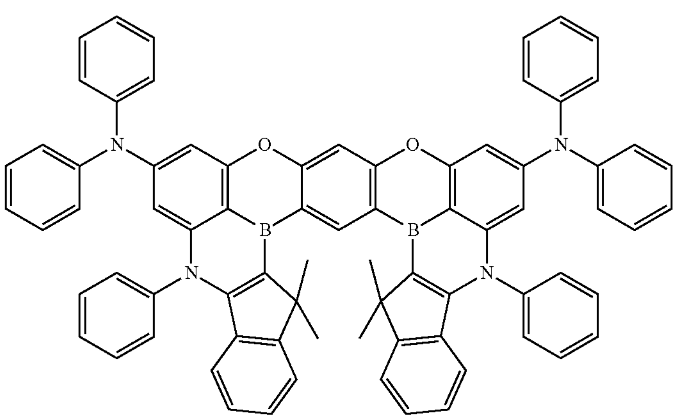

-continued
14
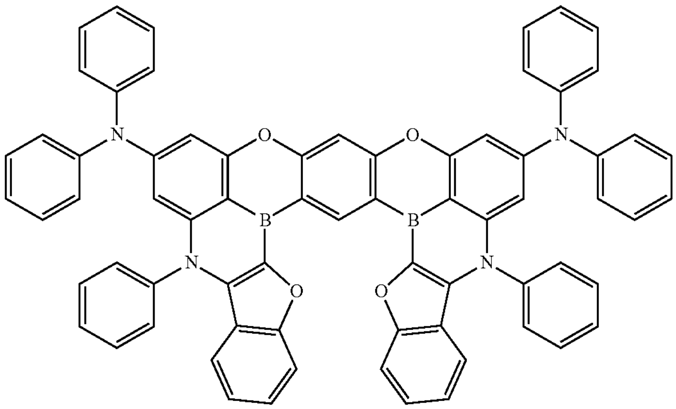
15
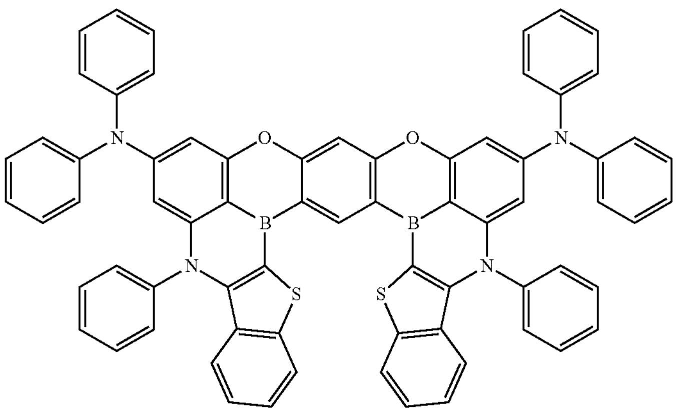
16
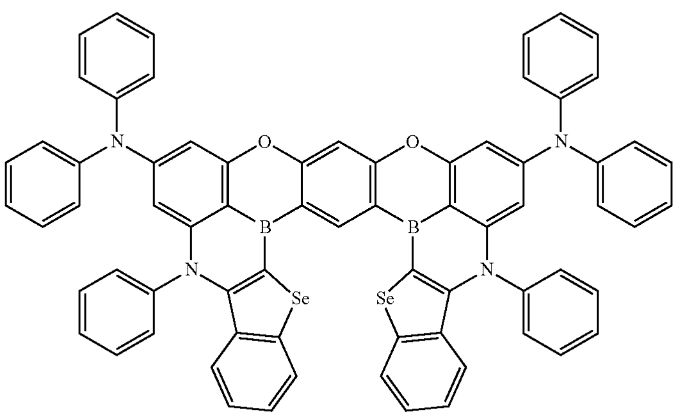
17
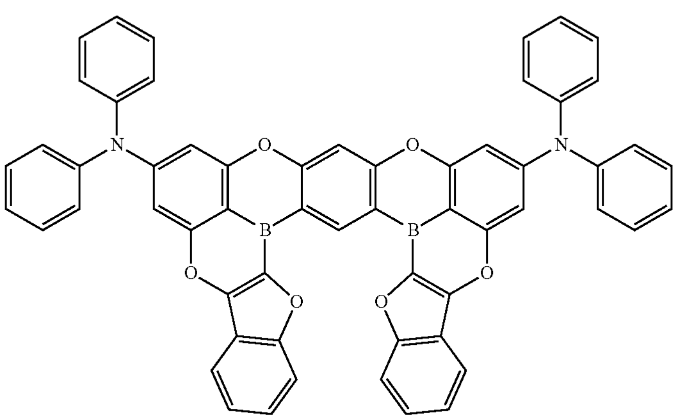

-continued
18
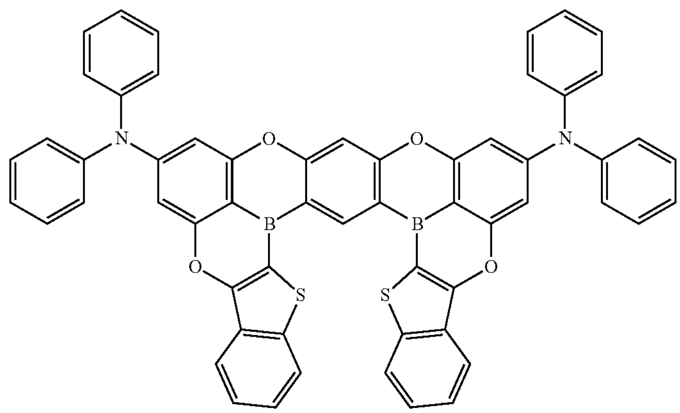
19
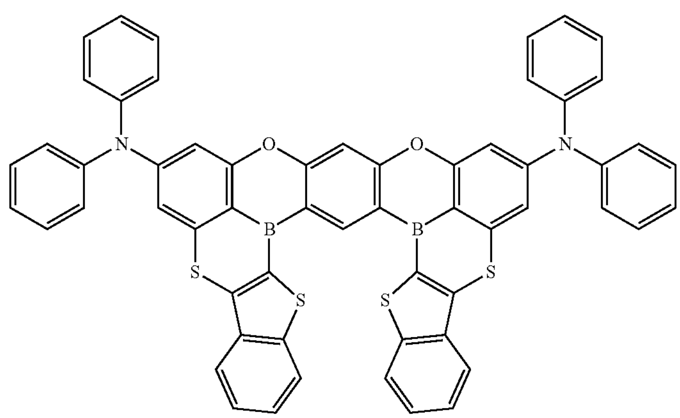
20
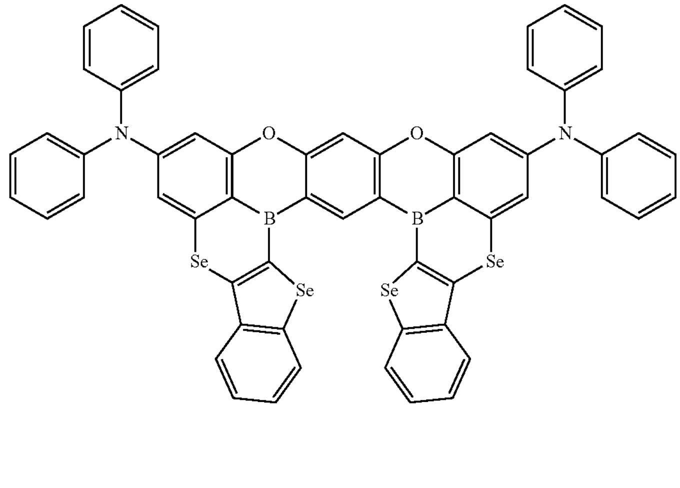

-continued
21
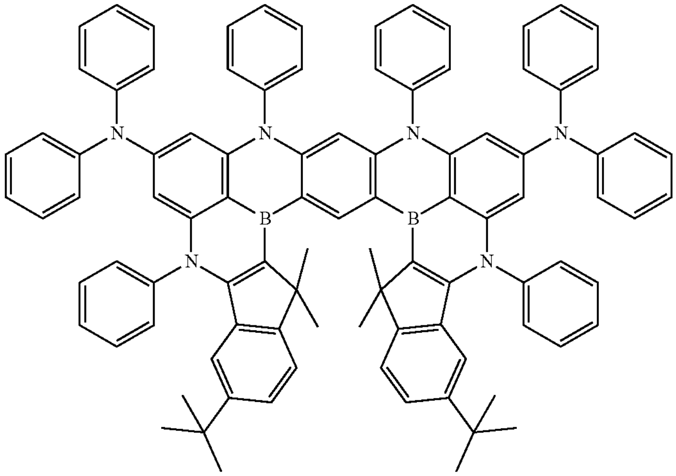
22
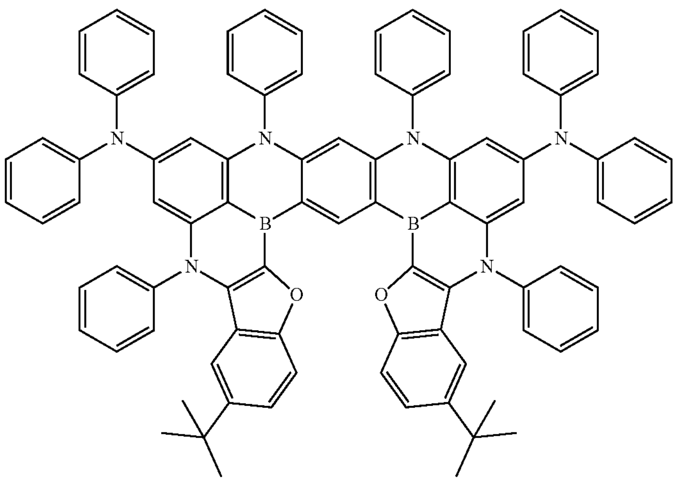
23
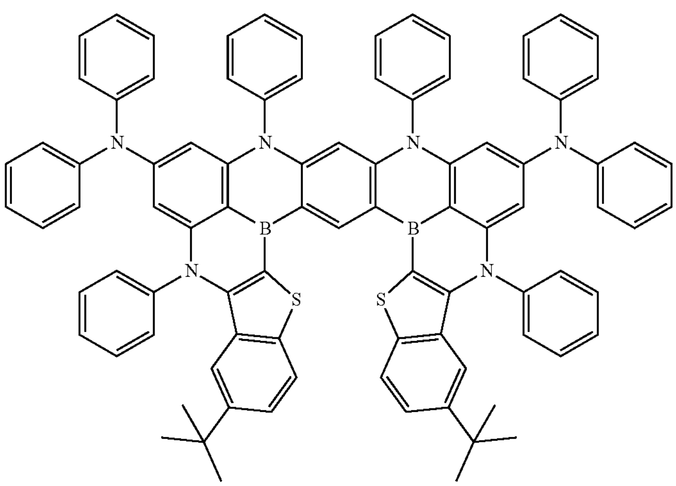

-continued
24
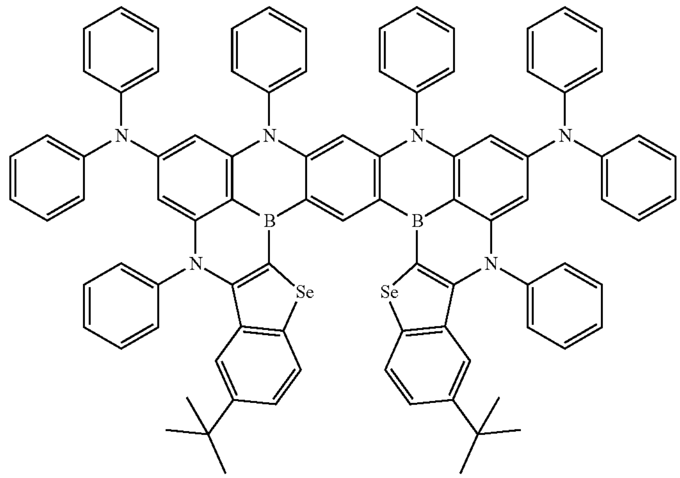
25
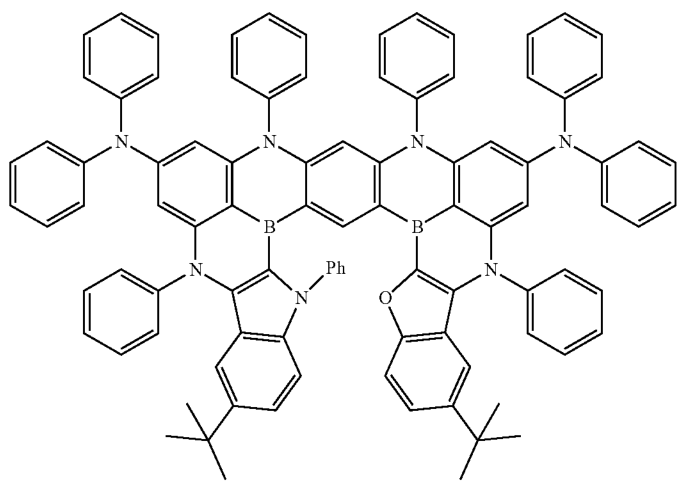
26
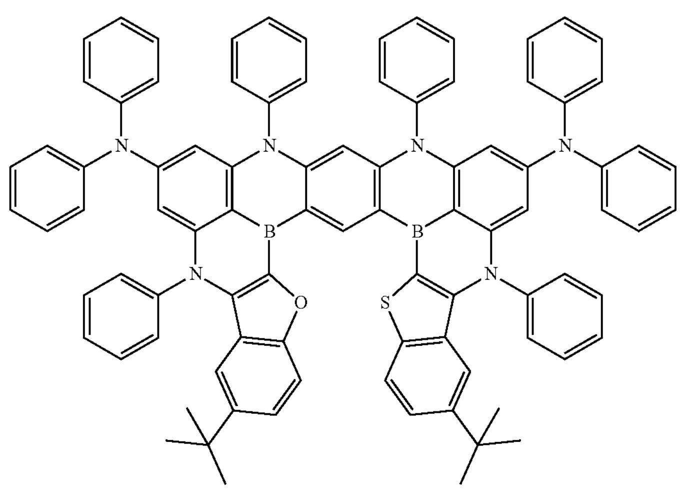

-continued
27
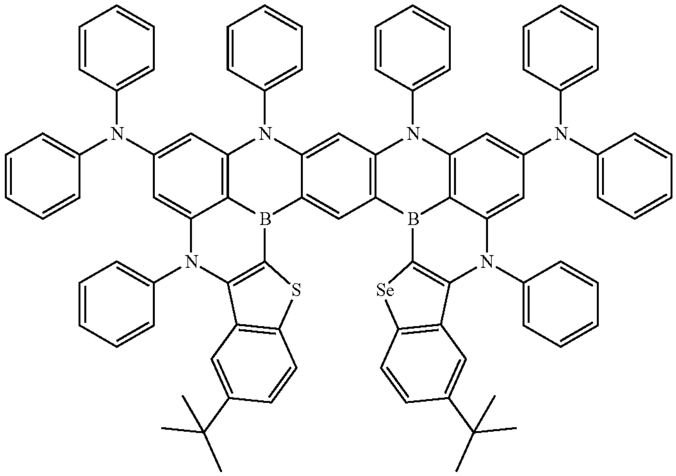
28
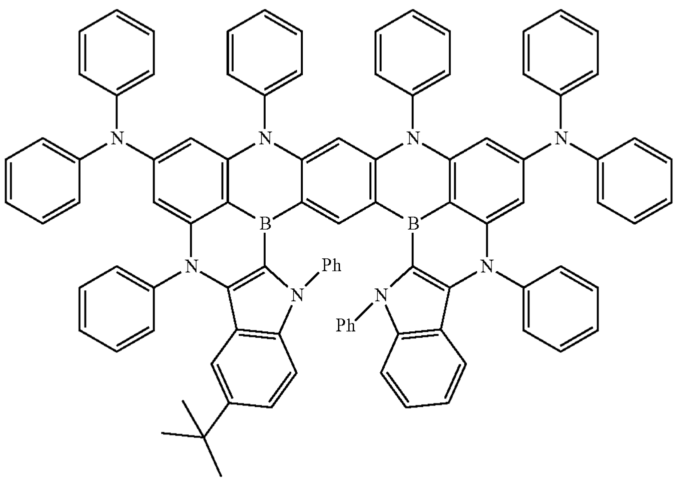
29
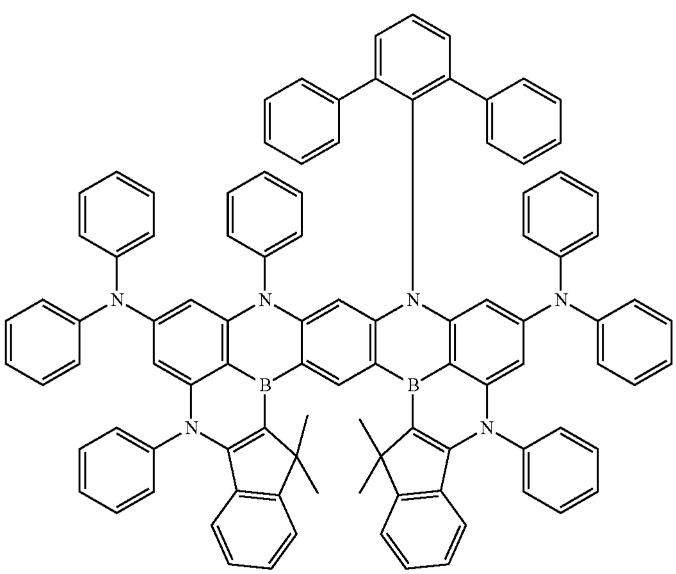

-continued
30
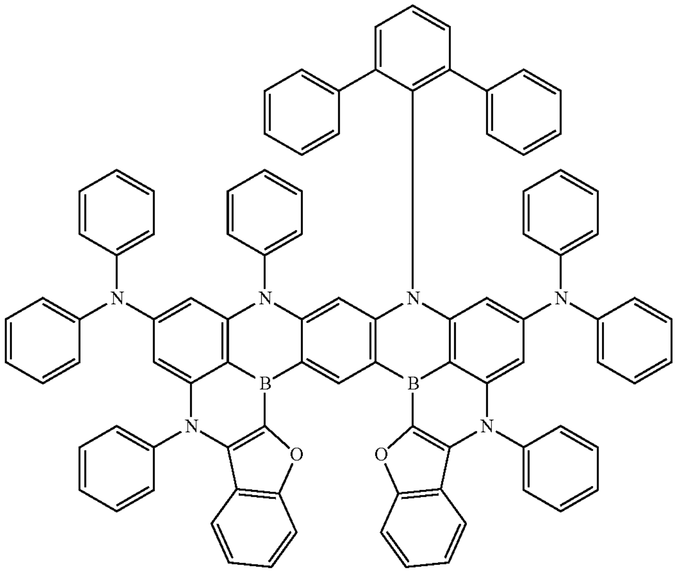
31
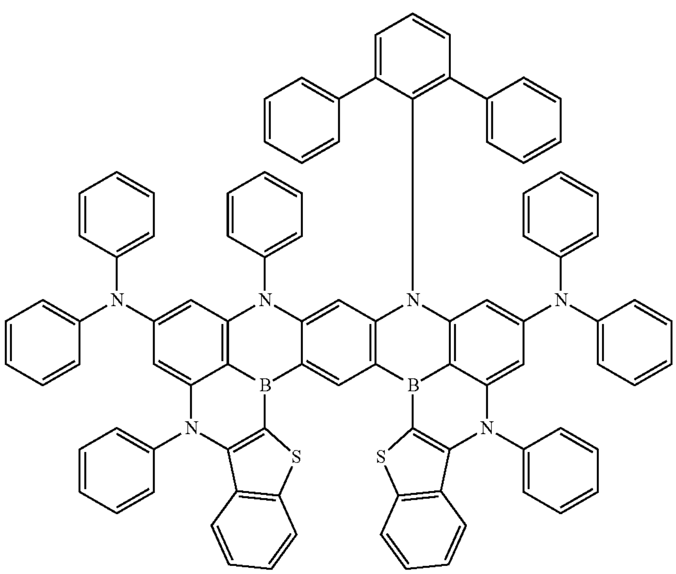

-continued
32
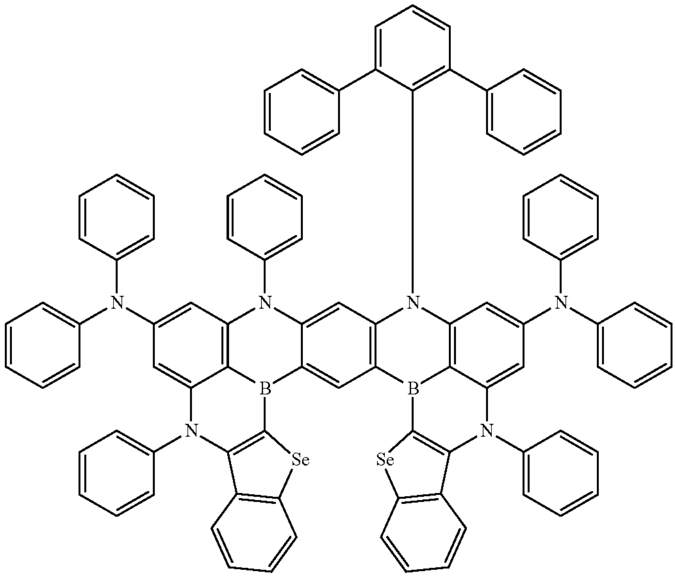
33
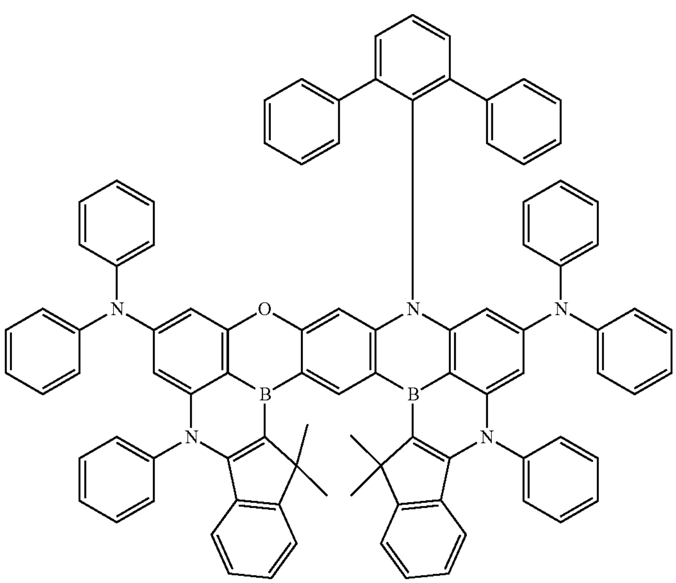

-continued
34
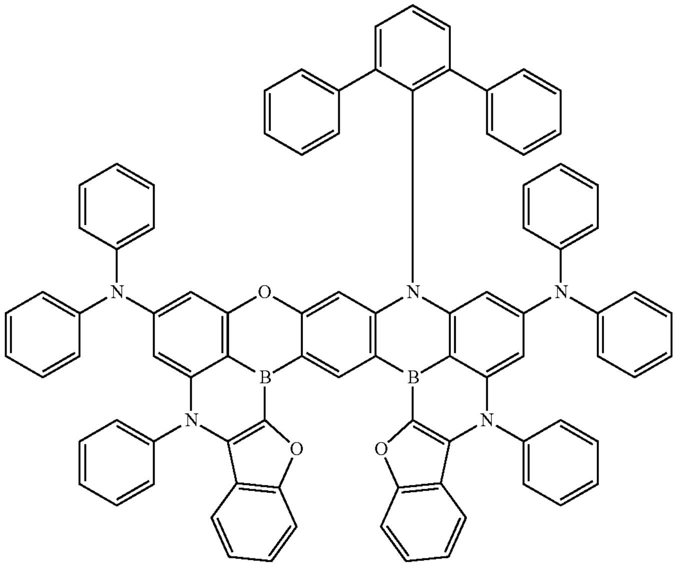
35
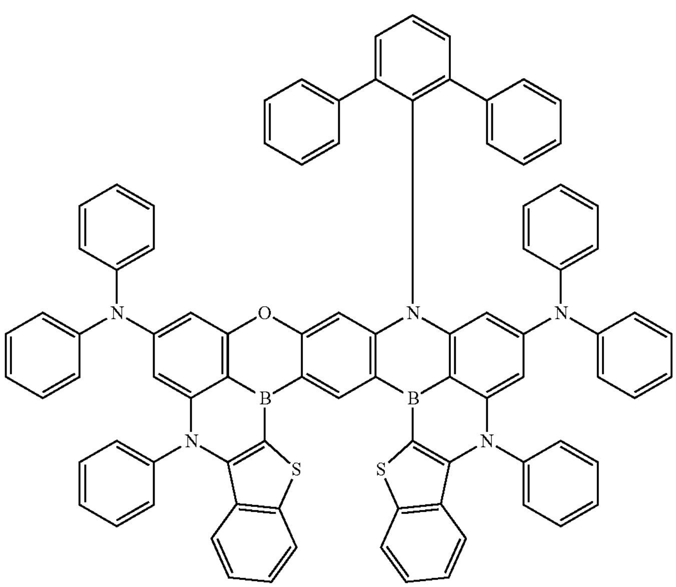

-continued
36
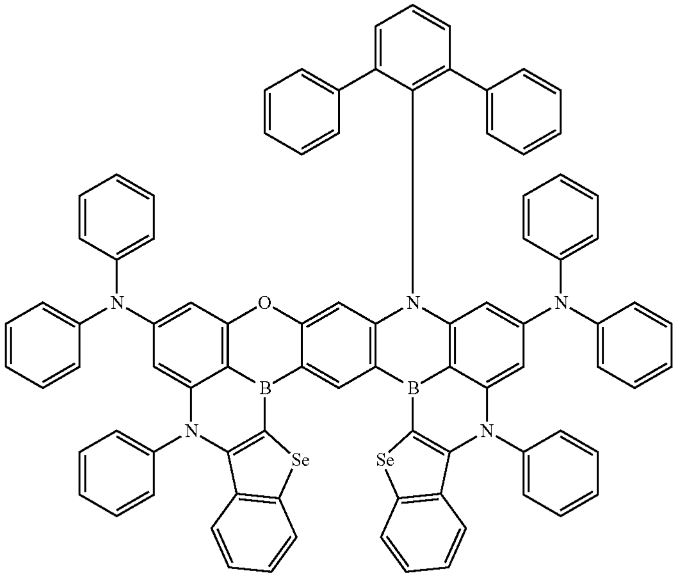
37
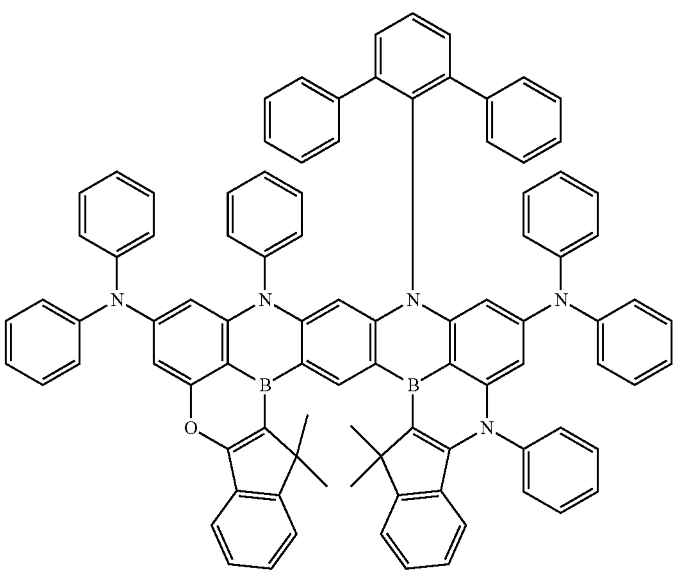

-continued
38
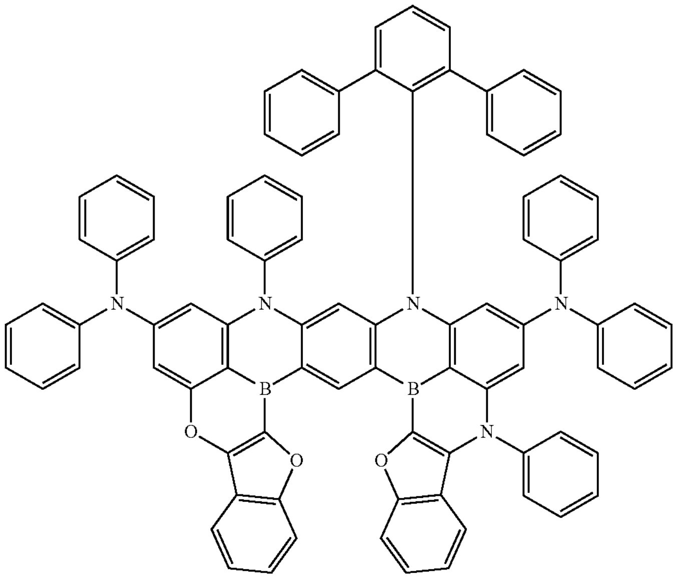
39
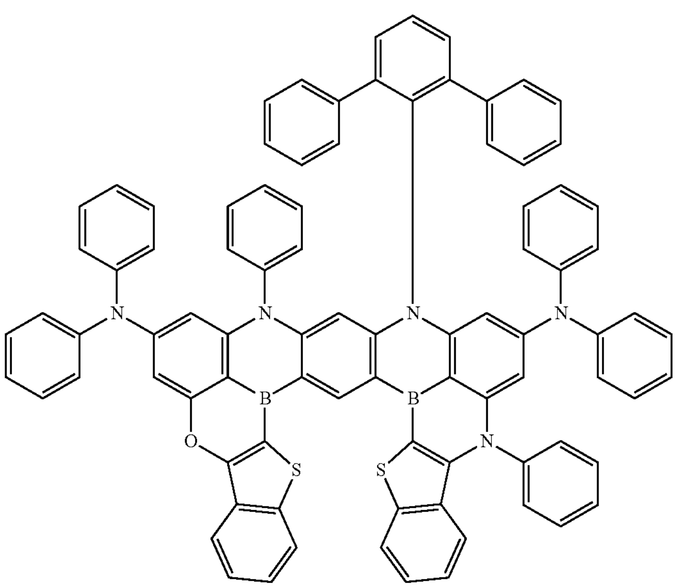

-continued
40
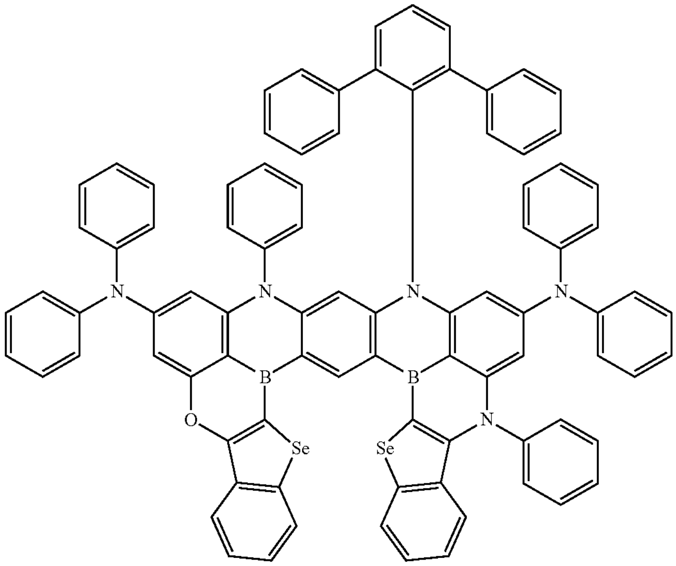
41
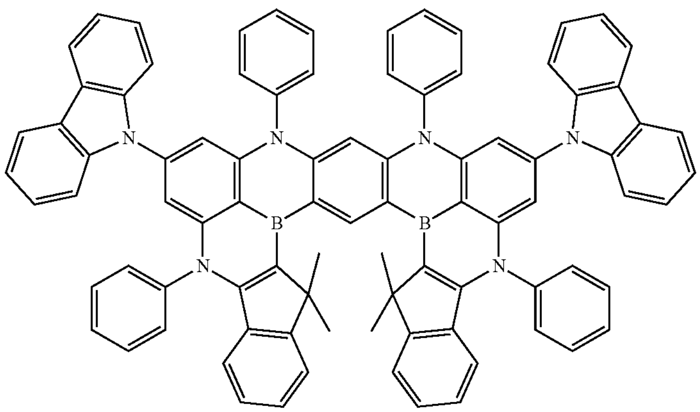
42
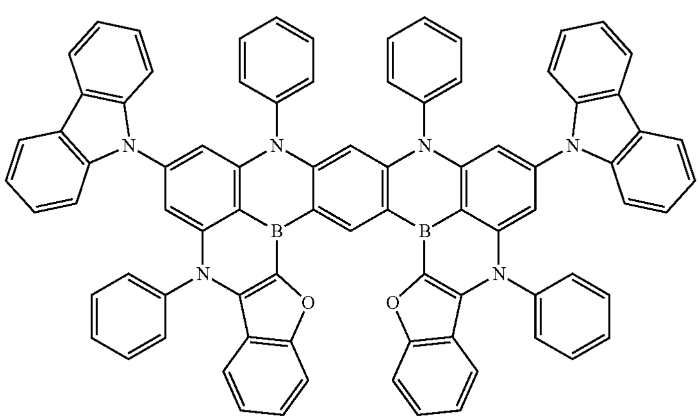

-continued
43
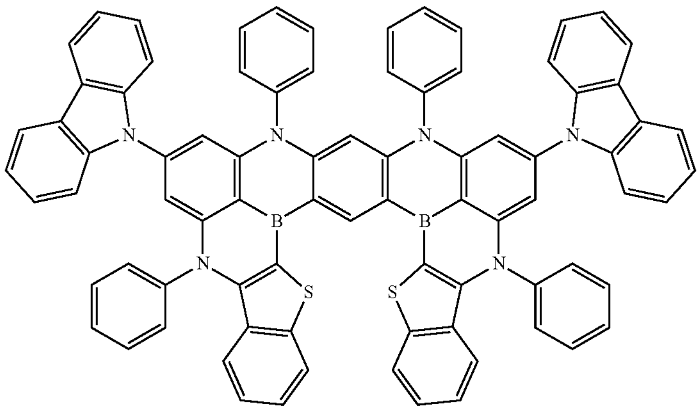
44
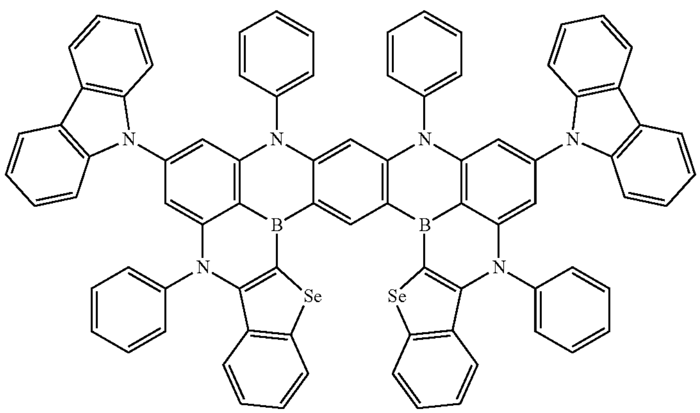
45
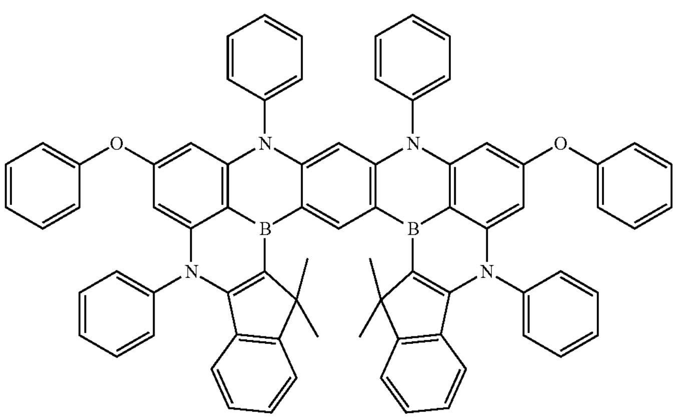
46
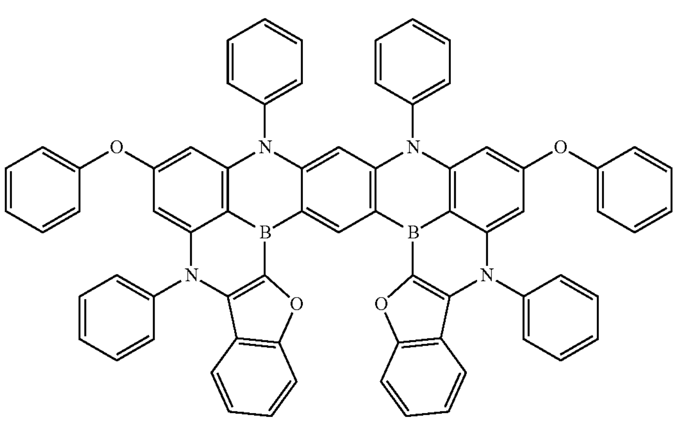

-continued
47
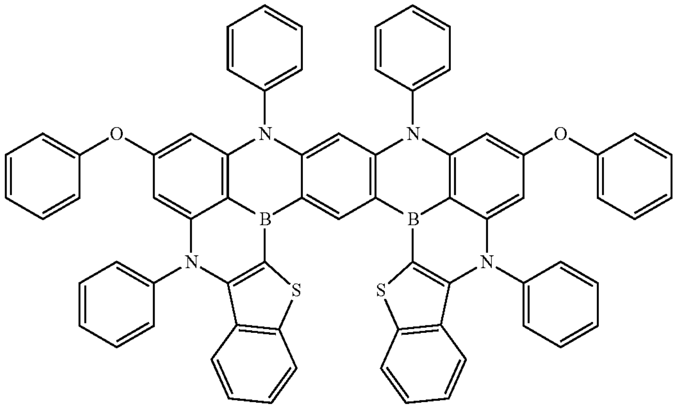
48
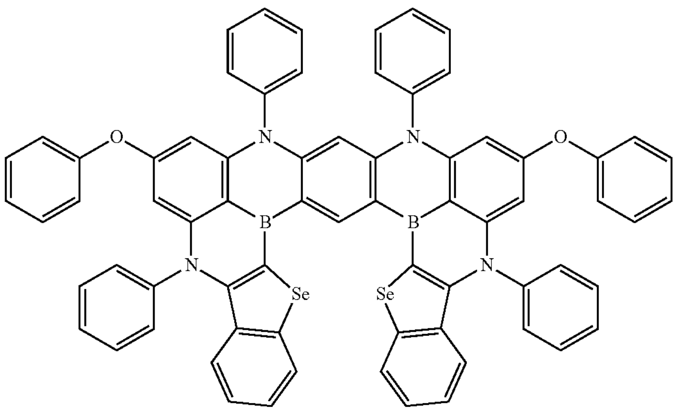
49
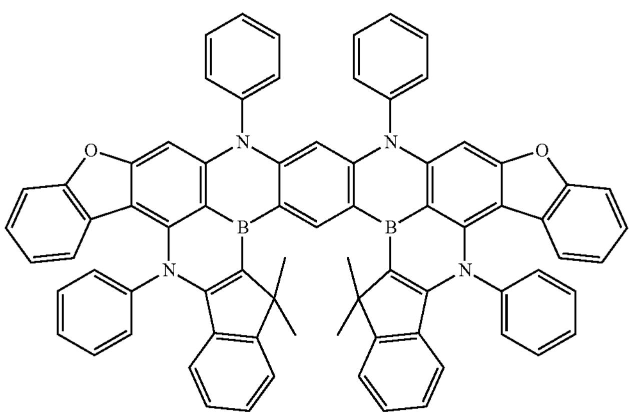
50
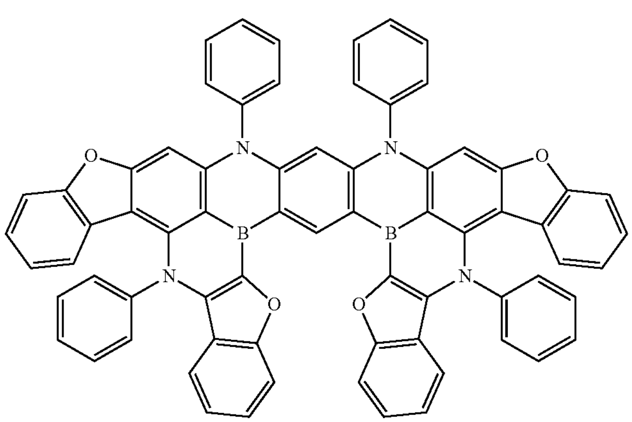

-continued
51
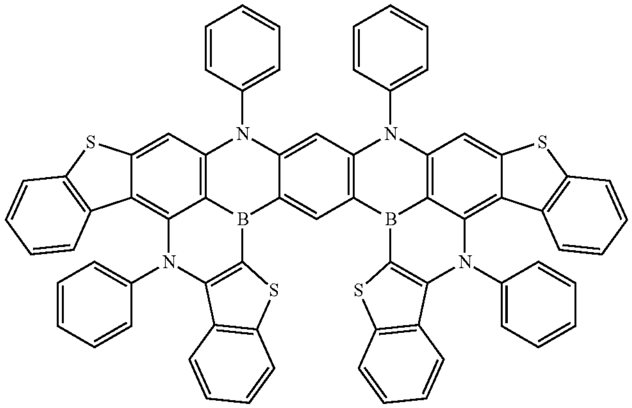
52
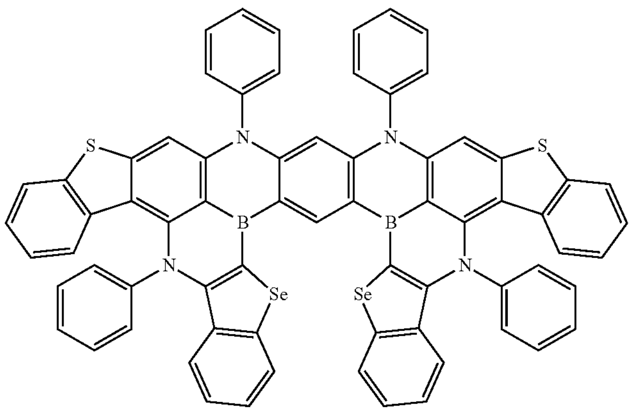
53
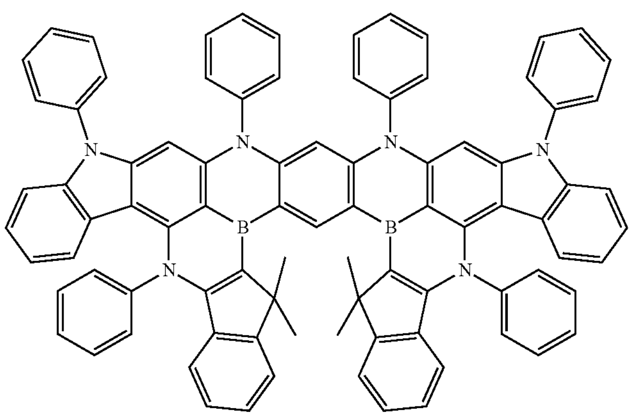
54
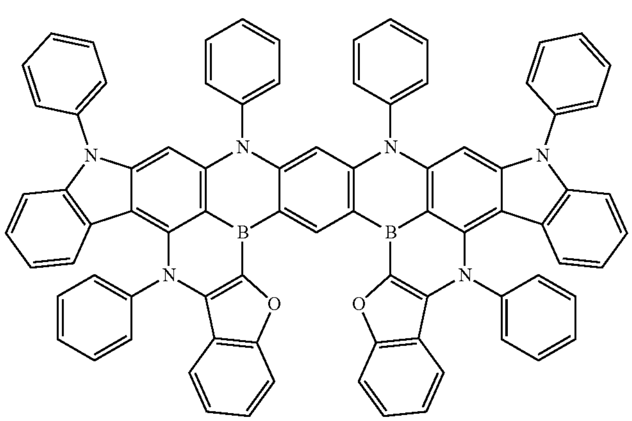

-continued
55
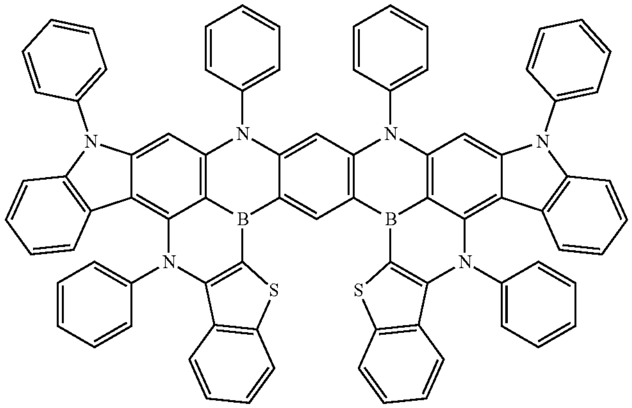
56
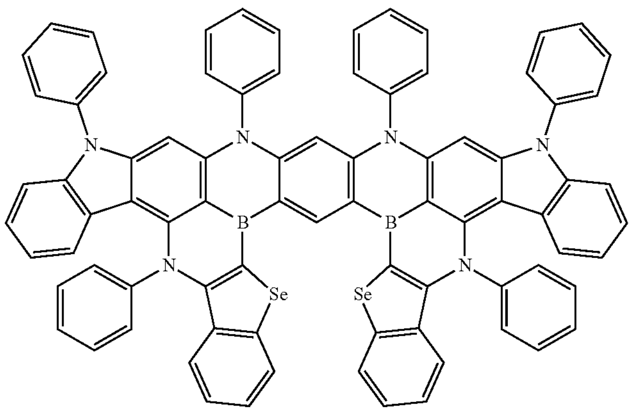
57
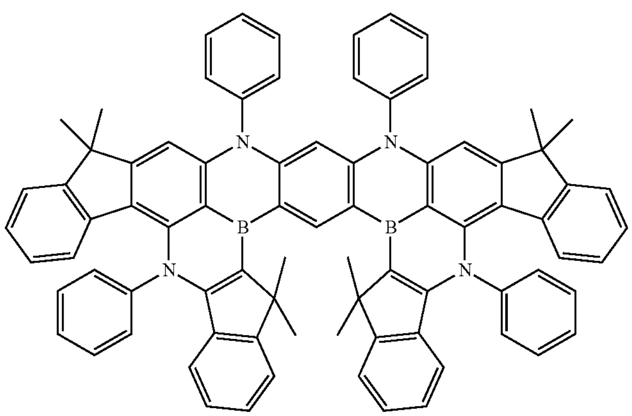
58
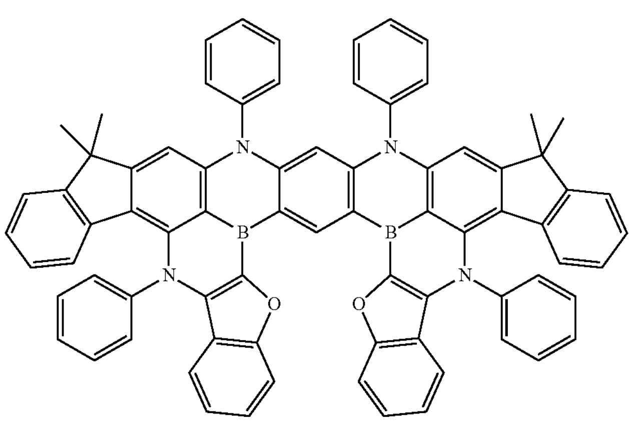

-continued
59
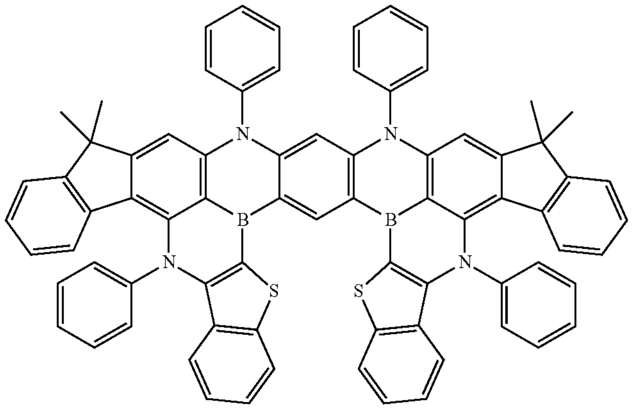
60
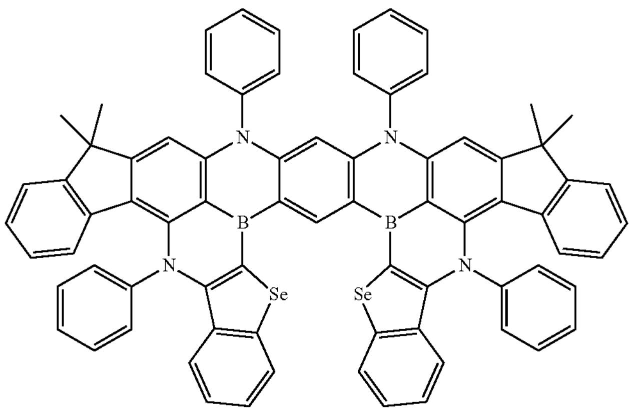
61
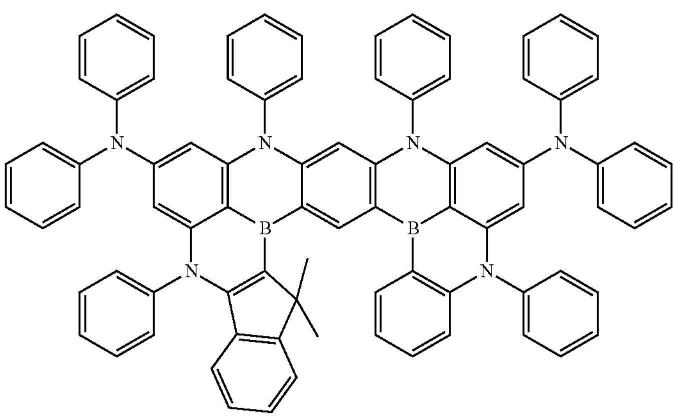
62
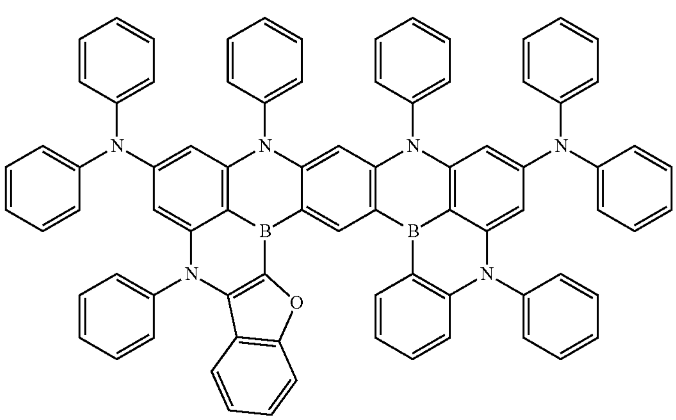

-continued
63
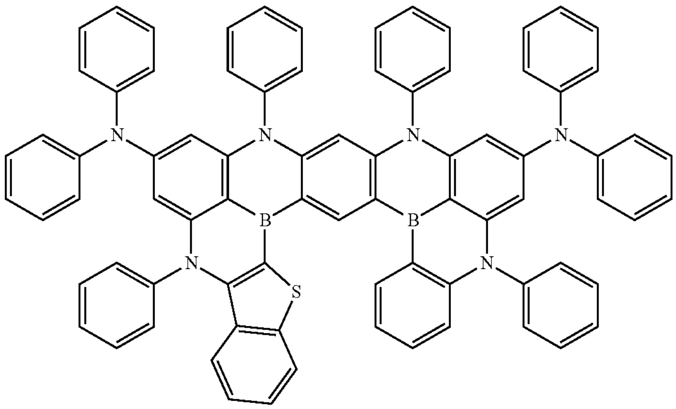
64
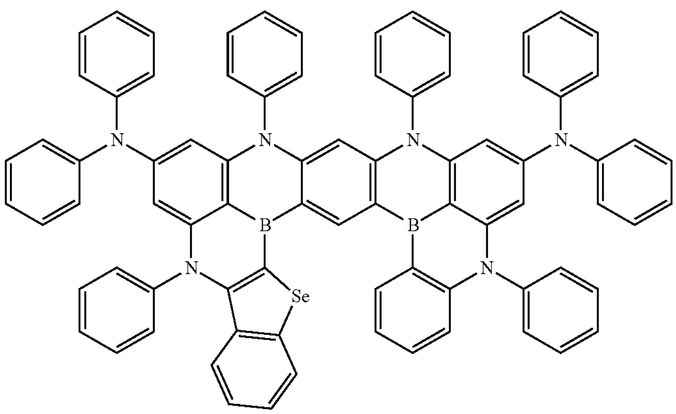
65
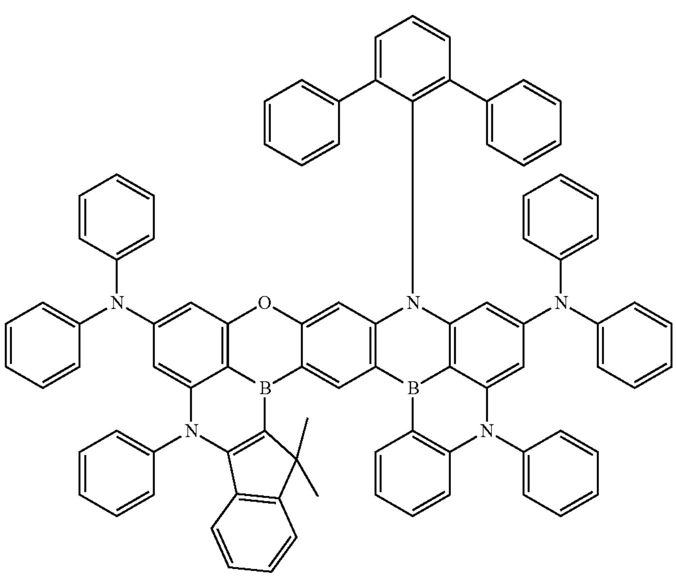

-continued
66
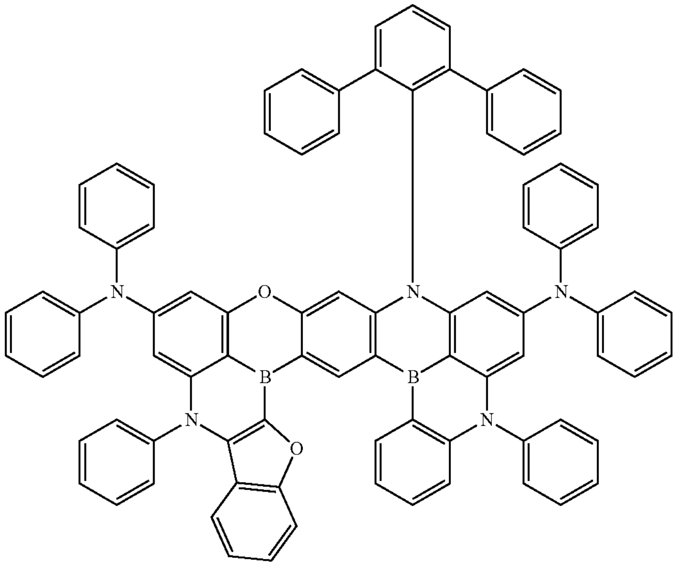
67
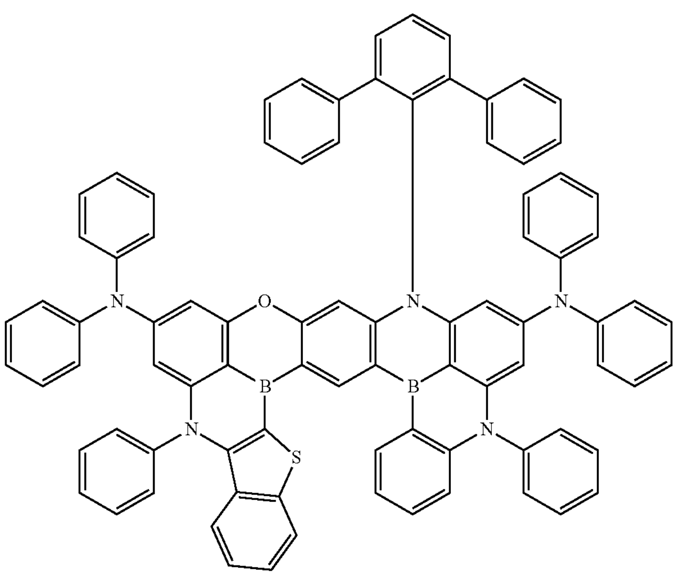

-continued
68
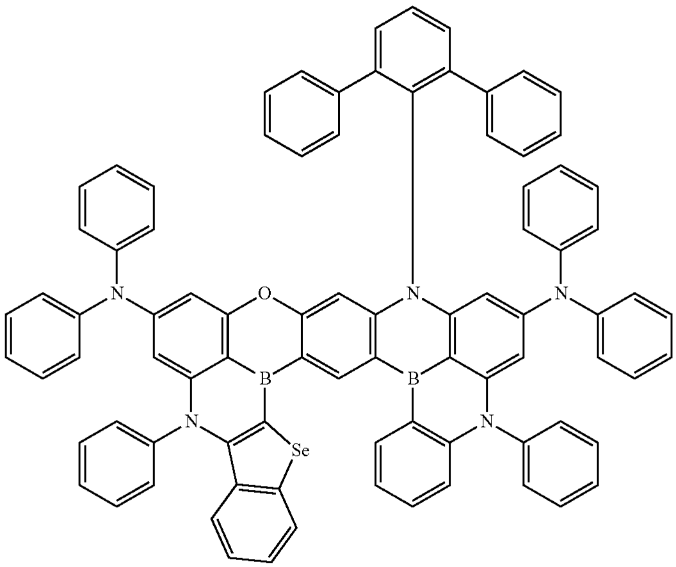
69
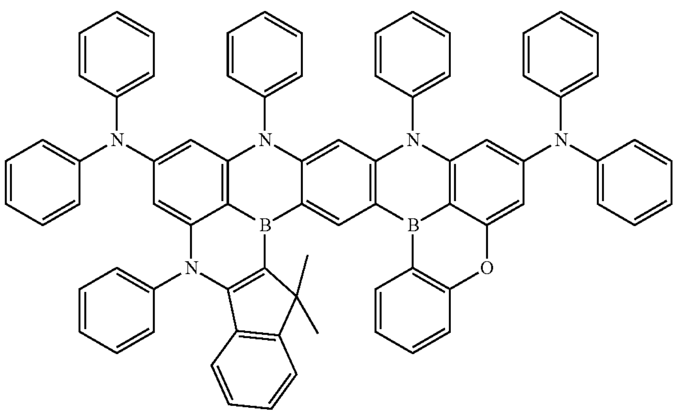
70
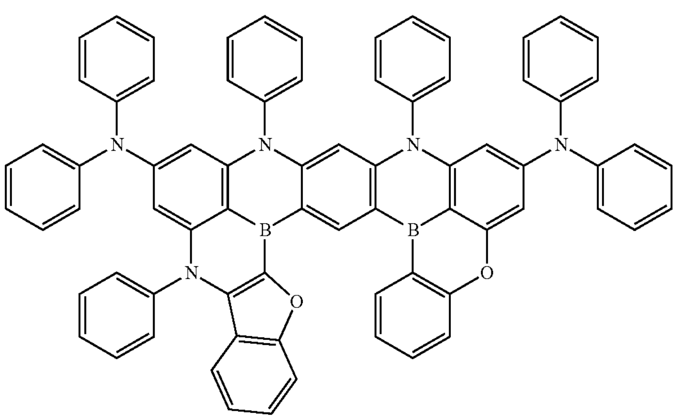

-continued
71
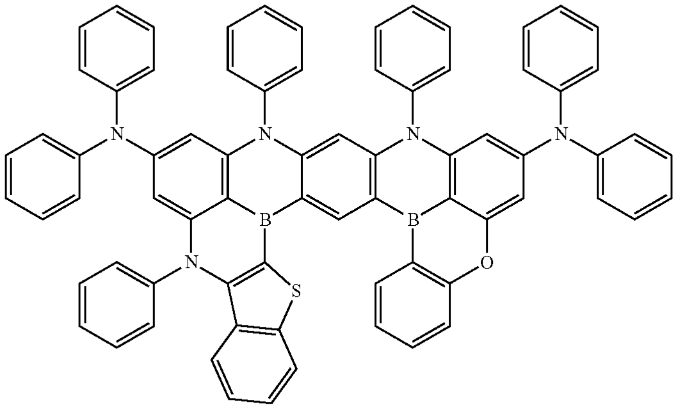
72
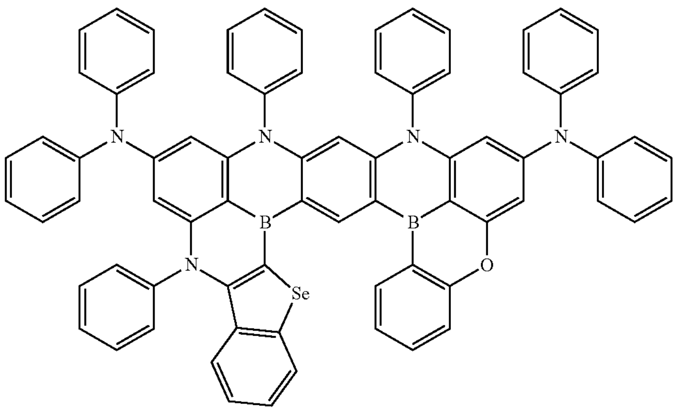
73
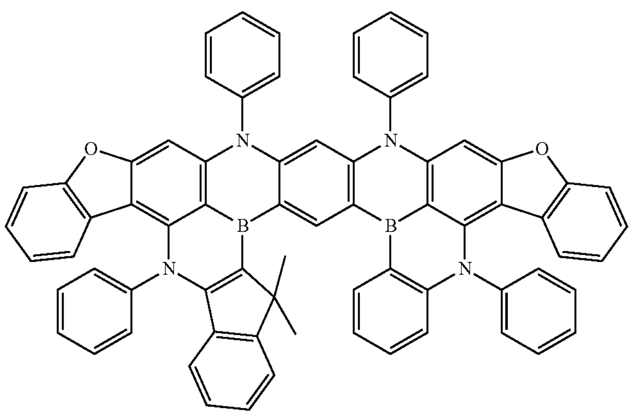
74
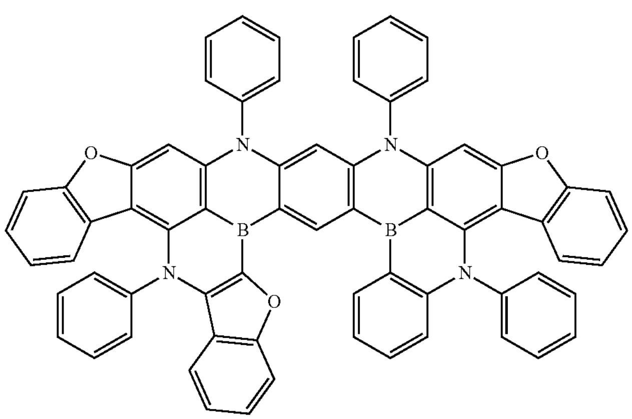

-continued
75
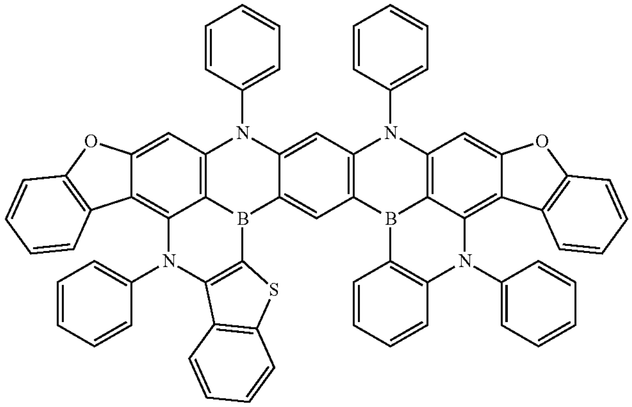
76
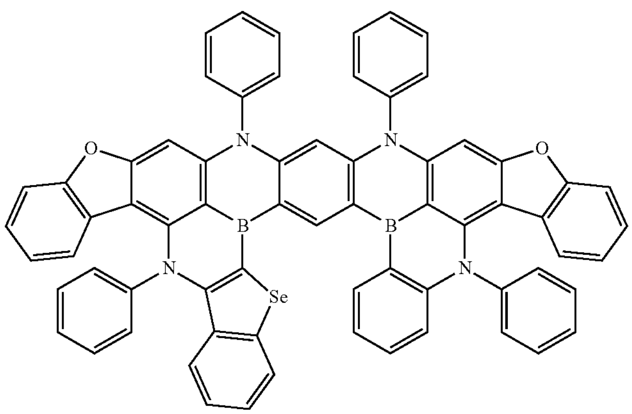
77
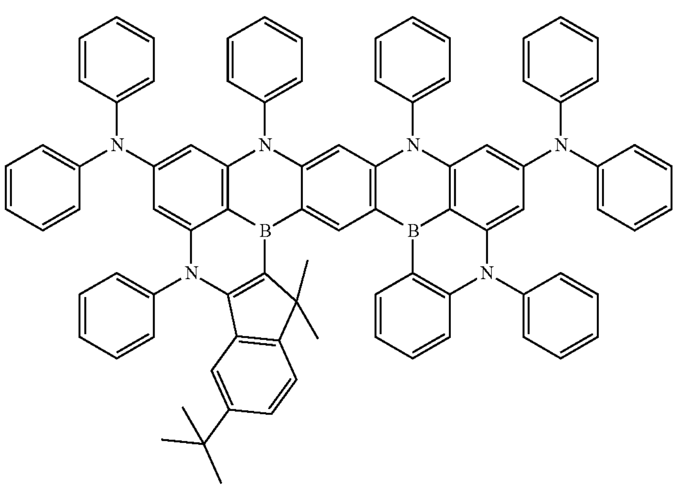

-continued
78
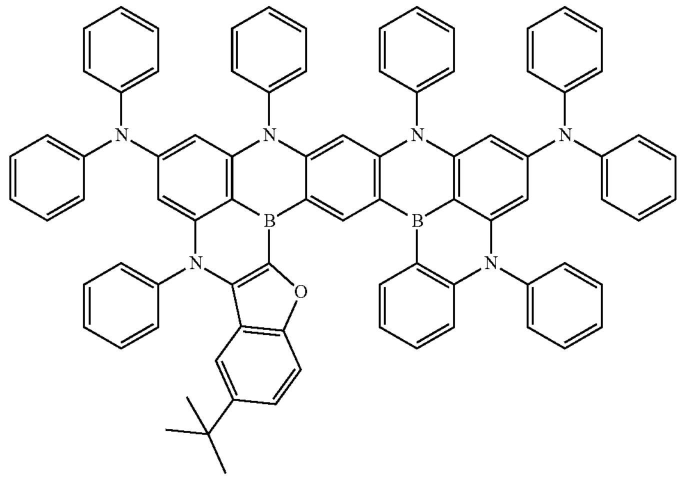
79
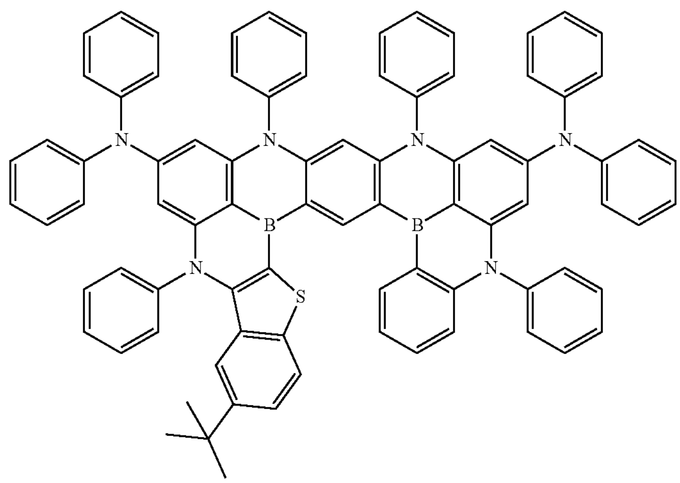
80
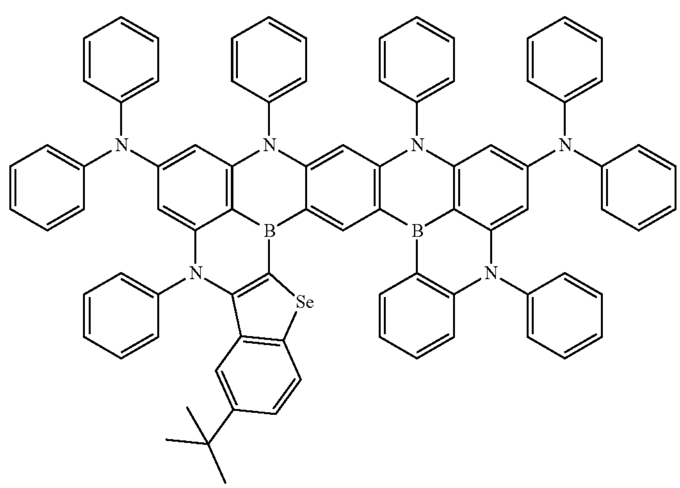

-continued
81
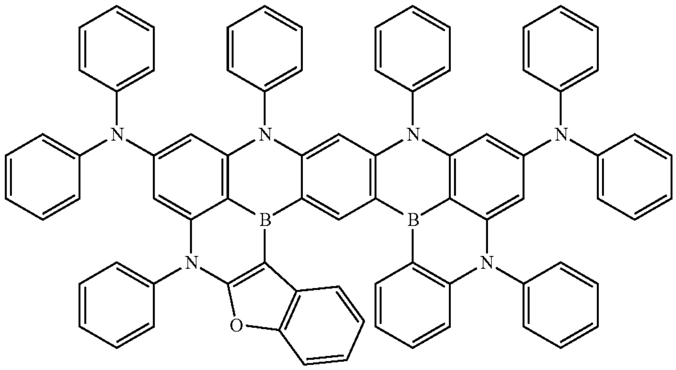
82
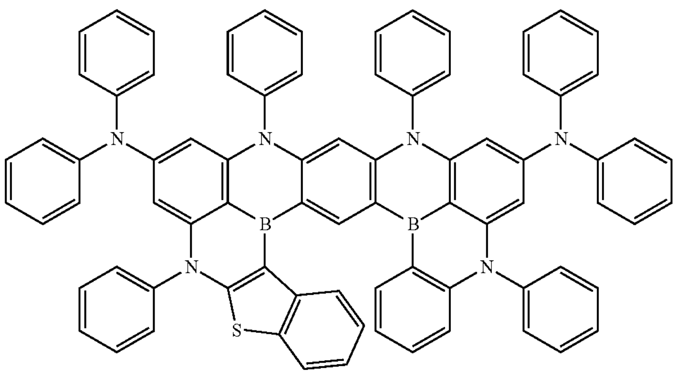
83
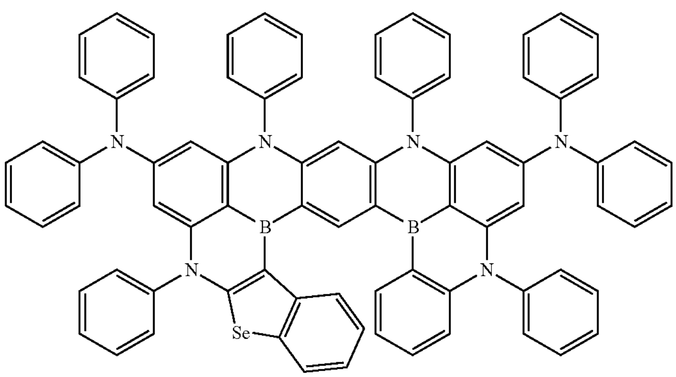
84
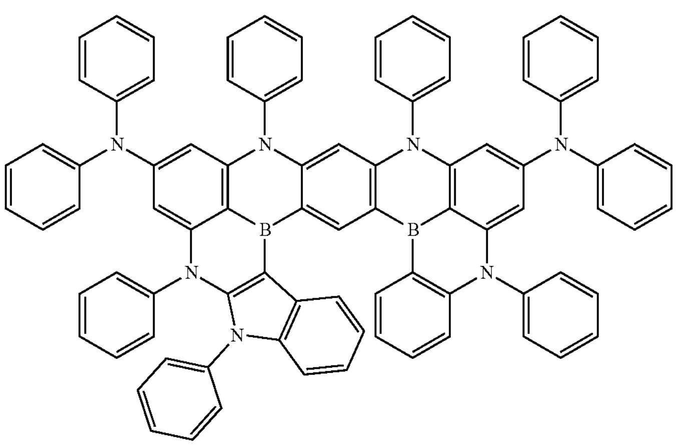

-continued
85
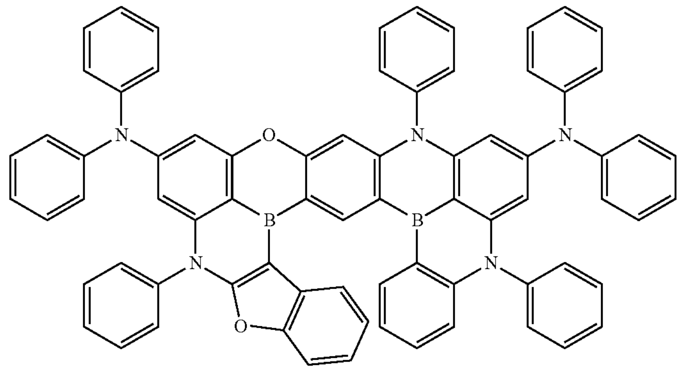
86
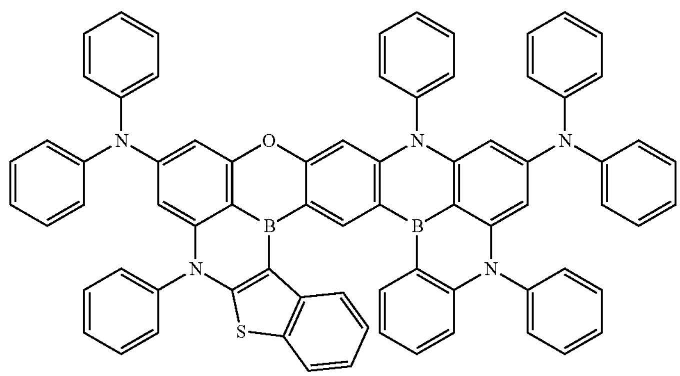
87
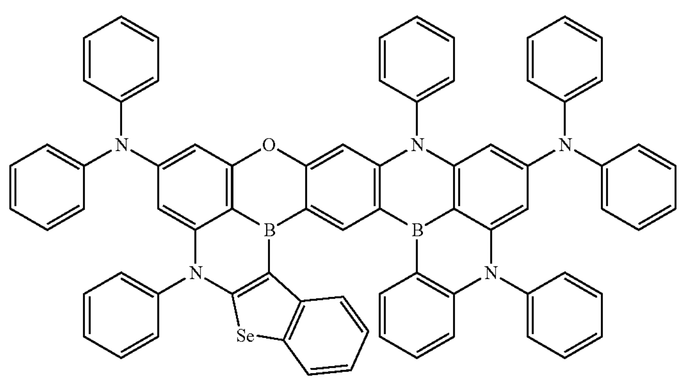
88
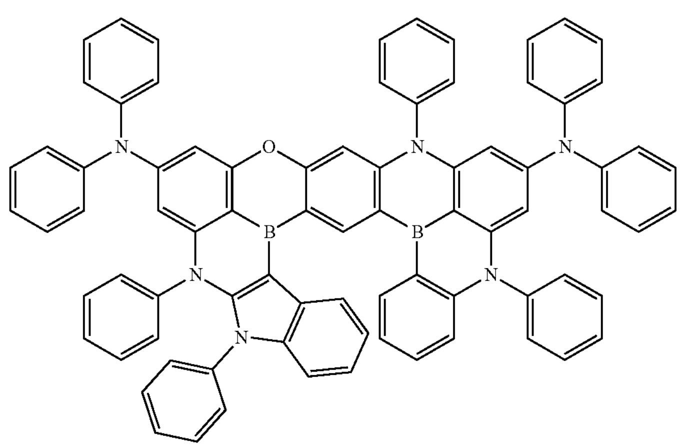

-continued
89
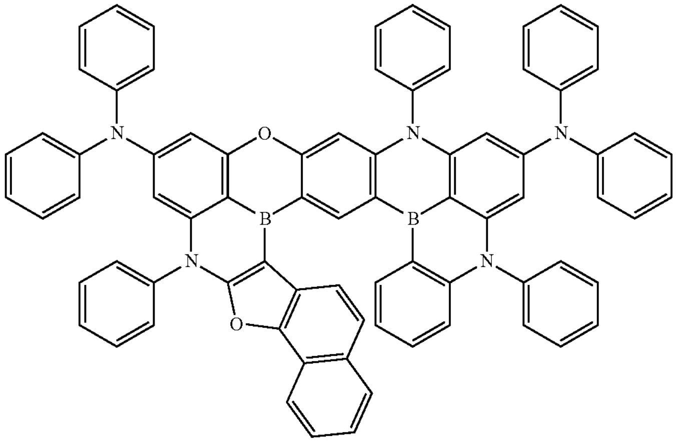
90
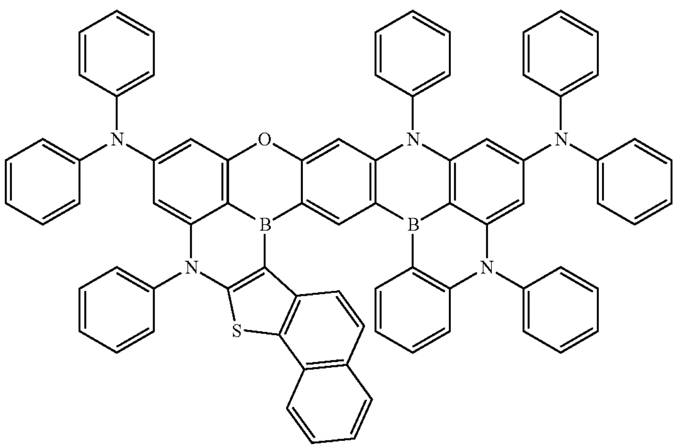
91
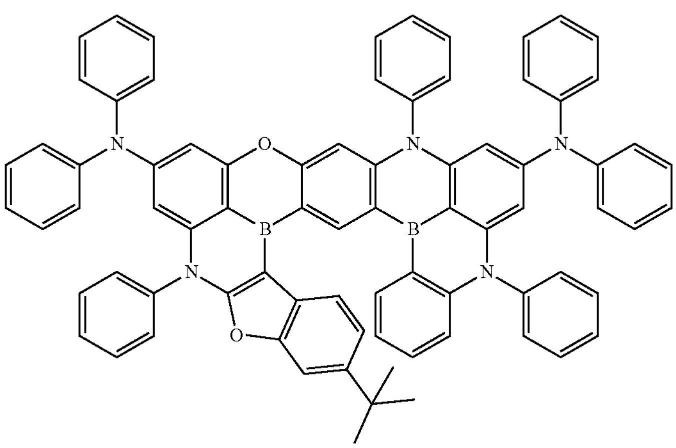

-continued
92
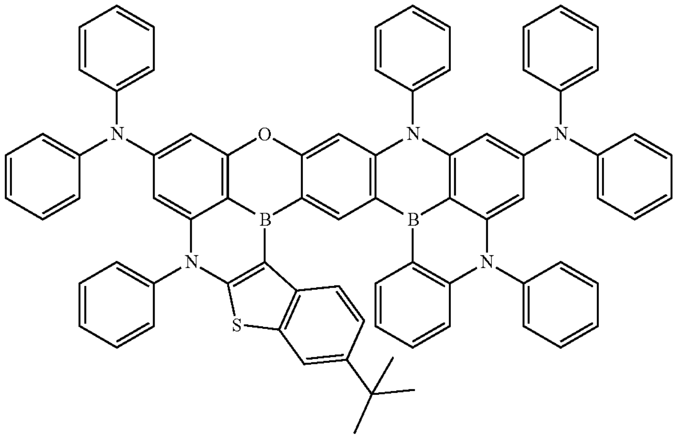
93
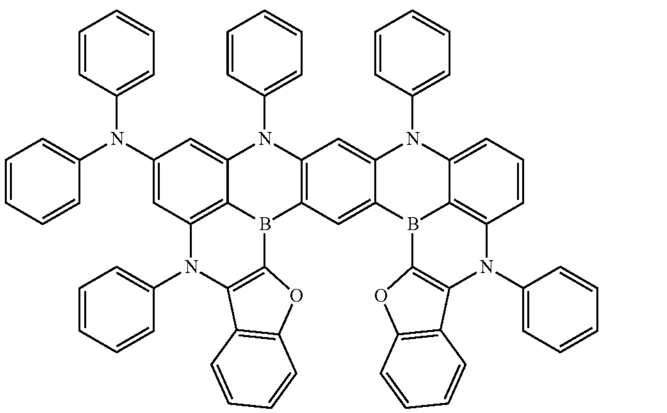
94
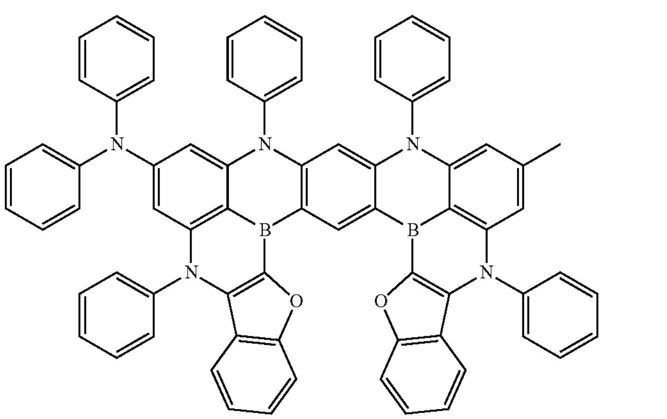

-continued
95
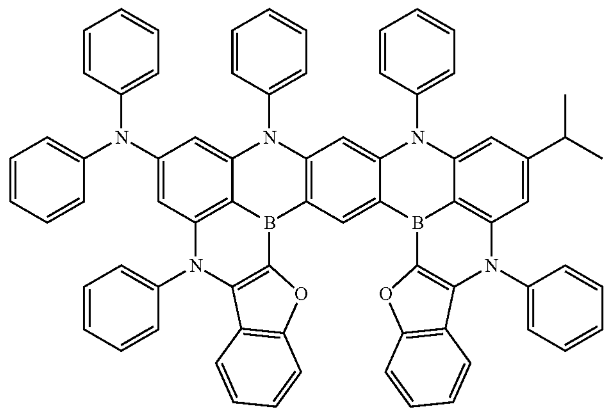
96
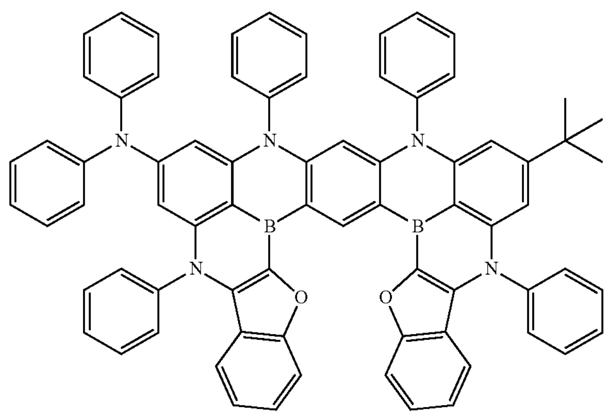
97
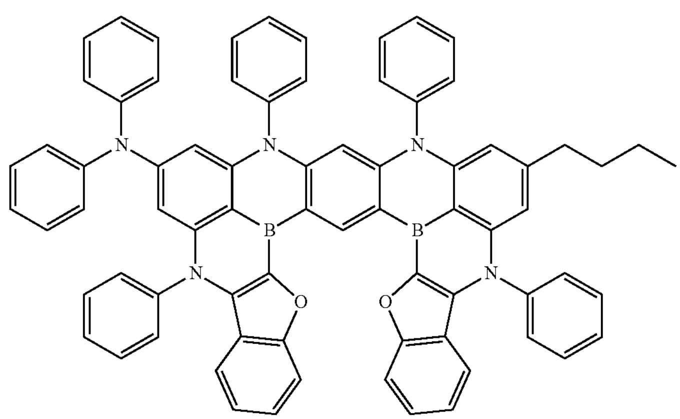
98
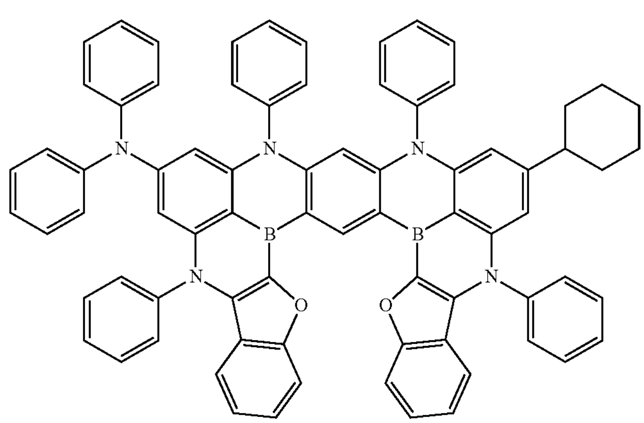

-continued
99
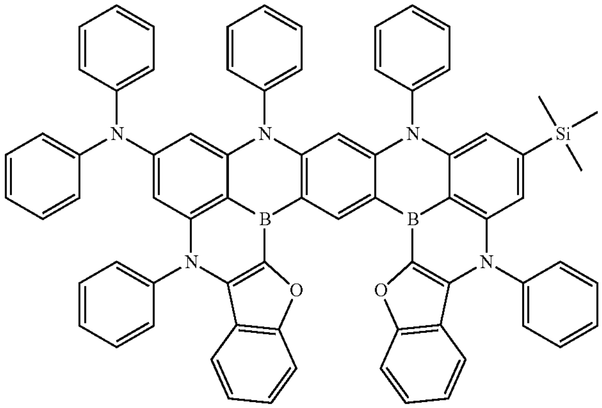
100
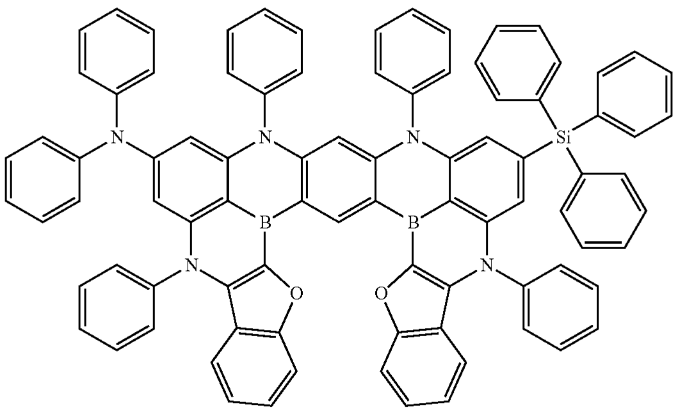
101
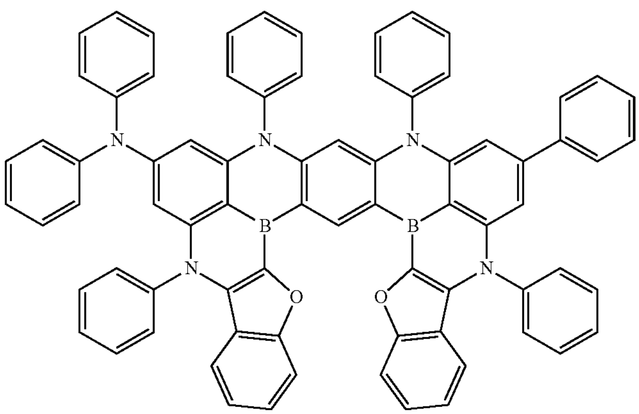
102
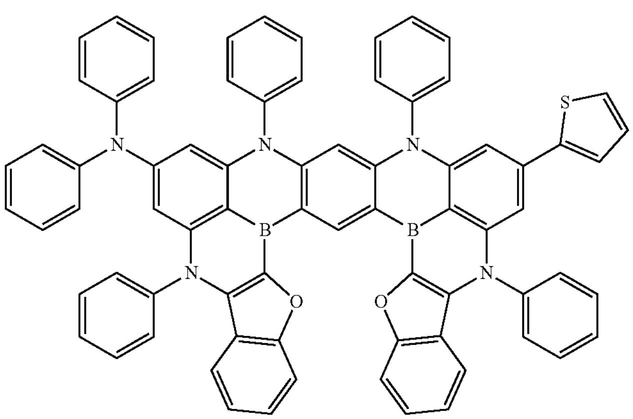

-continued
103
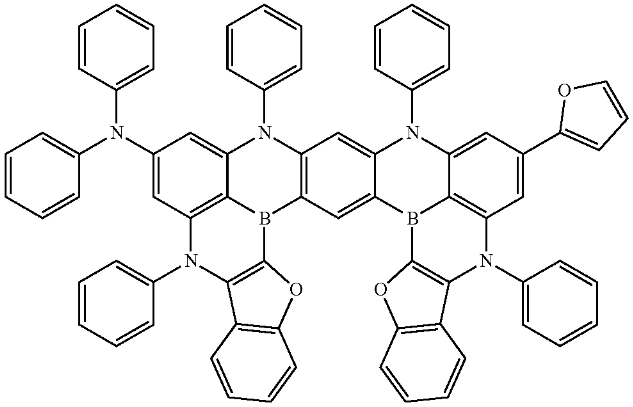
104
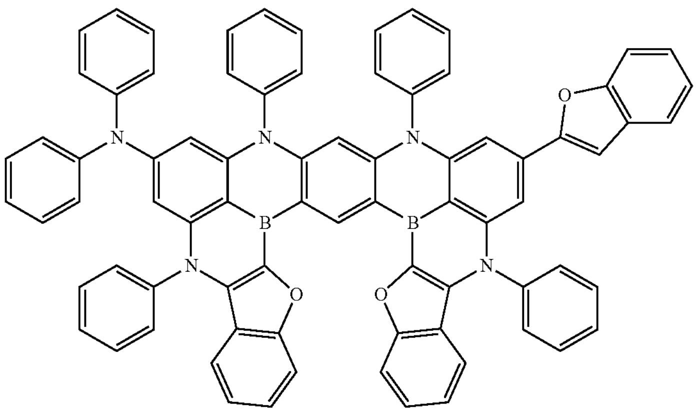
105
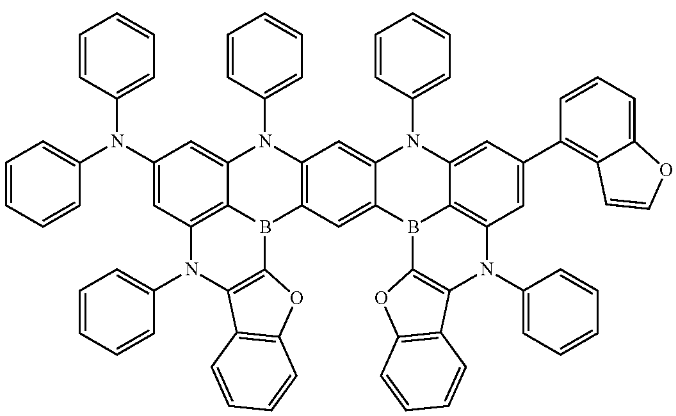
106
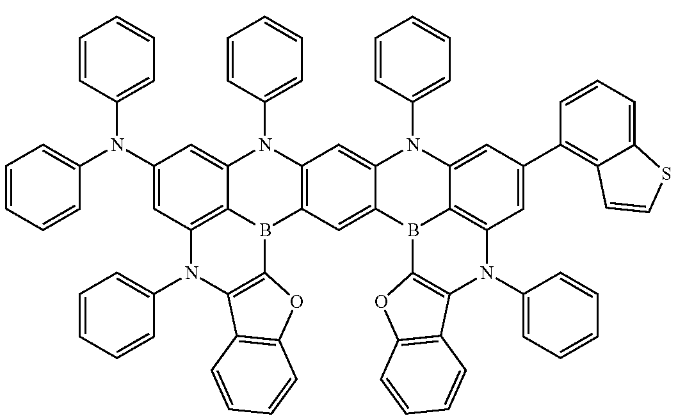

-continued
107
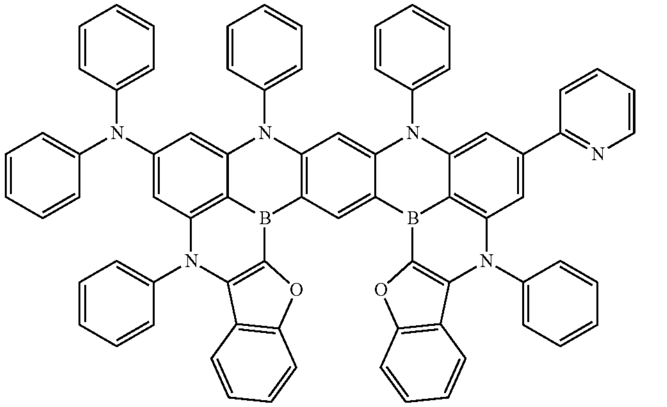
108
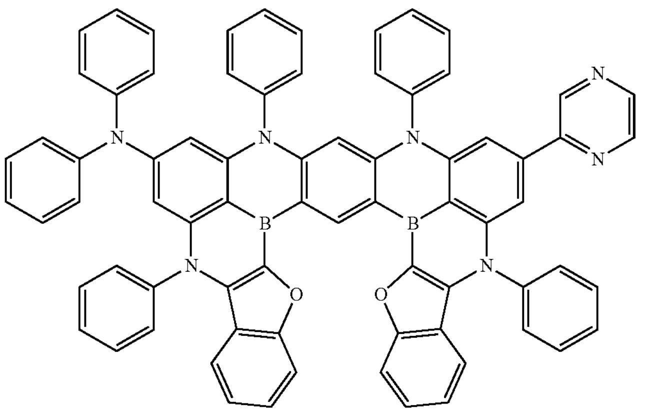
109
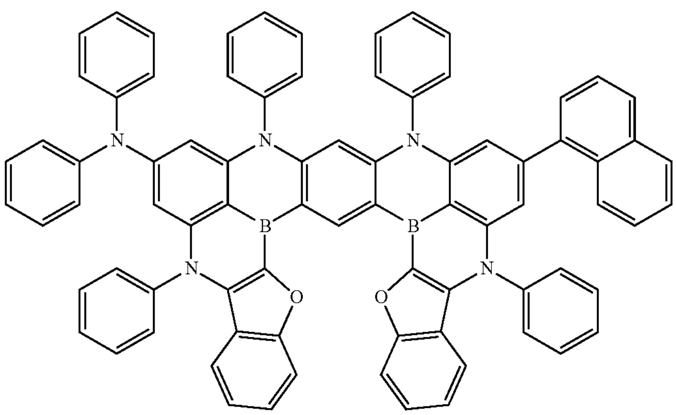
110
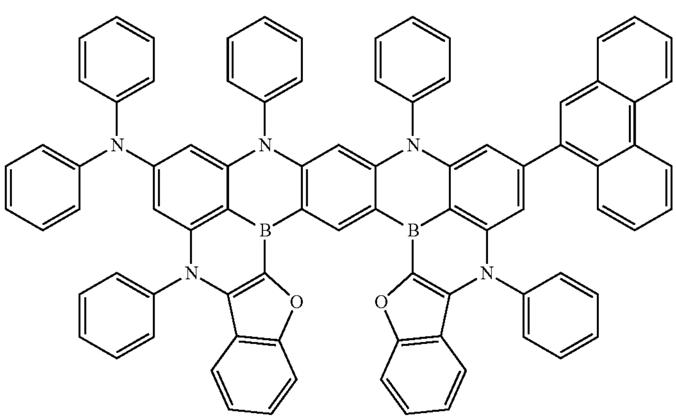

-continued
111
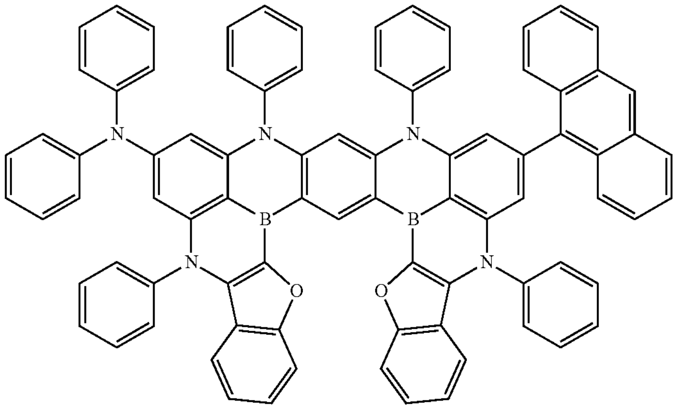
112
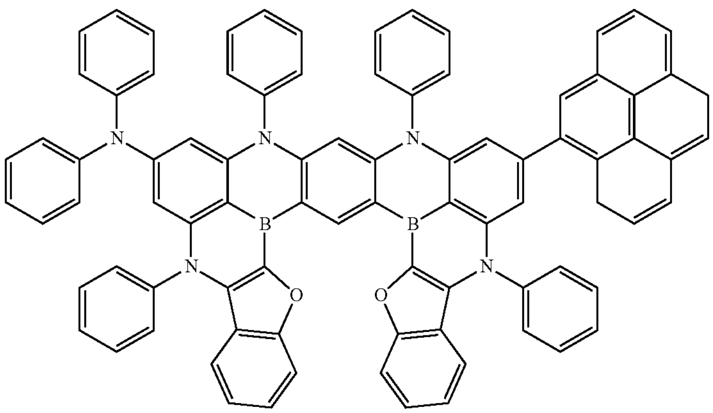
113
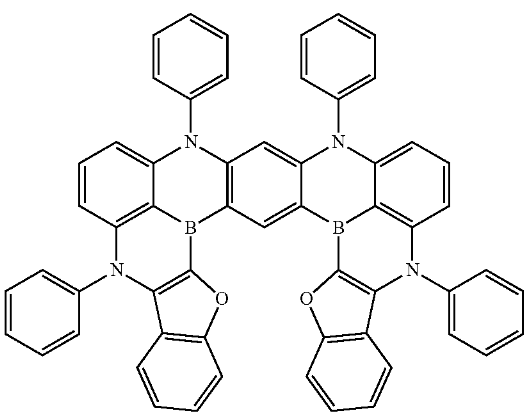
114
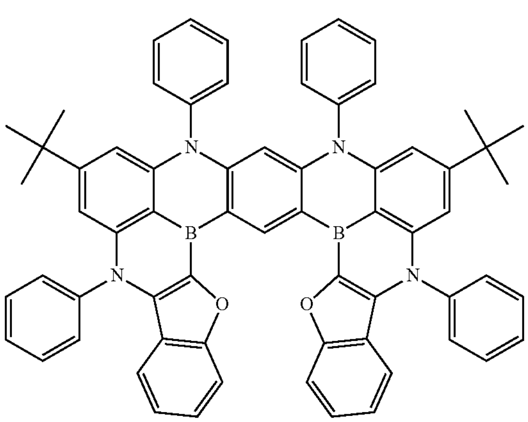

-continued
115
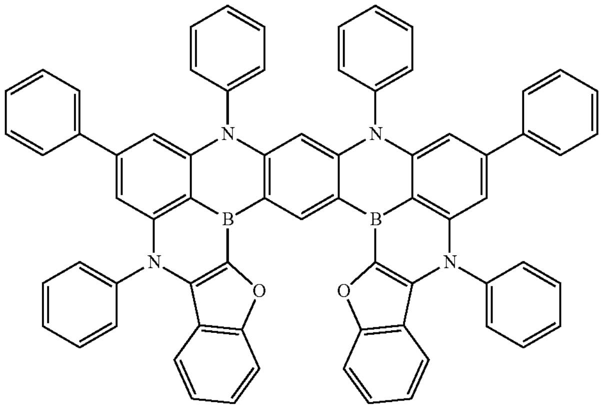
116
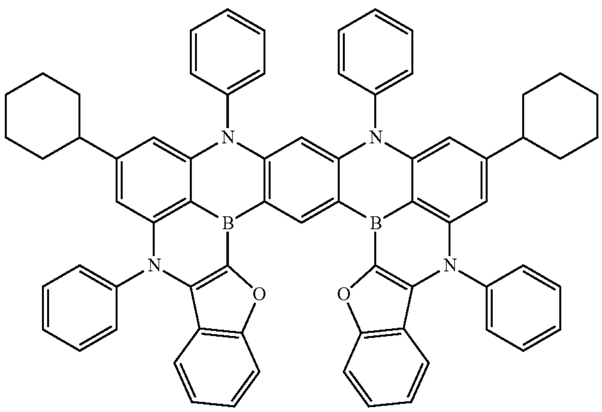
117
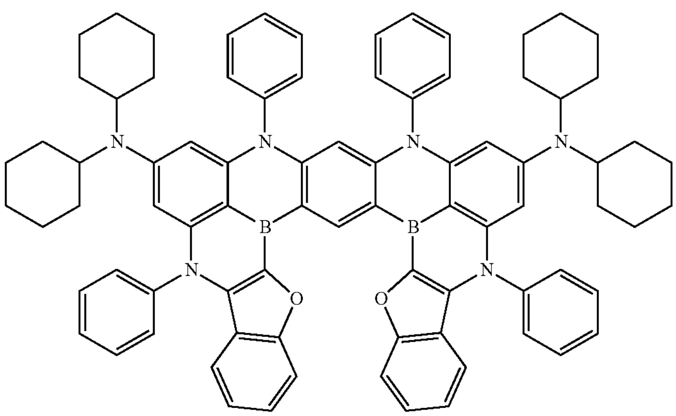
118
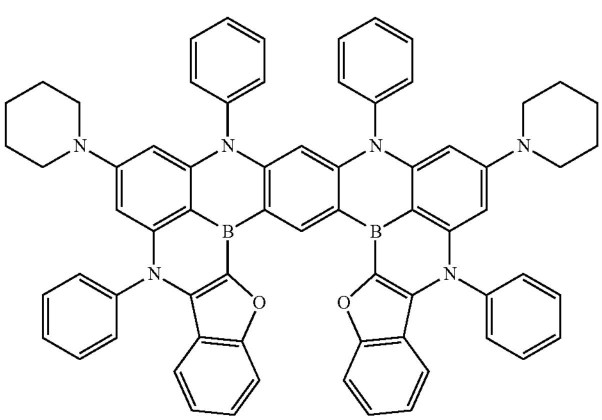

-continued
119
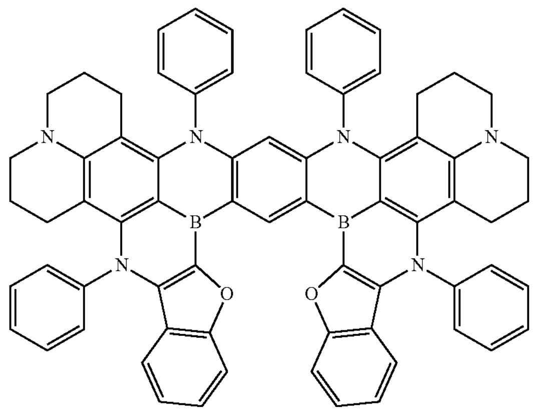
120
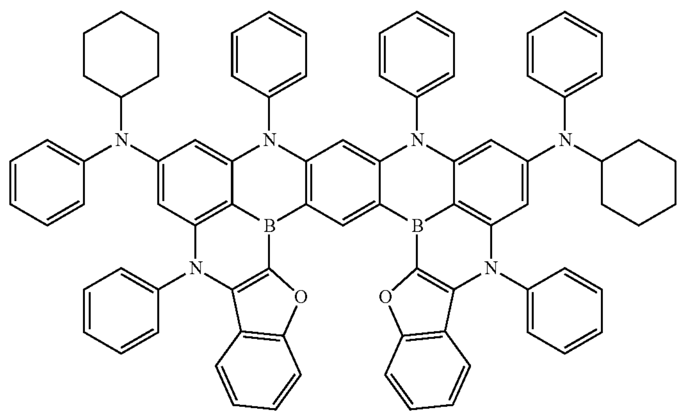
121
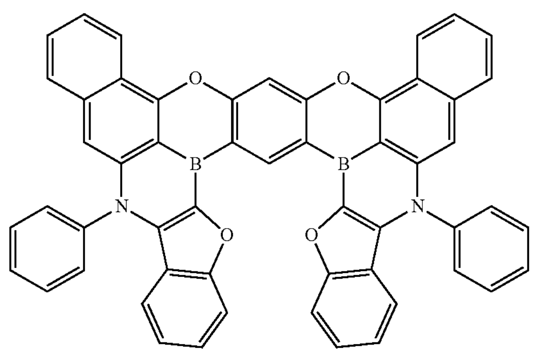
122
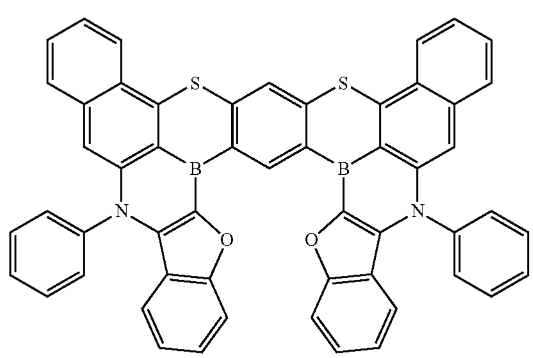

-continued
123
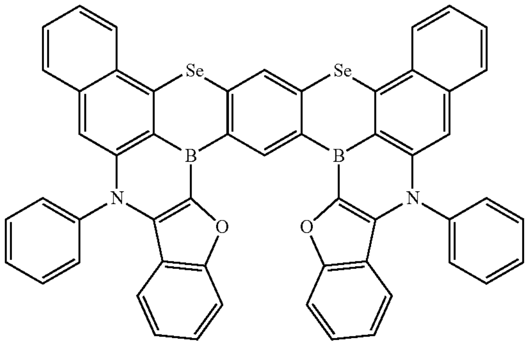
124
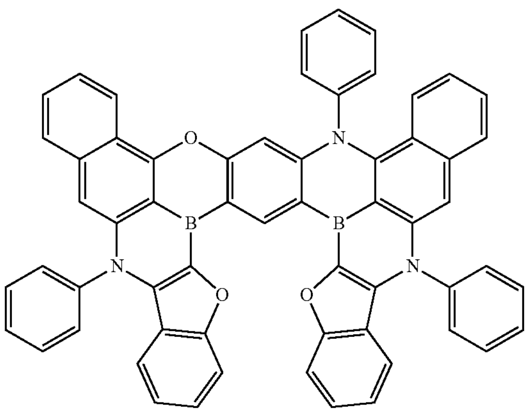
125
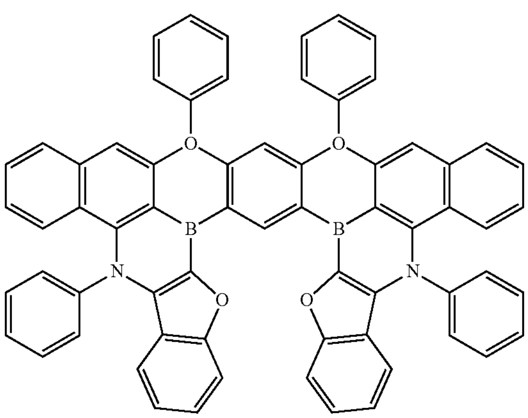
126
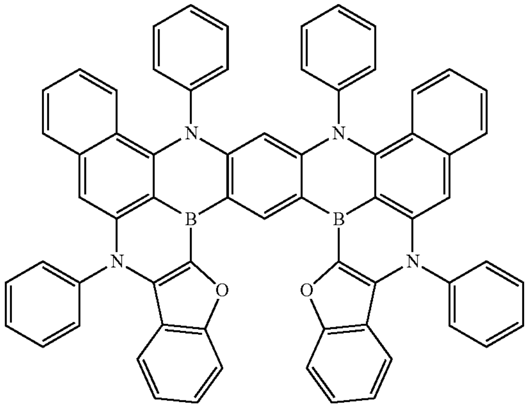

-continued
127
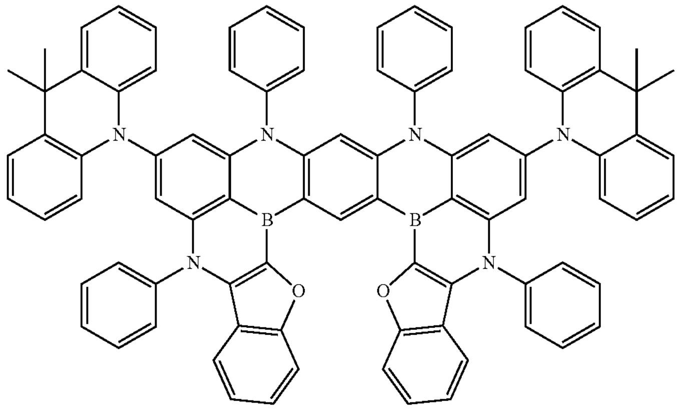
128
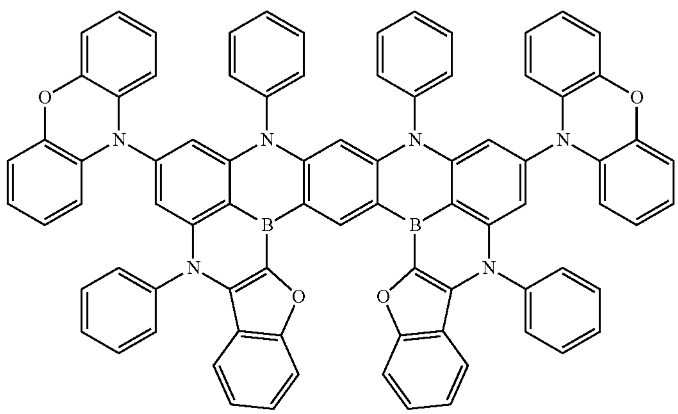
129
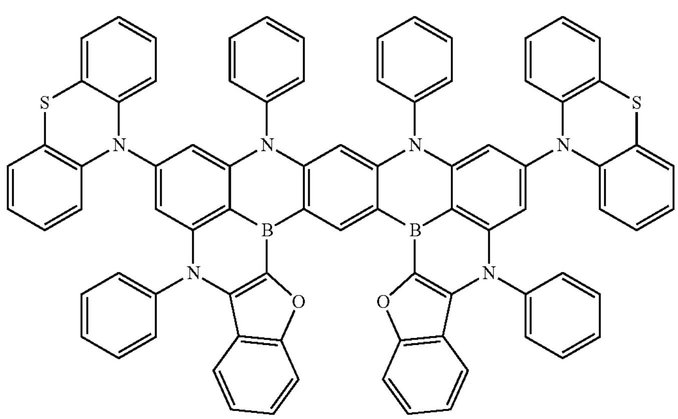

-continued
130
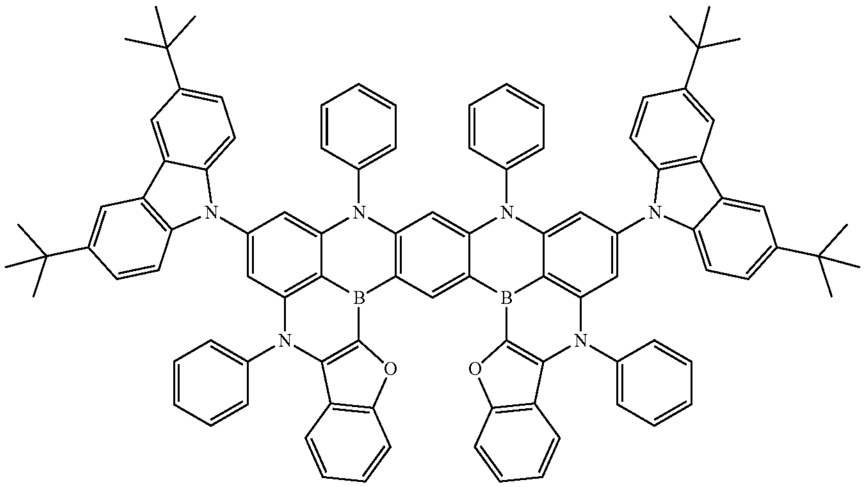
131
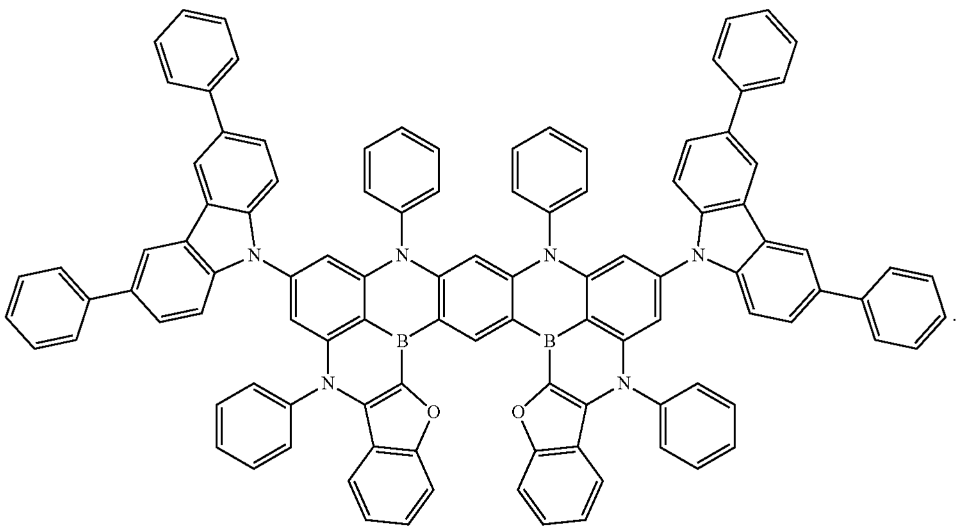
* * * * *

UNITED STATES PATENT AND TRADEMARK OFFICE
CERTIFICATE OF CORRECTION

PATENT NO. : 12,279,515 B2
APPLICATION NO. : 17/446894
DATED : April 15, 2025
INVENTOR(S) : Taeil Kim et al.

It is certified that error appears in the above-identified patent and that said Letters Patent is hereby corrected as shown below:

In the Claims

In Column 179, Line 10, in Claim 1, above "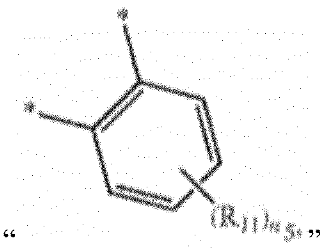" insert -- Formula 3 --.

In Column 180, Lines 19-33, in Claim 6, Formula 4-2, delete

"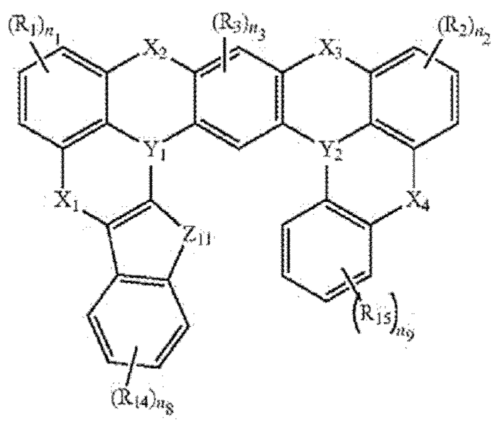" and insert

Signed and Sealed this
Twenty-second Day of July, 2025

Coke Morgan Stewart
*Acting Director of the United States Patent and Trademark Office*

-- 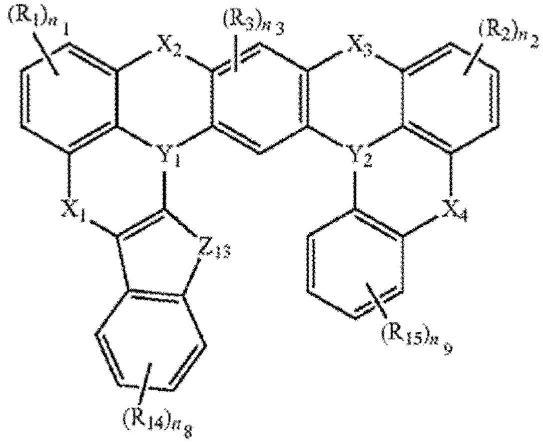 --.
In Columns 255-256, Line 4, in Claim 12, Structure 125, delete
" 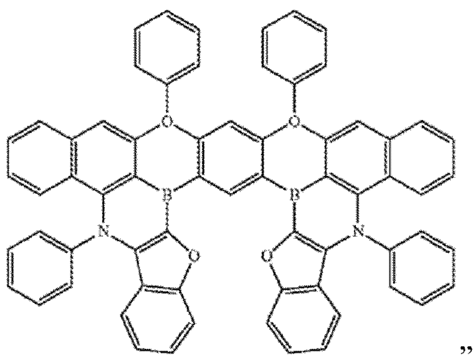 " and insert -- 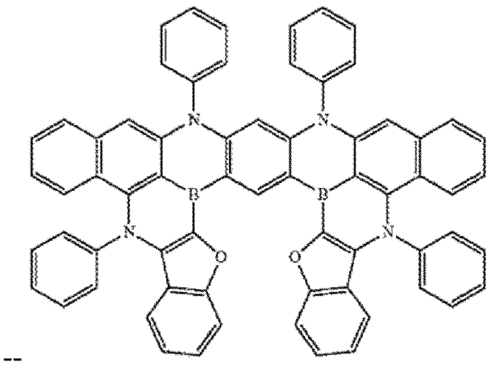 --.
In Column 261, Line 32, in Claim 13, above " 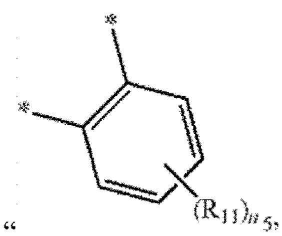 " insert -- Formula 3 --.
In Column 262, Line 15, in Claim 14, Formula E-2b, delete
" $(\mathrm{Cbz1}) \!-\!\!-\!\! (\mathrm{L}_b)_b \!-\!\!-\!\! (\mathrm{Cbz}_2),$ " and insert
-- $(\mathrm{Cbz1}) \!-\! (\mathrm{L}_b)_b \!-\! (\mathrm{Cbz2}),$ --.

In Column 263, Lines 34-49, in Claim 16, Formula 4-1, delete
" 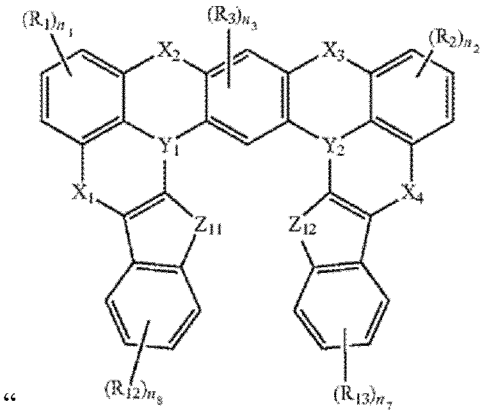 " and insert -- 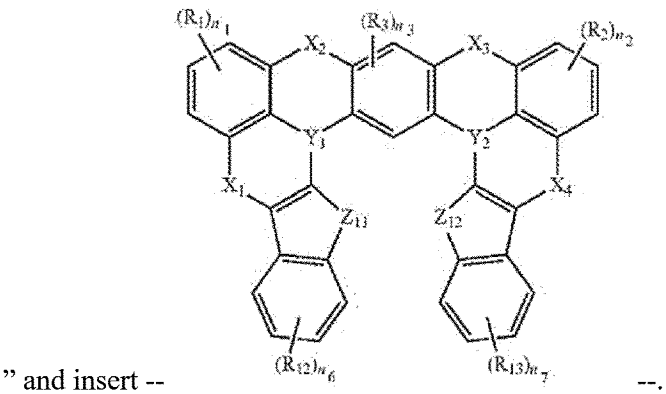 --.
In Columns 339-340, Line 4, in Claim 20, Structure 125, delete
" 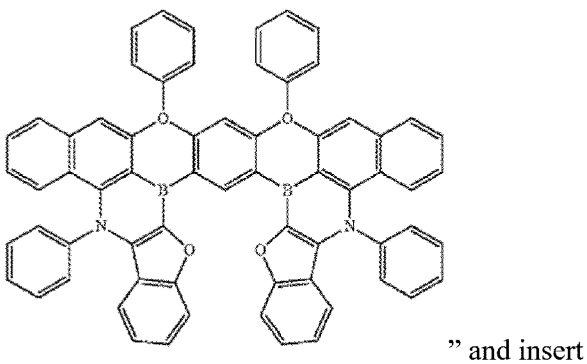 " and insert -- 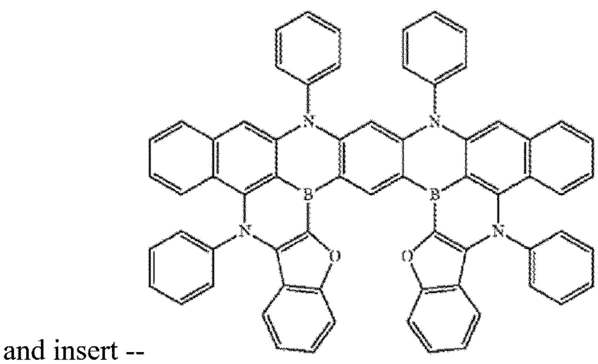 --.